US012243884B2

(12) United States Patent
Fukasaku et al.

(10) Patent No.: US 12,243,884 B2
(45) Date of Patent: Mar. 4, 2025

(54) SEMICONDUCTOR DEVICE AND SOLID-STATE IMAGING SENSOR

(71) Applicant: SONY SEMICONDUCTOR SOLUTIONS CORPORATION, Kanagawa (JP)

(72) Inventors: Katsuhiko Fukasaku, Kanagawa (JP); Koichi Matsumoto, Kanagawa (JP); Akito Shimizu, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 815 days.

(21) Appl. No.: 17/282,805

(22) PCT Filed: Oct. 2, 2019

(86) PCT No.: PCT/JP2019/038840
§ 371 (c)(1),
(2) Date: Apr. 5, 2021

(87) PCT Pub. No.: WO2020/075583
PCT Pub. Date: Apr. 16, 2020

(65) Prior Publication Data

US 2021/0391366 A1 Dec. 16, 2021

(30) Foreign Application Priority Data

Oct. 12, 2018 (JP) ................................ 2018-193723
Jun. 26, 2019 (JP) ................................ 2019-119168

(51) Int. Cl.
*H01L 27/146* (2006.01)
*H01L 29/06* (2006.01)
(Continued)

(52) U.S. Cl.
CPC .... *H01L 27/14616* (2013.01); *H01L 29/0692* (2013.01); *H01L 29/4236* (2013.01); *H01L 29/7827* (2013.01)

(58) Field of Classification Search
CPC ........... H01L 27/14616; H01L 29/7827; H01L 29/06; H01L 29/7828; H01L 29/0692;
(Continued)

(56) References Cited

U.S. PATENT DOCUMENTS 5,670,810 A 9/1997 Tamaki et al.
2003/0141514 A1 7/2003 Yamaguchi
(Continued)

FOREIGN PATENT DOCUMENTS

CN 102668081 A 9/2012
CN 106415845 A 2/2017
(Continued)

OTHER PUBLICATIONS

International Search Report prepared by the Japan Patent Office on Nov. 6, 2019, for International Application No. PCT/JP2019/038840.

*Primary Examiner* — Eric K Ashbahian
*Assistant Examiner* — Halee Cramer
(74) *Attorney, Agent, or Firm* — SHERIDAN ROSS P.C.

(57) ABSTRACT

A semiconductor device according to an aspect of the present technology includes a low-concentration N-type region, a first high-concentration N-type region and a second high-concentration N-type region that are stacked with the low-concentration N-type region interposed therein, a gate electrode that surrounds the low-concentration N-type region as viewed from a stacking direction, which is a direction in which the low-concentration N-type region, the first high-concentration N-type region, and the second high-concentration N-type region are stacked, a first insulating
(Continued)

film placed between the gate electrode and the low-concentration N-type region, and a second insulating film placed between the gate electrode and the first high-concentration N-type region. The first high-concentration N-type region is connected to one of a source electrode and a drain electrode. The second high-concentration N-type region is connected to the other of the source electrode and the drain electrode.

27 Claims, 104 Drawing Sheets

(51) Int. Cl.
*H01L 29/423* (2006.01)
*H01L 29/78* (2006.01)

(58) Field of Classification Search
CPC .......... H01L 29/4236; H01L 29/66787; H01L 29/66666; H01L 21/02576
See application file for complete search history.

(56) References Cited

U.S. PATENT DOCUMENTS

| | | | |
|---|---|---|---|
| 2004/0051104 | A1 | 3/2004 | Yamashita et al. |
| 2011/0049333 | A1 | 3/2011 | Yamashita |
| 2014/0138752 | A1 | 5/2014 | Kao |
| 2017/0200790 | A1* | 7/2017 | Hitora .................. H01L 29/872 |
| 2018/0102477 | A1 | 4/2018 | Choi |
| 2019/0096952 | A1* | 3/2019 | Tsai .................. H01L 27/14689 |
| 2020/0043968 | A1* | 2/2020 | Hynecek .......... H01L 27/14636 |
| 2020/0212184 | A1* | 7/2020 | Takahashi .......... H01L 29/7813 |

FOREIGN PATENT DOCUMENTS

| | | | |
|---|---|---|---|
| JP | H03-250770 | | 11/1991 |
| JP | H08-335699 | | 12/1996 |
| JP | 2004-186463 | | 7/2004 |
| JP | 2005142503 | A | 6/2005 |
| JP | 2009070947 | A | 4/2009 |
| JP | 2011-049240 | | 3/2011 |
| JP | 2014022561 | A | 2/2014 |
| JP | 2014056963 | A | 3/2014 |
| JP | 2014-123771 | | 7/2014 |
| JP | 2015-233073 | | 12/2015 |
| JP | 2016127284 | A | 7/2016 |
| JP | 2018129374 | A | 8/2018 |
| WO | WO 2003/028110 | | 4/2003 |
| WO | WO-2011077580 | A1 | 6/2011 |
| WO | WO 2015/016140 | | 2/2015 |
| WO | WO 2016/013554 | | 6/2017 |
| WO | WO-2018180574 | A1 | 10/2018 |

* cited by examiner

SEMICONDUCTOR DEVICE AND SOLID-STATE IMAGING SENSOR

CROSS REFERENCE TO RELATED APPLICATIONS

This application is a national stage application under 35 U.S.C. 371 and claims the benefit of PCT Application No. PCT/JP2019/038840 having an international filing date of 2 Oct. 2019, which designated the United States, which PCT application claimed the benefit of Japanese Patent Application Nos. 2018-193723, filed 12 Oct. 2018 and 2019-119168, filed 26 Jun. 2019, the entire disclosures of each of which are incorporated herein by reference.

TECHNICAL FIELD

The technology relating to the present disclosure (present technology) relates to a semiconductor device used in image capturing devices, and a solid-state imaging sensor in which the semiconductor device is built into an amplifying transistor, for example.

BACKGROUND ART

Some semiconductor devices have a Gate All Around structure (referred to a "GAA structure" in the following description) in which a gate electrode is formed surrounding a channel, as in the technology disclosed in PTL 1, for example.

CITATION LIST

Patent Literature

[PTL 1]
JP 2015-233073 A

SUMMARY

Technical Problem

However, semiconductor devices with a GAA structure, such as in the technology disclosed in PTL 1, have a problem in that the manufacturing process is complicated, and the cost increases due to the increase in the number of processes.

With the foregoing problem in view, it is an object of the present technology to provide a semiconductor device that is able to suppress the manufacturing process from becoming complicated, and a solid-state imaging sensor in which the semiconductor device is built into an amplifying transistor.

Solution to Problem

A semiconductor device includes a low-concentration N-type region, a first high-concentration N-type region, a second high-concentration N-type region, a gate electrode, a first insulating film, and a second insulating film. The first high-concentration N-type region and the second high-concentration N-type region are stacked with the low-concentration N-type region interposed therein, and are regions that have a higher concentration of impurity than the low-concentration N-type region. Also, the first high-concentration N-type region is connected to one of a source electrode and a drain electrode, and the second high-concentration N-type region is connected to the other of the source electrode and the drain electrode. The gate electrode that surrounds the low-concentration N-type region as viewed from a stacking direction, which is a direction in which the low-concentration N-type region, the first high-concentration N-type region, and the second high-concentration N-type region are stacked. The first insulating film is placed between the gate electrode and the low-concentration N-type region. The second insulating film is placed between the gate electrode and the first high-concentration N-type region.

The solid-state imaging sensor according to an aspect of the present technology has a pixel circuit that is provided with an amplifying transistor, and the above-described semiconductor device is built into the amplifying transistor.

DESCRIPTION OF EMBODIMENTS

Embodiments of the present technology will be described below with reference to the Figures. In the Figures, parts that are the same or similar are denoted by the same or similar reference signs, and repetitive description will be omitted. The Figures are schematic, and there are cases included in which the Figures differ from actual items. The embodiments shown below are for exemplifying devices and methods to substantiate the technical idea of the present technology, and the technical idea of the present technology is not limited to devices and methods exemplified in the following embodiments. Various changes may be made to the technical idea of the present technology within the technical scope set forth in the Claims.

First Embodiment

<Overall Configuration of Semiconductor Device>

A semiconductor device according to a first embodiment is built into an amplifying transistor provided to a pixel circuit of a solid-state imaging sensor, for example.

Figure 1:
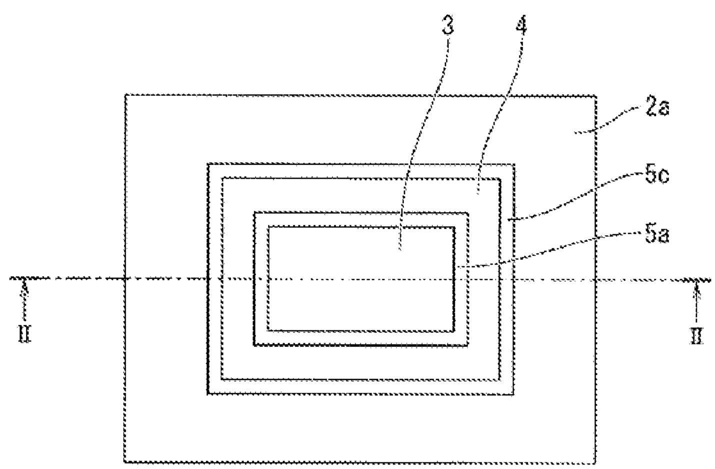
FIG. 1 is a plane view illustrating a configuration of a semiconductor device according to a first embodiment.
Figure 2:
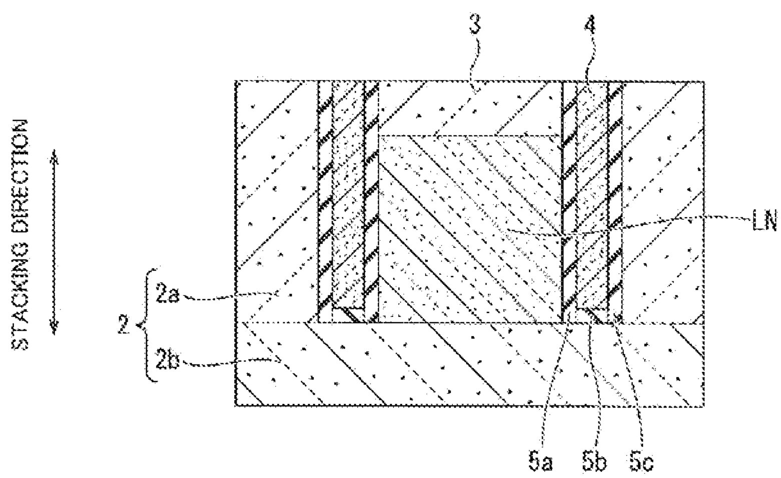
FIG. 2 is a cross-sectional view taken along line II-II in FIG. 1.

As illustrated in FIG. 1 and FIG. 2, the semiconductor device has a low-concentration N-type region LN, a first high-concentration N-type region 2, a second high-concentration N-type region 3, a gate electrode 4, a first insulating film 5*a*, a second insulating film 5*b*, and a third insulating film 5*c*.

The low-concentration N-type region LN is formed using a material of which the concentration of impurity is not higher than 10 keV/1E$^{18}$ (cm$^{-2}$). In the first embodiment, a case in which the low-concentration N-type region LN is formed using phosphorus with concentration of impurity of 100 keV/1E$^{13}$ (cm$^{-2}$) will be described.

Also, the shape of the low-concentration N-type region LN is a cuboid.

In the cuboid that the low-concentration N-type region LN forms, two faces that are not adjacent to each other each form planes as viewed in the stacking direction illustrated in FIG. 2. Note that description of the stacking direction will be described later.

Accordingly, the shape of the low-concentration N-type region LN as viewed from the stacking direction is a square.

The first high-concentration N-type region 2 is formed using a material that has a higher concentration of impurity than the low-concentration N-type region LN, such as a material that has concentration of impurity of not lower than 10 keV/1E$^{19}$ (cm$^{-2}$), for example. In the first embodiment, a case in which the first high-concentration N-type region 2 is formed using phosphorus with concentration of impurity of 500 keV/1E$^{14}$ (cm$^{-2}$), and phosphorus with concentration of impurity of 100 keV/1E$^{14}$ (cm$^{-2}$), will be described.

Also, the first high-concentration N-type region 2 is formed including a facing region 2*a* and a base region 2*b*.

The facing region 2*a* is a region that faces the low-concentration N-type region LN with the gate electrode 4 interposed therebetween. In the first embodiment, a case in which the facing region 2*a* is formed using phosphorus with concentration of impurity of 100 keV/1E$^{14}$ (cm$^{-2}$) will be described as an example.

The base region 2*b* is a region including a portion that comes into contact with one face of the two faces of the low-concentration N-type region LN that are not adjacent with each other (the lower face in FIG. 2), and a portion that faces the gate electrode 4 in the stacking direction. In the first embodiment, a case in which the base region 2*b* is formed using phosphorus with concentration of impurity of 500 keV/1E$^{14}$ (cm$^{-2}$) will be described as an example.

Also, the first high-concentration N-type region 2 is connected to one of a source electrode and a drain electrode. In the first embodiment, a case in which the facing region 2*a* of the first high-concentration N-type region 2 is connected to the drain electrode ("Drain" illustrated in FIG. 2), as illustrated in the Figure, will be described.

The second high-concentration N-type region 3 is formed using a material that has a higher concentration of impurity than the low-concentration N-type region LN, such as a material that has concentration of impurity of not lower than 10 keV/1E$^{19}$ (cm$^{-2}$), for example. In the first embodiment, a case in which the second high-concentration N-type region 3 is formed using phosphorus with concentration of impurity of 10 keV/1E$^{14}$ (cm$^{-2}$) will be described.

Also, the second high-concentration N-type region 3 is in contact with the other face of the two faces of the low-concentration N-type region LN that are not adjacent with each other (the upper face in FIG. 2).

According to the above, the first high-concentration N-type region 2 and the second high-concentration N-type region 3 are stacked along with the low-concentration N-type region LN with the low-concentration N-type region LN interposed therebetween, and are regions of which the concentration of impurity is higher than that of the low-concentration N-type region LN.

Accordingly, the stacking direction is the direction in which the low-concentration N-type region LN, the first high-concentration N-type region 2, and the second high-concentration N-type region 3 are stacked.

Also, the second high-concentration N-type region 3 is connected to the other of the source electrode and the drain electrode. In the first embodiment, a case in which the second high-concentration N-type region 3 is connected to the source electrode ("Source" illustrated in FIG. 2), as illustrated in the Figure, will be described. The face of the second high-concentration N-type region 3 that is connected to the source electrode, and the face of the facing region 2*a* that is connected to the drain electrode, are of the same height as viewed from a direction orthogonal to the stacking direction (the height of the silicon surface).

Accordingly, the face of the first high-concentration N-type region 2 that is connected to the source electrode or the drain electrode, and the face of the second high-concentration N-type region 3 that is connected to the source electrode or the drain electrode, are at the same height as viewed from the direction orthogonal to the stacking direction.

The gate electrode 4 surrounds the low-concentration N-type region LN as viewed from the stacking direction (up-down direction in FIG. 2).

Also, the gate electrode 4 has a portion that does not face the low-concentration N-type region LN. That is to say, the low-concentration N-type region LN has a portion that does not face the gate electrode 4.

As for a material for the gate electrode 4, at least one of polycrystalline silicon (Poly-Si), titanium nitride (TiN), copper (Cu), aluminum (Al), and tungsten (W) is used, for example. In the first embodiment, a case in which polycrystalline silicon is used as the material for the gate electrode 4 will be described.

The shape of the gate electrode 4 is square, as viewed from the stacking direction.

The first insulating film 5*a* is placed interposed between the gate electrode and the low-concentration N-type region LN.

As for a material for the first insulating film 5*a*, at least one of silicon oxide (SiO), silicon nitride (SiN), and hafnium oxide (HfO) is used, for example.

The second insulating film 5*b* is interposed between the gate electrode and the first high-concentration N-type region 2.

As for a material for the second insulating film 5*b*, at least one of silicon oxide, silicon nitride, and hafnium oxide is used, for example.

The third insulating film 5*c* is placed interposed between the facing region 2*a* and the gate electrode.

As for a material for the third insulating film 5*c*, at least one of silicon oxide, silicon nitride, and hafnium oxide is used, for example.

In the first embodiment, a case in which silicon oxide is used as the material for the first insulating film 5*a*, the second insulating film 5*b*, and the third insulating film 5*c*, will be described.

The semiconductor device according to the first embodiment has a distribution, in a region below the silicon surface, of a layer in which the concentration of impurity is high (first high-concentration N-type region 2), a layer in which the concentration of impurity is low (low-concentration N-type region LN), and a layer in which the concentration of impurity is high (second high-concentration N-type region 3) in the vertical direction. In addition, the semiconductor device according to the first embodiment has a GAA structure in which around the low-concentration N-type region LN is surrounded by a gate insulating film (first insulating film 5*a*, second insulating film 5*b*, and third insulating film 5*c*) and the gate electrode 4. Accordingly, electric current flows in the up-down direction (stacking direction), from the source electrode to which the second high-concentration N-type region 3 is connected, through a channel (channel region) formed by the low-concentration N-type region LN, to the first high-concentration N-type region 2 (base region 2*b*) connected to the drain electrode.

Figure 3:
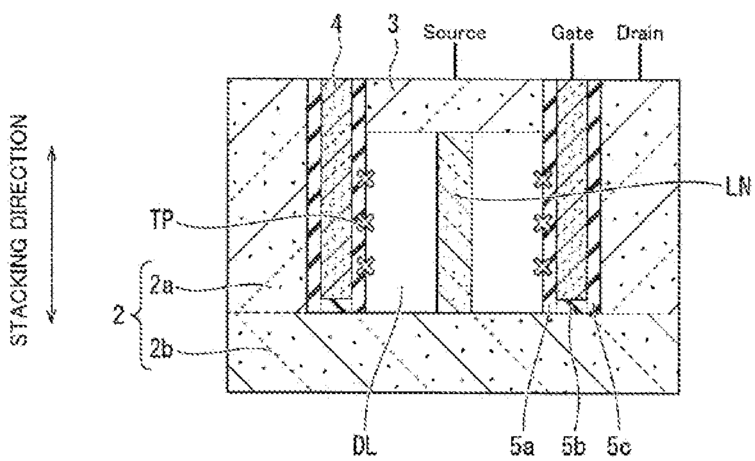
FIG. 3 is a cross-sectional view illustrating operations of the semiconductor device.

Also, the gate electrode 4 adjusts the width of a depletion layer DL by gate potential, from around the channel, and when the gate potential is reduced the depletion layer DL is enlarged, as illustrated in FIG. 3. When the entire channel is depleted, electric current no longer flows from the source electrode to the drain electrode (at time of off operation). Conversely, when the gate potential is increased and the depletion layer DL is narrowed, electric current flows from the source electrode to the drain electrode (at time of on operation). Note that FIG. 3 shows interface traps of the gate insulating film, denoted by reference sign TP.

<Manufacturing Process of Semiconductor Device>

A manufacturing process for manufacturing the semiconductor device according to the first embodiment will be described by way of FIG. 4 through FIG. 10, with reference to FIG. 1 through FIG. 3.

The manufacturing process of the semiconductor device includes a base region forming process, an isolation forming process, a facing region forming process, an oxide film deposition process, and a polysilicon deposition process. Additionally included are a mask removal process, a low-concentration N-type region forming process, a second high-concentration N-type region forming process, a thermal treatment process, and a contact forming process.

Figure 4:
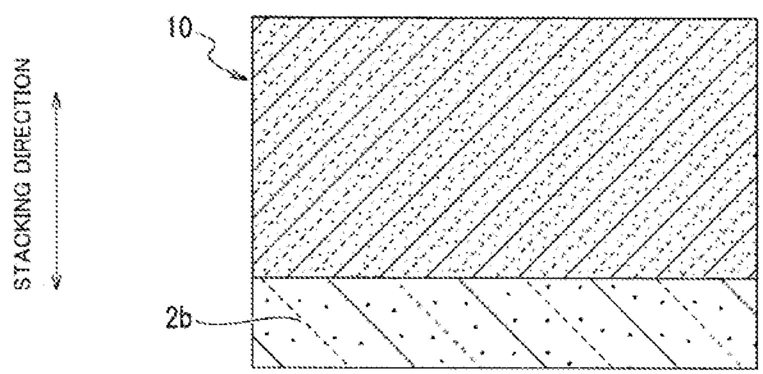
FIG. 4 is a cross-sectional view illustrating, out of manufacturing processes of the semiconductor device according to the first embodiment, a base region forming process.

In the base region forming process, phosphorus with concentration of impurity of 500 keV/1E$^{14}$ (cm$^{-2}$) is injected by ion injection to the lower region of a silicon substrate 10, thereby forming the base region 2*b*, as illustrated in FIG. 4.

Figure 5:
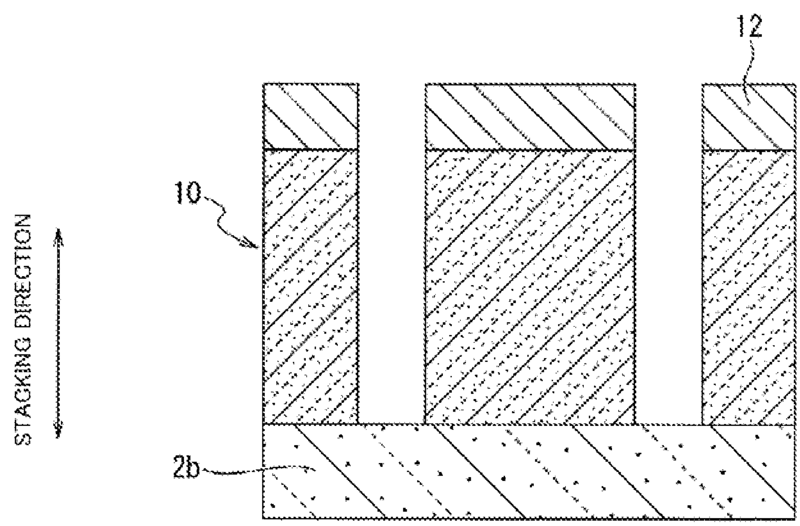
FIG. 5 is a cross-sectional view illustrating, out of manufacturing processes of the semiconductor device according to the first embodiment, an isolation forming process.

The isolation forming process is a post-process of the base region forming process. In the isolation forming process, a hard mask 12 formed of a nitride film or the like is patterned by photolithography, in regions excluding regions where the gate electrode 4, the first insulating film 5*a*, the second insulating film 5*b*, and the third insulating film 5*c* are to be formed later, as illustrated in FIG. 5. Further, in the isolation forming process, the silicon substrate 10 is etched back by plasma etching to a depth of approximately 500 [nm] at the regions where the gate electrode 4, the first insulating film 5*a*, the second insulating film 5*b*, and the third insulating film 5*c* are to be formed later.

Figure 6:
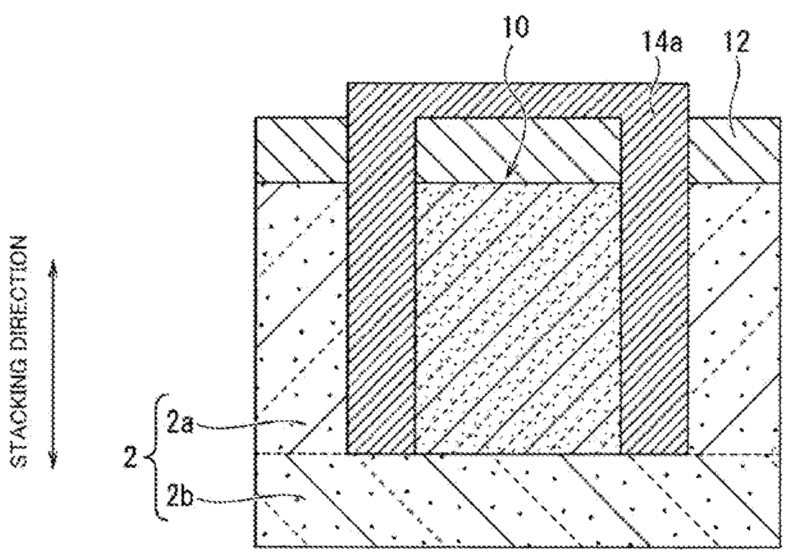
FIG. 6 is a cross-sectional view illustrating, out of manufacturing processes of the semiconductor device according to the first embodiment, a facing region forming process.

The facing region forming process is a post-process of the isolation forming process. In the facing region forming process, a first resist mask 14*a* is formed by photolithography on the portions of the silicon substrate 10 etched back in the isolation forming process and portions surrounding the portions etched back in the isolation forming process as viewed from the stacking direction, as illustrated in FIG. 6. Further, in the facing region forming process, phosphorus with concentration of impurity of 100 keV/1E$^{14}$ (cm$^{-2}$) is injected by ion injection to the regions of the silicon substrate 10 where the first resist mask 14*a* is not formed, thereby forming the facing region 2*a*.

The oxide film deposition process is a post-process of the facing region forming process.

Figure 7:
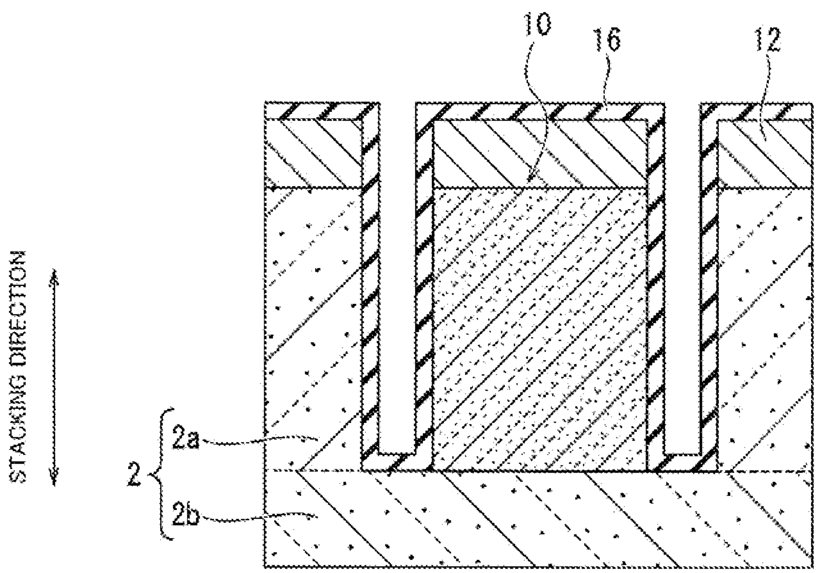
FIG. 7 is a cross-sectional view illustrating, out of manufacturing processes of the semiconductor device according to the first embodiment, an oxide film deposition process.

In the oxide film deposition process, the first resist mask 14*a* formed in the facing region forming process is removed, as illustrated in FIG. 7. Thereafter, an oxide film 16 that will later become the first insulating film 5*a*, the second insulating film 5*b*, and the third insulating film 5*c*, is deposited by thermal oxidization on the silicon substrate 10, the base region 2*b*, and the hard mask 12, to a thickness of approximately 7 [nm], for example.

The polysilicon deposition process is a post-process of the oxide film deposition process.

Figure 8:
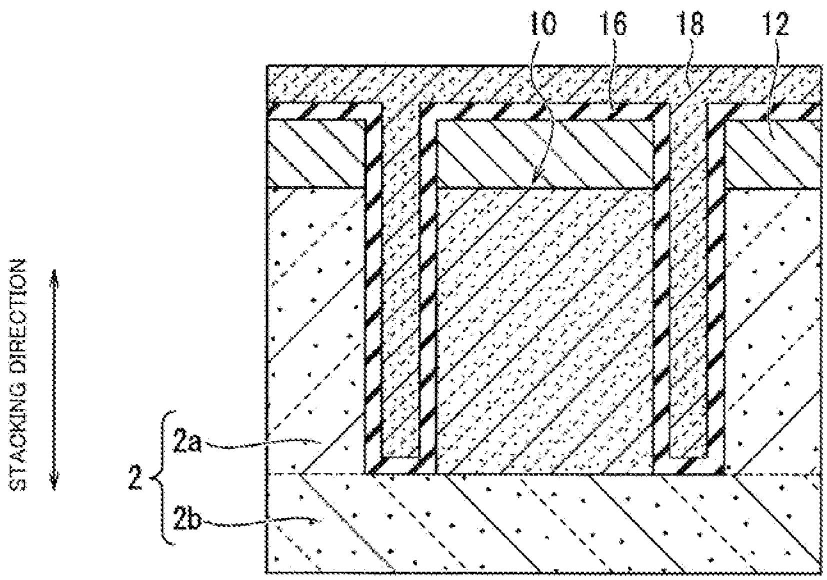
FIG. 8 is a cross-sectional view illustrating, out of manufacturing processes of the semiconductor device according to the first embodiment, a polysilicon deposition process.

In the polysilicon deposition process, polysilicon 18 is deposited on the face on which the oxide film 16 has been deposited in the oxide film deposition process, by the CVD (Chemical Vapor Deposition) method, as illustrated in FIG. 8.

Figure 9:
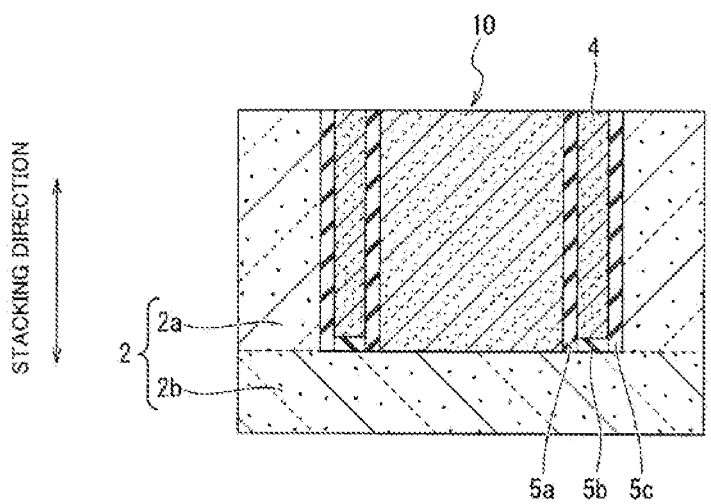
FIG. 9 is a cross-sectional view illustrating, out of manufacturing processes of the semiconductor device according to the first embodiment, a mask removal process.

The mask removal process is a post-process of the polysilicon deposition process. In the mask removal process, the polysilicon 18 deposited in the polysilicon deposition process is planarized by the CMP (Chemical Mechanical Polishing) method, as illustrated in FIG. 9. Further, in the mask removal process, the hard mask 12 patterned in the isolation forming process is removed by wet etching, thereby forming the gate electrode 4, the first insulating film 5*a*, the second insulating film 5*b*, and the third insulating film 5*c*.

The low-concentration N-type region forming process is a post-process of the mask removal process.

Figure 10:
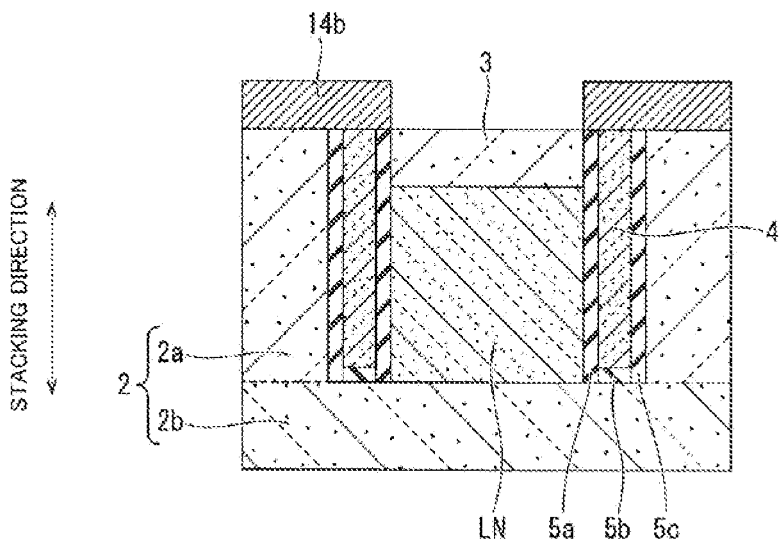
FIG. 10 is a cross-sectional view illustrating, out of manufacturing processes of the semiconductor device according to the first embodiment, a low-concentration N-type region forming process and a second high-concentration N-type region forming process.

In the low-concentration N-type region forming process, a second resist mask 14*b* is formed by photolithography on the facing region 2*a*, the gate electrode 4, the first insulating film 5*a*, and the third insulating film 5*c*, as illustrated in FIG. 10. Further, in the low-concentration N-type region forming process, phosphorus with concentration of impurity of 100 keV/1E$^{13}$ (cm$^{-2}$) is injected by ion injection to the silicon substrate 10 in the region where the second resist mask 14*b* is not formed, thereby forming the low-concentration N-type region LN.

The second high-concentration N-type region forming process is a post-process of the low-concentration N-type region forming process.

In the second high-concentration N-type region forming process, as illustrated in FIG. 10, phosphorus with concentration of impurity of 100 keV/1E$^{14}$ (cm$^{-2}$) is injected by ion injection to the face of the low-concentration N-type region LN that is on the opposite side from the face in contact with the base region 2*b* (the upper-side face in FIG. 10). Thus, the second high-concentration N-type region 3 is formed in the second high-concentration N-type region forming process.

The thermal treatment process and the contact forming process are post-processes of the second high-concentration N-type region forming process.

In the thermal treatment process, the impurities are activated by performing thermal treatment.

In the contact forming process, processing the same as known processing for forming a CMOS is performed, thereby connecting the first high-concentration N-type region 2 to one of the source electrode and the drain electrode, and connecting the second high-concentration N-type region 3 to the other of the source electrode and the drain electrode.

The configuration of the first embodiment has compatibility with the manufacturing process for forming a conventional CMOS, which is known, and accordingly a semiconductor device that is able to suppress the manufacturing process from becoming complicated can be provided.

Also, the configuration of the first embodiment has a structure in which the channel formed of the low-concentration N-type region LN is surrounded by the gate electrode 4, and accordingly a structure is formed where the channel is not affected by interface traps of the gate insulating film. Accordingly, noise occurring due to interface traps can be suppressed.

Modification of First Embodiment

Although polycrystalline silicon is used as the material of the gate electrode 4 in the first embodiment, this is not limiting, and titanium nitride and aluminum may be used as the material for the gate electrode 4. In this case, using silicon oxide as the main component of the material for the first insulating film 5*a*, the second insulating film 5*b*, and the third insulating film 5*c*, and using hafnium oxide as an additive thereof, is suitable for a combination between the gate electrode 4 and gate insulating film.

Second Embodiment

Figure 11:
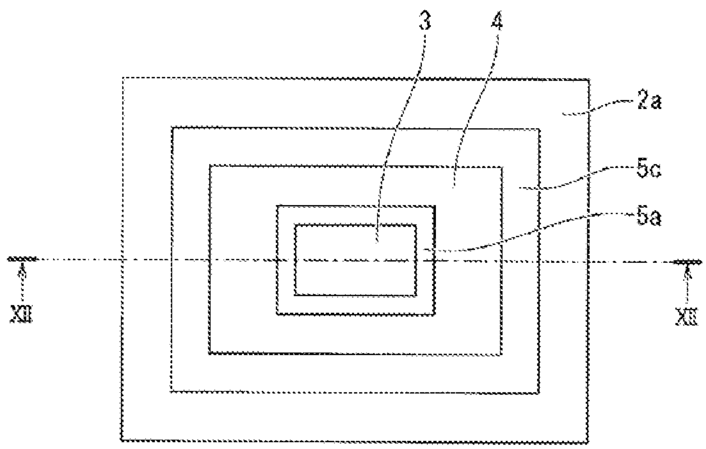
FIG. 11 is a plane view illustrating a configuration of a semiconductor device according to a second embodiment.
Figure 12:
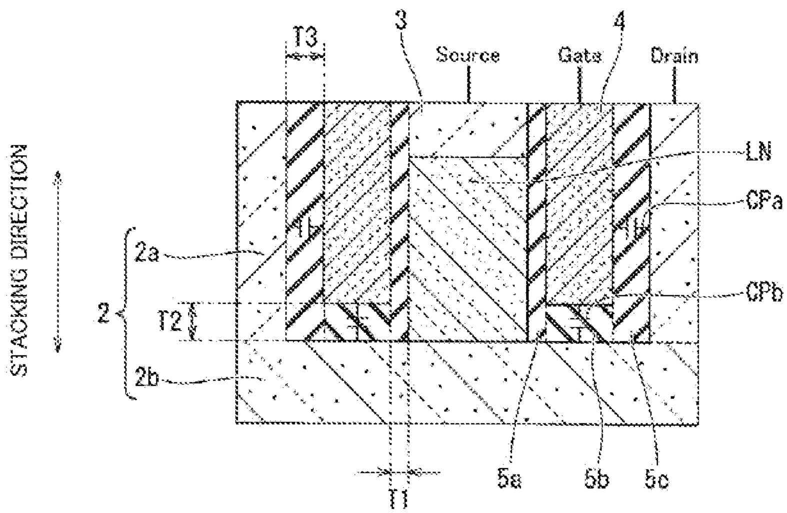
FIG. 12 is a cross-sectional view taken along line XII-XII in FIG. 11.

A semiconductor device according to a second embodiment also has the cross-sectional structure illustrated in FIG. 1, and shares in common the structure of the semiconductor device according to the first embodiment. However, the semiconductor device according to the second embodiment differs from the first embodiment with regard to a configuration in which a film thickness T2 of the second insulating film 5*b* and a film thickness T3 of the third insulating film 5*c* are thicker than a film thickness T1 of the first insulating film 5*a*, as illustrated in FIG. 11 and FIG. 12.

<Manufacturing Process of Semiconductor Device>

A manufacturing process for manufacturing the semiconductor device according to the second embodiment will be described by way of FIG. 13 through FIG. 19, with reference to FIG. 11 and FIG. 12.

The manufacturing process of the semiconductor device includes a base region forming process, an isolation forming process, a facing region forming process, a first oxide film deposition process, a first oxide film etching process, a first mask removal process, and a second oxide film deposition process. Additionally included in the manufacturing process of the semiconductor device are a polysilicon deposition process, a second mask removal process, a low-concentration N-type region forming process, a second high-concentration N-type region forming process, a thermal treatment process, and a contact forming process.

The base region forming process, the isolation forming process, the facing region forming process, the low-concentration N-type region forming process, the second high-concentration N-type region forming process, the thermal treatment process, and the contact forming process are the same as in the first embodiment described above, and accordingly description will be omitted.

The first oxide film deposition process is a post-process of the facing region forming process.

Figure 13:
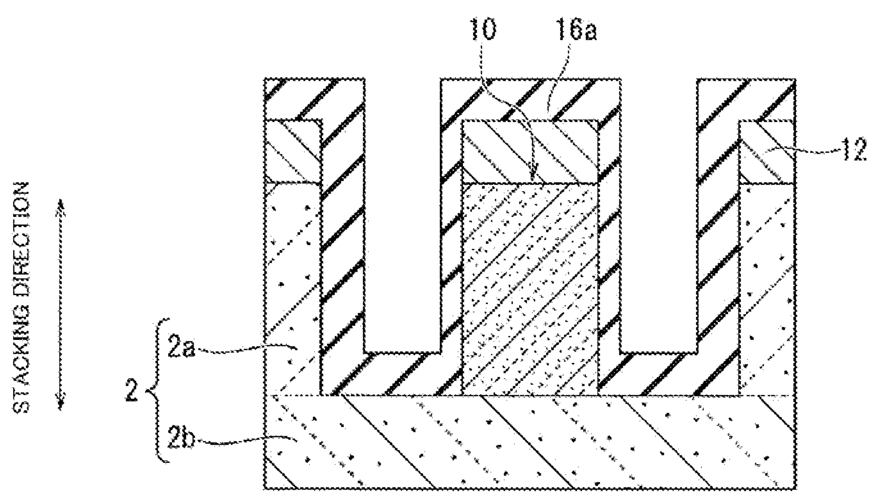
FIG. 13 is a cross-sectional view illustrating, out of manufacturing processes of the semiconductor device according to the second embodiment, a first oxide film deposition process.

In the first oxide film deposition process, a first oxide film 16*a* that will later become the second insulating film 5*b* and the third insulating film 5*c* is deposited by thermal oxidization on the silicon substrate 10, the base region 2*b*, and the hard mask 12, to a thickness of approximately 14 [nm], for example, as illustrated in FIG. 13.

The first oxide film etching process is a post-process of the first oxide film deposition process.

Figure 14:
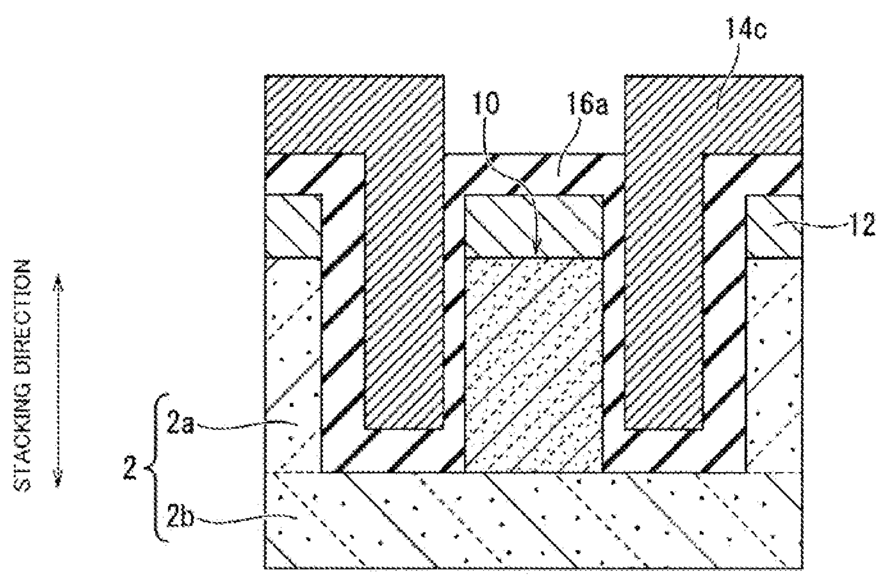
FIG. 14 is a cross-sectional view illustrating, out of manufacturing processes of the semiconductor device according to the second embodiment, a first oxide film etching process.
Figure 15:
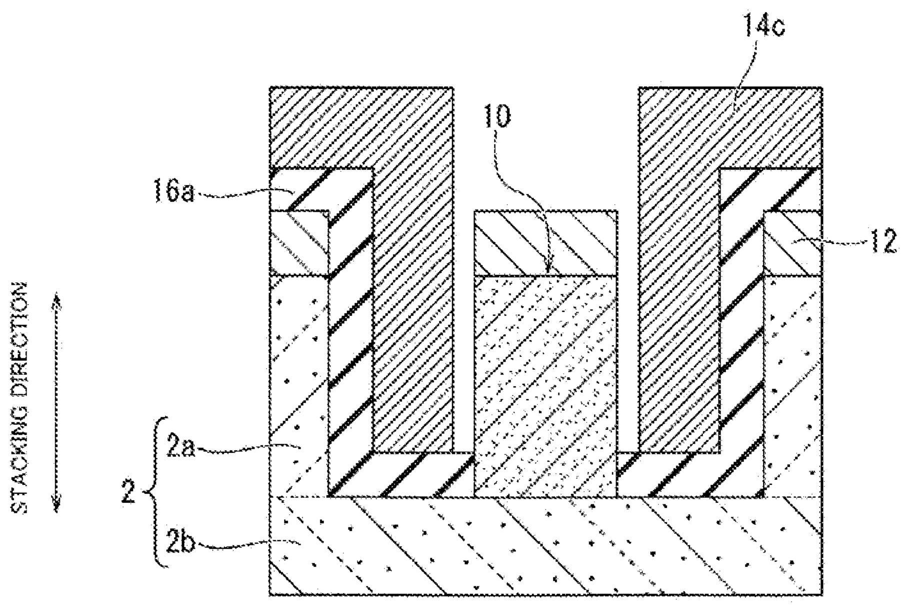
FIG. 15 is a cross-sectional view illustrating, out of manufacturing processes of the semiconductor device according to the second embodiment, the first oxide film etching process.

In the first oxide film etching process, a third resist mask 14*c* is formed by photolithography at the portion of the silicon substrate 10 etched back in the isolation forming process, and portions on the peripheral side from the portion etched back in the isolation forming process, as illustrated in FIG. 14. Further, in the first oxide film etching process, portions of the first oxide film 16*a* not covered by the third resist mask 14*c* are removed by wet etching, as illustrated in FIG. 15.

The first mask removal process is a post-process of the first oxide film etching process.

Figure 16:
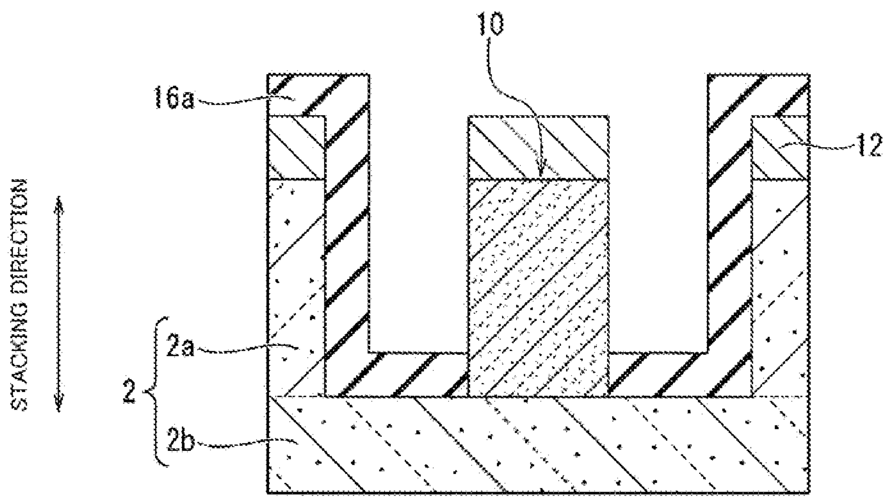
FIG. 16 is a cross-sectional view illustrating, out of manufacturing processes of the semiconductor device according to the second embodiment, a first mask removal process.

In the first mask removal process, the third resist mask 14*c* is removed, as illustrated in FIG. 16.

The second oxide film deposition process is a post-process of the first mask removal process.

Figure 17:
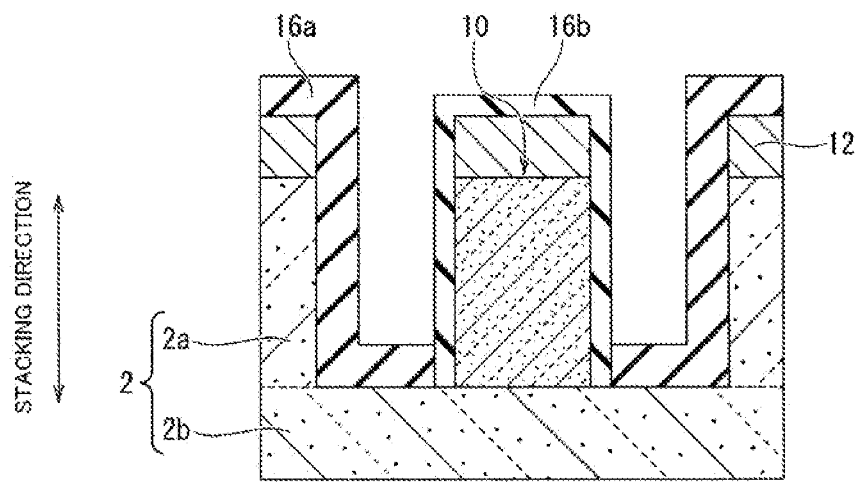
FIG. 17 is a cross-sectional view illustrating, out of manufacturing processes of the semiconductor device according to the second embodiment, a second oxide film deposition process.

In the second oxide film deposition process, a second oxide film 16*b* that will later become the first insulating film 5*a* is deposited by thermal oxidization on the silicon substrate 10, the base region 2*b*, and the hard mask 12, to a thickness of approximately 7 [nm], for example, as illustrated in FIG. 17.

The polysilicon deposition process is a post-process of the second oxide film deposition process.

Figure 18:
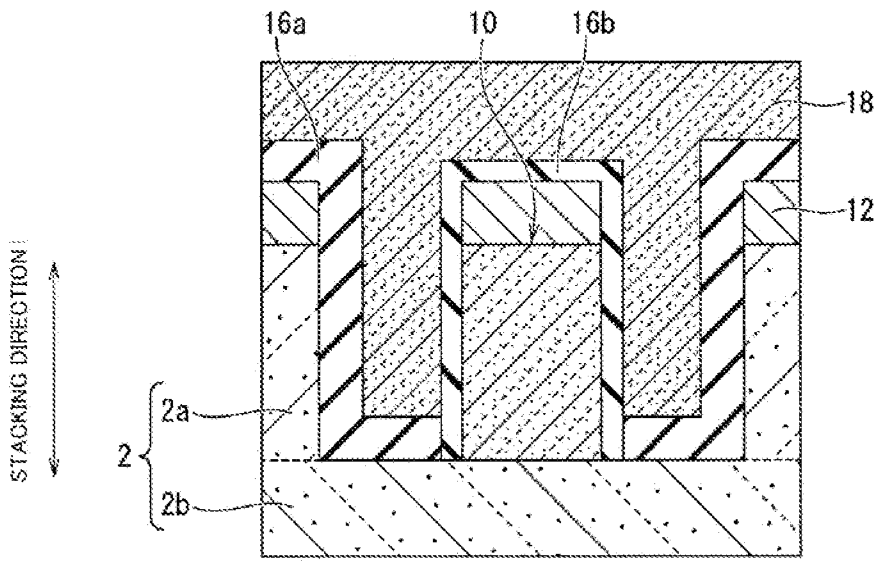
FIG. 18 is a cross-sectional view illustrating, out of manufacturing processes of the semiconductor device according to the second embodiment, a polysilicon deposition process.

In the polysilicon deposition process, polysilicon 18 is deposited by the CVD method on the face on which the second oxide film 16*b* is deposited in the second oxide film deposition process, as illustrated in FIG. 18.

Figure 19:
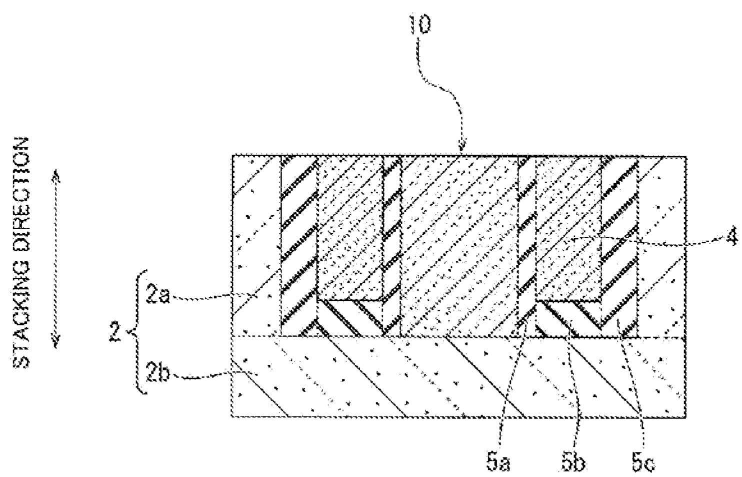
FIG. 19 is a cross-sectional view illustrating, out of manufacturing processes of the semiconductor device according to the second embodiment, a mask removal process.

The mask removal process is a post-process of the polysilicon deposition process. In the mask removal process, the polysilicon 18 deposited in the polysilicon deposition process is planarized by the CMP method, as illustrated in FIG. 19. Further, in the mask removal process, the hard mask 12 patterned in the isolation forming process is removed by wet etching, thereby forming the gate electrode 4, the first insulating film 5*a*, the second insulating film 5*b*, and the third insulating film 5*c*.

According to the configuration of the second embodiment, by differing the film thickness of the second insulating film 5*b* and the third insulating film 5*c*, and the film thickness of the first insulating film 5*a*, first parasitic capacitance CPa and second parasitic capacitance CPb can be reduced. The first parasitic capacitance CPa is parasitic capacitance formed between the facing region 2*a* and the gate electrode 4. The second parasitic capacitance CPb is parasitic capacitance formed between the base region 2*b* and the gate electrode 4.

Accordingly, between the drain electrode and the gate electrode 4 can be made to be low capacitance.

Third Embodiment

Figure 20:
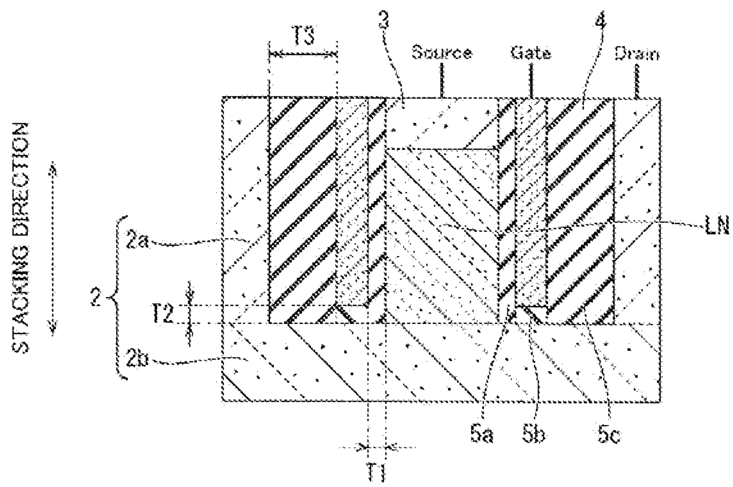
FIG. 20 is a cross-sectional view illustrating a configuration of a semiconductor device according to a third embodiment.

A semiconductor device according to a third embodiment also has the cross-sectional structure illustrated in FIG. 1, and shares in common the structure of the semiconductor device according to the first embodiment. However, the semiconductor device according to the third embodiment differs from the first embodiment with regard to a configuration in which the film thickness T3 of the third insulating film 5*c* is thicker than the film thickness T1 of the first insulating film 5*a* and the film thickness T2 of the second insulating film 5*b*, as illustrated in FIG. 20.

<Manufacturing Process of Semiconductor Device>

A manufacturing process for manufacturing the semiconductor device according to the third embodiment will be described by way of FIG. 21 through FIG. 27, with reference to FIG. 20.

The manufacturing process according to the third embodiment includes a base region forming process, an isolation forming process, a facing region forming process, a first oxide film deposition process, a first oxide film etching process, a first mask removal process, and a second oxide film deposition process. Additionally included in the manufacturing process of the semiconductor device are a polysilicon deposition process, a second mask removal process, a low-concentration N-type region forming process, a second high-concentration N-type region forming process, a thermal treatment process, and a contact forming process.

The base region forming process, the isolation forming process, the facing region forming process, the low-concentration N-type region forming process, the second high-concentration N-type region forming process, the thermal treatment process, and the contact forming process are the same as in the first embodiment described above, and accordingly description will be omitted.

The first oxide film deposition process is a post-process of the facing region forming process.

Figure 21:
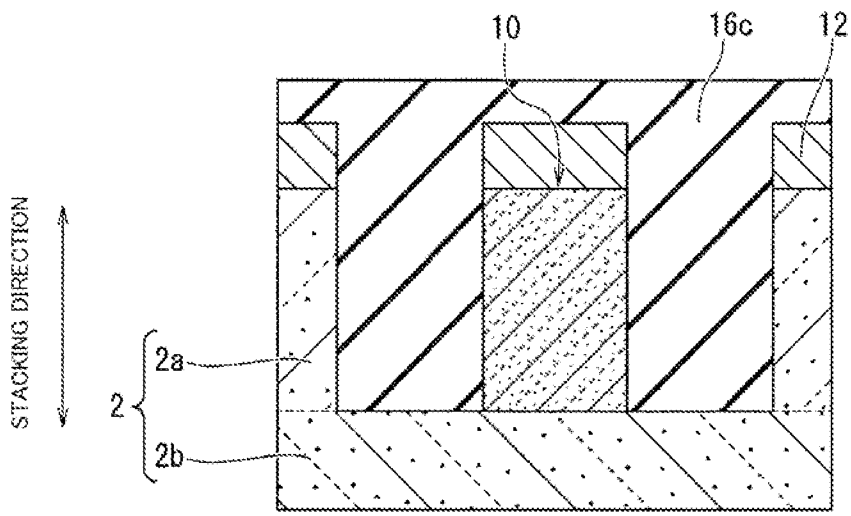
FIG. 21 is a cross-sectional view illustrating, out of manufacturing processes of the semiconductor device according to the third embodiment, a first oxide film deposition process.

In the first oxide film deposition process, a third oxide film 16*c* that will later become the third insulating film 5*c* is deposited by thermal oxidization on the silicon substrate 10, the base region 2*b*, and the hard mask 12, to a thickness of approximately 14 [nm], for example, as illustrated in FIG. 21.

The first oxide film etching process is a post-process of the first oxide film deposition process.

Figure 22:
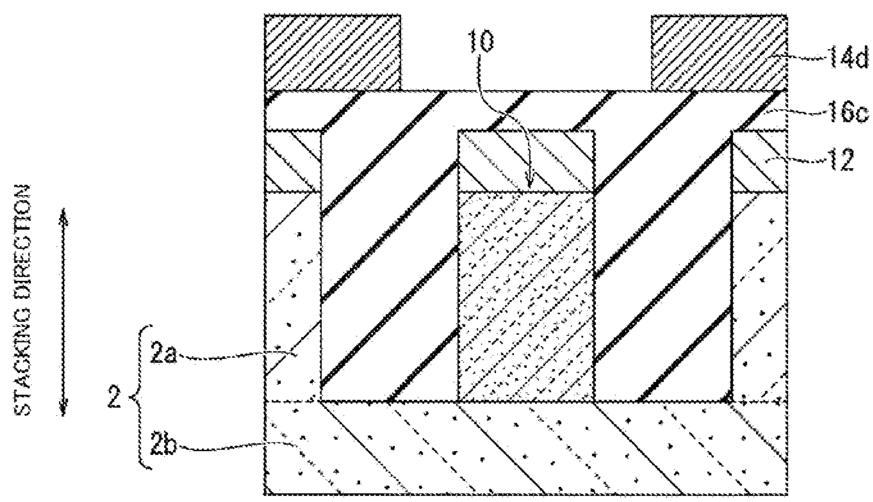
FIG. 22 is a cross-sectional view illustrating, out of manufacturing processes of the semiconductor device according to the third embodiment, a first oxide film etching process.

In the first oxide film etching process, a fourth resist mask 14*d* is formed by photolithography at the portions of the third oxide film 16*c* deposited in the first oxide film deposition process excluding the region that will later become the low-concentration N-type region LN and the region that will become the first insulating film 5*a*, as illustrated in FIG. 22.

Figure 23:
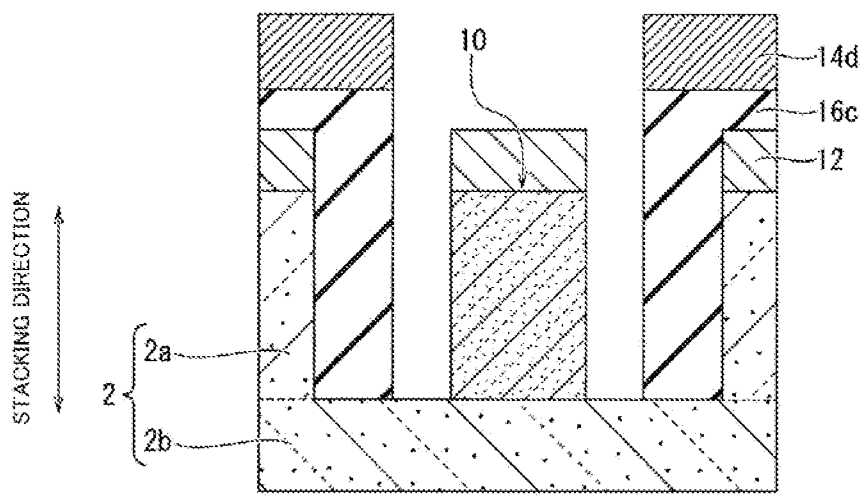
FIG. 23 is a cross-sectional view illustrating, out of manufacturing processes of the semiconductor device according to the third embodiment, the first oxide film etching process.

Further, in the first oxide film etching process, portions of the third oxide film 16*c* not covered by the fourth resist mask 14*d* are removed by wet etching, as illustrated in FIG. 23.

The first mask removal process is a post-process of the first oxide film etching process.

Figure 24:
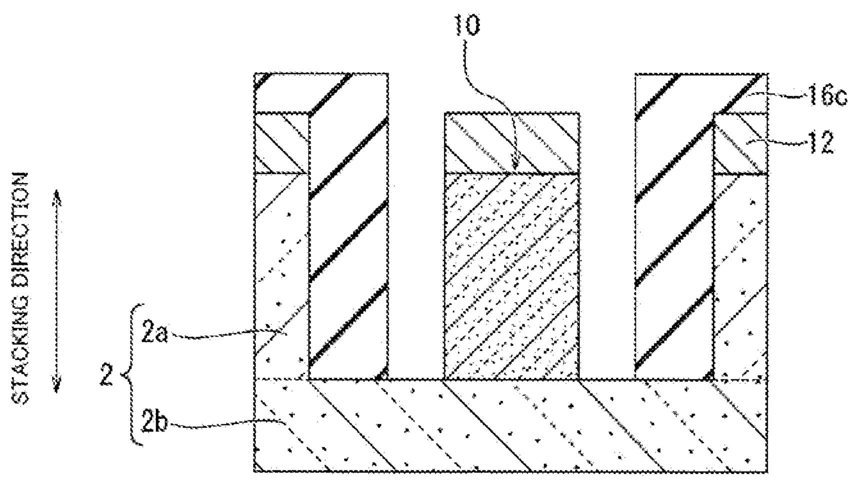
FIG. 24 is a cross-sectional view illustrating, out of manufacturing processes of the semiconductor device according to the third embodiment, a first mask removal process.

In the first mask removal process, the fourth resist mask 14*d* is removed, as illustrated in FIG. 24.

The second oxide film deposition process is a post-process of the first mask removal process.

Figure 25:
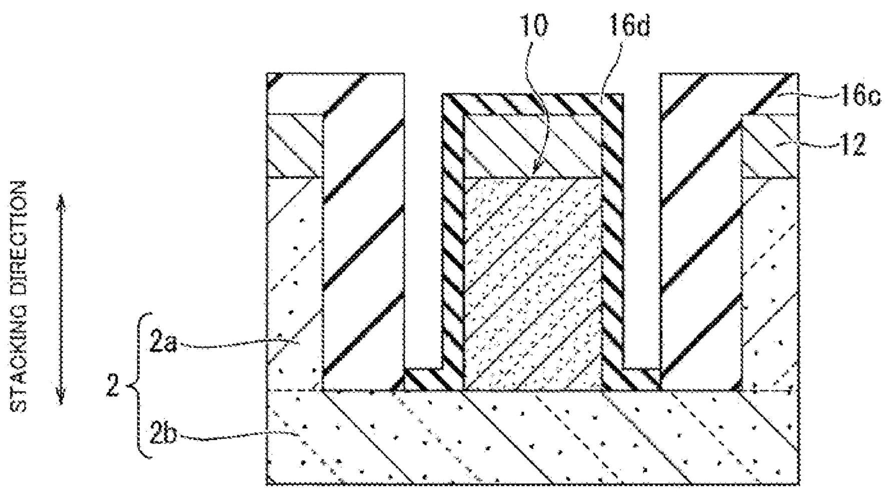
FIG. 25 is a cross-sectional view illustrating, out of manufacturing processes of the semiconductor device according to the third embodiment, a second oxide film deposition process.

In the second oxide film deposition process, a fourth oxide film 16*d* that will later become the first insulating film 5*a* and the second insulating film 5*b* is deposited by thermal oxidization on the silicon substrate 10, the base region 2*b*, and the hard mask 12, to a thickness of approximately 7 [nm], for example, as illustrated in FIG. 25.

The polysilicon deposition process is a post-process of the second oxide film deposition process.

Figure 26:
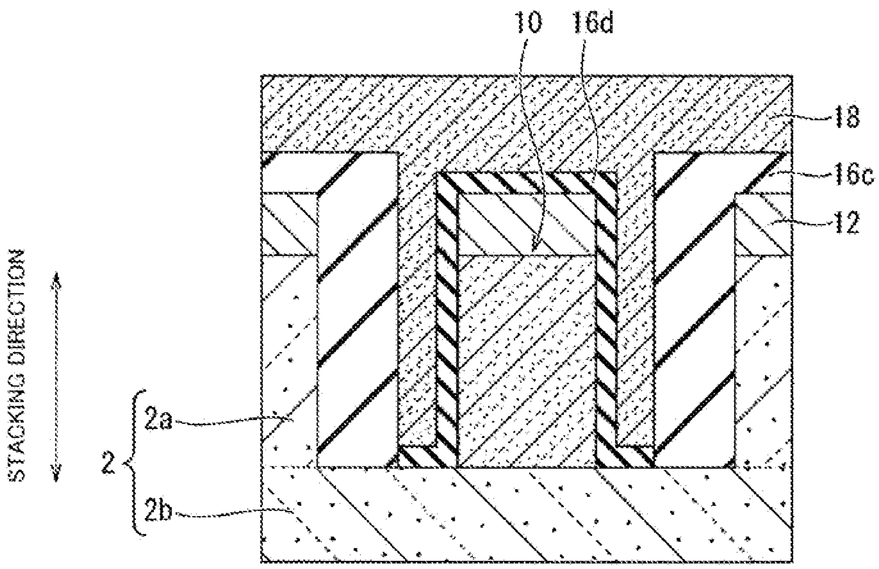
FIG. 26 is a cross-sectional view illustrating, out of manufacturing processes of the semiconductor device according to the third embodiment, a polysilicon deposition process.

In the polysilicon deposition process, polysilicon 18 is deposited by the CVD method on the face on which the second oxide film 16*b* is deposited in the second oxide film deposition process, as illustrated in FIG. 26.

Figure 27:
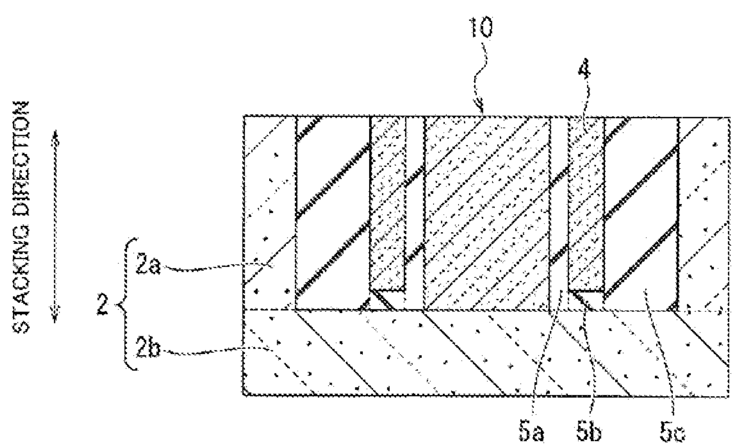
FIG. 27 is a cross-sectional view illustrating, out of manufacturing processes of the semiconductor device according to the third embodiment, a mask removal process.

The mask removal process is a post-process of the polysilicon deposition process. In the mask removal process, the polysilicon 18 deposited in the polysilicon deposition process is planarized by the CMP method, as illustrated in FIG. 27. Further, in the mask removal process, the hard mask 12 patterned in the isolation forming process is removed by wet etching, thereby forming the gate electrode 4, the first insulating film 5*a*, the second insulating film 5*b*, and the third insulating film 5*c*.

Fourth Embodiment

Figure 28:
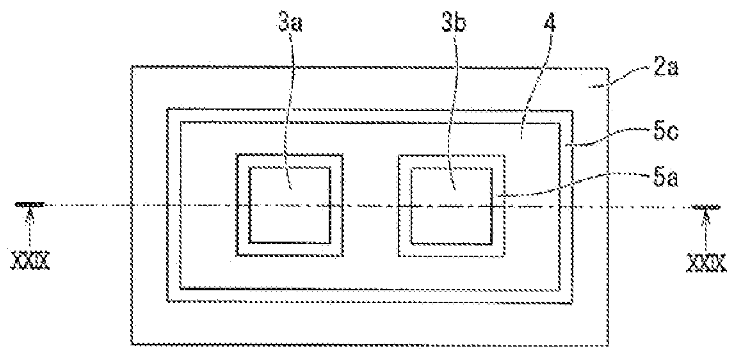
FIG. 28 is a plane view illustrating a configuration of a semiconductor device according to a fourth embodiment.
Figure 29:
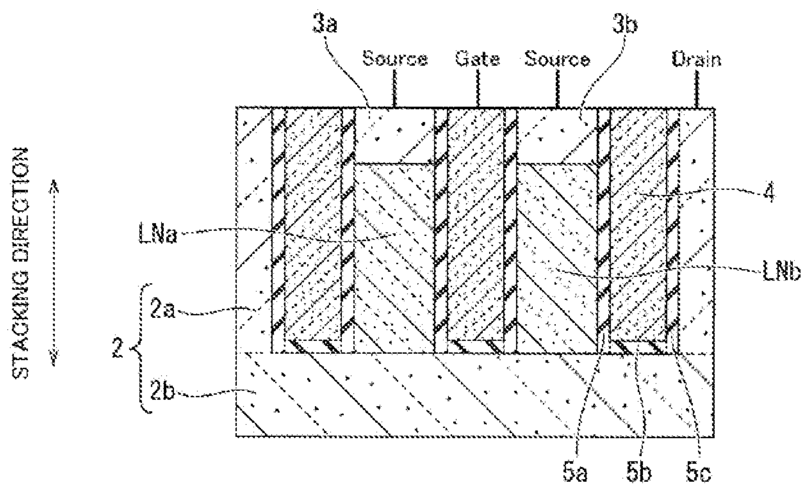
FIG. 29 is a cross-sectional view taken along line XXIX-XXIX in FIG. 28.

A semiconductor device according to a fourth embodiment differs from the first embodiment with regard to a configuration of having a plurality of (two) low-concentration N-type regions LNa and 1*b* and a plurality of (two) second high-concentration N-type regions 3*a* and 3*b*, as illustrated in FIG. 28 and FIG. 29. Description of portions that are in common with the first embodiment may be omitted in the following description.

The two low-concentration N-type regions LNa and 1*b* are placed with a spacing between each other.

The two second high-concentration N-type regions 3*a* and 3*b* are each in contact with the face of the two low-concentration N-type regions LNa and 1*b* on the opposite side from the face in contact with the base region 2*b*. Note that in the Figures, a configuration is illustrated in which the second high-concentration N-type region 3*a* is in contact with the low-concentration N-type region LNa, and the second high-concentration N-type region 3*b* is in contact with the low-concentration N-type region LNb.

Accordingly, a plurality of second high-concentration N-type regions (second high-concentration N-type regions 3*a* and 3*b*) and a plurality of low-concentration N-type regions (low-concentration N-type regions LNa and 1*b*) are stacked in one first high-concentration N-type region 2.

According to the configuration of the fourth embodiment, increasing the number of source electrodes enables electric current to be increased by increasing area efficiency as compared to the configuration of the first embodiment, and the size of the transistor can be adjusted.

Modification of Fourth Embodiment

Figure 30:
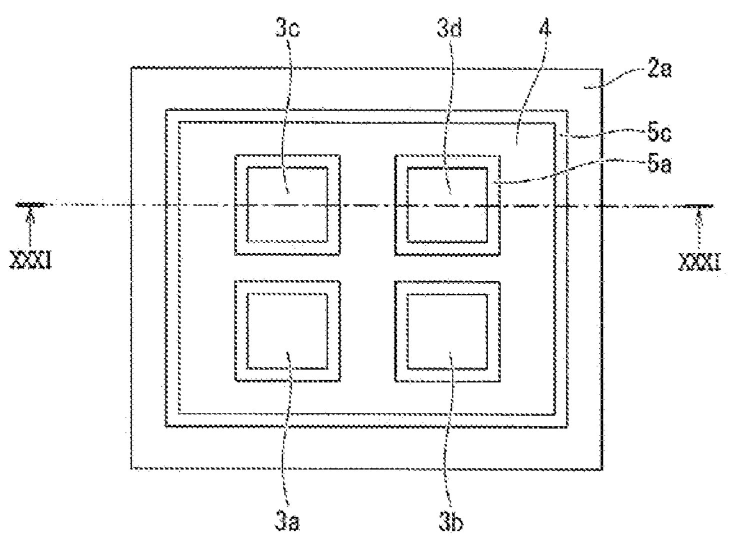
FIG. 30 is a plane view illustrating a configuration of a semiconductor device according to a modification of the fourth embodiment.
Figure 31:
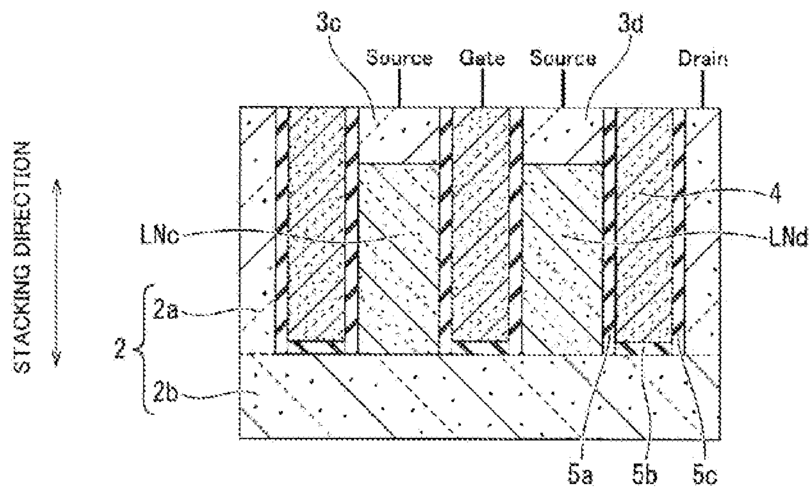
FIG. 31 is a cross-sectional view taken along line XXXI-XXXI in FIG. 30.

Although the fourth embodiment is a configuration that has two low-concentration N-type regions LNa and 1*b* and two second high-concentration N-type regions 3*a* and 3*b*, this is not limiting. That is to say, a configuration may be made that has four low-concentration N-type regions LNa through 1*d* and four second high-concentration N-type regions 3*a* through 3*d*, as illustrated in FIG. 30 and FIG. 31, for example.

According to this configuration, electric current can be increased by increasing area efficiency as compared to the configuration of the fourth embodiment, and the size of the transistor can be adjusted.

Fifth Embodiment

Figure 32:
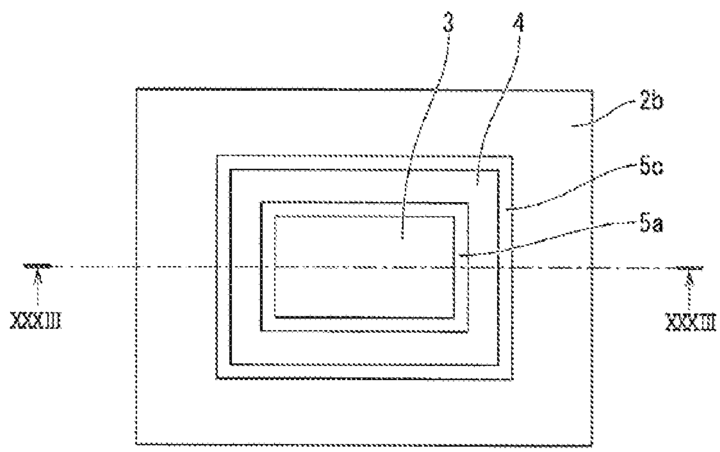
FIG. 32 is a plane view illustrating a configuration of a semiconductor device according to a fifth embodiment.
Figure 33:
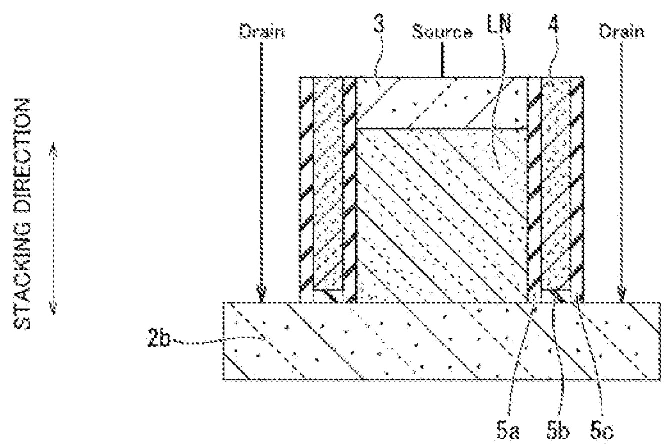
FIG. 33 is a cross-sectional view taken along line XXXIII-XXXIII in FIG. 32.

The semiconductor device according to a fifth embodiment differs from the first embodiment with regard to a configuration in which the face where the first high-concentration N-type region 2 is connected to the drain electrode and the face where the second high-concentration N-type region 3 is connected to the source electrode are at different heights, as illustrated in FIG. 32 and FIG. 33. Also, the two faces are at different heights as viewed from a direction orthogonal to the stacking direction. Description of portions that are in common with the first embodiment may be omitted in the following description.

The first high-concentration N-type region 2 is formed including only the base region 2*b*.

Portions of the base region 2*b* that are not facing the low-concentration N-type region LN, the gate electrode 4, the first insulating film 5*a*, the second insulating film 5*b*, or the third insulating film 5*c* are connected to the drain electrode. According to the configuration of the fifth embodiment, freedom in design of the semiconductor device can be improved.

Sixth Embodiment

Figure 34:
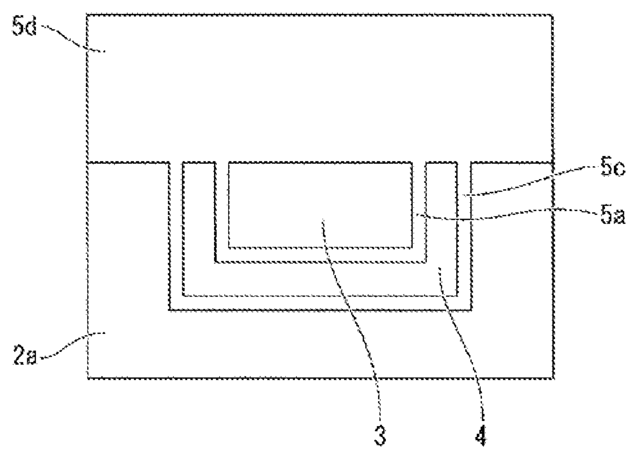
FIG. 34 is a plane view illustrating a configuration of a semiconductor device according to a sixth embodiment.

The semiconductor device according to a sixth embodiment differs from the first embodiment with regard to a configuration in which the gate electrode 4 includes a portion facing the low-concentration N-type region LN and a portion not facing the low-concentration N-type region LN as viewed from the stacking direction, and a configuration including a fourth insulating film 5*d*, as illustrated in FIG. 34. Description of portions that are in common with the first embodiment may be omitted in the following description.

The gate electrode 4 faces, out of four faces of the low-concentration N-type region LN adjacent to two faces in contact with the first high-concentration N-type region 2 and the second high-concentration N-type region 3, three faces.

The fourth insulating film 5*d* is in contact with the low-concentration N-type region LN, the first high-concentration N-type region 2, the second high-concentration N-type region 3, the gate electrode 4, the first insulating film 5*a*, the second insulating film 5*b*, and the third insulating film 5*c*, in a direction orthogonal to the stacking direction.

At least one of silicon oxide, silicon nitride, and hafnium oxide, for example, is used as the material for the fourth insulating film 5*d*.

A case of using silicon oxide as the material of the fourth insulating film 5*d* will be described in the sixth embodiment.

According to the configuration of the sixth embodiment, a configuration is made where gate potential is controlled from three directions with regard to the channel formed at the low-concentration N-type region LN. Also, a configuration may be made where gate potential is controlled from one direction or two directions with regard to the channel.

According to the configuration of the sixth embodiment, freedom in design of the semiconductor device can also be improved.

Seventh Embodiment

Figure 35:
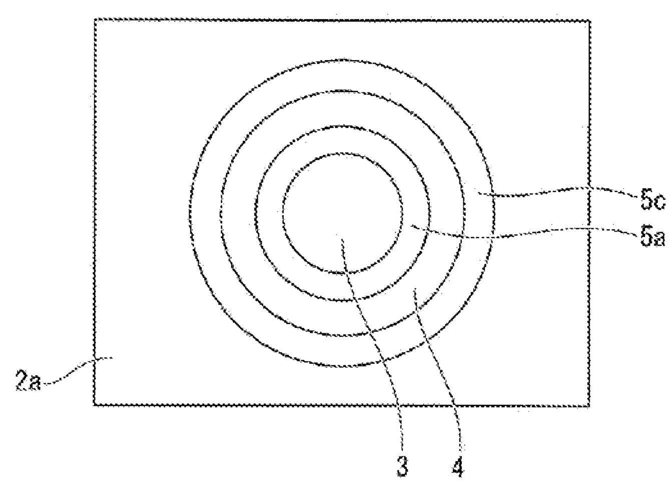
FIG. 35 is a plane view illustrating a configuration of a semiconductor device according to a seventh embodiment.

The semiconductor device according to a seventh embodiment differs from the first embodiment with regard to a configuration in which the shape of the low-concentration N-type region LN is circular as viewed from the stacking direction, and the shape of the gate electrode 4 is circular as viewed from the stacking direction, as illustrated in FIG. 35.

Accordingly, the shape of the second high-concentration N-type region 3 is also circular as viewed from the stacking direction.

According to the configuration of the seventh embodiment, the shape of the channel formed at the low-concentration N-type region LN is a shape that does not have pointed corners, and accordingly there are no positions within the channel where the electrical field is concentrated, and the distribution of the electrical field is uniform, thereby enabling uniform transistor operations.

Eighth Embodiment

Figure 36:
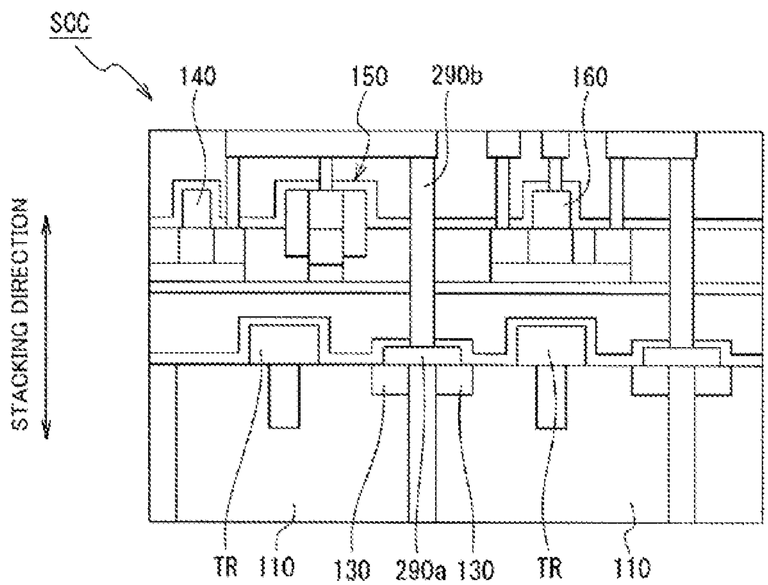
FIG. 36 is a cross-sectional view illustrating a configuration of a solid-state imaging sensor according to an eighth embodiment.

The semiconductor device according to an eighth embodiment is included in a solid-state imaging sensor SCC, as illustrated in FIG. 36. Description of portions that are in common with the first embodiment may be omitted in the following description.

The solid-state imaging sensor SCC is provided with a first semiconductor layer 260, an interlayer insulating layer 270, a second semiconductor layer 280, an N-type polysilicon pad 290*a*, and a shared contact 290*b*.

The first semiconductor layer 260 is a semiconductor layer in which pixel circuits 210 are placed.

The pixel circuits 210 are provided with a photodiode 110, a transfer transistor TR, and a floating diffusion 130.

The photodiode 110 performs photoelectric conversion of incident light, and generates and stores a charge in accordance with the quantity of light of the photoelectric conversion.

One end (anode electrode) of the photodiode 110 (photoelectric conversion device) is grounded. The other end (cathode electrode) of the photodiode 110 is connected to a source electrode of the transfer transistor TR.

The transfer transistor TR is placed interposed between the photodiode 110 and the floating diffusion 130. The drain electrode of the transfer transistor TR is connected to the drain electrode of a reset transistor 140 and the gate electrode of an amplifying transistor 150.

Figure 37:
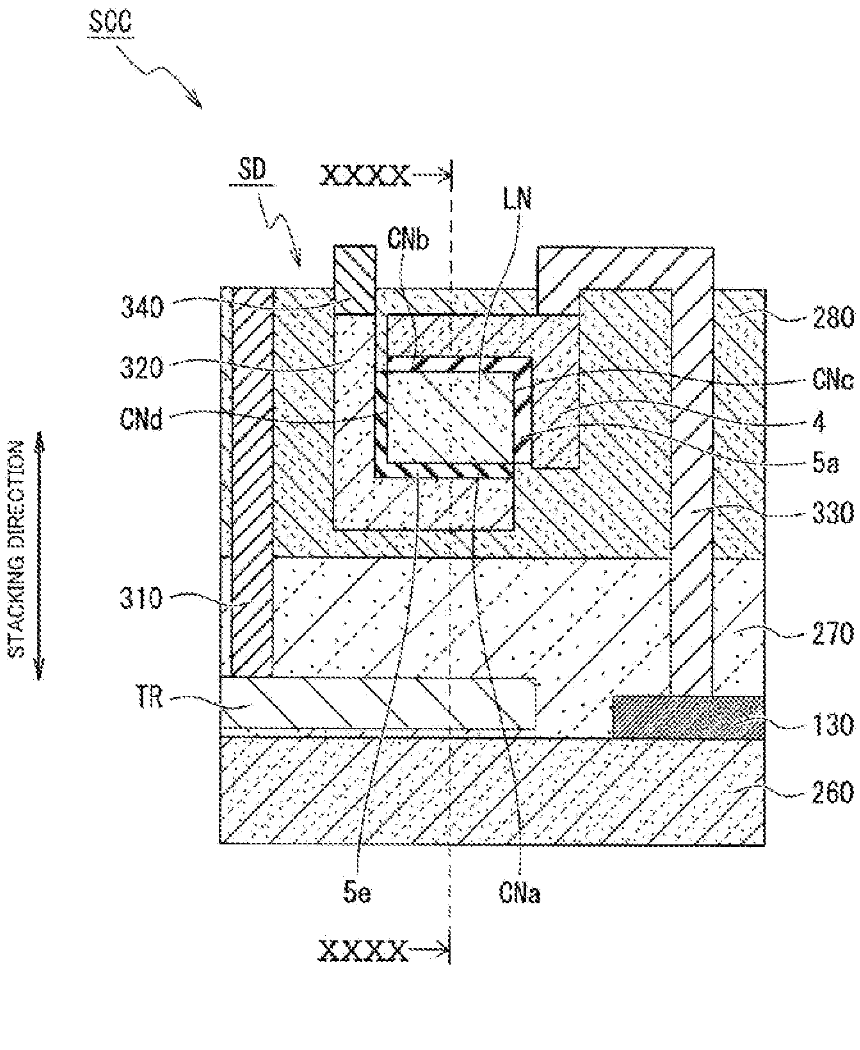
FIG. 37 is a cross-sectional view illustrating the configuration of the solid-state imaging sensor according to the eighth embodiment.

Also, the transfer transistor TR turns transfer of charges from the photodiode 110 to the floating diffusion 130 on or off, following drive signals TGR supplied to the gate electrode from a timing control unit that is omitted from illustration. Also, transfer-side interlayer wiring 310 that passes through the interlayer insulating layer 270 and the second semiconductor layer 280 is connected to the transfer transistor TR, as illustrated in FIG. 37.

The floating diffusion 130 stores charges transferred from the photodiode 110 via the transfer transistor TR, and converts into voltage. That is to say, signal charges stored in the photodiode 110 are transferred to the floating diffusion 130. Note that the floating diffusion 130 is formed at a point where the drain electrode of the transfer transistor TR, the source electrode of the later-described reset transistor 140, and the gate electrode of the later-described amplifying transistor 150 are connected (connection point).

The interlayer insulating layer 270 is a layer stacked on the first semiconductor layer 260, and insulates between the first semiconductor layer 260 and the second semiconductor layer 280.

The second semiconductor layer 280 is a layer stacked on the interlayer insulating layer 270, and is a semiconductor layer where the amplifying transistor 150 including a semiconductor device SD and the reset transistor 140 are placed.

The amplifying transistor 150 is a source-grounded transistor of which the gate electrode is connected to the floating diffusion 130 and the source electrode is grounded.

The N-type polysilicon pad 290*a* connects four floating diffusions 130 that four pixel circuits 210 respectively are provided with. Note that only two of the four floating diffusions 130 and photodiodes 110 are illustrated in FIG. 36.

The shared contact 290*b* connects the N-type polysilicon pad 290*a* and the amplifying transistor 150.

Figure 38:
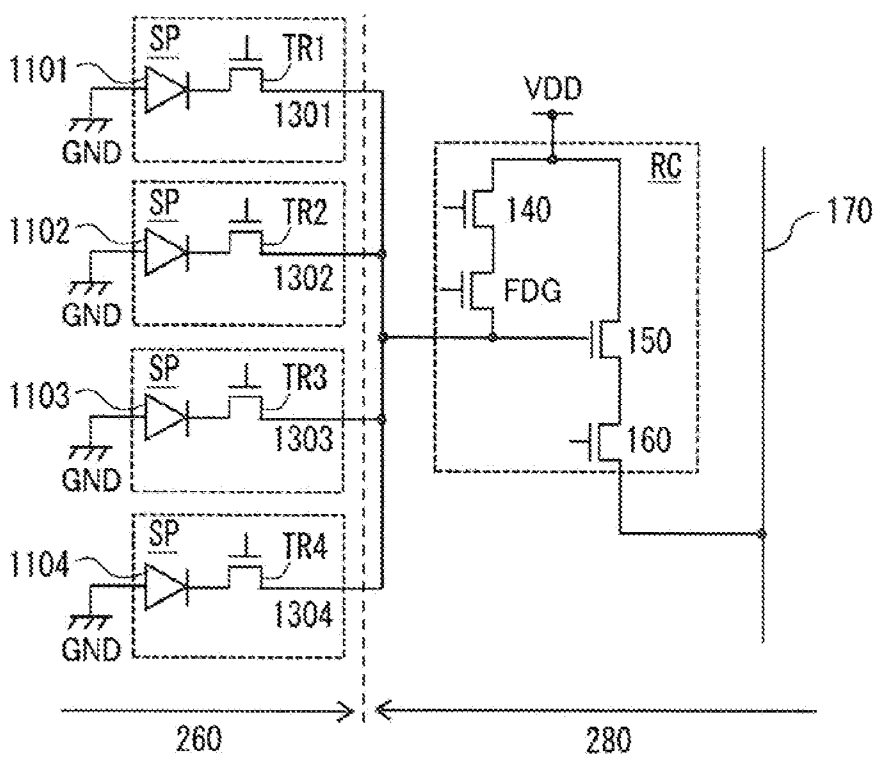
FIG. 38 is a diagram representing an example of sensor pixels and a read circuit.

The first semiconductor layer 260 also has a plurality of sensor pixels SP that performs photoelectric conversion. The plurality of sensor pixels SP is provided within a pixel region of the first semiconductor layer 260 in a matrix form. In the eight embodiment, a case will be described in which four sensor pixels SP share one read circuit RC, as illustrated in FIG. 38. To "share" here means that the outputs of the four sensor pixels SP are input to the shared read circuit RC.

The sensor pixels SP each have the same components as each other. In FIG. 38, identification Nos. (1, 2, 3, 4) are appended to the reference signs of the sensor pixels SP, to distinguish the components of the sensor pixels SP from each other. Hereinafter, in a case where there is a need to differentiate among the components of the sensor pixels SP, identification Nos. will be appended to the reference signs of the components of the sensor pixels SP, and in a case where there is no need to differentiate among the components of the sensor pixels SP, appending identification Nos. to the reference signs of the components of the sensor pixels SP will be omitted.

The sensor pixels SP each have the photodiode 110, the transfer transistor TR, and the floating diffusion 130, for example.

The floating diffusions 130 that the sensor pixels SP sharing one read circuit RC have are electrically connected to each other, and are electrically connected to the input end of the shared read circuit RC. The read circuit RC has, for example, the reset transistor 140, the amplifying transistor 150, and a selecting transistor 160. Note that the selecting transistor 160 may be omitted as necessary. The source (output end of the read circuit RC) of the selecting transistor 160 is electrically connected to a vertical signal line 170. The gate of the selecting transistor 160 is electrically connected to a pixel drive line (omitted from illustration).

The source (output end of the read circuit RC) of the amplifying transistor 150 is electrically connected to the vertical signal line 170. An FD transfer switching transistor FDG is provided between the source of the reset transistor 140 and the gate of the amplifying transistor 150. The gate of the amplifying transistor 150 is electrically connected to the source of the FD transfer switching transistor FDG.

The FD transfer switching transistor FDG is used when switching conversion efficiency. Generally, pixel signals are small when shooting in dark locations. Based on Q=CV, if the capacitance (FD capacitance C) of the floating diffusion 130 is large when performing charge-to-voltage conversion, the V at the time of converting to voltage at the amplifying transistor 150 will be small. Conversely, in bright locations, the pixel signal is large, and if the FD capacitance C is large, the floating diffusion 130 cannot receive the whole charge from the photodiode 110. Further, there is a need for the FD capacitance C to be large so that the V at the time of converting into voltage at the amplifying transistor 150 is not too large (i.e., becomes smaller). With this in view, when the FD transfer switching transistor FDG is turned on, the gate capacitance increases by that of the FD transfer switching transistor FDG, and accordingly the entire FD capacitance C increases. Conversely, when the FD transfer switching transistor FDG is turned off, the entire FD capacitance C decreases. Thus, the FD capacitance C can be varied by switching the FD transfer switching transistor FDG on and off, and the conversion efficiency can be switched.

Figure 39:
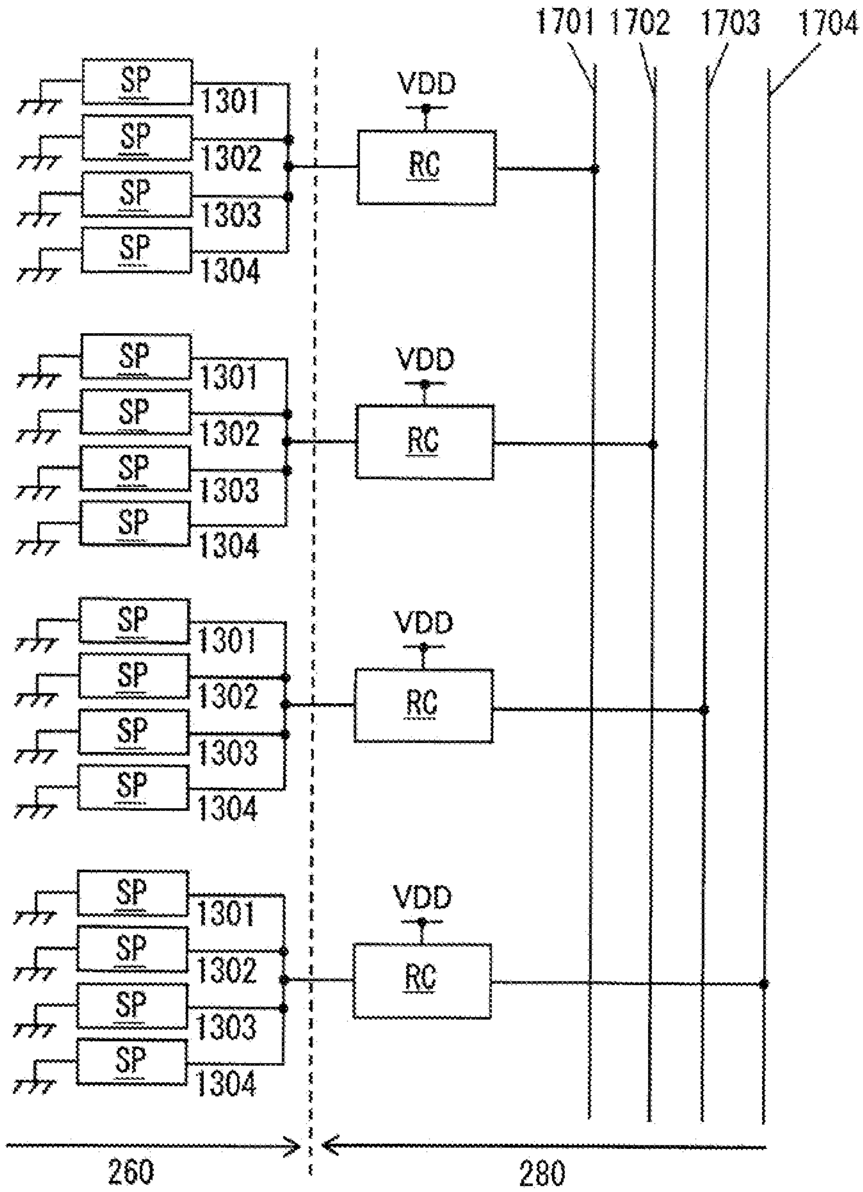
FIG. 39 is a diagram representing an example of a connection arrangement of a plurality of read circuits and a plurality of vertical signal lines.

FIG. 39 represents an example of a connection arrangement of a plurality of read circuits RC and a plurality of vertical signal lines 170. In a case where the plurality of read circuits RC are placed arrayed in the direction in which the vertical signal lines 170 extend (e.g., in the column direction), one of the plurality of vertical signal lines 170 may be allocated to each read circuit RC. For example, in a case where four read circuits RC are placed arrayed in the direction in which the vertical signal lines 170 extend (e.g., in the column direction), one of the four vertical signal lines 170 may be allocated to each of the read circuits RC, as illustrated in FIG. 39. Note that in FIG. 39, identification Nos. (1, 2, 3, 4) are appended to the reference signs of the vertical signal lines 170, to distinguish among the vertical signal lines 170.

Figure 40:
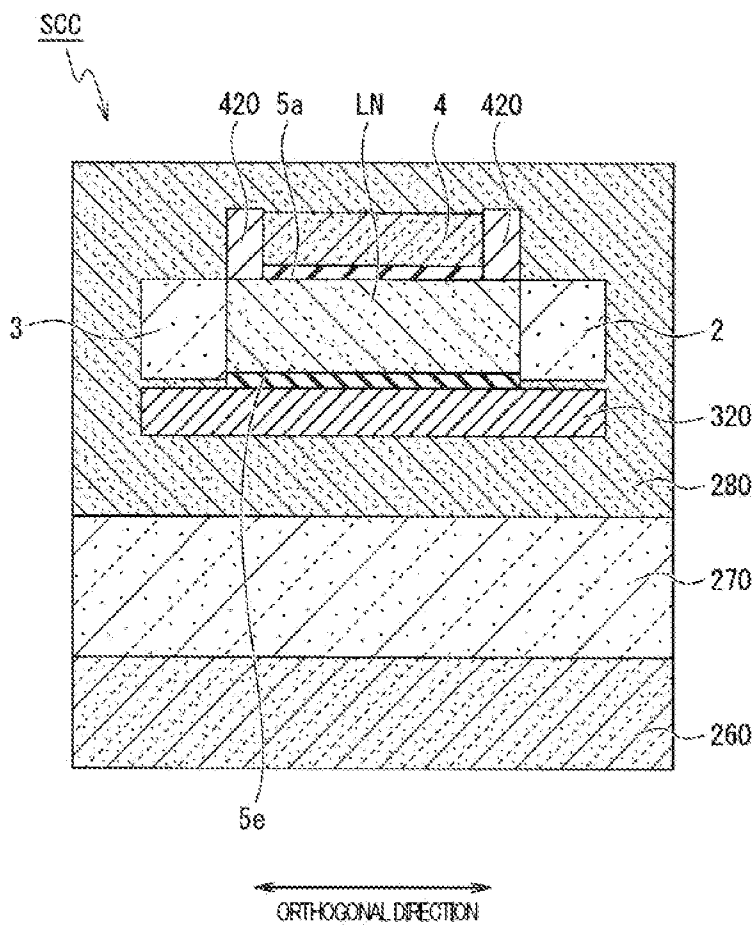
FIG. 40 is a cross-sectional view taken along line XXXX-XXXX in FIG. 37.

The semiconductor device SD has the low-concentration N-type region LN, the first high-concentration N-type region 2, the second high-concentration N-type region 3, the gate electrode 4, a shielding electrode 320, the first insulating film 5*a*, the second insulating film 5*b*, and a fifth insulating film 5*e*, as illustrated in FIG. 1 and FIG. 2, and in FIG. 37 and FIG. 40. In FIG. 37, the first high-concentration N-type region 2, the second high-concentration N-type region 3, and the second insulating film 5*b* are omitted from illustration.

The low-concentration N-type region LN is formed using a material that has concentration of impurity of 10 keV/1E$^{18}$ (cm$^{-2}$) or lower, for example. Also, the shape of the low-concentration N-type region LN is a cuboid.

As viewed from the stacking direction, which is the direction in which the low-concentration N-type region LN, the first high-concentration N-type region 2, and the second high-concentration N-type region 3 are stacked, the low-concentration N-type region LN is a square that has two sides parallel to the stacking direction and two sides orthogonal to the stacking direction.

The first high-concentration N-type region 2 is formed using a material that has a concentration of impurity higher than that of the low-concentration N-type region LN. Also, the first high-concentration N-type region 2 is connected to one of a source electrode and a drain electrode.

The second high-concentration N-type region 3 is formed using a material that has a concentration of impurity higher than that of the low-concentration N-type region LN. Also, second high-concentration N-type region 3 is connected to the other of the source electrode and the drain electrode.

The first high-concentration N-type region 2 and the second high-concentration N-type region 3 are stacked in a direction orthogonal to the direction in which the first semiconductor layer 260 and the second semiconductor layer 280 are stacked, with the low-concentration N-type region LN interposed therebetween. Note that in FIG. 40, the direction orthogonal to the direction in which the first semiconductor layer 260 and the second semiconductor layer 280 are stacked will be referred to as "orthogonal direction". A spacer layer 420 illustrated in FIG. 40 will be described later.

The gate electrode 4 faces at least part of the low-concentration N-type region LN. Specifically, the gate electrode 4 faces at least part of the low-concentration N-type region LN as viewed from the stacking direction and the orthogonal direction. The gate electrode 4 is also connected to the floating diffusion 130 and electrically connected to the first semiconductor layer 260, by gate-side interlayer wiring 330 that passes through the interlayer insulating layer 270 and the second semiconductor layer 280. Note that the gate-side interlayer wiring 330 is wiring to electrically connect the gate electrode 4 and the first semiconductor layer 260. Further, the gate electrode 4 is formed in a letter-L shape that has two orthogonal sides as viewed from the stacking direction. One of the two sides of the gate electrode 4 faces, of two sides (CNa, CNb) of the low-concentration N-type region LN that are parallel with the stacking direction, the side CNb that is farther from the first semiconductor layer 260 as viewed from the stacking direction. The other of the two sides of the gate electrode 4 faces, of two sides (CNc, CNd) of the low-concentration N-type region LN that are orthogonal to the stacking direction, the side CNc that is nearer to the gate-side interlayer wiring 330, as viewed from the stacking direction.

The shielding electrode 320 faces at least part of the low-concentration N-type region LN at a portion different from the portion which the gate electrode 4 faces. Specifically, the shielding electrode 320 faces at least part of the low-concentration N-type region LN as viewed from the stacking direction and the orthogonal direction, and faces at least part of the low-concentration N-type region LN at a portion different from the portion which the gate electrode 4 faces.

Also, the shielding electrode 320 is electrically connected to a portion that differs from the first semiconductor layer 260 and the second semiconductor layer 280 (e.g., a semiconductor layer omitted from illustration, that is stacked above the second semiconductor layer 280), using shielding-side wiring 340, for example. Note that the shielding-side wiring 340 is wiring for electrically connecting the shielding electrode 320 to a semiconductor layer that is different from the first semiconductor layer 260 and the second semiconductor layer 280.

A case of a configuration where the shielding electrode 320 is set to a fixed potential such as GND potential or the like, by connecting the shielding-side wiring 340 to the shielding electrode 320, will be described in the eighth embodiment. Further, the shielding electrode 320 is formed in a letter-L shape that has two orthogonal sides as viewed from the stacking direction. One of the two sides of shielding electrode 320 faces, of the two sides of the low-concentration N-type region LN that are parallel with the stacking direction, the side CNa that is nearer to the first semiconductor layer 260 as viewed from the stacking direction. The other of the two sides that the shielding electrode 320 has faces, of two sides of the low-concentration N-type region LN that are orthogonal to the stacking direction, the side CNd that is nearer to the transfer-side interlayer wiring 310, as viewed from the stacking direction.

Thus, the gate electrode 4 and the shielding electrode 320 face the four sides of the low-concentration N-type region LN (CNa through CNd) as viewed from the stacking direction, which is the direction in which the low-concentration N-type region LN, the first high-concentration N-type region 2, and the second high-concentration N-type region 3 are stacked.

The first insulating film **5*a* is placed interposed between the gate electrode 4** and the low-concentration N-type region LN.

The second insulating film **5*b* is placed interposed between the gate electrode 4 and the first high-concentration N-type region 2**.

The fifth insulating film **5*e* is placed interposed between the shielding electrode 320** and the low-concentration N-type region LN.

At least one of silicon oxide, silicon nitride, and hafnium oxide, for example, is used as the material for the fifth insulating film **5*e***.

<Manufacturing Process of Solid-State Imaging Sensor>

A manufacturing process of manufacturing the solid-state imaging sensor SCC according to the eight embodiment will be described by way of FIG. 41 through FIG. 55, with reference to FIG. 36 through FIG. 40.

Figure 41:
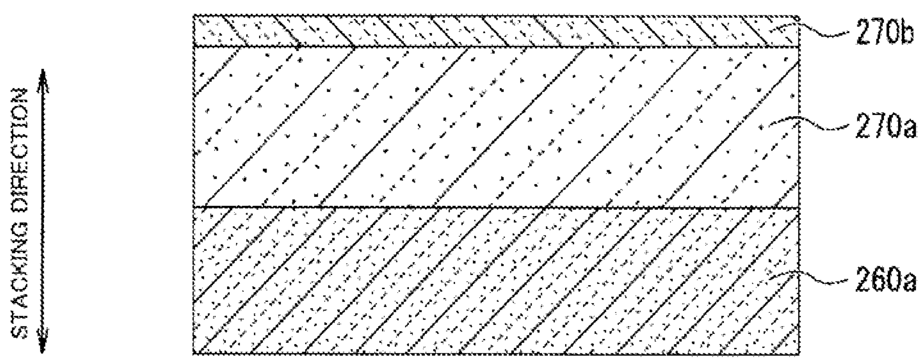
FIG. 41 is a cross-sectional view illustrating a manufacturing process of the solid-state imaging sensor according to the eighth embodiment.
Figure 42:
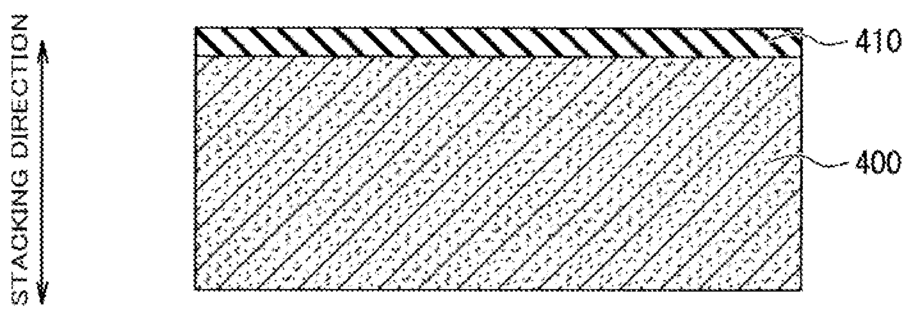
FIG. 42 is a cross-sectional view illustrating a manufacturing process of the solid-state imaging sensor according to the eighth embodiment.

In the manufacturing process of the solid-state imaging sensor SCC, first, a first interlayer insulating film **270*a* and a second interlayer insulating film 270*b* for forming the interlayer insulating layer 270 are formed on a first semiconductor substrate 260*a* (formed using Si, for example) for forming the first semiconductor layer 260, as illustrated in FIG. 41. Note that the first interlayer insulating film 270*a* is formed from an oxide film, for example. Also, the second interlayer insulating film 270*b* is formed from an oxide film or a nitride film, for example. Next, a fifth base insulating film 410 for forming the fifth insulating film 5*e* is formed on a channel semiconductor substrate 400 (formed using Si, for example) for forming the low-concentration N-type region LN, as illustrated in FIG. 42. Note that the fifth base insulating film 410** is formed from an oxide film, for example.

Figure 43:
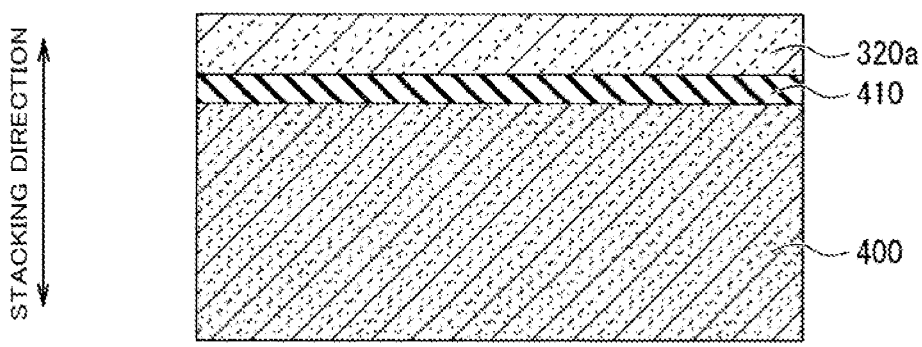
FIG. 43 is a cross-sectional view illustrating a manufacturing process of the solid-state imaging sensor according to the eighth embodiment.

Further, on the opposite face of the fifth base insulating film 410 from the face facing the channel semiconductor substrate 400 is formed a shielding electrode material layer **320*a* for forming the shielding electrode 320 on the entire face thereof, as illustrated in FIG. 43. Note that the shielding electrode material layer 320*a*** is formed using polycrystalline silicon, for example.

Figure 44:
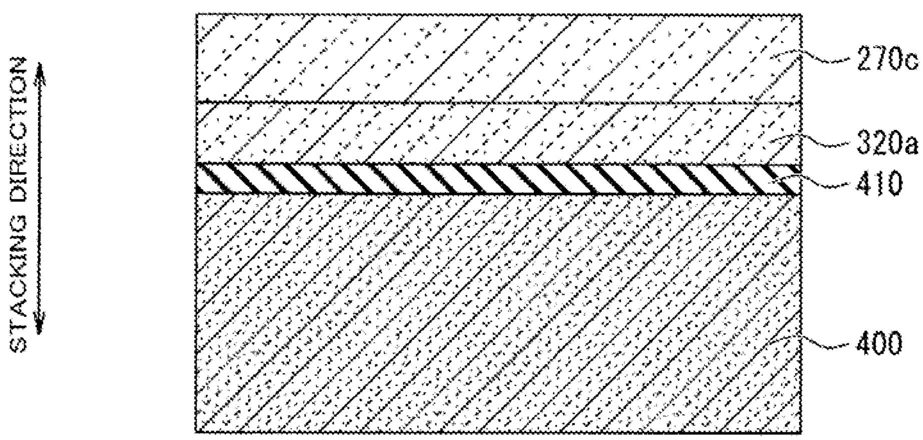
FIG. 44 is a cross-sectional view illustrating a manufacturing process of the solid-state imaging sensor according to the eighth embodiment.

Next, on the opposite face of the shielding electrode material layer **320*a* from the face facing the fifth base insulating film 410 is formed a third interlayer insulating film 270*c*, by which the interlayer insulating layer 270 is formed by applying a second interlayer insulating film 270*b* to the entire face thereof, as illustrated in FIG. 44. Note that the third interlayer insulating film 270*c*** is formed from an oxide film, for example.

Figure 45:
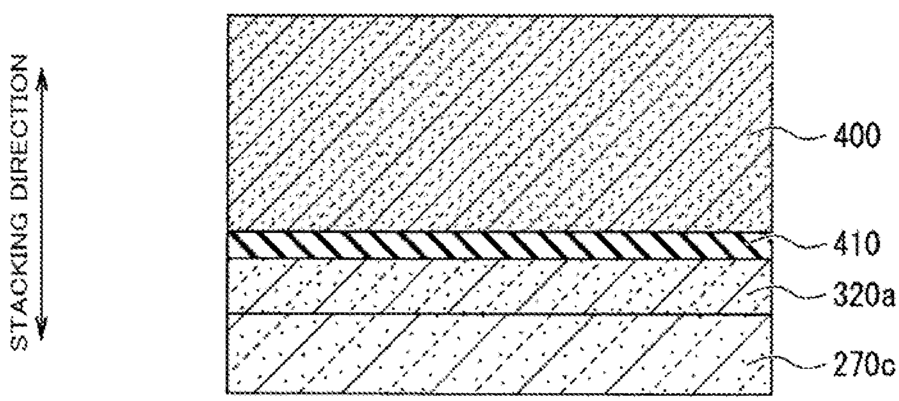
FIG. 45 is a cross-sectional view illustrating a manufacturing process of the solid-state imaging sensor according to the eighth embodiment.
Figure 46:
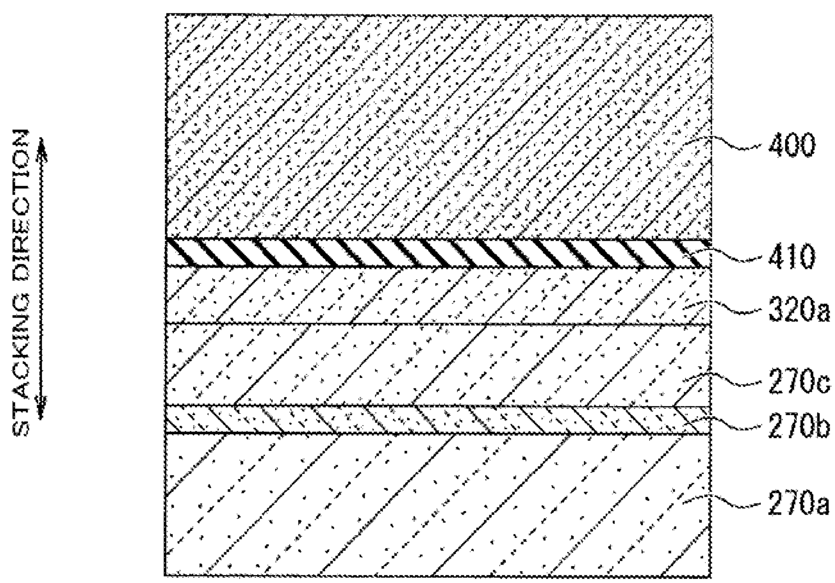
FIG. 46 is a cross-sectional view illustrating a manufacturing process of the solid-state imaging sensor according to the eighth embodiment.

Thereafter, the stacked body of the channel semiconductor substrate 400, the fifth base insulating film 410, the shielding electrode material layer **320*a*, and the third interlayer insulating film 270*c* is inverted in the stacking direction as illustrated in FIG. 45, and further, the third interlayer insulating film 270*c* and the second interlayer insulating film 270*b* are applied to each other, as illustrated in FIG. 46**.

Figure 47:
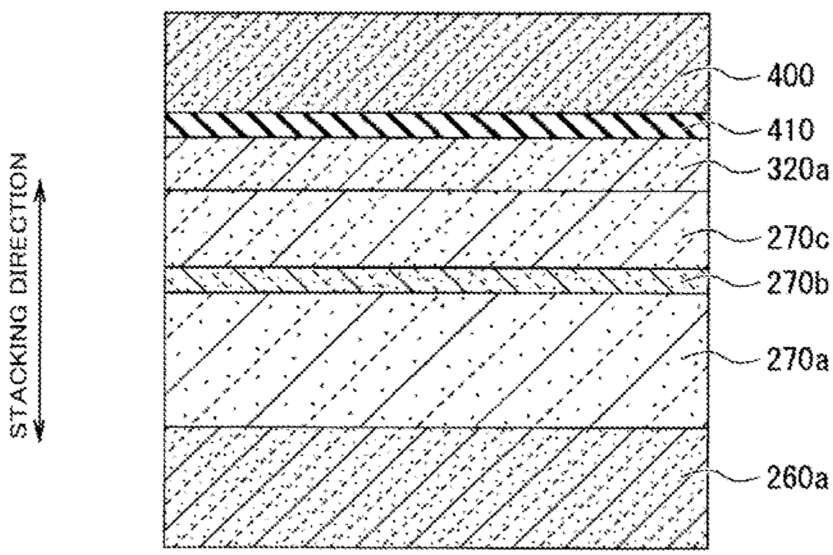
FIG. 47 is a cross-sectional view illustrating a manufacturing process of the solid-state imaging sensor according to the eighth embodiment.
Figure 48:
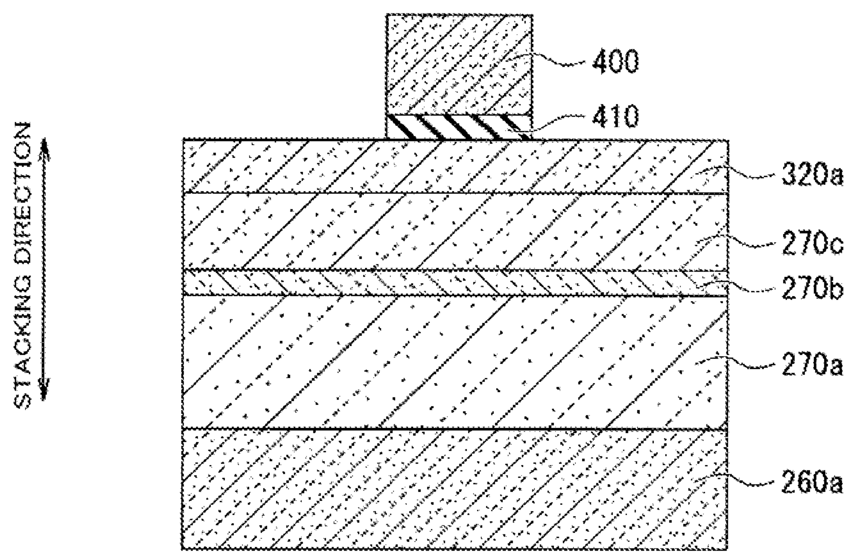
FIG. 48 is a cross-sectional view illustrating a manufacturing process of the solid-state imaging sensor according to the eighth embodiment.

Next, the channel semiconductor substrate 400 is polished to a thickness for forming the low-concentration N-type region LN as illustrated in FIG. 47, following which the channel semiconductor substrate 400 and the fifth base insulating film 410 are etched leaving the region corresponding to the low-concentration N-type region LN, as illustrated in FIG. 48.

Figure 49:
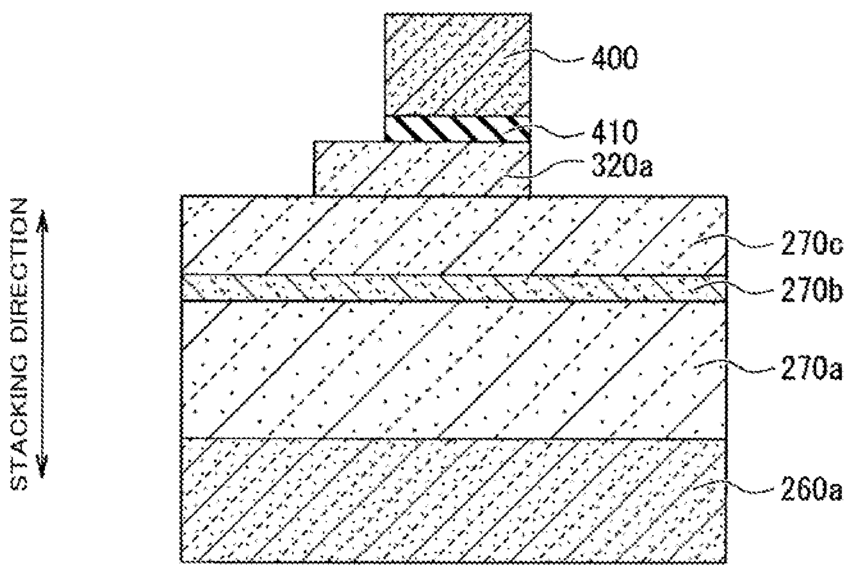
FIG. 49 is a cross-sectional view illustrating a manufacturing process of the solid-state imaging sensor according to the eighth embodiment.

Further, the shielding electrode material layer **320*a* is etched, leaving, of the shielding electrode material layer 320*a*, a portion for forming one of the two sides that the shielding electrode 320 has, as illustrated in FIG. 49**.

Figure 50:
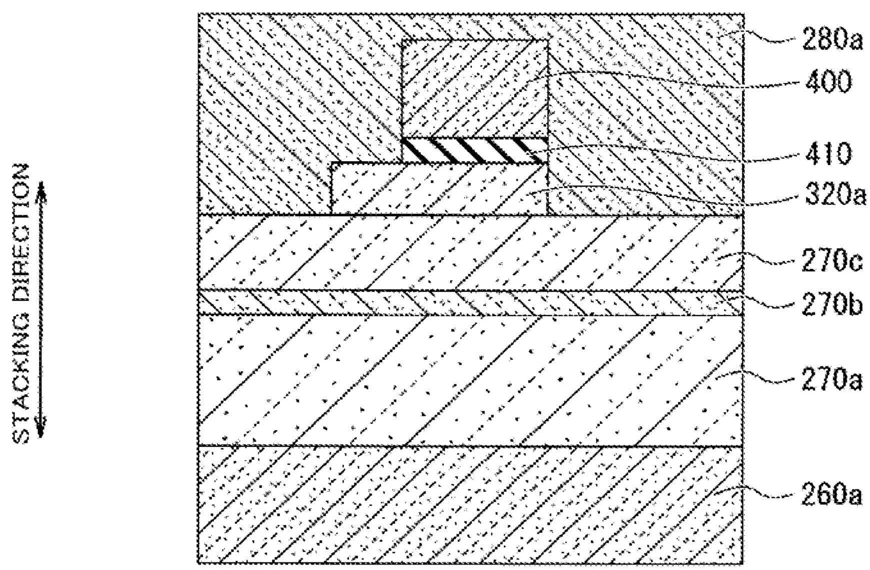
FIG. 50 is a cross-sectional view illustrating a manufacturing process of the solid-state imaging sensor according to the eighth embodiment.

Next, on the opposite face of the third interlayer insulating film **270*c* from the face facing the second interlayer insulating film 270*b* is formed a second layer material insulating film 280*a* for forming the second semiconductor layer 280, on the entire face thereof, so as to embed the entirety of the channel semiconductor substrate 400, the fifth base insulating film 410, and the shielding electrode material layer 320*a*, as illustrated in FIG. 50. Note that the second layer material insulating film 280***a* is formed of an oxide film, for example.

Figure 51:
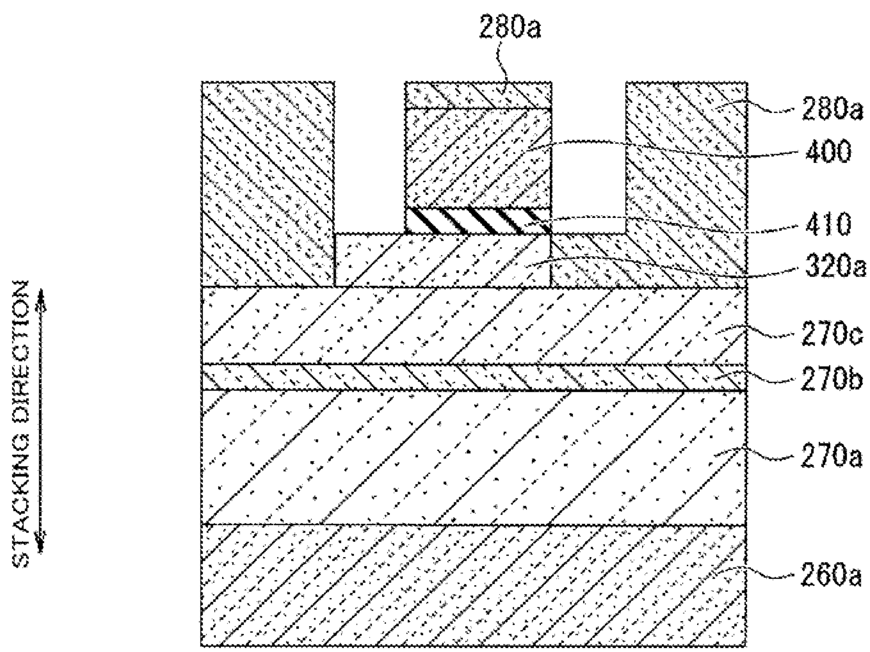
FIG. 51 is a cross-sectional view illustrating a manufacturing process of the solid-state imaging sensor according to the eighth embodiment.

Thereafter, as illustrated in FIG. 51, the portions of the second layer material insulating film 280*a* where the gate electrode 4 and the shielding electrode 320 facing the two sides (CNc, CNd) orthogonal to the stacking direction of the low-concentration N-type region LN are to be formed are engraved back.

Figure 52:
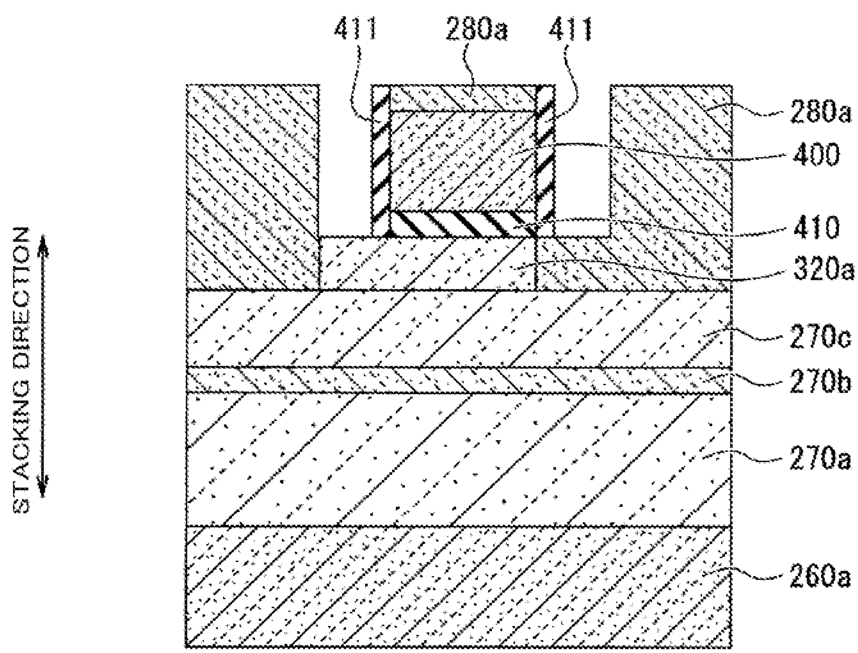
FIG. 52 is a cross-sectional view illustrating a manufacturing process of the solid-state imaging sensor according to the eighth embodiment.

Next, a fifth side insulating film 411 that is a portion that forms the first insulating film 5*a* and the portion of the fifth insulating film 5*e* that forms the fifth insulating film 5*e* along with the fifth base insulating film 410 is formed, as illustrated in FIG. 52.

Figure 53:
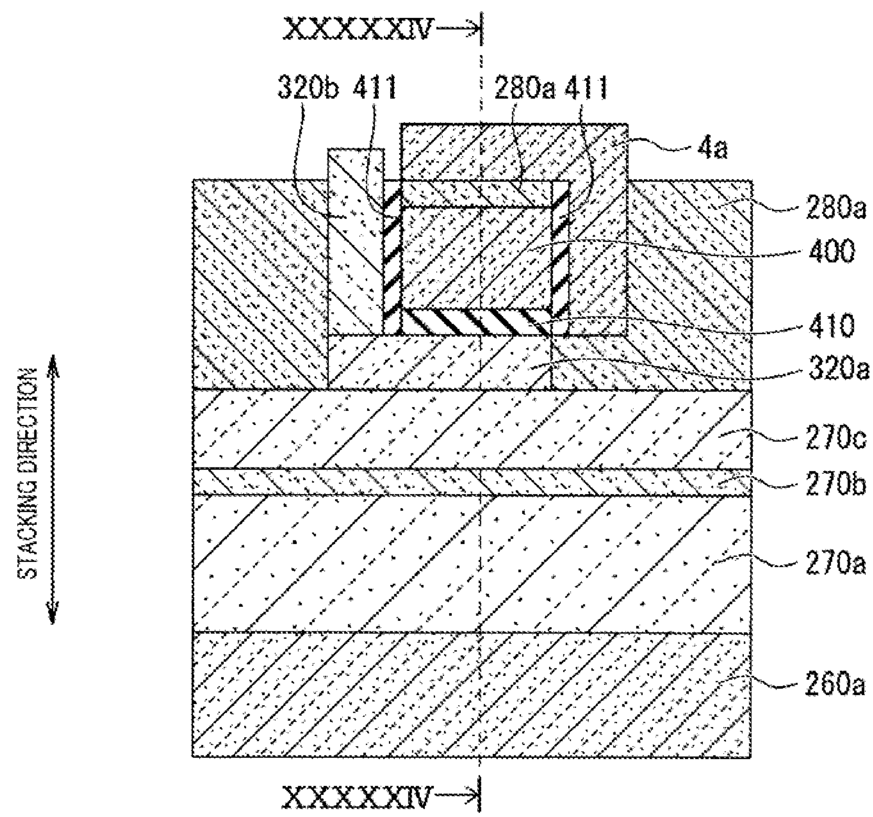
FIG. 53 is a cross-sectional view illustrating a manufacturing process of the solid-state imaging sensor according to the eighth embodiment.

Further, as illustrated in FIG. 53, a gate-side electrode material 4*a* is formed at a portion where the gate electrode 4 is to be formed. Further, a shielding-side electrode material 320*b* is formed at a portion where the other of the two sides that the shielding electrode 320 has is to be formed.

Figure 54:
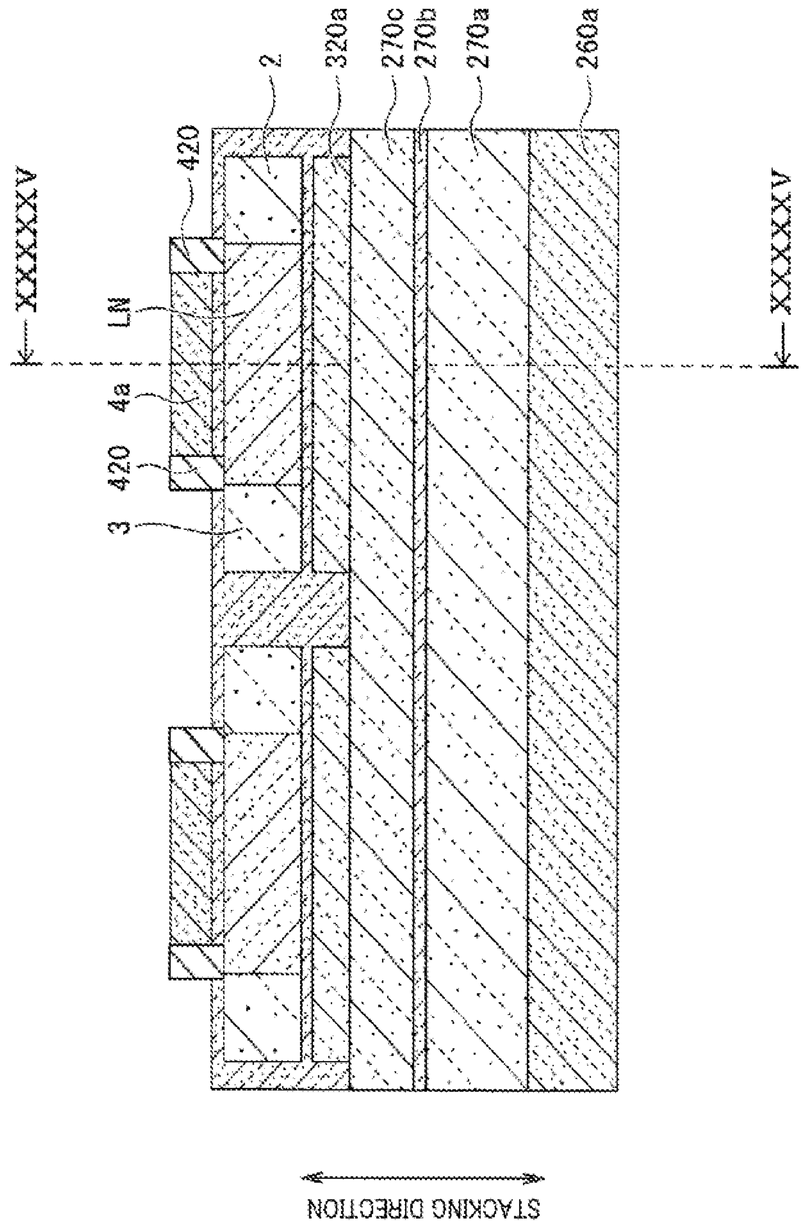
FIG. 54 is a cross-sectional view taken along line XXXXXIV-XXXXXIV in FIG. 53.

Next, as illustrated in FIG. 54, spacer layers 420 are formed to each of two faces of the one side, out of the two sides that the gate electrode 4 has, which faces the low-concentration N-type region LN, continuing thereto. Further, the first high-concentration N-type region 2 and the second high-concentration N-type region 3 are formed by ion injection, for example, to a portion facing the low-concentration N-type region LN in the stacking direction.

Figure 55:
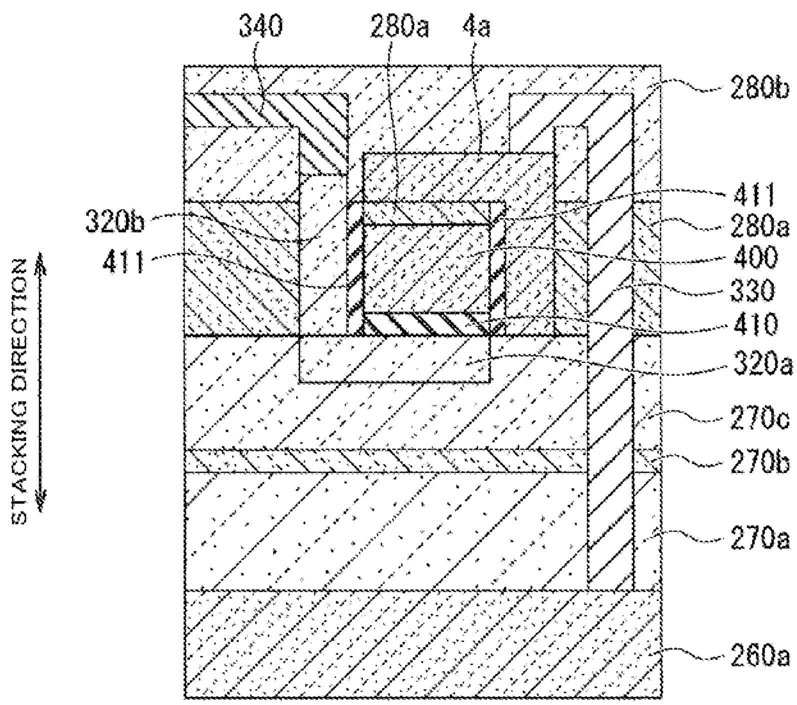
FIG. 55 is a cross-sectional view taken along line XXXXXV-XXXXXV in FIG. 54.

Thereafter, a third layer material insulating film 280*b* for forming the second semiconductor layer 280 along with the second layer material insulating film 280*a* is formed, embedding the gate electrode 4 and the spacer layer 420, as illustrated in FIG. 55. Note that the third layer material insulating film 280*b* is formed from an oxide film, for example. Further, a contact hole communicating with the gate electrode 4 and the shielding electrode 320 is formed, and a conductor (e.g., tungsten) is used to form the gate-side interlayer wiring 330 and the shielding-side wiring 340.

According to the configuration of the eighth embodiment, the electrodes (gate electrode 4 and shielding electrode 320) that face the low-concentration N-type region LN are divided into two, and a fixed potential is set to the shielding electrode 320, which enables shielding from electric fields from adjacent structures with different potentials (transfer-side interlayer wiring 310 and gate-side interlayer wiring 330). Accordingly, the drop in threshold voltage that occurs due to the same bias being applied to the low-concentration N-type region LN from all directions can be suppressed.

Also, according to the configuration of the eighth embodiment, setting a potential that differs from that of the gate electrode 4 (potential that differs from the GND potential) to the shielding electrode 320, for example, enables the threshold voltage to be optionally controlled.

Drop in the threshold voltage occurs due to the following factor.

In a case of an integral structure in which the electrodes facing the low-concentration N-type region LN are not divided, the electrodes facing each other function as a back gate of each other, and the bias amount for cancelling out and inverting spatial charge within the channel (low-concentration N-type region LN) drops. Accordingly, the threshold voltage drops greatly, and controlling the threshold voltage within an appropriate range becomes difficult.

Modification of Eighth Embodiment

Although the eighth embodiment has a configuration in which a spacing is provided between the gate electrode 4 and the gate-side interlayer wiring 330, as illustrated in FIG. 37, for example, this is not limiting, and a configuration may be made in which the gate electrode 4 and the gate-side interlayer wiring 330 are in contact.

Ninth Embodiment

Figure 56:
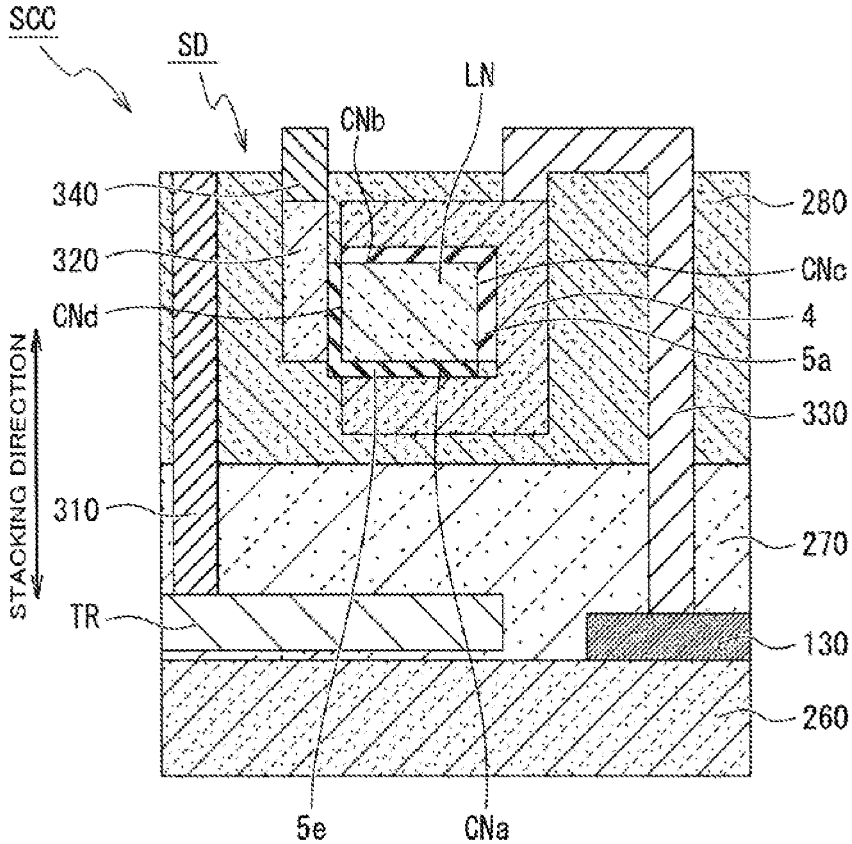
FIG. 56 is a cross-sectional view illustrating a configuration of a solid-state imaging sensor according to a ninth embodiment.

The solid-state imaging sensor according to a ninth embodiment differs from the eight embodiment with regard to the configuration of the gate electrode 4 and the shielding electrode 320, as illustrated in FIG. 56. Description of portions that are in common with the eighth embodiment may be omitted in the following description.

The gate electrode 4 is formed in a letter-C shape with two parallel sides and one side orthogonal to the two parallel sides, as viewed from the stacking direction. The two parallel sides that the gate electrode 4 has face the two sides of the low-concentration N-type region LN that are parallel to the stacking direction (CNa, CNb), as viewed from the stacking direction. The one side that is orthogonal to the two parallel sides of the gate electrode 4 faces the one side CNc of the two sides (CNc, CNd) of the low-concentration N-type region LN orthogonal to the stacking direction that is nearer to the gate-side interlayer wiring 330, as viewed from the stacking direction.

The shielding electrode 320 is formed linearly on only one side, as viewed from the stacking direction. The one side of the shielding electrode 320 faces the one side CNd, out of the two sides (CNc, CNd) of the low-concentration N-type region LN orthogonal to the stacking direction, which is nearer to the transfer-side interlayer wiring 310, as viewed from the stacking direction.

By the above, the gate electrode 4 and the shielding electrode 320 face the four sides (CNa through CNd) of the low-concentration N-type region LN, as viewed from the stacking direction, which is the direction in which the low-concentration N-type region LN, the first high-concentration N-type region 2, and the second high-concentration N-type region 3 are stacked.

According to the configuration of the ninth embodiment, the electrodes (gate electrode 4 and shielding electrode 320) that face the low-concentration N-type region LN are divided into two, and a fixed potential is set to the shielding electrode 320, which enables shielding from electric fields from adjacent structures with different potentials (transfer-side interlayer wiring 310 and gate-side interlayer wiring 330). Accordingly, the drop in threshold voltage that occurs due to the same bias being applied to the low-concentration N-type region LN from all directions can be suppressed.

Also, according to the configuration of the ninth embodiment, setting a potential that differs from that of the gate electrode 4 (potential that differs from the GND potential) to the shielding electrode 320, for example, enables the threshold voltage to be optionally controlled.

Tenth Embodiment

Figure 57:
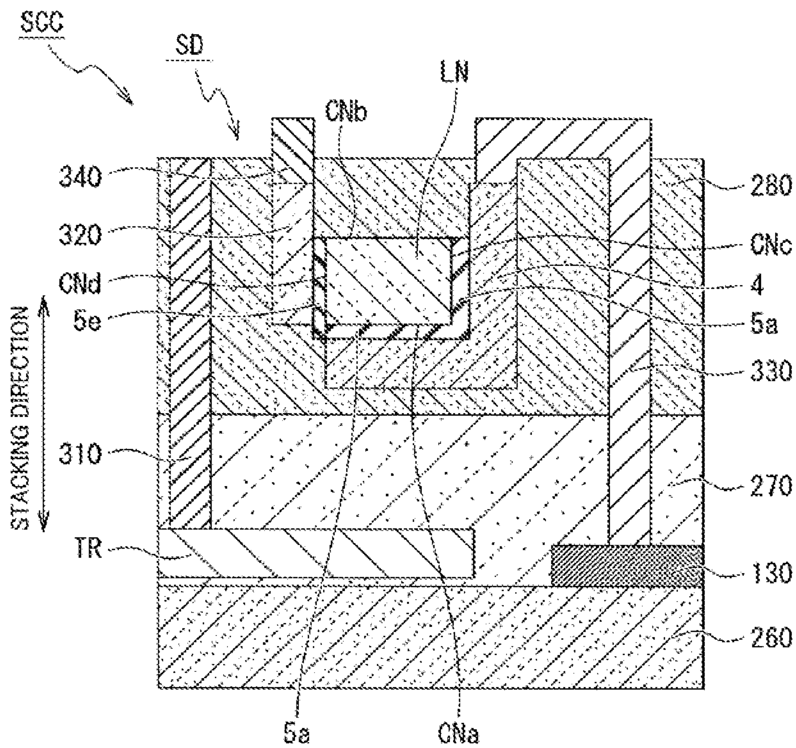
FIG. 57 is a cross-sectional view illustrating a configuration of a solid-state imaging sensor according to a tenth embodiment.

The solid-state imaging sensor according to a tenth embodiment differs from the eight embodiment with regard to the configuration of the gate electrode 4 and the shielding electrode 320, as illustrated in FIG. 57. Description of portions that are in common with the eighth embodiment may be omitted in the following description.

The gate electrode 4 is formed in a letter-L shape having two sides that are orthogonal, as viewed from the stacking direction. One of the two sides of the gate electrode 4 faces, out of the two sides (CNa, CNb) of the low-concentration N-type region LN that are parallel to the stacking direction, the one side CNa that is nearer to the first semiconductor layer 260, as viewed from the stacking direction. The other of the two sides of the gate electrode 4 faces, out of the two sides (CNc, CNd) of the low-concentration N-type region LN that are orthogonal to the stacking direction, the one side CNc that is nearer to the gate-side interlayer wiring 330.

The shielding electrode 320 is formed linearly on only one side, as viewed from the stacking direction. The one side of the shielding electrode 320 faces the one side CNd, out of the two sides (CNc, CNd) of the low-concentration N-type region LN orthogonal to the stacking direction, which is nearer to the transfer-side interlayer wiring 310.

By the above, the gate electrode 4 and the shielding electrode 320 face three sides (CNa, CNc, CNd) of the low-concentration N-type region LN, as viewed from the stacking direction, which is the direction in which the low-concentration N-type region LN, the first high-concentration N-type region 2, and the second high-concentration N-type region 3 are stacked.

According to the configuration of the tenth embodiment, the electrodes (gate electrode 4 and shielding electrode 320) that face the low-concentration N-type region LN are divided into two, and a fixed potential is set to the shielding electrode 320, which enables shielding from electric fields from adjacent structures with different potentials (transfer-side interlayer wiring 310 and gate-side interlayer wiring 330). Accordingly, the drop in threshold voltage that occurs due to the same bias being applied to the low-concentration N-type region LN from all directions can be suppressed.

Also, according to the configuration of the tenth embodiment, setting a potential that differs from that of the gate electrode 4 (potential that differs from the GND potential) to the shielding electrode 320, for example, enables the threshold voltage to be optionally controlled.

Eleventh Embodiment

Figure 58:
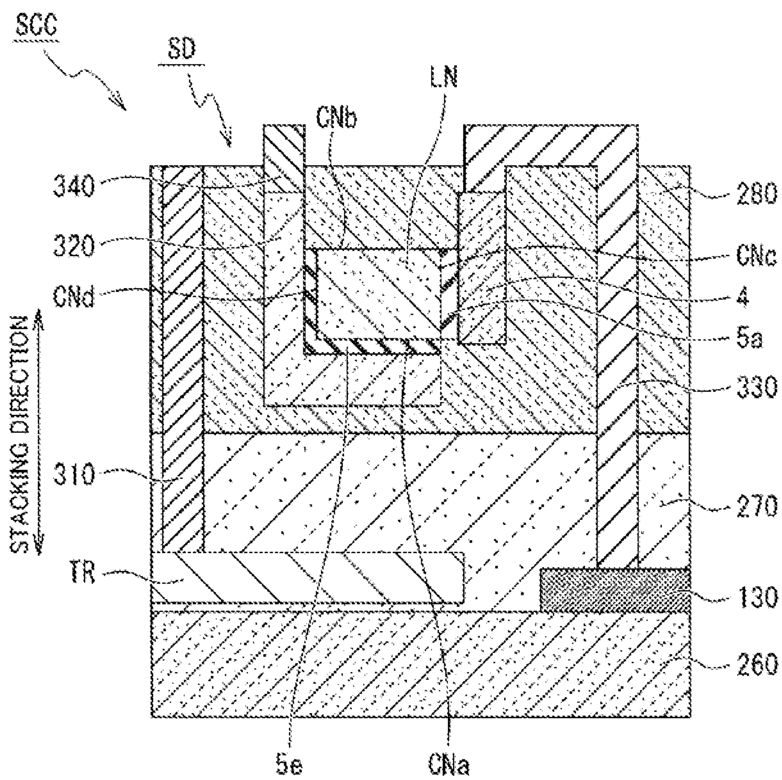
FIG. 58 is a cross-sectional view illustrating a configuration of a solid-state imaging sensor according to an eleventh embodiment.

The solid-state imaging sensor according to an eleventh embodiment differs from the eight embodiment with regard to the configuration of the gate electrode 4 and the shielding electrode 320, as illustrated in FIG. 58. Description of portions that are in common with the eighth embodiment may be omitted in the following description.

The gate electrode 4 is formed linearly on only one side, as viewed from the stacking direction. As viewed from the stacking direction, the one side of the gate electrode 4 faces the one side CNc, out of the two sides (CNc, CNd) of the low-concentration N-type region LN orthogonal to the stacking direction, which is nearer to the gate-side interlayer wiring 330.

The shielding electrode 320 is formed in a letter-L shape having two sides that are orthogonal, as viewed from the stacking direction. One of the two sides of the shielding electrode 320 faces, out of the two sides (CNa, CNb) of the low-concentration N-type region LN that are parallel to the stacking direction, the one side CNa that is nearer to the first semiconductor layer 260, as viewed from the stacking direction. The other of the two sides of the shielding electrode 320 faces, out of the two sides (CNc, CNd) of the low-concentration N-type region LN that are orthogonal to the stacking direction, the one side CNd that is nearer to the transfer-side interlayer wiring 310.

By the above, the gate electrode 4 and the shielding electrode 320 face three sides (CNa, CNc, CNd) of the low-concentration N-type region LN, as viewed from the stacking direction, which is the direction in which the low-concentration N-type region LN, the first high-concentration N-type region 2, and the second high-concentration N-type region 3 are stacked.

According to the configuration of the eleventh embodiment, the electrodes (gate electrode 4 and shielding electrode 320) that face the low-concentration N-type region LN are divided into two, and a fixed potential is set to the shielding electrode 320, which enables shielding from electric fields from adjacent structures with different potentials (transfer-side interlayer wiring 310 and gate-side interlayer wiring 330). Accordingly, the drop in threshold voltage that occurs due to the same bias being applied to the low-concentration N-type region LN from all directions can be suppressed.

Also, according to the configuration of the eleventh embodiment, setting a potential that differs from that of the gate electrode 4 (potential that differs from the GND potential) to the shielding electrode 320, for example, enables the threshold voltage to be optionally controlled.

Twelfth Embodiment

Figure 59:
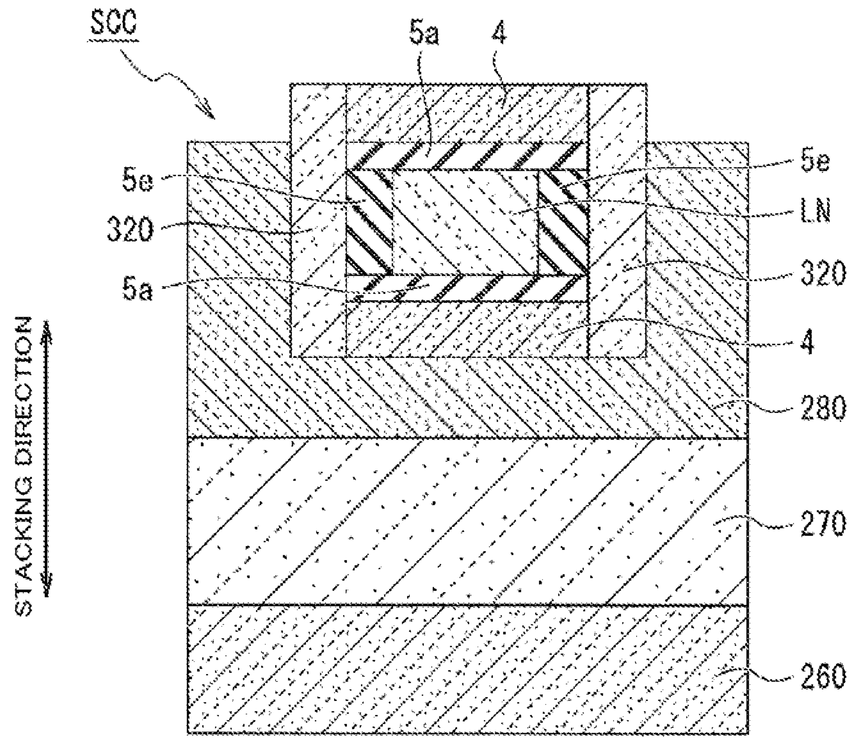
FIG. 59 is a cross-sectional view illustrating a configuration of a solid-state imaging sensor according to a twelfth embodiment.

The solid-state imaging sensor according to a twelfth embodiment differs from the eight embodiment with regard to the configuration of the gate electrode 4, the shielding electrode 320, and the fifth insulating film **5*e*, as illustrated in FIG. 59**. Description of portions that are in common with the eighth embodiment may be omitted in the following description.

In the solid-state imaging sensor SCC according to the twelfth embodiment, the gate electrode 4 and the shielding electrode 320 are integrated. The integrated gate electrode 4 and shielding electrode 320 are formed in a square tube form, and surround the low-concentration N-type region LN, as viewed from the stacking direction.

The gate electrode 4 has two parallel sides, as viewed from the stacking direction. The two parallel sides that the gate electrode 4 has face the two sides (CNa, CNb) of the low-concentration N-type region LN that are parallel to the stacking direction, as viewed from the stacking direction.

The shielding electrode 320 has two parallel sides, as viewed from the stacking direction. The two parallel sides that the shielding electrode 320 has face the two sides (CNc, CNd) of the low-concentration N-type region LN that are orthogonal to the stacking direction, as viewed from the stacking direction.

The thickness of the fifth insulating film **5*e* is thicker than the thickness of the first insulating film 5*a*. In the twelfth embodiment, a configuration will be described in which the thickness of the fifth insulating film 5*e* is not less than twice the thickness of the first insulating film 5*a***, as an example.

According to the configuration of the twelfth embodiment, by making the fifth insulating film **5*e* to be thicker than the first insulating film 5*a*, the channel length of the low-concentration N-type region LN is defined by the structural dimensions of the gate electrode 4 along the orthogonal direction, even if there is variance in the length of the shielding electrode 320. Accordingly, variance in characteristics of the amplifying transistor 150 due to variance in the length of the shielding electrode 320** can be suppressed.

Also, according to the configuration of the twelfth embodiment, the shielding electrode 320 can shield against electric fields from adjacent structures with different potentials (transfer-side interlayer wiring 310 and gate-side interlayer wiring 330). Accordingly, the drop in threshold voltage that occurs due to the same bias being applied to the low-concentration N-type region LN from all directions can be suppressed.

Thirteenth Embodiment

Figure 60:
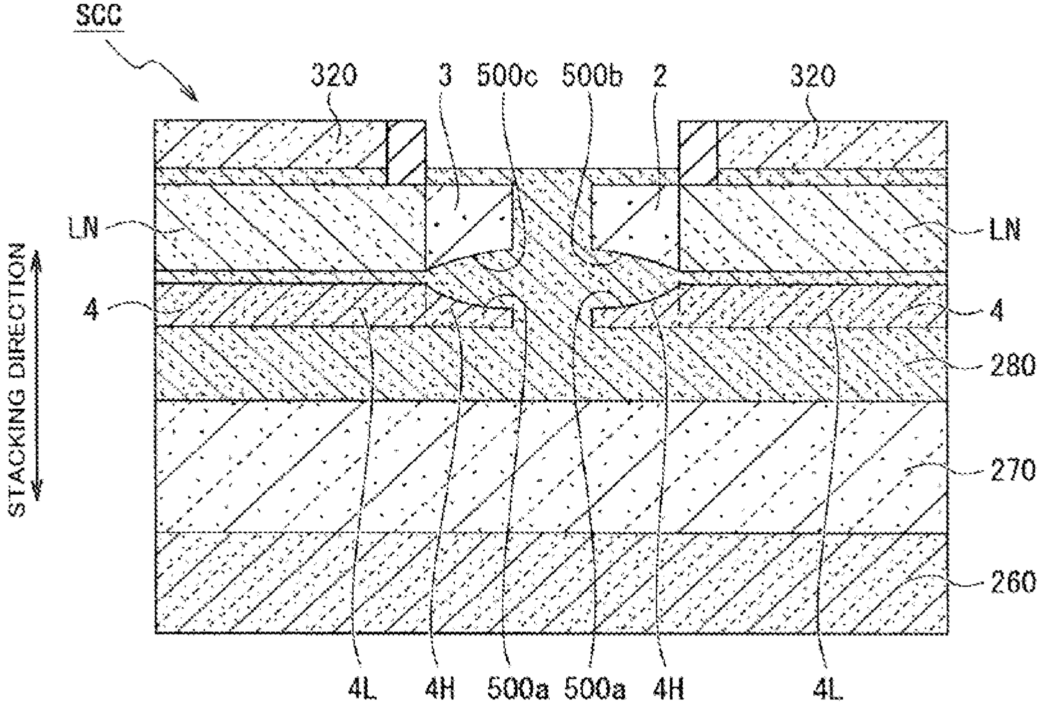
FIG. 60 is a cross-sectional view illustrating a configuration of a solid-state imaging sensor according to a thirteenth embodiment.

The solid-state imaging sensor according to a thirteenth embodiment differs from the eight embodiment with regard to the configuration of the gate electrode 4, the first high-concentration N-type region 2, and the second high-concentration N-type region 3, as illustrated in FIG. 60. Description of portions that are in common with the eighth embodiment may be omitted in the following description.

The gate electrode 4 has a low-concentration-region facing portion 4L and a high-concentration-region facing portion 4H.

The low-concentration-region facing portion 4L is a portion that faces the low-concentration N-type region LN. Also, the distance between the low-concentration-region facing portion 4L and the low-concentration N-type region LN is uniform. The high-concentration-region facing portion 4H is a portion that faces the first high-concentration N-type region 2 and the second high-concentration N-type region 3. Also, a gate-side inclined portion 500*a* is formed in the high-concentration-region facing portion 4H.

The gate-side inclined portion 500*a* is formed in a shape in which the farther away from the center of the gate electrode 4, the farther the face of the gate electrode 4 facing the first high-concentration N-type region 2 and the second high-concentration N-type region 3 is away from the first high-concentration N-type region 2 and the second high-concentration N-type region 3.

A first high-concentration side inclined portion 500*b* is formed in the first high-concentration N-type region 2 at a portion facing the gate electrode 4. The first high-concentration-side inclined portion 500*b* is formed in a shape in which the farther away from the low-concentration N-type region LN, the farther the face of the first high-concentration-side inclined portion 500*b* facing the gate electrode 4 is away from the gate electrode 4.

A second high-concentration side inclined portion 500*c* is formed in the second high-concentration N-type region 3 at a portion facing the gate electrode 4.

The second high-concentration side inclined portion 500*c* is formed in a shape in which the farther away from the low-concentration N-type region LN, the farther the face of the second high-concentration side inclined portion 500*c* facing the gate electrode 4 is away from the gate electrode 4.

According to the above, in the solid-state imaging sensor according to the thirteenth embodiment, the facing distance of the high-concentration-region facing portion 411, and the first high-concentration N-type region 2 and second high-concentration N-type region 3, facing each other, is longer than the facing distance of the low-concentration-region facing portion 4L and the low-concentration N-type region LN facing each other.

<Manufacturing Process of Solid-State Imaging Sensor>

The manufacturing process of manufacturing the solid-state imaging sensor SCC according to the thirteenth embodiment will be described by way of FIG. 61, with reference to FIG. 60.

Figure 61:
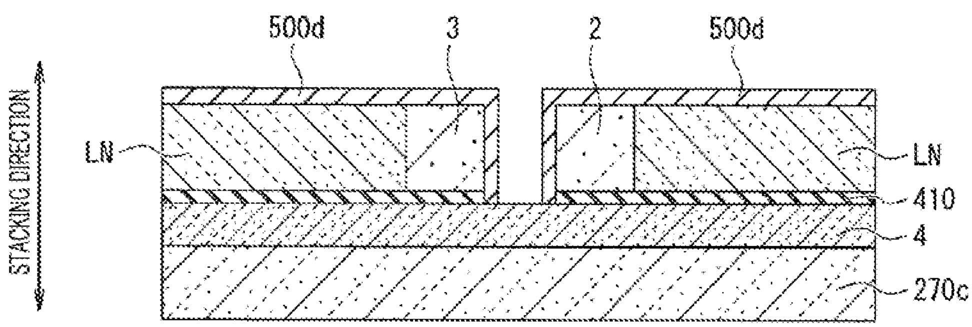
FIG. 61 is a cross-sectional view illustrating a manufacturing process of the solid-state imaging sensor according to the thirteenth embodiment.

In the manufacturing process of the solid-state imaging sensor SCC, a protective film 500*d* is formed on the low-concentration N-type region LN, and on the first high-concentration N-type region 2 and the second high-concentration N-type region 3, as illustrated in FIG. 61. Thereafter, the gate-side inclined portion 500*a* is formed at the portion of the gate electrode 4 facing the first high-concentration N-type region 2 and the second high-concentration N-type region 3, by isotropic etching, for example. Further, the first high-concentration-side inclined portion 500*b* is formed at the portion of the first high-concentration N-type region 2 that faces the gate electrode 4. Additionally, the second high-concentration-side inclined portion 500*c* is formed at the portion of the second high-concentration N-type region 3 that faces the gate electrode 4.

Thereafter, a layer that embeds the low-concentration N-type region LN, and the first high-concentration N-type region 2 and the second high-concentration N-type region 3, is formed, using silicon oxide or the like.

According to the configuration of the thirteenth embodiment, a portion of the gate electrode 4 that overlaps with the first high-concentration N-type region 2 and the second high-concentration N-type region 3 to which the source electrode and the drain electrode are connected is removed by etching, whereby the parasitic capacitance of the gate electrode 4 can be reduced. Accordingly, deterioration in the efficiency of converting light signals in to electric signals by the pixel circuit 210 can be suppressed.

Note that the nearer the distance of the first high-concentration N-type region 2 and the second high-concentration N-type region 3 as to the gate electrode 4 is, the parasitic capacitance between the first high-concentration N-type region 2 and the second high-concentration N-type region 3, and the gate electrode 4 increases. Accordingly, efficiency of converting light signals in to electric signals by the pixel circuit 210 deteriorates.

Modification of Thirteenth Embodiment

In the thirteenth embodiment, the configuration of the solid-state imaging sensor is a configuration in which the distance of the portion where the gate electrode 4, and the first high-concentration N-type region 2 and the second high-concentration N-type region 3, face each other, is longer than the distance at the portion where the gate electrode 4 and the low-concentration N-type region LN face each other, but this is not limiting. That is to say, a configuration may be made in which the distance of a portion where the gate electrode 4, and at least one of the first high-concentration N-type region 2 and the second high-concentration N-type region 3, face each other, is longer than the distance at the portion where the gate electrode 4 and the low-concentration N-type region LN face each other.

Fourteenth Embodiment

A fourteenth embodiment will be described in detail below with reference to the Figures. Note that description will be made in the following order. 1. Embodiment (image capturing device having a stacked structure of three substrates)

2. Modification 1 (example 1 of planar configuration)

3. Modification 2 (example 2 of planar configuration)

4. Modification 3 (example 3 of planar configuration)

5. Modification 4 (example having inter-substrate contact portion at middle portion of pixel array unit)

6. Modification 5 (example of having planar transfer transistor)

7. Modification 6 (example of one pixel connected to one pixel circuit)

8. Modification 7 (configuration example of pixel isolation portion)

9. Adaptation example (image capturing system)

10. Application examples

1. EMBODIMENT

[Functional Configuration of Image Capturing Device 1]

Figure 62:
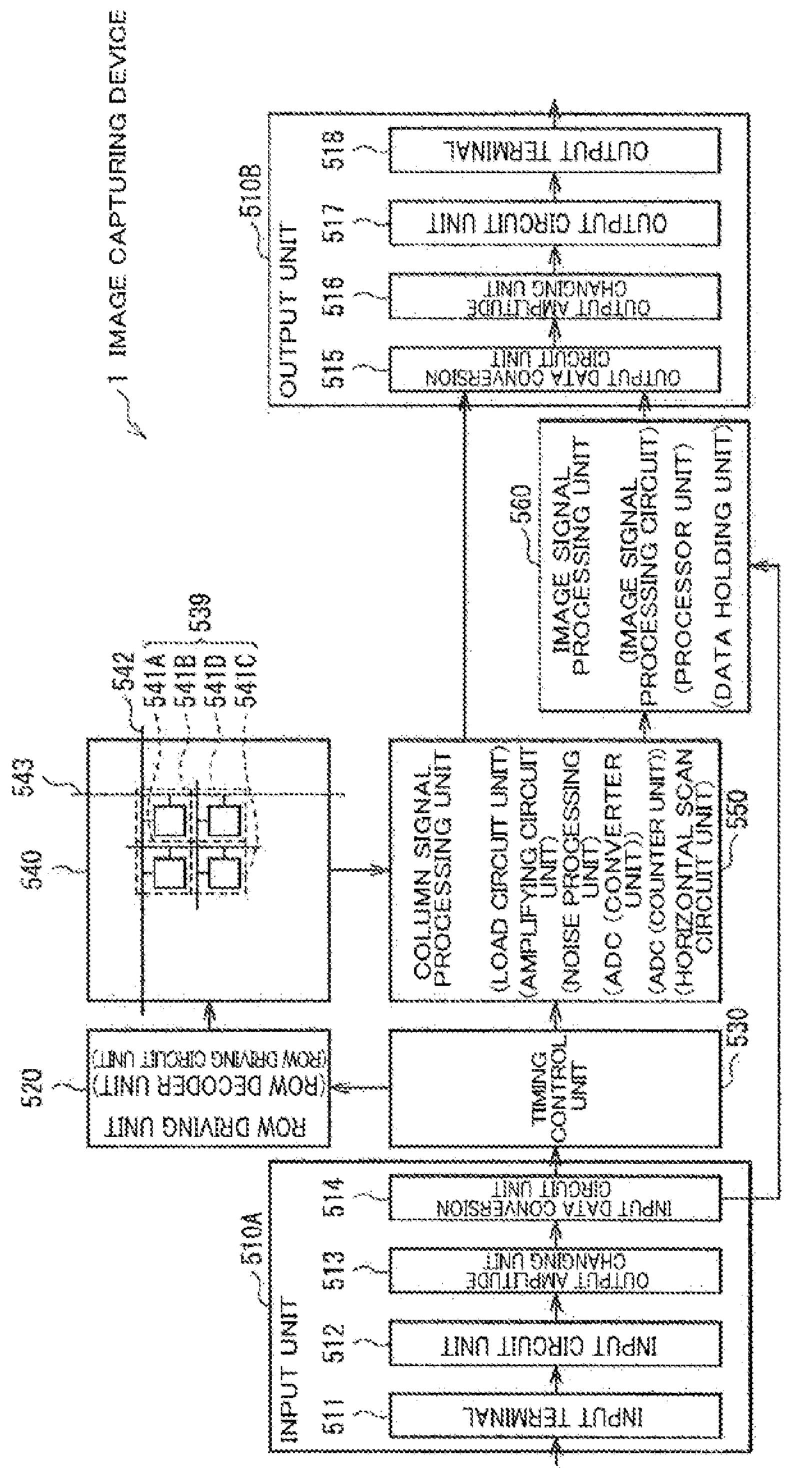
FIG. 62 is a block diagram representing an example of a functional configuration of an image capturing device according to a fourteenth embodiment.

FIG. 62 is a block diagram illustrating an example of the functional configuration of an image capturing device (image capturing device 1) according to an embodiment of the present disclosure.

The image capturing device 1 in FIG. 62 includes, for example, an input unit 510A, a row driving unit 520, a timing control unit 530, a pixel array unit 540, a column signal processing unit 550, an image signal processing unit 560, and an output unit 510B.

Pixels 541 are repetitively placed in an array in the pixel array unit 540. More specifically, a pixel sharing unit 539 including a plurality of pixels is a unit of repetition, and this is repeatedly placed in an array made up of a row direction and a column direction. Note that in the present specification, the row direction may be referred to as the H direction and the column direction orthogonal to the row direction as the V direction, for the sake of convenience. In the example in FIG. 62, one pixel sharing unit 539 includes four pixels (pixels 541A, 541B, 541C, and 541D). The pixels 541A, 541B, 541C, and 541D each have a photodiode PD (illustrated in later-described FIG. 67, etc.). The pixel sharing unit 539 is an increment that shares one pixel circuit (pixel circuit 210 in later-described FIG. 64). In other words, one pixel circuit (later-described pixel circuit 210) is possessed by every four pixels (pixels 541A, 541B, 541C, and 541D). The pixel signals of each of the pixels 541A, 541B, 541C, and 541D are sequentially read out by operating this pixel circuit in time division. The pixels 541A, 541B, 541C, and 541D are placed in two rows×two columns, for example. Provided to the pixel array unit 540 is, along with the pixels 541A, 541B, 541C, and 541D, a plurality of row drive signal lines 542 and a plurality of vertical signal lines (column read lines) 543. The row drive signal lines 542 drives the pixels 541 included in each of the plurality of pixel sharing units 539 arrayed in the row direction in the pixel array unit 540. The pixels of the pixel sharing unit 539 that are placed arrayed in the row direction are driven. A plurality of transistors is provided in the pixel sharing unit 539, which will be described later in detail with reference to FIG. 65. A plurality of row drive signal lines 542 is connected to one pixel sharing unit 539 to drive each of the plurality of transistors. The pixel sharing unit 539 is connected to the vertical signal lines (column read lines) 543. Pixel signals are read out from each of the pixels 541A, 541B, 541C, and 541D included in the pixel sharing unit 539 via the vertical signal lines (column read lines) 543.

The row driving unit 520 includes a row address control unit that decides the positions of rows for pixel driving, for example, which is to say in other words, includes a row decoder unit and a row driving circuit unit for generating signals to drive the pixels 541A, 541B, 541C, and 541D.

The column signal processing unit 550 is connected to the vertical signal lines 543, for example, and is provided with a load circuit unit that makes up the pixels 541A, 541B, 541C, and 541D (pixel sharing unit 539) and a source-follower circuit. The column signal processing unit 550 may have an amplifying circuit unit that amplifies signals read out from the pixel sharing unit 539 via the vertical signal lines 543. The column signal processing unit 550 may have a noise processing unit. In the noise processing unit, noise level of the system is removed from signals read out from the pixel sharing unit 539 as the result of photoelectric conversion, for example.

The column signal processing unit 550 has an analog-digital converter (ADC), for example. In the analog digital converter, signals read out from the pixel sharing unit 539 or analog signals subjected to the above noise processing are converted into digital signals. The ADC includes a comparator unit and a counter unit, for example. In the comparator unit, analog signals that are the object of conversion and reference signals that are the object of comparison are compared. In the counter unit, the time until comparison results at the comparator unit are inverted is measured. The column signal processing unit 550 may include a horizontal scan circuit unit that performs control of scanning read columns.

The timing control unit 530 supplies signals to control timing to the row driving unit 520 and the column signal processing unit 550, on the basis of reference clock signals and timing control signals input to the device.

The image signal processing unit 560 is a circuit that performs various types of signal processing on data obtained as a results of photoelectric conversion, in other words, on data obtained as a result of image capturing operations at the image capturing device 1. The image signal processing unit 560 includes an image signal processing circuit and a data holding unit, for example. The image signal processing unit 560 may include a processor unit.

An example of signal processing executed at the image signal processing unit 560 is tone curve correction processing in which captured image data that has been subjected to AD conversion is imparted with more gradients in a case of being data in which a dark subject has been shot, and gradients are reduced in a case of being data in which a bright subject has been shot. In this case, tone curve characteristics data is preferably stored in the data holding unit of the image signal processing unit 560 in advance, with regard to what sort of tone curve to base correction of gradients of captured data on.

The input unit 510A is for inputting the above-described reference clock signals, timing control signals, characteristics data, and so forth, for example, from an external device to the image capturing device 1. Timing control signals are, for example, vertical synchronizing signals and horizontal synchronizing signals, and so forth. Characteristics data is to be stored in the data holding unit of the image signal processing unit 560, for example. The input unit 510A includes, for example, an input terminal 511, an input circuit unit 512, an input amplitude changing unit 513, an input data conversion circuit unit 514, and a power source supply unit (omitted from illustration).

The input terminal 511 is an external terminal for inputting data. The input circuit unit 512 is for taking signals input to the input terminal 511 into the image capturing device 1. The input amplitude changing unit 513 changes the amplitude of signals taken in by the input circuit unit 512 into an amplitude that is more readily used within the image capturing device 1. The input data conversion circuit unit 514 changes the array of data columns of the input data. The input data conversion circuit unit 514 is configured of a serial-to-parallel conversion circuit, for example. The serial signals received as input data are converted to parallel signals in this serial-to-parallel conversion circuit. Note that in the input unit 510A, the input amplitude changing unit 513 and the input data conversion circuit unit 514 may be omitted. The power source supply unit supplies power source set to various types of voltages necessary within the image capturing device 1, on the basis of power source externally supplied to the image capturing device 1.

The input unit 510A may be provided with a memory interface circuit that receives data from an eternal memory device, when the image capturing device 1 is connected to the external memory device. Examples of the external memory device include flash memory, SRAM, DRAM, and so forth.

The output unit 510B externally outputs image data from the device. This image data is, for example, image data shot by the image capturing device 1, and image data subjected to signal processing by the image signal processing unit 560, and so forth. The output unit 510B includes, for example, an output data conversion circuit unit 515, an output amplitude changing unit 516, an output circuit unit 517, and an output terminal 518.

The output data conversion circuit unit 515 is configured of a parallel-to-serial conversion circuit, for example, and parallel signals used within the image capturing device 1 are converted into serial signals at the output data conversion circuit unit 515. The output amplitude changing unit 516 changes the amplitude of signals used within the image capturing device 1. The signals of which the amplitude has been changed is more readily used at an external device externally connected to the image capturing device 1. The output circuit unit 517 is a circuit for outputting data within the image capturing device 1 to the outside of the device, and the output circuit unit 517 drives wiring outside of the image capturing device 1 that is connected to the output terminal 518. Data is output from the image capturing device 1 to an external device by the output terminal 518. The output data conversion circuit unit 515 and the output amplitude changing unit 516 may be omitted from the output unit 510B.

The output unit 510B may be provided with a memory interface circuit that outputs data to an external memory device when the image capturing device 1 is connected to the external memory device. Examples of the external memory device include flash memory, SRAM, DRAM, and so forth.

[General Configuration of Image Capturing Device 1]

Figure 63:
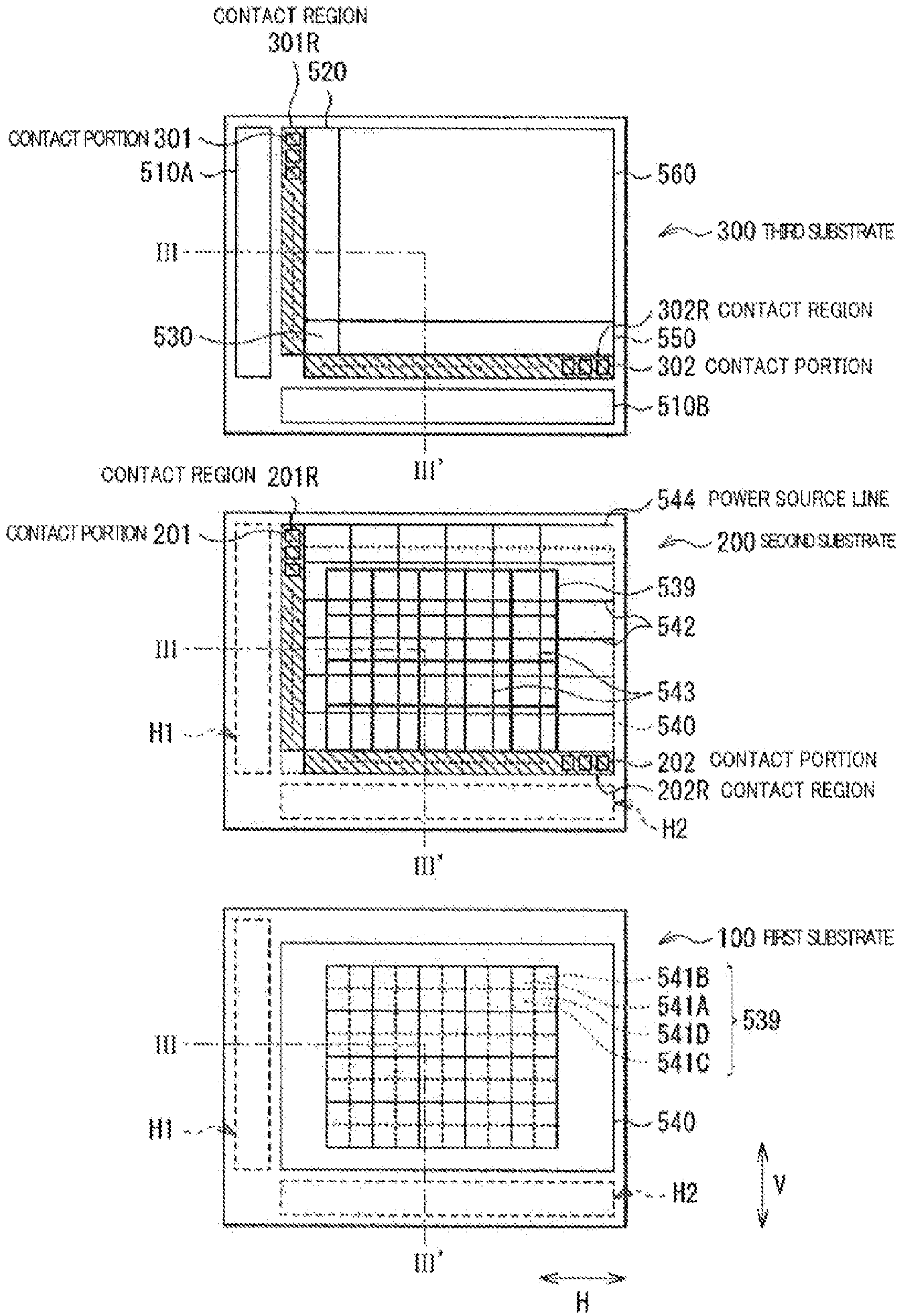
FIG. 63 is a plan schematic view representing a schematic configuration of the image capturing device illustrated in FIG. 62.
Figure 64:
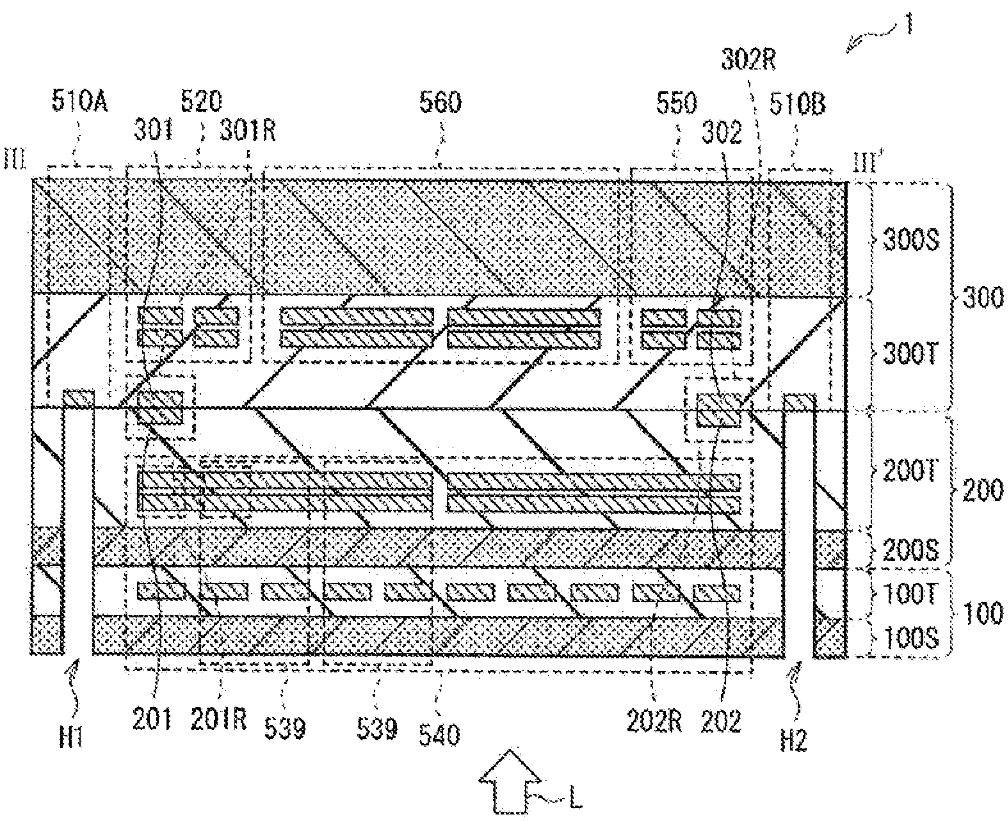
FIG. 64 is a schematic diagram representing a cross-sectional configuration, taken along line III-III' in FIG. 63.

FIG. 63 and FIG. 64 represent an example of a general configuration of the image capturing device 1). The image capturing device 1 has three substrates (first substrate 100, second substrate 200, and third substrate 300). FIG. 63 represents the planar configuration of each of the first substrate 100, the second substrate 200, and the third substrate 300, schematically, and FIG. 64 schematically represents the cross-sectional configuration of the first substrate 100, the second substrate 200, and the third substrate 300 stacked on each other. FIG. 64 corresponds to a cross-sectional configuration taken along line III-III' shown in FIG. 63. The image capturing device 1 is an image capturing device having a three-dimensional structure in which the three substrates (first substrate 100, second substrate 200, and third substrate 300) are configured applied to each other. The first substrate 100 includes a semiconductor layer 100S and a wiring layer 100T. The second substrate 200 includes a semiconductor layer 200S and a wiring layer 200T. The third substrate 300 includes a semiconductor layer 300S and a wiring layer 300T. Now, for the sake of convenience, the wiring and the interlayer insulating films on the surroundings thereof included in each substrate of the first substrate 100, the second substrate 200, and the third substrate 300, will collectively be referred to as the wiring layers (100T, 200T, 300T) provided on the respective substrates (first substrate 100, second substrate 200, third substrate 300). The first substrate 100, the second substrate 200, and the third substrate 300 are stacked in this order, and are placed in the order of the semiconductor layer 100S, the wiring layer 100T, the semiconductor layer 200S, the wiring layer 200T, the semiconductor layer 300S, and the wiring layer 300T in the stacking direction. The specific configuration of the first substrate 100, the second substrate 200, and the third substrate 300 will be described later. The arrow shown in FIG. 64 represents the direction of incidence of light L to the image capturing device 1. In the present specification, the light-incident side of the image capturing device 1 may be referred to as "bottom", "bottom side", or "lower side", and the opposite side from the incident-light side as "top", "top side", or "upper side", for the sake of convenience, in the following cross-sectional views. Also, with regard to substrates provided with a semiconductor layer and a wiring layer, the side with the wiring layer may be referred to as the front face and the side with the semiconductor layer as the rear face in the present specification, for the sake of convenience. Note that the description of the specification is not limited to the above ways of reference. The image capturing device 1 is, for example, a back-illuminated image capturing device in which light enters from the rear face side of the first substrate 100 that has photodiodes.

The pixel array unit 540 and the pixel sharing unit 539 included in the pixel array unit 540 are configured using both the first substrate 100 and the second substrate 200. The plurality of pixels 541A, 541B, 541C, and 541D that the pixel sharing unit 539 has are provided to the first substrate 100. Each pixel 541 has a photodiode (later-described photodiode PD) and a transfer transistor (later-described transfer transistor TR). The pixel circuit that the pixel sharing unit 539 has (later-described pixel circuit 210) is provided on the second substrate 200. The pixel circuit reads out pixel signals transferred from the photodiodes of each of the pixels 541A, 541B, 541C, and 541D via the transfer transistor, or resets the photodiodes. The second substrate 200 has, in addition to such pixel circuits, a plurality of row drive signal lines 542 extending in the row direction and a plurality of vertical signal lines 543 extending in the column direction. The second substrate 200 further has power source lines 544 that extend in the row direction. The third substrate 300 has, for example, the input unit 510A, the row driving unit 520, the timing control unit 530, the column signal processing unit 550, the image signal processing unit 560, and the output unit 510B. The row driving unit 520 is provided in a region in which a portion thereof overlaps the pixel array unit 540 in the stacking direction of the first substrate 100, the second substrate 200, and the third substrate 300 (hereinafter referred to simply as stacking direction), for example. More specifically, the row driving unit 520 is provided in a region that overlaps near the end portion of the pixel array unit 540 in the H direction, in the stacking direction (FIG. 63). The column signal processing unit 550 is provided in a region in which a portion thereof overlaps the pixel array unit 540 in the stacking direction, for example. More specifically, the column signal processing unit 550 is provided in a region that overlaps near the end portion of the pixel array unit 540 in the V direction, in the stacking direction (FIG. 63). Although omitted from illustration, the input unit 510A and the output unit 510B may be placed at a portion other than the third substrate 300, and may be placed on the second substrate 200, for example. Alternatively, the input unit 510A and the output unit 510B may be provided on the rear face (light-incident face) side of the first substrate 100. Note that the pixel circuit provided on the second substrate 200 may be alternatively referred to as pixel transistor circuit, pixel transistor group, pixel transistors, pixel read circuit, or read circuit. The term pixel circuit is used in the present specification.

The first substrate 100 and the second substrate 200 are electrically connected by through electrodes (through electrodes 120E and 121E in later-described FIG. 67), for example. The second substrate 200 and the third substrate 300 are electrically connected via contact portions 201, 202, 301, and 302, for example. The contact portions 201 and 202 are provided to the second substrate 200, and the contact portions 301 and 302 are provided to the third substrate 300. The contact portion 201 of the second substrate 200 comes into contact with the contact portion 301 of the third substrate 300, and the contact portion 202 of the second substrate 200 comes into contact with the contact portion 302 of the third substrate 300. The second substrate 200 has a contact region 201R where a plurality of contact portions 201 is provided, and a contact region 202R where a plurality of contact portions 202 is provided. The third substrate 300 has a contact region 301R where a plurality of contact portions 301 is provided, and a contact region 302R where a plurality of contact portions 302 is provided. The contact regions 201R and 301R are provided between the pixel array unit 540 and the row driving unit 520 in the stacking direction (FIG. 64). In other words, the contact regions 201R and 301R are provided in regions where the row driving unit 520 (third substrate 300) and the pixel array unit 540 (second substrate 200) overlap in the stacking direction, or in a proximal region thereof, for example. The contact regions 201R and 301R are placed at an end portion in the H direction of such a region, for example (FIG. 63). For example, on the third substrate 300, the contact region 301R is provided at a portion of the row driving unit 520, specifically at a position overlapping the H-direction end portion of the row driving unit 520 (FIG. 63, FIG. 64). The contact portions 201 and 301 are for connecting the row driving unit 520 provided to the third substrate 300 and the row drive signal lines 542 provided to the second substrate 200, for example. The contact portions 201 and 301 may connect the input unit 510A provided to the third substrate 300 with the power source lines 544 and reference potential lines (later described reference potential lines VSS), for example. The contact regions 202R and 302R are provided between the pixel array unit 540 and the column signal processing unit 550 in the stacking direction (FIG. 64). In other words, the contact regions 202R and 302R are provided in regions where the column signal processing unit 550 (third substrate 300) and the pixel array unit 540 (second substrate 200) overlap in the stacking direction, or in a proximal region, for example. The contact regions 202R and 302R are placed at an end portion in the V direction of such a region, for example (FIG. 63). For example, on the third substrate 300, the contact region 301R is provided at a portion of the column signal processing unit 550, specifically at a position overlapping the V-direction end portion of the column signal processing unit 550 (FIG. 63, FIG. 64). The contact portions 202 and 302 are for connecting pixel signals (signals corresponding to the amount of charge generated at the photodiodes as a result of photoelectric conversion) output from each of the plurality of pixel sharing units 539 that the pixel array unit 540 has, for example, to the column signal processing unit 550 provided on the third substrate 300. An arrangement is made in which the pixel signals are sent from the second substrate 200 to the third substrate 300.

FIG. 64 is an example of a cross-sectional view of the image capturing device 1, as described above. The first substrate 100, the second substrate 200, and the third substrate 300 are electrically connected via the wiring layers 100T, 200T, and 300T. For example, the image capturing device 1 has electric connecting portions that electrically connect the second substrate 200 and the third substrate 300. Specifically, the contact portions 201, 202, 301, and 302 are formed of electrodes formed of an electroconductive material. The electroconductive material is formed of metal materials such as, for example, copper (Cu), aluminum (Al), gold (Au), and so forth. The contact regions 201R, 202R, 301R, and 302R electrically connect the second substrate and the third substrate by directly joining wiring formed as electrodes with each other, for example, thereby enabling input and/or output of signals between the second substrate 200 and the third substrate 300.

The electric connecting portions that electrically connect the second substrate 200 and the third substrate 300 may be provided at desired positions. For example, the electric connecting portions may be provided at regions overlapping with the pixel array unit 540 in the stacking direction, as described regarding the contact regions 201R, 202R, 301R, and 302R in FIG. 64. Alternatively, the electric connecting portions may be provided at regions not overlapping with the pixel array unit 540 in the stacking direction. Specifically, the electric connecting portions may be provided at regions overlapping a peripheral portion, placed on the outer side of the pixel array unit 540, in the stacking direction.

Connecting hole portions H1 and H2, for example, are provided to the first substrate 100 and the second substrate 200. The connecting hole portions H1 and H2 pass through the first substrate 100 and the second substrate 200 (FIG. 64). The connecting hole portions H1 and H2 are provided on the outer side of the pixel array unit 540 (or the portion overlapping the pixel array unit 540) (FIG. 63). For example, the connecting hole portion H1 is placed on the outer side of the pixel array unit 540 in the H direction, and the connecting hole portion H2 is placed on the outer side of the pixel array unit 540 in the V direction. For example, the connecting hole portion H1 reaches the input unit 510A provided on the third substrate 300, and the connecting hole portion H2 reaches the output unit 510B provided on the third substrate 300. The connecting hole portions H1 and 112 may be hollow, or may contain an electroconductive material in at least part thereof. For example, there is a configuration in which a bonding wire is connected to an electrode formed as the input unit 510A and/or the output unit 510B.

Alternatively, there is a configuration in which an electrode formed as the input unit 510A and/or the output unit 510B and an electroconductive material provided to the connecting hole portions H1 and 112 are connected. The electroconductive material provided to the connecting hole portions H1 and 112 may be embedded in part or all of the connecting hole portions H1 and 112, or the electroconductive material may be formed on the side walls of the connecting hole portions H1 and H2.

Note that although a configuration is shown in FIG. 64 in which the input unit 510A and the output unit 510B are provided to the third substrate 300, this is not limiting. For example, the input unit 510A and/or the output unit 510B may be provided on the second substrate 200, by sending signals of the third substrate 300 to the second substrate 200 via the wiring layers 200T and 300T. In the same way, the input unit 510A and/or the output unit 510B may be provided on the first substrate 100, by sending signals of the second substrate 200 to the first substrate 1000 via the wiring layers 100T and 200T.

Figure 65:
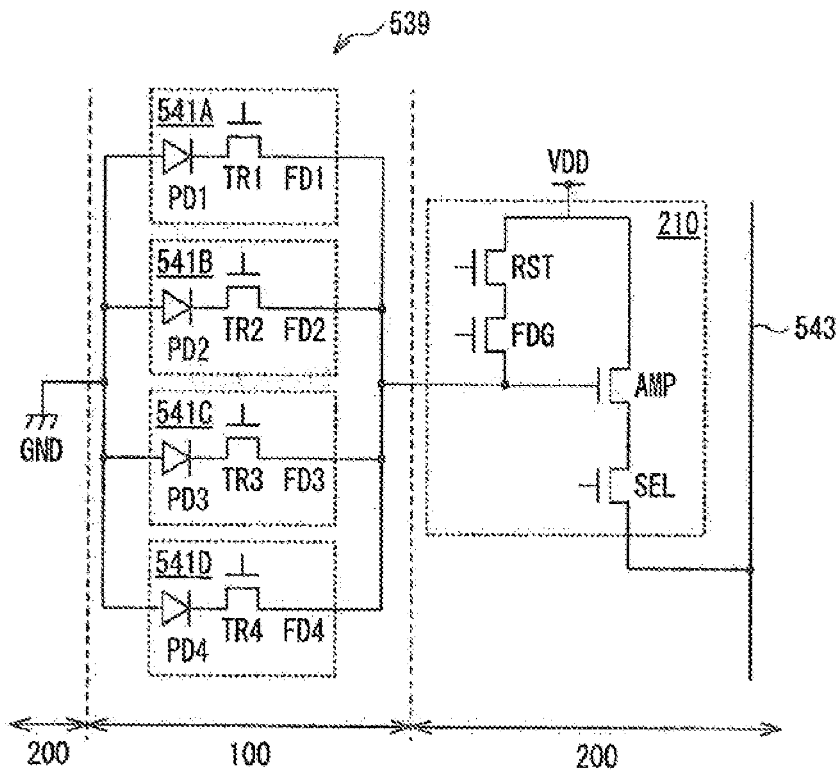
FIG. 65 is an equivalent circuit diagram of a pixel sharing unit illustrated in FIG. 62.

FIG. 65 is an equivalent circuit diagram representing an example of the configuration of the pixel sharing unit 539. The pixel sharing unit 539 includes a plurality of pixels 541 (four pixels 541 of pixels 541A, 541B, 541C, and 541D are represented in FIG. 65), one pixel circuit 210 connected to the plurality of pixels 541, and a vertical signal line 5433 connected to the pixel circuit 210. The pixel circuit 210 includes, for example, four transistors, which specifically are an amplifying transistor AMP, a selecting transistor SEL, a reset transistor RST, and an FD conversion gain switching transistor FD. The pixel sharing unit 539 performs time-division operation of one pixel circuit 210, as described above, thereby sequentially outputting pixel signals of the respective four pixels 541 (pixels 541A, 541B, 541C, and 541D) included in the pixel sharing unit 539 to the vertical signal line 543. The arrangement in which one pixel circuit 210 is connected to a plurality of pixels 541, and the pixel signals of the plurality of pixels 541 are output by the one pixel circuit 210 by time-division, is referred to as "a plurality of pixels 541 sharing one pixel circuit 210".

The pixels 541A, 541B, 541C, and 541D each have the same components as each other. Hereinafter, in order to differentiate the components of the pixels 541A, 541B, 541C, and 541D from each other, identification No. 1 will be appended to the reference signs of the components of the pixel 541A, identification No. 2 to the reference signs of the components of the pixel 541B, identification No. 3 to the reference signs of the components of the pixel 541C, and identification No. 4 to the reference signs of the components of the pixel 541D. In a case where there is no need to differentiate among the components of the pixels 541A, 541B, 541C, and 541D, appending identification Nos. to the reference signs of the components of the pixels 541A, 541B, 541C, and 541D will be omitted.

The pixels 541A, 541B, 541C, and 541D each have, for example, a photodiode PD, a transfer transistor TR electrically connected to the photodiode PD, and a floating diffusion FD electrically connected to the transfer transistor TR. The cathode of the photodiode PD (PD1, PD2, PD3, PD4) is electrically connected to the source of the transfer transistor TR, and the anode is electrically connected to a reference potential line (e.g., a ground). The photodiode PD performs photoelectric conversion of incident light, and generates charges in accordance with the quantity of light received. The transfer transistor TR (transfer transistor TR1, TR2, TR3, TR4) is, for example, an n-type CMOS (Complementary Metal Oxide Semiconductor) transistor. The drain of the transfer transistor TR is electrically connected to the floating diffusion FD, and the gate is electrically connected to a drive signal line. This drive signal line is part of the plurality of row drive signal lines 542 (see FIG. 62) connected to one pixel sharing unit 539. The transfer transistor TR transfers charges generated at the photodiode PD to the floating diffusion FD. The floating diffusion FD (floating diffusion FD1, FD2, FD3, and FD4) is an n-type diffusion layer region formed in a p-type semiconductor layer. The floating diffusion FD is charge holding means that temporarily holds charges transferred from the photodiode PD, and also is charge-to-voltage converting means that generate voltage in accordance with the amount of the charges.

The four floating diffusions FD (floating diffusion FD1, FD2, FD3, and FD4) included in one pixel sharing unit 539 are electrically connected to each other, and are electrically connected to the gate of the amplifying transistor AMP and the source of the FD conversion gain switching transistor FDG. The drain of the FD conversion gain switching transistor FDG is connected to the source of the reset transistor RST, and the gate of the FD conversion gain switching transistor FDG is connected to a drive signal line. This drive signal line is part of the plurality of row drive signal lines 542 connected to one pixel sharing unit 539. The drain of the reset transistor RST is connected to a power source line VDD, and the gate of the reset transistor RST is connected to a drive signal line. This drive signal line is part of the plurality of row drive signal lines 542 connected to one pixel sharing unit 539. The gate of the amplifying transistor AMP is connected to the floating diffusion FD, the drain of the amplifying transistor AMP is connected to the power source line VDD, and the source of the amplifying transistor AMP is connected to the drain of the selecting transistor SEL. The source of the selecting transistor SEL is connected to the vertical signal line 543, and the gate of the selecting transistor SEL is connected to a drive signal line. This drive signal line is part of the plurality of row drive signal lines 542 connected to one pixel sharing unit 539.

When the transfer transistor TR goes to an on state, the transfer transistor TR transfers the charge in the photodiode PD to the floating diffusion FD. The gate of the transfer transistor TR (transfer gate TG) includes a so-called vertical electrode, for example, and is provided extending from the front face of the semiconductor layer (the semiconductor layer 100S in the later-described FIG. 67) to a depth reaching the PD, as illustrated in the later-described FIG. 67. The reset transistor RST resets the potential of the floating diffusion FD to a predetermined potential. When the reset transistor RST goes to an on state, the potential of the floating diffusion FD is reset to the potential of the power source line VDD. The selecting transistor SEL controls the output timing of pixel signals from the pixel circuit 210. The amplifying transistor AMP generates signals of a voltage corresponding to the level of the charge held in the floating diffusion FD, as pixel signals. The amplifying transistor AMP is connected to the vertical signal line 543 via the selecting transistor SEL. The amplifying transistor AMP has a source-follower configuration along with a load circuit unit (see FIG. 62) connected to the vertical signal line 543, in the column signal processing unit 550. When the selecting transistor SEL goes to an on state, the amplifying transistor AMP outputs the voltage of the floating diffusion FD to the column signal processing unit 550 via the vertical signal line 543. The reset transistor RST, the amplifying transistor AMP, and the selecting transistor SEL are, for example, N-type CMOS transistors.

The FD conversion gain switching transistor FDG is used for changing the gain of the charge-to voltage conversion at the floating diffusion FD. Generally, pixel signals are small when shooting in dark locations. Based on Q=CV, if the capacitance (FD capacitance C) of the floating diffusion FD is large when performing charge-to-voltage conversion, the V at the time of converting to voltage at the amplifying transistor AMP will be small. Conversely, in bright locations, the pixel signal is large, and if the FD capacitance C is large, the floating diffusion FD cannot receive the whole charge from the photodiode PD. Further, there is a need for the FD capacitance C to be large so that the V at the time of converting into voltage at the amplifying transistor AMP is not too large (i.e., becomes smaller). With this in view, when the FD conversion gain switching transistor FDG is turned on, the gate capacitance increases by an amount equivalent to that of the FD conversion gain switching transistor FDG, and accordingly the entire FD capacitance C increases. Conversely, when the FD conversion gain switching transistor FDG is turned off, the entire FD capacitance C decreases. Thus, the FD capacitance C can be varied by switching the FD conversion gain switching transistor FDG on and off, and the conversion efficiency can be switched. The FD conversion gain switching transistor FDG is, for example, a N-type CMOS transistor.

Note that a configuration may be made where no FD conversion gain switching transistor FDG is provided. At this time, for example, the pixel circuit 210 is configured of the three transistors of the amplifying transistor AMP, the selecting transistor SEL, and the reset transistor RST, for example. The pixel circuit 210 has at least one of pixel transistors such as the amplifying transistor AMP, the selecting transistor SEL, the reset transistor RST, and the FD conversion gain switching transistor FDG, for example.

The selecting transistor SEL may be provided between the power source line VDD and the amplifying transistor AMP. In this case, the drain of the reset transistor RST is electrically connected to the power source line VDD and the drain of the selecting transistor SEL. The source of the selecting transistor SEL is electrically connected to the drain of the amplifying transistor AMP, and the gate of the selecting transistor SEL is electrically connected to the row drive signal line 542 (see FIG. 62). The source of the amplifying transistor AMP (the output end of the pixel circuit 210) is electrically connected to the vertical signal line 543, and the gate of the amplifying transistor AMP is electrically connected to the source of the reset transistor RST. Although omitted from illustration, the number of pixels 541 that share one pixel circuit 210 may be other than four. For example, two or eight pixels 541 may share one pixel circuit 210.

Figure 66:
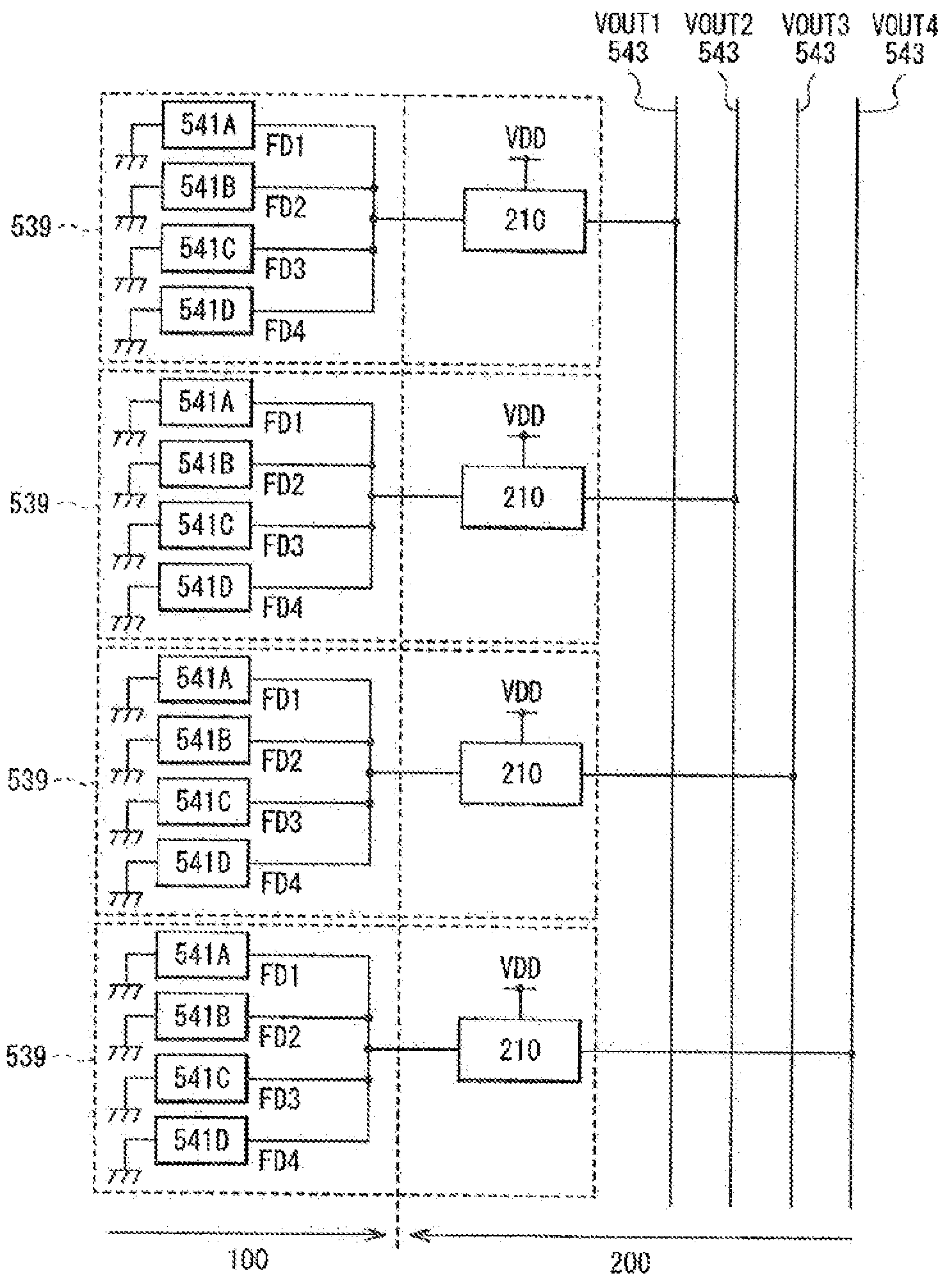
FIG. 66 is a diagram representing an example of a connection arrangement of a plurality of pixel sharing units and a plurality of vertical signals lines.

FIG. 66 represents an example of a connection arrangement of a plurality of pixel sharing units 539 and vertical signal lines 543. For example, four pixel sharing units 539 arranged in the column direction are divided into four groups, and a vertical signal line 543 is connected to each of these four groups. An example is shown in FIG. 66 in which each of the four groups has one pixel sharing unit 539, to simplify description, but each of the four groups may have a plurality of pixel sharing units 539. Thus, in the image capturing device 1, a plurality of pixel sharing units 539 arrayed in the column direction may be divided into groups including one or a plurality of pixel sharing units 539. An arrangement may be made in which, for example, a vertical signal line 543 and the column signal processing unit 550 is connected to each of these groups, and is capable of reading out pixel signals from each of the groups at the same time. Alternatively, in the image capturing device 1, one vertical signal line 543 may be connected to a plurality of pixel sharing units 539 arrayed in the column direction. At this time, pixel signals are sequentially read out by time division from the plurality of pixel sharing units 539 connected to the one vertical signal line 543.

[Specific Configuration of Image Capturing Device 1]

Figure 67:
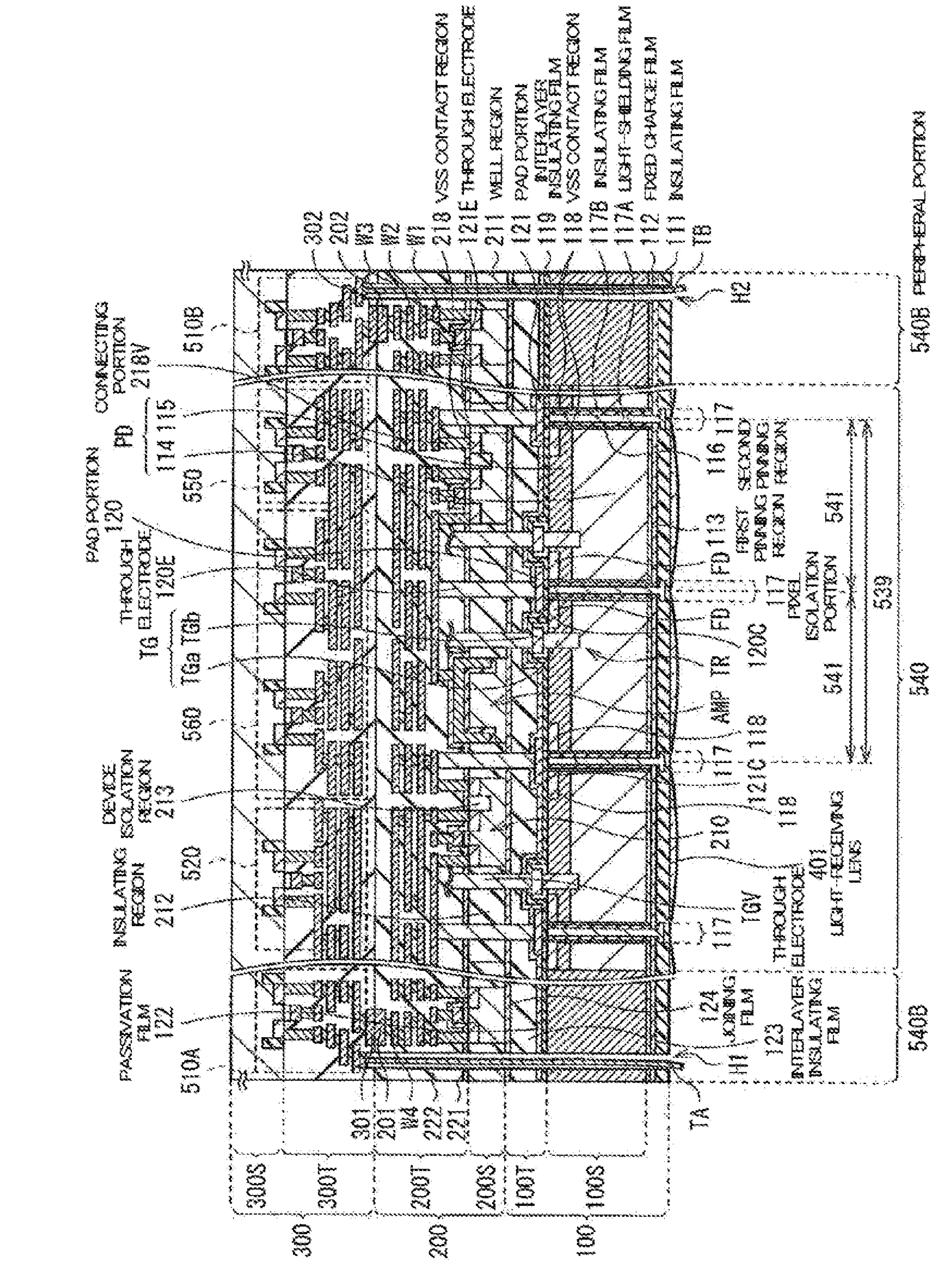
FIG. 67 is a cross-sectional schematic view representing an example of a specific configuration of the image capturing device illustrated in FIG. 64.

FIG. 67 represents an example of the cross-sectional configuration of the image capturing device 1 in the perpendicular direction as to the main faces of the first substrate 100, the second substrate 100, and the third substrate 300. FIG. 67 is a schematic representation to facilitate the positional relation among the components, and may be different from an actual cross-section. In the image capturing device 1, the first substrate 100, the second substrate 200, and the third substrate 300 are stacked in this order. The image capturing device 1 further has light-receiving lenses 401 on the rear face side (light-incident face side) of the first substrate 100. A color filter layer (omitted from illustration) may be provided between the light-receiving lenses 401 and the first substrate 100. The light-receiving lenses 401 are provided for each of the pixels 541A, 541B, 541C, and 541D, for example. The image capturing device 1 is a back-illuminated image capturing device, for example. The image capturing device 1 has the pixel array unit 540 placed in the middle portion, and a peripheral portion 540B placed on the outside of the pixel array unit 540.

The first substrate 100 has an insulating film 111, a fixed charge film 112, and the semiconductor layer 100S and the wiring layer 100T, in order from the light-receiving lens 401 side. The semiconductor layer 100S is configured of a silicon substrate, for example. The semiconductor layer 100S has a p-well layer 115 at a portion of the front face (the wiring layer 100T-side face) and nearby thereto, for example, and has an n-type semiconductor region 114 at another region (region deeper than the p-well layer 115). For example, a p-n junction type photodiode PD is configured from the n-type semiconductor region 114 and the p-well layer 115. The p-well layer 115 is a p-type semiconductor region.

Figure 68A:
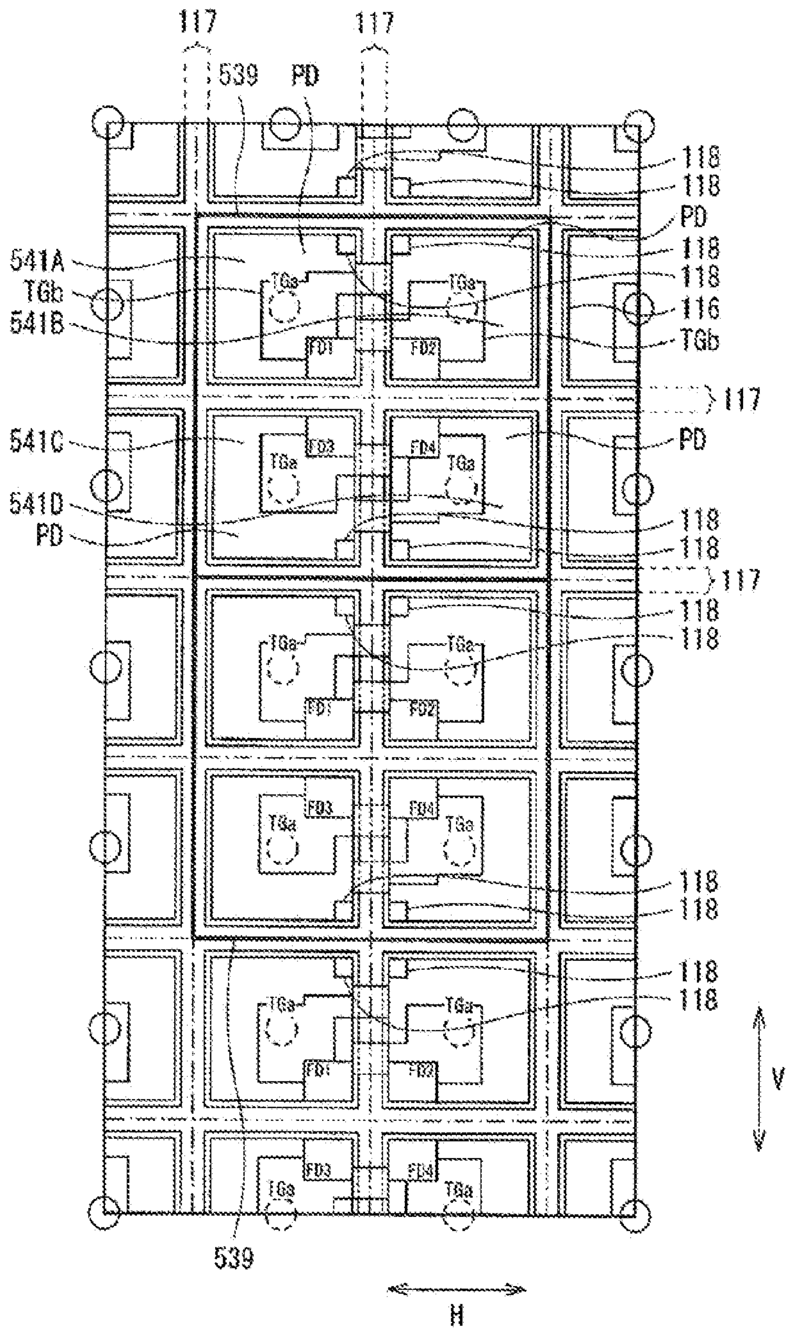
FIG. 68A is a schematic diagram representing an example of a planar configuration of principal portions of a first substrate illustrated in FIG. 67.

FIG. 68A represents an example of the planar configuration of the first substrate 100. FIG. 68A primarily represents the planar configuration of pixel isolation portions 117, photodiodes PD, floating diffusions FD, VSS contact regions 118, and transfer transistors TR of the first substrate 100. The configuration of the first substrate 100 will be described by way of FIG. 68A, along with FIG. 67.

The floating diffusions FD and the VSS contact regions 118 are provided near the front face of the semiconductor layer 100S. The floating diffusions FD are configured of an n-type semiconductor region provided within the p-well layer 115. The respective floating diffusions FD of the pixels 541A, 541B, 541C, and 541D (floating diffusion FD1, FD2, FD3, and FD4) are provided near to each other at the middle portion of the pixel sharing unit 539, for example (FIG. 68A). The four floating diffusions (floating diffusion FD1, FD2, FD3, and FD4) included in the pixel sharing unit 539 are electrically connected to each other within the first substrate 100 (more specifically, within the wiring layer 100T) via electrical connecting means (later-described pad portions 120), which will be described later in detail. Further, the floating diffusions FD are connected from the first substrate 100 to the second substrate 200 (more specifically, from the wiring layer 100T to the wiring layer 200T) via electrical means (later-described through electrodes 120E). In the second substrate 200 (more specifically, within the wiring layer 200T), the floating diffusion FD is electrically connected to the gate of the amplifying transistor AMP and the source of the FD conversion gain switching transistor FDG by the electrical means.

The VSS contact region 118 is a region electrically connected to the reference potential lines VSS and is placed distanced from the floating diffusion FD. For example, in the pixels 541A, 541B, 541C, and 541D, the floating diffusion FD is placed at one end of each pixel in the V direction, and the VSS contact region 118 is placed at the other end (FIG. 68A). The VSS contact region 118 is configured of a p-type semiconductor region, for example. The VSS contact region 118 is connected to a ground potential or a fixed potential, for example. Accordingly, reference potential is supplied to the semiconductor layer 100S.

The transfer transistors TR are provided to the first substrate 100, as well as the photodiodes PD, the floating diffusions FD, and the VSS contact regions 118. The photodiodes PD, the floating diffusions FD, the VSS contact regions 118, and the transfer transistors TR are provided to each of the pixels 541A, 541B, 541C, and 541D. The transfer transistors TR are provided on the front face side of the semiconductor layer 100S (the opposite side from the light-incident face side, the second substrate 200 side). The transfer transistors TR have the transfer gate TG. The transfer gate TG includes a horizontal portion TGb facing the front face of the semiconductor layer 100S, and a vertical portion TGa provided within the semiconductor layer 100S, for example. The vertical portion TGa extends in the thickness direction of the semiconductor layer 100S. One end of the vertical portion TGa is in contact with the horizontal portion TGb, and the other end is provided within the n-type semiconductor region 114. By configuring the transfer transistor TR of a vertical transistor in this way, defective transfer of pixel signals occurs less readily, and the reading efficiency of pixel signals can be improved.

The horizontal portion TGb of the transfer gate TG extends from a position facing the vertical portion TGa toward the middle portion of the pixel sharing unit 539 in the H direction, for example (FIG. 68A). Accordingly, the position in the H direction of the through electrode (later-described through electrode TGV) that reaches the transfer gate TG can be brought nearer in the H direction to the through electrodes (later-described through electrodes 120E and 121E) connected to the floating diffusion FD and the VSS contact region 118. For example, the plurality of pixel sharing units 539 provided to the first substrate 100 have the same configuration as each other (FIG. 68A).

Figure 68B:
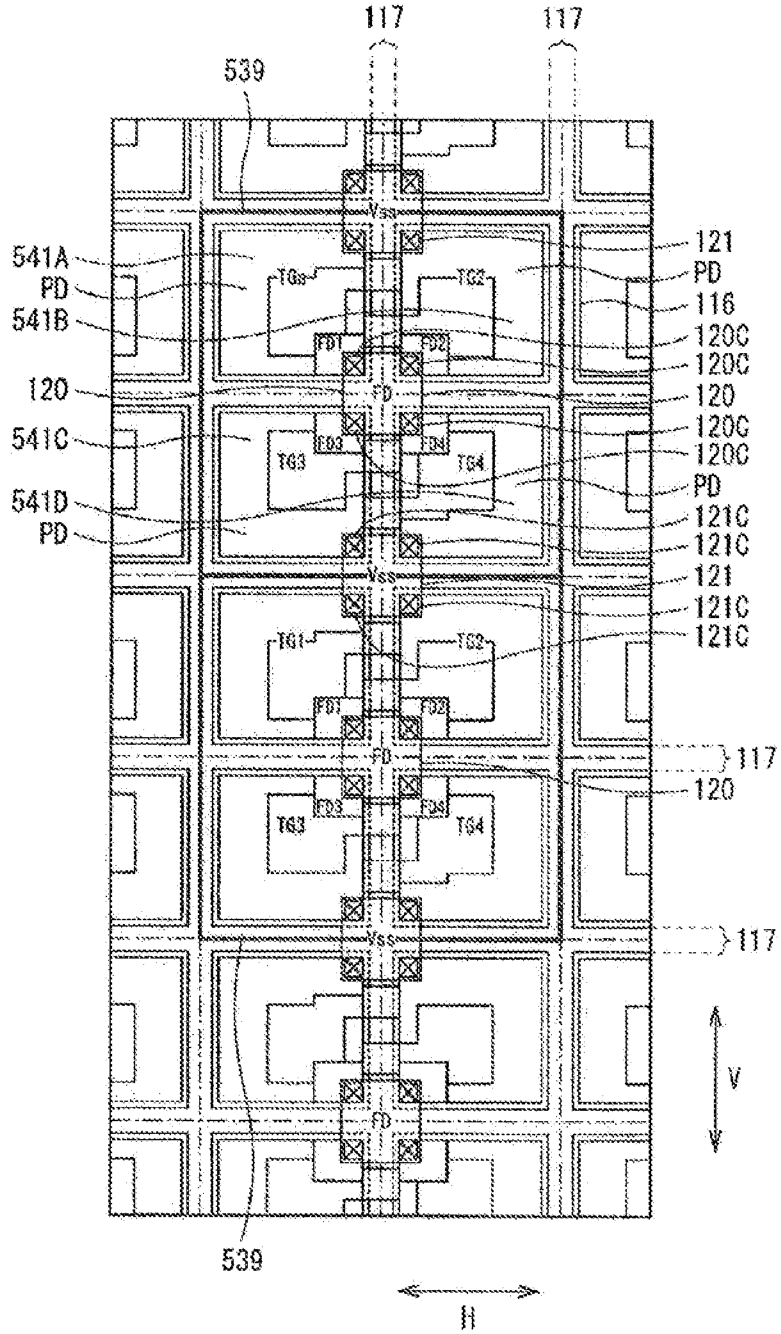
FIG. 68B is a schematic diagram representing a planar configuration of pad portions along with principal portions of the first substrate illustrated in FIG. 68A.

The semiconductor layer 100S is provided with pixel isolation portions 117 that isolate the pixels 541A, 541B, 541C, and 541D from each other. The pixel isolation portion 117 are formed extending in the normal direction of the semiconductor layer 100S (direction perpendicular to the front face of the semiconductor layer 100S). The pixel isolation portions 117 are provided so as to section off the pixels 541A, 541B, 541C, and 541D from each other, and have a grid-like planar form, for example (FIG. 68A, FIG. 68B). The pixel isolation portions 117 isolate the pixels 541A, 541B, 541C, and 541D electrically and optically from each other, for example. The pixel isolation portions 117 include a light-shielding film 117A and an insulating film 117B, for example. Tungsten (W) or the like, for example, is used for the light-shielding film 117A. The insulating film 117B is provided between the light-shielding film 117A and the p-well layer 115 or the n-type semiconductor region 114. The insulating film 117B is configured from silicon oxide (SiO), for example. The pixel isolation portions 117 have an FTI (Full Trench Isolation) structure, and pass completely through the semiconductor layer 100S. The pixel isolation portions 117 are not limited to the FTI structure completely passing through the semiconductor layer 100S, although this is not illustrated. For example, the pixel isolation portions 117 may have a DTI (Deep Trench Isolation) structure that does not completely pass through the semiconductor layer 100S. The pixel isolation portions 117 extend in the normal direction of the semiconductor layer 100S, and are formed in a partial region of the semiconductor layer 100S.

A first pinning region 113 and a second pinning region 116, for example, are provided to the semiconductor layer 100S. The first pinning region 113 is provided near the rear face of the semiconductor layer 100S, and is placed between the n-type semiconductor region 114 and the fixed charge film 112. The second pinning region 116 is provided to the side faces of the pixel isolation portions 117, specifically between the pixel isolation portions 117 and the p-well layer 115 or the n-type semiconductor region 114. The first pinning region 113 and the second pinning region 116 are configured of p-type semiconductor regions, for example.

The fixed charge film 112 that has a negative fixed charge is provided between the semiconductor layer 100S and the insulating film 111. The first pinning region 113, which is a hole accumulation layer, is formed on the interface of the light-receiving face (rear face) side of the semiconductor layer 100S by the electric field induced by the fixed charge film 112. Accordingly, occurrence of dark current due to the interface state at the light-receiving face side of the semiconductor layer 100S can be suppressed. The fixed charge film 112 is formed of an insulating film having a negative fixed charge, for example. Examples of insulating film materials having such a negative fixed charge include hafnium oxide, zircon oxide, aluminum oxide, titanium oxide, and tantalum oxide.

The light-shielding film 117A is provided between the fixed charge film 112 and the insulating film 111. This light-shielding film 117A may be provided continuously from the light-shielding film 117A making up the pixel isolation portions 117. This light-shielding film 117A between the fixed charge film 112 and the insulating film 111 is selectively provided at positions facing the pixel isolation portions 117 within the semiconductor layer 100S, for example. The insulating film 111 is provided so as to cover this light-shielding film 117A. The insulating film 111 is configured of silicon oxide, for example.

The wiring layer 100T provided between the semiconductor layer 100S and the second substrate 200 has an interlayer insulating film 119, pad portions 120 and 121, a passivation film 122, an interlayer insulating film 123, and a joining film 124 in this order from the semiconductor layer 100S side. The horizontal portion TGb of the transfer gate TG is provided in this wiring layer 100T, for example. The interlayer insulating film 119 is provided over the entire front face of the semiconductor layer 100S, and is in contact with the semiconductor layer 100S. The interlayer insulating film 119 is configured of a silicon oxide film, for example. Note that the configuration of the wiring layer 100T is not limited to the above-described configuration, and it is sufficient to be a configuration that has wiring and an insulating film.

FIG. 68B illustrates, along with the planar configuration illustrated in FIG. 68A, the configuration of the pad portions 120 and 121. The pad portions 120 and 121 are provided at selective regions on the interlayer insulating film 119. The pad portions 120 are for connecting the floating diffusions FD (floating diffusions FD1, FD2, FD3, and FD4) of each of the pixels 541A, 541B, 541C, and 541D to each other. The pad portions 120 are placed to each pixel sharing unit 539, at the middle portion of the pixel sharing unit 539 in planar view (FIG. 68B), for example. The pad portions 120 are provided straddling the pixel isolation portion 117, and are placed superimposed on at least part of each of the floating diffusions FD1, FD2, FD3, and FD4 (FIG. 67, FIG. 68B). Specifically, the pad portions 120 are formed in regions overlapping at least part of each of the plurality of floating diffusions FD (floating diffusions FD1, FD2, FD3, and FD4) that share the pixel circuit 210, and at least part of the pixel isolation portion 117 formed between the plurality of photodiodes PD (photodiodes PD1, PD2, PD3, PD4) that share the pixel circuit 210, as viewed in a direction perpendicular to the front face of the semiconductor layer 100S. Connecting vias 120C for electrically connecting the pad portions 120 and the floating diffusions FD1, FD2, FD3, and FD4 are provided in the interlayer insulating film 119. The connecting vias 120C are provided for each of the pixels 541A, 541B, 541C, and 541D. Part of the pad portions 120 are embedded in the connecting vias 120C, for example, thereby electrically connecting the pad portions 120 and the floating diffusions FD1, FD2, FD3, and FD4.

The pad portions 121 are for connecting the plurality of VSS contact regions 118 to each other. For example, the VSS contact regions 118 provided in pixels 541C and 541D of one pixel sharing unit 539 and the VSS contact regions 118 provided in pixels 541A and 541B of another pixel sharing unit 539 that are adjacent in the V direction are electrically connected by the pad portion 121. The pad portions 121 are provided straddling the pixel isolation portion 117, for example, and are placed superimposed on at least part of each of the four VSS contact regions 118. Specifically, the pad portions 121 are formed in regions overlapping at least part of each of the plurality of VSS contact regions 118, and at least part of the pixel isolation portion 117 formed between the plurality of VSS contact region 118, as viewed in a direction perpendicular to the front face of the semiconductor layer 100S. Connecting vias 121C for electrically connecting the pad portions 121 and the VSS contact regions 118 are provided in the interlayer insulating film 119.

The connecting vias 121C are provided for each of the pixels 541A, 541B, 541C, and 541D. Part of the pad portions 121 are embedded in the connecting vias 121C, for example, thereby electrically connecting the pad portions 121 and the VSS contact regions 118. For example, the pad portions 120 and the pad portions 121 of each of the plurality of pixel sharing units 539 arrayed in the V direction are placed at substantially the same position in the H direction (FIG. 68B).

Providing the pad portions 120 allows the wiring for connecting from the floating diffusions FD to the pixel circuit 210 (e.g., gate electrodes of amplifying transistors AMP) to be reduced over the entire chip. In the same way, providing the pad portions 121 allows the wiring for supplying potential to the VSS contact regions 118 to be reduced over the entire chip. This enables reduction in the area of the entire chip, suppression in electrical interference among wiring in miniaturized pixels, and/or reduction in costs due to reduction in the number of parts, and so forth, to be realized.

The pad portions 120 and 121 can be provided at desired positions on the first substrate 100 and the second substrate 200. Specifically, the pad portions 120 and 121 can be provided on either of the wiring layer 100T and an insulating region 212 of the semiconductor layer 200S. When providing to the wiring layer 100T, the pad portions 120 and 121 may be in direct contact with the semiconductor layer 100S. Specifically, a configuration may be made where the pad portions 120 and 121 are directly connected to at least part of each of the floating diffusions FD and/or the VSS contact regions 118. Also, a configuration may be made where the connecting vias 120C and 121C are provided from each of the floating diffusions FD and/or the VSS contact regions 118 that are connected to the pad portions 120 and 121, and the pad portions 120 and 121 are provided at desired positions in the wiring layer 100T or the insulating region 2112 of the semiconductor layer 200S.

Particularly, when providing the pad portions 120 and 121 to the wiring layer 100T, wiring connected to the floating diffusions FD and/or the VSS contact regions 118 in the insulating region 212 of the semiconductor layer 200S can be reduced. Accordingly, in the second substrate 200 forming the pixel circuits 210, the area of the insulating region 212 for forming through wiring to connect from the floating diffusions FD to the pixel circuits 210 can be reduced. Accordingly, a larger area can be secured on the second substrate 200 for forming the pixel circuits 210.

Securing the area for the pixel circuits 210 allows the size of forming pixel transistors to be increased, which can contribute to improved image due to noise reduction and so forth.

In particular, in a case of using an FTI structure for the pixel isolation portions 117, the floating diffusions FD and/or the VSS contact regions 118 preferably are provided in the pixels 541, and accordingly the wiring for connecting the first substrate 100 and the second substrate 200 can be markedly reduced by using the configuration of the pad portions 120 and 121.

Also, the pad portions 120 to which the plurality of floating diffusions FD are connected, and the pad portions 121 to which the plurality of VSS contact regions 118 are connected, are alternately placed in a straight line in the V direction, as illustrated in FIG. 68B, for example. Also, the pad portions 120 and 121 are formed at positions surrounded by the plurality of photodiodes PD, the plurality of transfer gates TG, and the plurality of floating diffusions FD. Accordingly, devices other than the floating diffusions FD and the VSS contact regions 118 can be freely placed on the first substrate 100 on which a plurality of devices are formed, and the layout of the entire chip can be made to be more efficient. Also, symmetry in layout of the devices formed in the pixel sharing units 539 is secured, and variance in characteristic among the pixels 541 can be suppressed.

The pad portions 120 and 121 are configured of polysilicon (Poly Si), for example, and more specifically of doped polysilicon to which an impurity has been added. The pad portions 120 and 121 preferably are configured of an electroconductive material with high heat resistance properties, such as polysilicon, tungsten (W), titanium (Ti), and titanium nitride (TiN) and so forth. Accordingly, the pixel circuits 210 can be formed after applying the semiconductor layer 200S of the second substrate 200 to the first substrate 100. The reason for this will be described below. Note that in the following description, the method of forming the pixel circuits 210 after applying the first substrate 100 and the semiconductor layer 200S of the second substrate 200 to each other will be referred to as first manufacturing method.

Now, an arrangement is conceivable in which the pixel circuits 210 are formed on the second substrate 200, and thereafter applied to the first substrate 100 (hereinafter referred to as second manufacturing method). In this second manufacturing method, electrodes for electrical connection are formed in advance on each of the surface of the first substrate 100 (surface of the wiring layer 100T) and the surface of the second substrate 200 (surface of the wiring layer 200T). When the first substrate 100 and the second substrate 200 are applied to each other, the electrodes for electrical connection, formed on each of the surface of the first substrate 100 and the surface of the second substrate 200, come into contact with each other at the same time. Accordingly, electrical connection is formed between the wiring included in the first substrate 100 and the wiring included in the second substrate 200. Thus, according to the configuration of the image capturing device 1 using the second manufacturing method, appropriate processes can be used for manufacturing in accordance with the configurations of each of the first substrate 100 and the second substrate 200 for example, and a high-quality and high-performance image capturing device can be manufactured.

In such a second manufacturing method, when applying the first substrate 100 and the second substrate 200 to each other, positioning error may occur due to a manufacturing device for applying. Also, the first substrate 100 and the second substrate 200 have sizes in the order of several tens of centimeters in diameter, for example, and when applying the first substrate 100 and the second substrate 200 to each other, stretching and shrinking of the substrates may occur in microscopic regions in portions of the first substrate 100 and the second substrate 200. This stretching and shrinking of the substrates is due to the timing of the substrates coming into contact with each other being slightly mismatched. Such stretching and shrinking of the first substrate 100 and the second substrate 200 may lead to error in the positions of the electrodes for electrical connection formed on each of the surface of each of the first substrate 100 and the surface of the second substrate 200. In the second manufacturing method, measures are preferably taken so that the each of the electrodes of the first substrate 100 and the second substrate 200 are in contact even if such error occurs. Specifically, the size of the electrodes of at least one, preferably both, of the first substrate 100 and the second substrate 200 is enlarged, taking the above error into consideration. Accordingly, using the second manufacturing method results in the size of the electrodes formed on the surface of the first substrate 100 or the second substrate 200 (size in the planar direction of the substrates) being larger than the size of internal electrodes extending from inside the first substrate 100 or the second substrate 200 in the thickness direction to the surface, for example.

Conversely, configuring the pad portions 120 and 121 of an electroconductive material with heat resistant properties enables the above first manufacturing method to be used. In the first manufacturing method, the first substrate 100 that includes the photodiodes PD, the transfer transistors TR, and so forth is formed, and thereafter this first substrate 100 and the second substrate 200 (semiconductor layer 2000S) are applied to each other. At this time, the second substrate 200 is in a state in which active devices and patterns such as the wiring layer that configure the pixel circuits 210 are not formed yet. The second substrate 200 is in a state prior to formation of patterns, and accordingly even if error occurs in the position of applying when applying the first substrate 100 and the second substrate 200 to each other, no error occurs in positioning between the patterns of the first substrate 100 and the patterns of the second substrate 200 due to this applying error. The reason is that the patterns of the second substrate 200 are formed after applying the first substrate 100 and the second substrate 200 together. Note that at the time for forming patterns on the second substrate, pattern forming is performed using the patterns formed on the first substrate as objects for positioning in an exposure apparatus for pattern formation, for example. Due to the above-described reason, error in applying position between the first substrate 100 and the second substrate 200 is not a problem in manufacturing the image capturing device 1 according to the first manufacturing method. Due to the same reason, error due to stretching and shrinking of the substrates that occurs in the second manufacturing method is not a problem either in manufacturing the image capturing device 1 according to the first manufacturing method.

In the first manufacturing method, the first substrate 100 and the second substrate 200 (semiconductor layer 200S) are applied to each other in this way, and thereafter the active devices are formed on the second substrate 200. Following this, the through electrodes 120E and 121E, and through electrodes TGV (FIG. 67) are formed. Formation of the through electrodes 120E, 121E, and TGV is performed by forming patterns for the through electrodes by an exposure apparatus using reduction projection exposure from above the second substrate 200, for example. By using reduction exposure projection, even if there is error in positioning of the second substrate 200 and the exposure apparatus, the magnitude of error on the second substrate 200 is only a fraction of the error according to the above second manufacturing method (the inverse of the scale of reduction projection exposure). Accordingly, according to the configuration of the image capturing device 1 using the first manufacturing method, positioning among elements formed on each of the first substrate 100 and the second substrate 200 is facilitated, and a high-quality and high-performance image capturing device can be manufactured.

The image capturing device 1 manufactured using such first manufacturing method has characteristics different from the image capturing device manufactured using the second manufacturing method. Specifically, in the image capturing device 1 manufactured using the first manufacturing method, the through electrodes 120E, 121E, and TGV are substantially constant in thickness (size in the substrate planar direction) from the second substrate 200 to the first substrate 100, for example. Alternatively, when the through electrodes 120E, 121E, and TGV have tapered forms, the tapered forms having a constant inclination. The pixels 541 are more readily miniaturized in the image capturing device 1 that has such through electrodes 120E, 121E, and TGV.

Now, when manufacturing the image capturing device 1 according to the first manufacturing method, the active devices are formed on the second substrate 200 after applying the first substrate 100 and the second substrate 200 (semiconductor layer 200S) to each other, and accordingly, the effects of thermal treatment necessary for formation of the active devices reach the first substrate 100 as well. Accordingly, an electroconductive material with high thermal resistance properties is preferably used for the pad portions 120 and 121 provided to the first substrate 100, as described above. For example, a material that has a higher fusing point (i.e., high heat resistance properties) than at least part of wiring material included in the wiring layer 200T of the second substrate 200 is preferably used for the pad portions 120 and 121. For example, an electroconductive material with high heat resistance properties, such as doped silicon, tungsten, titanium, or titanium nitride or the like, is used for the pad portions 120 and 121. Thus, the image capturing device 1 can be manufactured using the above first manufacturing method.

The passivation film 122 is provided over the entire surface of the semiconductor layer 100S so as to cover the pad portions 120 and 121, for example (FIG. 67). The passivation film 122 is configured of a silicon nitride (SiN) film, for example. The interlayer insulating film 123 covers the pad portions 120 and 121, with the passivation film 122 interposed therebetween. The interlayer insulating film 123 is provided over the entire surface of the semiconductor layer 100S, for example. The interlayer insulating film 123 is configured of a silicon oxide (SiO) film, for example. The joining film 124 is provided over a joining face of the first substrate 100 (specifically, the wiring layer 100T) and the second substrate 200. That is to say, the joining film 124 is in contact with the second substrate 200. This joining film 124 is provided over the entire surface of the main face of the first substrate 100. The joining film 124 is configured of a silicon nitride film, for example.

The light-receiving lenses 401 face the semiconductor layer 100S, with the fixed charge film 112 and the insulating film 111 interposed therebetween, for example (FIG. 67). The light-receiving lenses 401 are provided at positions facing each of the photodiodes PD of the pixels 541A, 541B, 541C, and 541D, for example.

The second substrate 200 has the semiconductor layer 200S and the wiring layer 200T in this order from the first substrate 100 side. The semiconductor layer 200S is configured of a silicon substrate. A well region 211 is formed in the semiconductor layer 200S over the thickness direction thereof. The well region 211 is a p-type semiconductor region, for example. Pixel circuits 210, placed in each pixel sharing unit 539, are provided to the second substrate 200. The pixel circuits 210 are provided on the front face side (wiring layer 200T side) of the semiconductor layer 200S, for example. In the image capturing device 1, the second substrate 200 is applied to the first substrate 100 with the front face side (wiring layer 100T side) of the first substrate 100 facing the rear face side (semiconductor layer 200S side) of the second substrate 200. That is to say, the second substrate 200 is applied to the first substrate 100 in a face-to-back manner.

Figure 69:
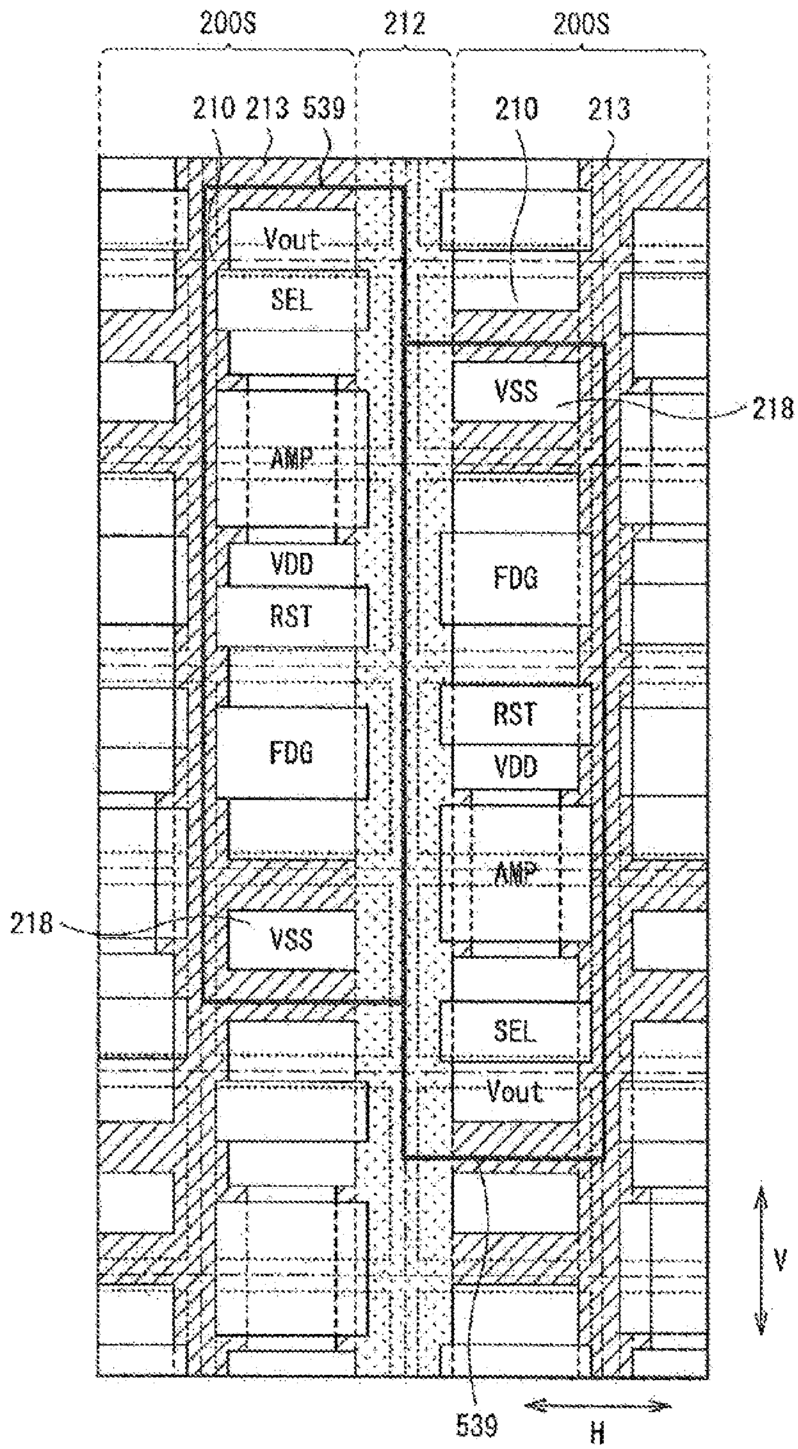
FIG. 69 is a schematic diagram representing an example of a planar configuration of a second substrate (semiconductor substrate) illustrated in FIG. 67.

FIG. 69 through FIG. 73 schematically represent an example of the planar configuration of the second substrate 200. FIG. 69 represents the configuration of pixel circuits 210 provided near the front face of the semiconductor layer 200S.

Figure 70:
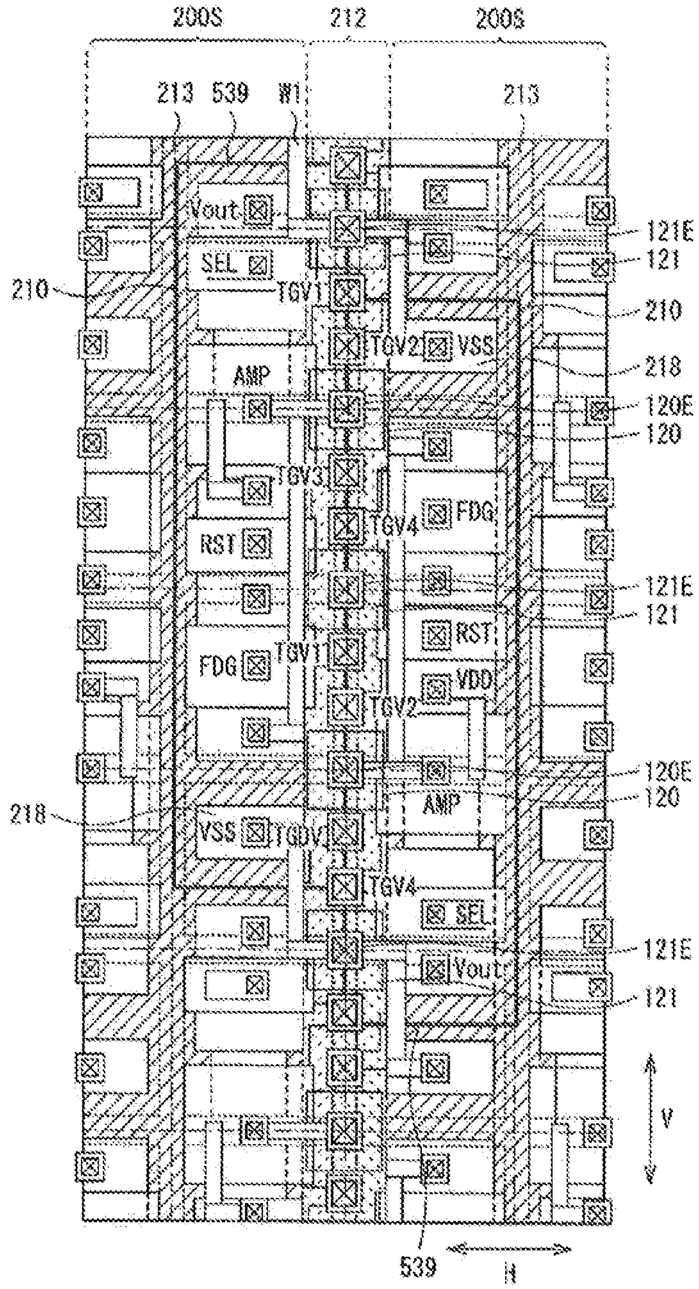
FIG. 70 is a schematic diagram representing an example of a planar configuration of a principal portions of pixel circuits and a first substrate, along with a first wiring layer illustrated in FIG. 67.
Figure 71:
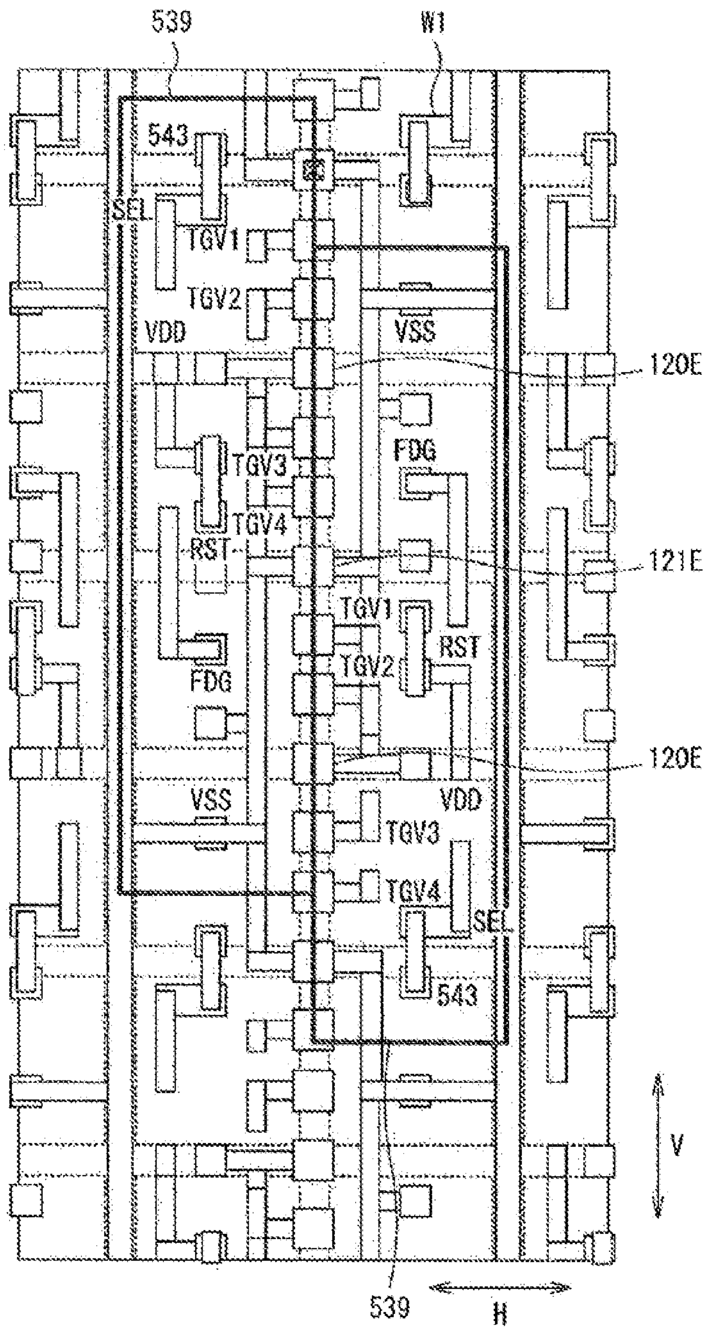
FIG. 71 is a schematic diagram representing an example of a planar configuration of the first wiring layer and a second wiring layer illustrated in FIG. 67.
Figure 72:
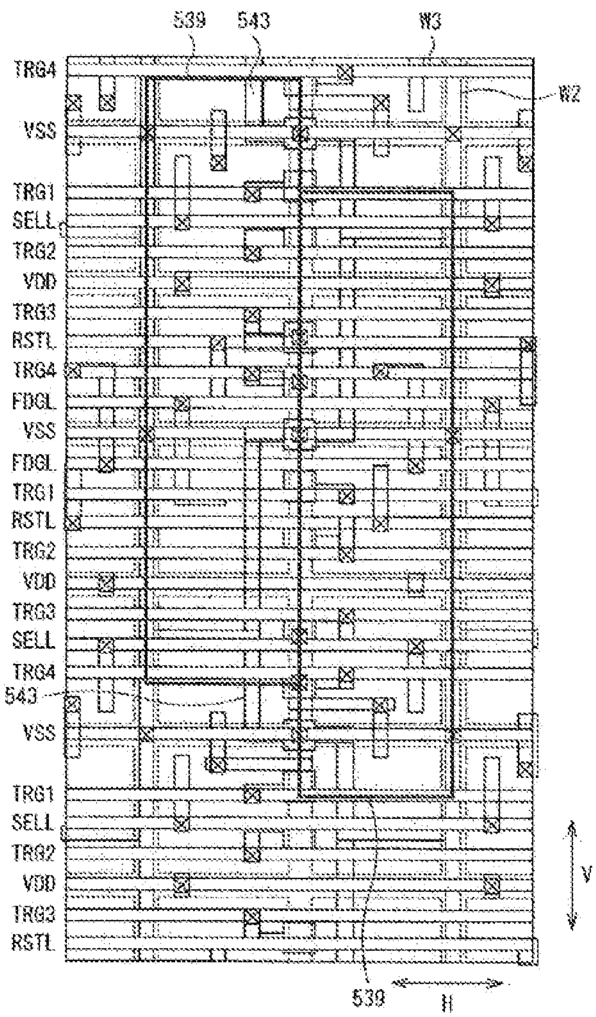
FIG. 72 is a schematic diagram representing an example of a planar configuration of the second wiring layer and a third wiring layer illustrated in FIG. 67.
Figure 73:
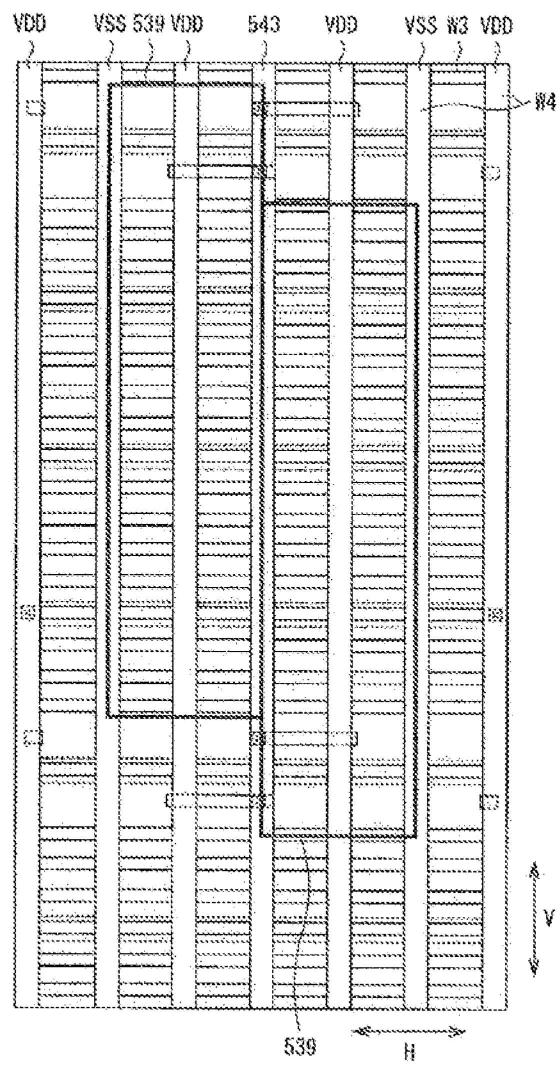
FIG. 73 is a schematic diagram representing an example of a planar configuration of the third wiring layer and a fourth wiring layer illustrated in FIG. 67.

FIG. 70 schematically represents the configuration of parts of the wiring layer 200T (specifically, a later-described first wiring layer W1) and the semiconductor layer 200S and the first substrate 100 connected to the wiring layer 200T. FIG. 71 through FIG. 73 represent an example of the planar configuration of the wiring layer 200T. The configuration of the second substrate 200 will be described below by way of FIG. 69 through FIG. 73, with reference to FIG. 67. In FIG. 69 and FIG. 70, the outlines of the photodiodes PD (boundaries between pixel isolation portions 117 and photodiodes PD) are represented by dashed lines, and boundaries between the semiconductor layer 200S at portions overlapping gate electrodes of the transistors configuring the pixel circuit 210, and device isolation regions 213 or insulating regions 214, are represented by dotted lines. Boundaries between the semiconductor layer 200S and device isolation regions 213, and boundaries between the device isolation region 213 and the insulating region 212, are provided in portions overlapping the gate electrodes of the amplifying transistors AMP, to one side in the channel width direction.

The second substrate 200 is provided with the insulating region 212 that divides the semiconductor layer 200S, and the device isolation regions 213 provided at a portion of the semiconductor layer 200S in the thickness direction (FIG. 67). For example, the through electrodes 120E and 121E and the through electrodes TGV (through electrodes TGV1, TGV2, TGV3, TGV4) of two pixel sharing units 539 connected to two pixel circuits 210 adjacent in the H direction are placed in the insulating region 212 provided between these two pixel circuits 210 (FIG. 70).

The insulating region 212 has substantially the same thickness as the semiconductor layer 200S (FIG. 67). The semiconductor layer 200S is divided by this insulating region 212. The through electrodes 120E and 121E and the through electrodes TGV are placed in this insulating region 212. The insulating region 212 is configured of silicon oxide, for example.

The through electrodes 120E and 121E are provided passing completely through the insulating region 212 in the thickness direction. The upper ends of the through electrodes 120E and 121E are connected to wiring (later-described first wiring W1, second wiring W2, third wiring W3, and fourth wiring W4) of the wiring layer 200T. The through electrodes 120E and 121E are provided passing completely through the insulating region 212, the joining film 124, the interlayer insulating film 123, and the passivation film 122, and the lower ends thereof are connected to the pad portions 120 and 121 (FIG. 67). The through electrodes 120E are for electrically connecting the pad portions 120 and the pixel circuits 210. That is to say, the floating diffusions FD of the first substrate 100 are electrically connected to the pixel circuits 210 of the second substrate 200 by the through electrodes 120E. The through electrodes 121E are for electrically connecting the pad portions 121 and the reference potential lines VSS of the wiring layer 200T. That is to say, the VSS contact regions 118 of the first substrate 100 are electrically connected to the reference potential lines VSS of the second substrate 200 by the through electrodes 121E.

The through electrodes TGV are provided passing completely through the insulating region 212 in the thickness direction. The upper ends of the through electrodes TGV are connected to the wiring of the wiring layer 200T. The through electrodes TGV are provided passing completely through the insulating region 212, the joining film 124, the interlayer insulating film 123, the passivation film 122, and the interlayer insulating film 119, and the lower ends thereof are connected to transfer gates TG (FIG. 67). These through electrodes TGV are for electrically connecting the respective transfer gates TG (transfer gates TG1, TG2, TG3, TG4) of the pixels 541A, 541B, 541C, and 541D and the wiring of the wiring layer 200T (part of the row drive signal lines 542, specifically wiring TRG1, TRG2, TRG3, and TRG4 in later-described FIG. 72). That is to say, the transfer gates TG of the first substrate 100 are electrically connected to the wiring TRG of the second substrate 200 by the through electrodes TGV, so that drive signals can be sent to each of the transfer transistors TR (transfer transistors TR1, TR2, TR3, and TR4).

The insulating region 212 is a region for providing the through electrodes 120E and 121E and the through electrodes TGV for electrically connecting the first substrate 100 and the second substrate 200, in a manner insulated from the semiconductor layer 200S. For example, the through electrodes 120E and 121E and the through electrodes TGV (through electrodes TGV1, TGV2, TGV3, TGV4) connected to two pixel circuits 210 (sharing units 539) adjacent in the H direction are placed in the insulating region 212 provided between these two pixel circuits 210. The insulating region 212 is provided extending in the V direction, for example (FIG. 69, FIG. 70). The placement of the horizontal portions TGb of the transfer gates TG is designed here such that the positions of the through electrodes TGV in the H direction are placed nearer to the positions of the through electrodes 120E and 121E in the H direction as compared to the vertical portions TGa (FIG. 68A, FIG. 70). For example, the through electrodes TGV are placed at substantially the same positions in the H direction as the through electrodes 120E and 120E. Accordingly, the through electrodes 120E and 121E and the through electrodes TGV can be provided together in the insulating region 212 extending in the V direction. As another placement example, providing the horizontal portions TGb only in regions superimposed on the vertical portions TGa is conceivable. In this case, the through electrodes TGV are formed substantially directly above the vertical portions TGa, and the through electrodes TGV are placed at substantially the middle portion in the H direction and the V direction of each of the pixels 541, for example. At this time, the positions in the H direction of the through electrodes TGV and the positions in the H direction of the through electrodes 120E and 121E greatly deviate. The insulating region 212, for example, is provided around the through electrodes TGV and the through electrodes 120E and 121E for electrical insulation from the semiconductor layer 200S that is near. In a case where the positions in the H direction of the through electrodes TGV and the positions in the H direction of the through electrodes 120E and 121E are far apart, the insulating regions 212 need to be independently provided around each of the through electrodes 120E, 121E, and TGV. This finely divides up the semiconductor layer 200S. In comparison with this, the layout in which the through electrodes 120E and 121E and the through electrodes TGV are disposed together in the insulating region 212 extending in the V direction enables the size of the semiconductor layer 200S in the H direction to be increased. Thus, a large area can be secured for the semiconductor device formation region in the semiconductor layer 200S. Accordingly, the size of the amplifying transistor AMP can be increased, and noise can be suppressed, for example.

As described with reference to FIG. 65, the pixel sharing unit 539 has a structure in which floating diffusions FD provided in each of a plurality of pixels 541 are electrically connected to each other, and the plurality of pixel 541 share one pixel circuit 210. The electrical connection among the floating diffusions FD is performed by the pad portions 120 provided to the first substrate 100 (FIG. 67, FIG. 68B). The electrical connection portion (pad portion 120) provided to the first substrate 100 and the pixel circuit 210 provided to the second substrate 200 are electrically connected by one through electrode 120E. As a separate configuration example, providing the electrical connection portion among the floating diffusions FD of the second substrate 200 is conceivable. In this case, four through electrodes connected to the respective floating diffusions FD1, FD2, FD3, and FD4 are provided to the pixel sharing unit 539. Accordingly, the number of through electrodes completely passing through the semiconductor layer 200S increases, and the insulating region 212 that insulates around these through electrodes becomes large on the second substrate 200. In comparison with this, the structure in which the pad portions 120 are provided on the first substrate 100 (FIG. 67, FIG. 68B) enables the number of through electors to be reduced, and the insulating region 212 to be made smaller. Thus, a large area can be secured for the semiconductor device formation region in the semiconductor layer 200S. Accordingly, the size of the amplifying transistor AMP can be increased, and noise can be suppressed, for example.

The device isolation region 213 is provided on the front face side of the semiconductor layer 200S. The device isolation region 213 has an STI (Shallow Trench Isolation) structure. In the device isolation region 213, the semiconductor layer 200S is engraved back in the thickness direction (perpendicular direction to the main face of the second substrate 200), and an insulating film is embedded in this engraved portion. This insulating film is configured of silicon oxide, for example. The device isolation region 213 is for device isolation among the plurality of transistors configuring the pixel circuit 210 in accordance with the layout of the pixel circuit 210. The semiconductor layer 200S (specifically, the well region 211) extends beneath the device isolation region 213 (deep portion of the semiconductor layer 200S).

Now, the difference between the outline shape (outline shape in the substrate planar direction) of the pixel sharing unit 539 of the first substrate 100, and the outline shape of the pixel sharing unit 539 of the second substrate 200, will be described with reference to FIG. 68*a*, FIG. 68B, and FIG. 69.

In the image capturing device 1, pixel sharing units 539 are provided over both of the first substrate 100 and the second substrate 200. The outline shapes of the pixel sharing unit 539 provided on the first substrate 100 and the outline shape of the pixel sharing units 539 provided on the second substrate 200 are different from each other, for example.

In FIG. 68A and FIG. 68B, the outer shape lines of the pixels 541A, 541B, 541C, and 541D are represented by single dot dashed lines, and the outline shapes of the pixel sharing units 539 are represented by heavy lines. For example, the pixel sharing units 539 of the first substrate 100 are configured of two pixels 541 (pixels 541A and 541B) placed adjacently in the H direction, and two pixels 541 (pixels 541C and 541D) placed adjacently thereto in the V direction. That is to say, the pixel sharing units 539 of the first substrate 100 are configured of four pixels 541 in two rows×two columns adjacently, and the pixel sharing units 539 of the first substrate 100 have a substantially square outline shape. In the pixel array unit 540, such pixel sharing units 539 are arrayed adjacently at a two-pixel pitch (a pitch equivalent to two pixels 541) in the H direction and at a two-pixel pitch (a pitch equivalent to two pixels 541) in the V direction.

In FIG. 69 and FIG. 70, the outer shape lines of the pixels 541A, 541B, 541C, and 541D are represented by single dot dashed lines, and the outline shapes of the pixel sharing units 539 are represented by heavy lines. For example, the outline shapes of the pixel sharing unit 539 of the second substrate 200 are smaller than the pixel sharing units 539 of the first substrate 100 in the H direction, and are larger than the pixel sharing units 539 on the first substrate 100 in the V direction. For example, the pixel sharing units 539 of the second substrate 200 are formed to a size (region) equivalent to one pixel in the H direction and formed to a size equivalent to four pixels in the V direction. That is to say, the pixel sharing units 539 of the second substrate 200 are formed at a size equivalent to pixels arrayed adjacently at one row×four columns, and the pixel sharing units 539 of the second substrate 200 have a substantially rectangular outline shape.

For example, in each pixel circuit 210, the selecting transistor SEL, the amplifying transistor AMP, the reset transistor RST, and the FD conversion gain switching transistor FDG are placed arrayed in the V direction in this order (FIG. 69). By making the outline shape of each pixel circuit 210 to be substantially rectangular as described above, the four transistors (the selecting transistor SEL, the amplifying transistor AMP, the reset transistor RST, and the FD conversion gain switching transistor FDG) can be placed arrayed in one direction (the V direction in FIG. 69). Accordingly, the drain of the amplifying transistor AMP and the drain of the reset transistor RST can be shared in a single diffusion region (the diffusion region connected to the power source line VDD). The formation region of each pixel circuit 210 can also be formed as a substantially square shape, for example (see later-described FIG. 82). In this case, two transistors are placed following one direction, and it becomes difficult to share a single diffusion region between the drain of the amplifying transistor AMP and the drain of the reset transistor RST. Accordingly, by providing the formation region of the pixel circuit 210 in a substantially rectangular shape, the four transistors are more readily placed near to each other, and the formation region of the pixel circuit 210 can be made smaller. That is to say, miniaturization of the pixels can be performed. Also, when making the formation region of the pixel circuit 210 smaller is unnecessary, the formation region of the amplifying transistor AMP can be made larger, enabling noise to be suppressed.

For example, in addition to the selecting transistor SEL, the amplifying transistor AMP, the reset transistor RST, and the FD conversion gain switching transistor FDG, a VSS contact region 218 connected to the reference potential lines VSS is provided near the front face of the semiconductor layer 200S. The VSS contact region 218 is configured of a p-type semiconductor region, for example. The VSS contact region 218 is electrically connected to the VSS contact region 118 of the first substrate 100 (semiconductor layer 100S) via the wiring of the wiring layer 200T and the through electrodes 121E. The VSS contact region 218 is provided at a position adjacent to the source of the FD conversion gain switching transistor FDG, with the device isolation region 213 interposed therebetween, for example (FIG. 69).

Next, the positional relation between the pixel sharing units 539 provided to the first substrate 100 and the pixel sharing units 539 provided to the second substrate 200 will be described with reference to FIG. 68B and FIG. 69. For example, of two pixel sharing units 539 arrayed in the V direction on the first substrate 100, one pixel sharing unit 539 (to the upper side in the plane of the Figure in FIG. 68B, for example) is connected to, out of two pixel sharing units 539 arrayed in the H direction on the second substrate 200, one pixel sharing unit 539 (to the left side in the plane of the Figure in FIG. 69, for example). For example, of the two pixel sharing units 539 arrayed in the V direction on the first substrate 100, the other pixel sharing unit 539 (to the lower side in the plane of the Figure in FIG. 68B, for example) is connected to, out of the two pixel sharing units 539 arrayed in the H direction on the second substrate 200, the other pixel sharing unit 539 (to the right side in the plane of the Figure in FIG. 69, for example).

For example, in the two pixel sharing units 539 arrayed in the H direction on the second substrate 200, the internal layout (placement of transistors and so forth) of one pixel sharing unit 539 is substantially equal to a layout in which the internal layout of the other pixel sharing unit 539 is inverted in the V direction and the H direction. The effects yielded by this layout will be described below.

In the two pixel sharing units 539 arrayed in the V direction on the first substrate 100, the pad portions 120 are each placed at the middle portion of the outline shapes of the pixel sharing units 539, i.e., at the middle of the pixel sharing units 539 in the V direction and the H direction (FIG. 68B). Conversely, the pixel sharing units 539 of the second substrate 200 have a substantially rectangular outline shape that is long in the V direction, as described above, and accordingly, for example, the amplifying transistor AMP connected to the pad portion 120 is placed at a position shifted upward in the plane of the Figure from the middle of the pixel sharing unit 539 in the V direction. For example, when the internal layout of the two pixel sharing units 539 arrayed in the H direction on the second substrate 200 is the same, the distance between the amplifying transistor AMP of one pixel sharing unit 539 and the pad portion 120 (e.g., the pad portion 120 of the pixel sharing unit 539 to the upper side in the plane of the Figure of FIG. 68) becomes relatively short. However, the distance between the amplifying transistor AMP of the other pixel sharing unit 539 and the pad portion 120 (e.g., the pad portion 120 of the pixel sharing unit 539 to the lower side in the plane of the Figure of FIG. 68) becomes long. Accordingly, the area of wiring necessary for connecting this amplifying transistor AMP and the pad portion 120 becomes large, and there is concern that the wiring layout of the pixel sharing unit 539 may become complicated. There is a possibility that this will affect miniaturization of the image capturing device 1.

In contrast to this, by inverting the mutual internal layouts of the two pixel sharing units 539 arrayed in the H direction on the second substrate 200 in at least the V direction, the distance between the amplifying transistor AMP and the pad portion 120 can be made shorter for both of these two pixel sharing units 539. Accordingly, miniaturization of the image capturing device 1 is easier as compared to a configuration where the internal layout of the two pixel sharing units 539 arrayed in the H direction on the second substrate 200 is the same. Note that the planar layout of each of the plurality of pixel sharing units 539 of the second substrate 200 is laterally symmetrical within the range shown in FIG. 69, but when the layout of the first wiring layer W1 illustrated in the later-described FIG. 70 is included, the layout becomes laterally asymmetrical.

Also, the mutual inner layouts of the two pixel sharing units 539 arrayed in the H direction on the second substrate 200 preferably are inverted in the H direction as well. The reason for this will be described below. The two pixel sharing units 539 arrayed in the H direction on the second substrate 200 are each connected to the pad portions 120 and 121 of the first substrate 100, as illustrated in FIG. 70. For example, the pad portions 120 and 121 are placed at the middle portion in the H direction of the two pixel sharing units 539 arrayed in the H direction on the second substrate 200 (between the two pixel sharing units 539 arrayed in the H direction). Accordingly by inverting the internal layout of the two pixel sharing units 539 arrayed in the H direction on the second substrate 200 as to each other in the H direction as well, the distance between each of the plurality of pixel sharing units 539 on the second substrate 200 and the pad portions 120 and 121 can be made smaller. That is to say, miniaturization of the image capturing device 1 is made even easier.

Also, the positions of the outer shape lines of the pixel sharing units 539 of the second substrate 200 do not need to match the outer shape lines of one of the pixel sharing units 539 of the first substrate 100. For example, of the two pixel sharing units 539 arrayed in the H direction of the second substrate 200, regarding one pixel sharing unit 539 (to the left side in the plane of the Figure in FIG. 70, for example), one outer shape line in the V direction (to the upper side in the plane of the Figure in FIG. 70, for example) is placed on the outer side of one outer shape line of the corresponding pixel sharing unit 539 of the first substrate 100 (to the upper side in the plane of the Figure in FIG. 68B, for example) in the V direction. Also, of the two pixel sharing units 539 arrayed in the H direction on the second substrate 200, regarding the other pixel sharing unit 539 (to the right side in the plane of the Figure in FIG. 70, for example), the other outer shape line in the V direction (to the lower side in the plane of the Figure in FIG. 70, for example) is placed on the outer side of the other outer shape line of the corresponding pixel sharing unit 539 of the first substrate 100 (to the lower side in the plane of the Figure in FIG. 68B, for example) in the V direction. By placing the pixel sharing units 539 on the second substrate 200 and the pixel sharing units 539 on the first substrate 100 in this way as to each other, the distance between the amplifying transistor AMP and the pad portion 120 can be made shorter. Accordingly, miniaturization of the image capturing device 1 is made easier.

Also, the positions of the outer shape lines do not need to match each other among the plurality of pixel sharing units 539 of the second substrate 200. For example, the outer shape lines in the V direction of the two pixel sharing units 539 arrayed in the H direction on the second substrate 200 are placed with the positions thereof shifted. Thus, the distance between the amplifying transistor AMP and the pad portion 120 can be reduced. Accordingly, miniaturization of the image capturing device 1 is made easier.

Repetitive placement of the pixel sharing units 539 in the pixel array unit 540 will be described with reference to FIG. 68B and FIG. 70. The pixel sharing units 539 of the first substrate 100 have a size of two pixels 541 in the H direction and a size of two pixels 541 in the V direction (FIG. 68B). For example, in the pixel array unit 540 of the first substrate 100, pixel sharing units 539 of a size equivalent to these four pixels 541 are adjacently repetitively arrayed at a two-pixel pitch (a pitch equivalent to two pixels 541) in the H direction and at a two-pixel pitch (a pitch equivalent to two pixels 541) in the V direction. Alternatively, a pair of pixel sharing units 539, in which two pixel sharing units 539 are adjacently placed in the V direction, may be provided to the pixel array unit 540 of the first substrate 100. In the pixel array unit 540 of the first substrate 100, this pair of pixel sharing units 539 are adjacently repetitively arrayed at a two-pixel pitch (a pitch equivalent to two pixels 541) in the H direction and at a four-pixel pitch (a pitch equivalent to four pixels 541) in the V direction, for example. The pixel sharing units 539 of the second substrate 200 have a size of one pixel 541 in the H direction and a size of four pixels 541 in the V direction (FIG. 70). For example, pairs of pixel sharing units 539 including two pixel sharing units 539 of a size equivalent to these four pixels 541 are provided to the pixel array unit 540 of the second substrate 200. The pixel sharing units 539 are placed adjacently in the H direction, and placed shifted in the V direction. In the pixel array unit 540 of the second substrate 200, such pairs of pixel sharing units 539 are placed adjacently and repetitively without gaps therebetween, at a two-pixel pitch (a pitch equivalent to two pixels 541) in the H direction and at a four-pixel pitch (a pitch equivalent to four pixels 541) in the V direction, for example. The pixel sharing units 539 can be placed without gaps by such a repetitive layout of pixel sharing units 539. Accordingly, miniaturization of the image capturing device 1 is made easier.

The amplifying transistor AMP preferably has a three-dimensional structure such as a Fin type or the like (FIG. 67), for example. Accordingly, the size of the effective gate width is larger, and noise can be suppressed. The selecting transistor SEL, the reset transistor RST, and the FD conversion gain switching transistor FDG have a planar structure, for example. The amplifying transistor AMP may have a planar structure. Alternatively, the selecting transistor SEL, the reset transistor RST, or the FD conversion gain switching transistor FDG may have a three-dimensional structure.

The wiring layer 200T includes a passivation film 221, an interlayer insulating film 222, and a plurality of sets of wiring (first wiring layer W1, second wiring layer W2, third wiring layer W3, fourth wiring layer W4), for example. The passivation film 221 is in contact with the surface of the semiconductor layer 200S, for example, and covers the entire surface of the semiconductor layer 200S. This passivation film 221 covers the gate electrodes of each of the selecting transistor SEL, the amplifying transistor AMP, the reset transistor RST, and the FD conversion gain switching transistor FDG. The interlayer insulating film 222 is provided between the passivation film 221 and the third substrate 300. The plurality of sets of wiring (first wiring layer W1, second wiring layer W2, third wiring layer W3, fourth wiring layer W4) are separated by this interlayer insulating film 222. The interlayer insulating film 222 is configured of silicon oxide, for example.

The first wiring layer W1, the second wiring layer W2, the third wiring layer W3, the fourth wiring layer W4, and the contact portions 201 and 202 are provided to the wiring layer 200T in this order from the semiconductor layer 200S side, and these are each insulated from each other by the interlayer insulating film 222, for example. A plurality of connecting portions for connecting the first wiring layer W1, the second wiring layer W2, the third wiring layer W3, or the fourth wiring layer W4, with lower layers thereof, are provided in the interlayer insulating film 222. The connecting portions are portions where an electroconductive material is embedded in connecting holes provided in the interlayer insulating film 222. For example, a connecting portion 218V that connects the first wiring layer W1 and the VSS contact region 218 of the semiconductor layer 200S is provided in the interlayer insulating film 222. The hole diameter of the connecting portions that connect among the elements of such a second substrate 200 is different from the hole diameter of the through electrodes 120E and 121E and the through electrodes TGV, for example. Specifically, the hole diameter of the connecting holes that connect among the elements of the second substrate 200 is preferably smaller than the hole diameter of the through electrodes 120E and 121E and the through electrodes TGV. The reason thereof will be described below. The depth of the connecting portions (connecting portion 218V, etc.) provided within the wiring layer 200T is smaller than the depth of the through electrodes 120E and 121E and the through electrodes TGV. Accordingly, the electroconductive material can be readily embedded in the connecting holes of the connecting portions as compared to the through electrodes 120E and 121E and the through electrodes TGV. Making the hole diameter of the connecting portions smaller than the hole diameter of the through electrodes 120E and 121E and the through electrodes TGV makes miniaturization of the image capturing device 1 easier.

For example, the through electrodes 120E and the gates of the amplifying transistors AMP and the sources of the FD conversion gain switching transistors FDG (specifically, connecting holes reaching the sources of the FD conversion gain switching transistors FDG) are connected by the first wiring layer W1. The first wiring layer W1 connects the through electrodes 121E and the connecting portions 218V, for example, and accordingly the VSS contact regions 218 of the semiconductor layer 200S and the VSS contact regions 118 of the semiconductor layer 100S are electrically connected.

Next, the planar configuration of the wiring layer 200T will be described with reference to FIG. 71 through FIG. 73. FIG. 71 represents an example of the planar configuration of the first wiring layer W1 and the second wiring layer W2. FIG. 72 represents an example of the planar configuration of the second wiring layer W2 and the third wiring layer W3. FIG. 73 represents an example of the planar configuration of the third wiring layer W3 and the fourth wiring layer W4.

For example, the third wiring layer W3 includes lines TRG1, TRG2, TRG3, TRG4, SELL, RSTL, and FDGL that extend in the H direction (row direction) (FIG. 72). These lines correspond to the plurality of row drive signal lines 542 described with reference to FIG. 65. The lines TRG1, TRG2, TRG3, and TRG4 are for sending drive signals to the transfer gates TG1, TG2, TG3, and TG4, respectively. The lines TRG1, TRG2, TRG3, and TRG4 are respectively connected to the transfer gates TG1, TG2, TG3, and TG4 via the second wiring layer W2, the first wiring layer W1, and the through electrodes 120E. The lines SELL are for sending drive signals to the gates of the selecting transistors SEL, the lines RSTL to the gates of the reset transistors RST, and the lines FDGL to the gates of the FD conversion gain switching transistors FDG, respectively. The lines SELL, RSTL, and FDGL are each connected to the respective gates of the selecting transistors SEL, the reset transistors RST, and the FD conversion gain switching transistors FDG, via the second wiring layer W2, the first wiring layer W1, and the connecting portions.

For example, the fourth wiring layer W4 includes the power source lines VDD, the reference potential lines VSS, and the vertical signal lines 543 that extend in the V direction (column direction) (FIG. 73). The power source lines VDD are connected to the drains of the amplifying transistors AMP and the drains of the reset transistors RST, via the third wiring layer W3, the second wiring layer W2, the first wiring layer W1, and the connecting portions. The reference potential lines VSS are connected to the VSS contact regions 218 via the third wiring layer W3, the second wiring layer W2, the first wiring layer W1, and the connecting portions 218V. The reference potential lines VSS are also connected to the VSS contact regions 118 of the first substrate 100 via the third wiring layer W3, the second wiring layer W2, the first wiring layer W1, the through electrodes 121E, and the pad portions 121. The vertical signal lines 543 are connected to the source (Vout) of the selecting transistors SEL via the third wiring layer W3, the second wiring layer W2, the first wiring layer W1, and the connecting portions.

The contact portions 201 and 202 may be provided at portions overlaying the pixel array unit 540 in planar view (e.g., FIG. 64) or may be provided at the peripheral portion 540B on the outer side of the pixel array unit 540 (e.g., FIG. 67). The contact portions 201 and 202 are provided on the front face of the second substrate 200 (face on the wiring layer 200T side). The contact portions 201 and 202 are configured of a metal such as Cu (copper) or Al (aluminum) or the like, for example. The contact portions 201 and 202 are exposed on the surface of the wiring layer 200T (face on the third substrate 300 side). The contact portions 201 and 202 are used for electrical connection between the second substrate 200 and the third substrate 300, and for applying the second substrate 200 and the third substrate 300 to each other.

FIG. 67 is a diagram illustrating an example in which peripheral circuits are provided in the peripheral portion 540B of the second substrate 200. These peripheral circuits may include part of the row driving unit 520 or part of the column signal processing unit 550 or the like. Also, an arrangement may be made where no peripheral circuits are placed in the peripheral portion 540B of the second substrate 200, as illustrated in FIG. 64, with the connecting hole portions H1 and H2 placed near the pixel array unit 540.

The third substrate 300 has the wiring layer 300T and the semiconductor layer 300S in this order from the second substrate 200 side, for example. The front face of the semiconductor layer 300S is provided on the second substrate 200 side, for example. The semiconductor layer 300S is configured of a silicon substrate. Circuits are provided on the front face side portion of this semiconductor layer 300S. Specifically, at least part of the input unit 510A, the row driving unit 520, the timing control unit 530, the column signal processing unit 550, the image signal processing unit 560, and the output unit 510B, for example, is provided at the front face side portion of the semiconductor layer 300S. The wiring layer 300T provided between the semiconductor layer 300S and the second substrate 200 includes, for example, an interlayer insulating film, a plurality of wiring layers separated by this interlayer insulating film, and contact portions 301 and 302. The contact portions 301 and 302 are exposed on the front face (face on the second substrate 200 side) of the wiring layer 300T, with the contact portions 301 coming into contact with the contact portions 201 of the second substrate 200, and the contact portions 302 coming into contact with the contact portions 202 of the second substrate 200, respectively. The contact portions 301 and 302 are electrically connected to circuits (at least one of the input unit 510A, the row driving unit 520, the timing control unit 530, the column signal processing unit 550, the image signal processing unit 560, and the output unit 510B, for example) formed on the semiconductor layer 300S. The contact portions 301 and 302 are configured of a metal such as Cu (copper) or Al (aluminum) or the like, for example. An external terminal TA is connected to the input unit 510A via the connecting hole portion H1, and an external terminal TB is connected to the output unit 510B via the connecting hole portion H2, for example.

Features of the image capturing device 1 will now be described.

Generally, an image capturing device has a main configuration made up of photodiodes and pixel circuits. Increasing the area of the photodiodes increases the charge generated as a result of the photoelectric conversion, and as a result the signal/noise ratio (S/N ratio) of the pixel signals improves, and better image data (image information) can be output from the image capturing device. Also, increasing the size of transistors (particularly the size of the amplifying transistors) included in the pixel circuits reduces noise generated at the pixel circuits, and as a result the S/N ratio of the captured signals improves, and better image data (image information) can be output from the image capturing device.

However, in an image capturing device in which the photodiodes and the pixel circuits are provided on the same semiconductor substrate, increasing the area of the photodiodes within the limited area of the semiconductor substrate conceivably will reduce the size of the transistors provided to the pixel circuits. Also, increasing the size of the transistors provided to the pixel circuits conceivably will reduce the area of the photodiodes.

In order to solve these problems, the image capturing device 1 according to the present embodiment uses a structure in which the plurality of pixels 541 share one pixel circuit 210, and also the shared pixel circuit 210 is placed superimposed on the photodiodes PD, for example. Accordingly, maximally increasing the area of the photodiodes PD and maximally increasing the size of the transistors provided to the pixel circuit 210 within the limited area of the semiconductor substrate can be realized. Accordingly, the S/N ratio of the pixel signals can be improved, and better image data (image information) can be output from the image capturing device 1.

When realizing a structure in which the plurality of pixels 541 share one pixel circuit 210, which is placed superimposed on the photodiodes PD, a plurality of lines extends from the floating diffusions FD of each of the plurality of pixels 541, connecting to the one pixel circuit 210. In order to secure a large area for the semiconductor substrate 200 on which the pixel circuits 210 are formed, these plurality of lines that extend can be connected to each other to form a connected line that is integrated into one, for example. In the same way, with regard to the plurality of lines extending from the VSS contact regions 118, the plurality of extending lines can be connected to each other to form connected wiring that is integrated into one.

For example, forming the connected wiring in which the plurality of lines extending from the floating diffusions FD of each of the plurality of pixels 541 are connected to each other on the semiconductor substrate 200 where the pixel circuits 210 are to be formed conceivably will reduce the area in which the transistors included in the pixel circuits 210 will be formed. In the same way, forming the connected wiring in which the plurality of lines extending from the VSS contact regions 118 of each of the plurality of pixels 541 are connected to each other and integrated into one on the semiconductor substrate 200 where the pixel circuits 210 are to be formed conceivably will reduce the area in which the transistors included in the pixel circuits 210 will be formed.

In order to solve these problems, for example, the image capturing device 1 according to the present embodiment may be provided with a structure in which a plurality of pixels 541 share one pixel circuit 210, and also the shared pixel circuit 210 is placed superimposed on the photodiodes PD, and connected wiring in which the floating diffusions FD of each of the plurality of pixels 541 are connected to each other and integrated into one, and connected wiring in which the VSS contact regions 118 provided to each of the plurality of pixels 541 are connected to each other and integrated into one, are provided to the first substrate 100.

Using the above-described second manufacturing method as the manufacturing method for providing the connected wiring in which the floating diffusions FD of each of the plurality of pixels 541 are connected to each other and integrated into one, and the connected wiring in which the VSS contact region 118 of each of the plurality of pixels 541 are connected to each other and integrated into one, to the first substrate 100 enables manufacturing to be performed using appropriate processes in accordance with the configurations of each of the first substrate 100 and the second substrate 200, for example, and a high-quality and high-performance image capturing device can be manufactured. Also, connected wiring for the first substrate 100 and the second substrate 200 can be formed by an easy process. Specifically, in a case of using the above second manufacturing method, electrodes for connection to the floating diffusions FD and electrodes for connection to the VSS contact regions 118 are each provided on the surface of the first substrate 100 and the surface of the second substrate 200 which serves as the application boundary interface of the first substrate 100 and the second substrate 200. Further, when applying the first substrate 100 and the second substrate 200 to each other, the electrodes formed on the surfaces of these two substrates are preferably large, so that the electrodes formed on these two substrate surfaces will come into contact with each other even if there is positional deviation among the electrodes provided on these two substrate surfaces. In this case, it is conceivable that placing the above electrodes in the limited area of each of the pixels provided to the image capturing device 1 will be difficult.

In order to solve the problem in which large electrodes are necessary on the application boundary interface of the first substrate 100 and the second substrate 200, the image capturing device 1 according to the present embodiment, for example, can use the above-described first manufacturing method as a manufacturing method in which a plurality of pixels 541 share one pixel circuit 210, and also the shared pixel circuit 210 is placed superimposed on the photodiodes PD. Accordingly, positioning among the elements formed on each of the first substrate 100 and the second substrate 200 is facilitated, and a high-quality and high-performance image capturing device can be manufactured. Further, a unique structure that occurs by using this manufacturing method can be provided. That is to say, a structure is provided in which the semiconductor layer 100S and the wiring layer 100T of the first substrate 100, and the semiconductor layer 200S and the wiring layer 200T of the second substrate 200 are stacked in that order, in other words, a structure in which the first substrate 100 and the second substrate 200 are stacked face-to-back, and through electrodes 120E and 121E are provided that completely pass through the semiconductor layer 200S and the wiring layer 100T of the first substrate 100, from the front face side of the semiconductor layer 200S of the second substrate 200, and reach the front face of the semiconductor layer 100S of the first substrate 100.

In the structure of the connected wiring in which the floating diffusions FD of each of the plurality of pixels 541 are connected to each other and integrated into one, and the connected wiring in which the VSS contact region 118 of each of the plurality of pixels 541 are connected to each other and integrated into one, are provided to the first substrate 100, there is a possibility that if this structure and the second substrate 200 are stacked using the first manufacturing method and the pixel circuits 210 are formed on the second substrate 200, the effects of thermal treatment necessary for formation of the active devices provided to the pixel circuit 210 will reach the connected wiring formed on the first substrate 100.

Accordingly, in order to solve the problem of the effects of thermal treatment for formation of the active devices reaching the connected wiring, the image capturing device 1 according to the present embodiment preferably uses an electroconductive material with high heat resistance properties for the connected wiring in which the floating diffusions FD of each of the plurality of pixels 541 are connected to each other and integrated into one, and the connected wiring in which the VSS contact regions 118 of each of the plurality of pixels 541 are connected to each other and integrated into one. Specifically, a material that has a higher fusing point than at least part of wiring material included in the wiring layer 200T of the second substrate 200 can be used for the electroconductive material with high heat resistance properties.

Thus, the image capturing device 1 according to the present embodiment is provided with, for example, (1) a structure in which the first substrate 100 and the second substrate 200 are stacked face-to-back (specifically, a structure in which the semiconductor layer 100S and the wiring layer 100T of the first substrate 100, and the semiconductor layer 200S and the wiring layer 200T of the second substrate 200 are stacked in that order), (2) a structure in which through electrodes 120E and 121E are provided that completely pass through the semiconductor layer 200S and the wiring layer 100T of the first substrate 100 from the front face side of the semiconductor layer 200S of the second substrate 200 and reach the front face of the semiconductor layer 100S of the first substrate 100, and (3) a structure in which an electroconductive material with high heat resistance properties is used to form the connected wiring in which the floating diffusions FD provided to each of the plurality of pixels 541 are connected to each other and integrated into one and the connected wiring in which the VSS contact regions 118 provided to each of the plurality of pixels 541 are connected to each other and integrated into one. Accordingly, the connected wiring in which the floating diffusions FD provided to each of the plurality of pixels 541 are connected to each other and integrated into one, and the connected wiring in which the VSS contact regions 118 provided to each of the plurality of pixels 541 are connected to each other and integrated into one, can be provided to the first substrate 100 without providing large electrodes at the interface between the first substrate 100 and the second substrate 200.

[Operations of Image Capturing Device 1]

Figure 74:
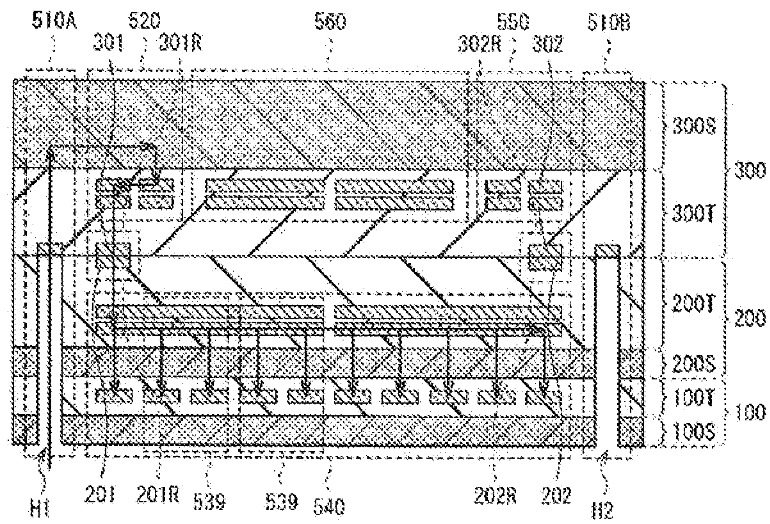
FIG. 74 is a schematic diagram for description regarding paths of input signals to the image capturing device illustrated in FIG. 64.
Figure 75:
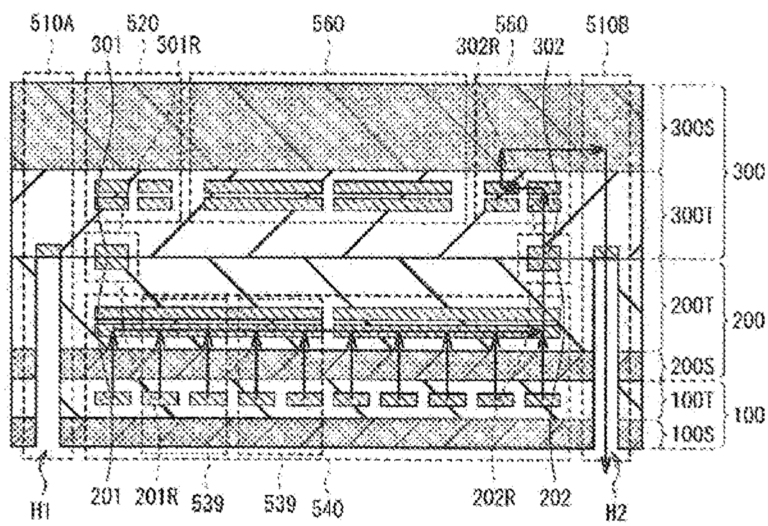
FIG. 75 is a schematic diagram for description regarding paths of pixel signals of the image capturing device illustrated in FIG. 64.

Next, operations of the image capturing device 1 will be described with reference to FIG. 74 and FIG. 75. FIG. 74 and FIG. 75 are illustrations in which arrows indicating paths of each of the signals have been added to FIG. 64. FIG. 74 represents paths of input signals externally input to the image capturing device 1, and paths of power source potential and reference potential by arrows. FIG. 75 represents signal paths of pixel signals externally output from the image capturing device 1 by arrows. For example, input signals (e.g., pixel clock and synchronization signal) input to the image capturing device 1 via the input unit 510A are transferred to the row driving unit 520 of the third substrate 300, and row driving signals are created at the row driving unit 520. These row driving signals are sent to the second substrate 200 via the contact portions 301 and 201. Further, the row driving signals reach each of the pixel sharing units 539 of the pixel array unit 540 via the row drive signal lines 542 within the wiring layer 200T. Of the row driving signals reaching the pixel sharing units 539 of the second substrate 200, driving signals for other than the transfer gate TG are input to the pixel circuits 210, and the transistors included in the pixel circuits 210 are driven. Driving signals for the transfer gate TG are input to the transfer gates TG1, TG2, TG3, and TG4 of the first substrate 100 via the through electrodes TGV, and the pixels 541A, 541B, 541C, and 541D are driven (FIG. 74). Also, the power source potential and the reference potential supplied to the input unit 510A (input terminal 511) of the third substrate 300 from outside of the image capturing device 1 are sent to the second substrate 200 via the contact portions 301 and 201, and are supplied to the pixel circuits 210 of each of the pixel sharing units 539 via wiring within the wiring layer 200T. The reference potential is further supplied to the pixels 541A, 541B, 541C, and 541D of the first substrate 100 as well, via the through electrodes 121E. Meanwhile, pixel signals obtained by photoelectric conversion at the pixels 541A, 541B, 541C, and 541D of the first substrate 100 are sent to the pixel circuit 210 of the second substrate 200 for each pixel sharing unit 539, via the through electrodes 120E. Pixel signals based on these pixel signals are sent to the third substrate 300 from the pixel circuit 210 via the vertical signal lines 543 and the contact portions 202 and 302. These pixel signals are subjected to processing at the column signal processing unit 550 and the image signal processing unit 560 of the third substrate 300, and thereafter are externally output via the output unit 510B.

Effects

In the present embodiment, the pixels 541A, 541B, 541C, and 541D (pixel sharing units 539) and the pixel circuits 210 are provided on different substrates from each other (first substrate 100 and second substrate 200). Accordingly, the area of the pixels 541A, 541B, 541C, and 541D and the pixel circuits 210 can be enlarged as compared to a case in which the pixels 541A, 541B, 541C, and 541D and the pixel circuits 210 are formed on the same substrate. As a result, the amount of pixel signals obtained by photoelectric conversion can be increased, and transistor noise at the pixel circuits 210 can be reduced. Accordingly, the signal/noise ratio of the pixel signals can be improved, and the image capturing device 1 can output better image data (image information). Also, the image capturing device 1 can be miniaturized (in other words, reduction in the pixel size and making the image capturing device 1 smaller). The number of pixels per unit area can be increased by reduction in the pixel size, and the image capturing device 1 can output high-quality images.

Also, in the image capturing device 1, the first substrate 100 and the second substrate 200 are electrically connected to each other by the through electrodes 120E and 121E provided in the insulating region 212. For example, methods of connecting the first substrate 100 and the second substrate 200 to each other by joining pad electrodes to each other, and connecting by through lines that completely pass through semiconductor layers (e.g., TSV (Thorough Si Via)) are conceivable. In comparison with such methods, providing the through electrodes 120E and 121E in the insulating region 212 enables the area needed for connection of the first substrate 100 and the second substrate 200 to be reduced. Accordingly, the pixel size can be reduced, and the size of the image capturing device 1 can be further reduced. Also, further miniaturization of the area per pixel enables the resolution to be further raised. When reduction in size of the chip is unnecessary, the formation region of the pixels 541A, 541B, 541C, and 541D and the pixel circuits 210 can be increased. As a result, the amount of pixel signals obtained by photoelectric conversion can be increased, and noise of transistors provided to the pixel circuits 210 can be reduced. Accordingly, the signal/noise ratio of the pixel signals can be improved, and the image capturing device 1 can output better image data (image information).

Also, in the image capturing device 1, the pixel circuits 210, the column signal processing unit 550, and image signal processing unit 560 are provided on different substrates (second substrate 200 and third substrate 300) from each other. Accordingly, the area of the pixel circuits 210 and the area of the column signal processing unit 550 and the image signal processing unit 560 can be enlarged as compared to a case where the pixel circuits 210, the column signal processing unit 550, and image signal processing unit 560 are formed on the same substrate. Accordingly, noise generated at the column signal processing unit 550 can be reduced, and a higher-level image processing circuit can be installed for the image signal processing unit 560. Accordingly, the signal/noise ratio of pixel signals can be improved, and the image capturing device 1 can output better image data (image information).

Also, in the image capturing device 1, the pixel array unit 540 is provided on the first substrate 100 and the second substrate 200, and the column signal processing unit 550 and the image signal processing unit 560 are provided on the third substrate 300. Also, the contact portions 201, 202, 301, and 302 that connect the second substrate 200 and the third substrate 300 are formed above the pixel array unit 540. Accordingly, the contact portions 201, 202, 301, and 302 can be freely laid out without interference from various types of wiring provided to the pixel array in the layout. Accordingly, the contact portions 201, 202, 301, and 302 can be used for electrical connection of the second substrate 200 and the third substrate 300. Using the contact portions 201, 202, 301, and 302 increases the degree of freedom of layout regarding the column signal processing unit 550 and the image signal processing unit 560, for example. Accordingly, noise generated at the column signal processing unit 550 can be reduced, and a higher-level image processing circuit can be installed for the image signal processing unit 560. Accordingly, the signal/noise ratio of pixel signals can be improved, and the image capturing device 1 can output better image data (image information).

Also, in the image capturing device 1, the pixel isolation portions 117 completely pass through the semiconductor layer 100S. Accordingly, even in a case where the distance between adjacent pixels (pixels 541A, 541B, 541C, and 541D) is small due to miniaturization of the area per pixel, color crosstalk among the pixels 541A, 541B, 541C, and 541D can be suppressed. Accordingly, the signal/noise ratio of pixel signals can be improved, and the image capturing device 1 can output even better image data (image information).

Also, in the image capturing device 1, a pixel circuit 210 is provided for each pixel sharing unit 539. Accordingly, the formation region of the transistors configuring the pixel circuit 210 (amplifying transistor AMP, reset transistor RST, selecting transistor SEL, and FD conversion gain switching transistor FDG) can be enlarged as compared to a case of providing a pixel circuit 210 for each of the pixels 541A, 541B, 541C, and 541D. For example, increasing the formation region of the amplifying transistor AMP enables noise to be suppressed. Accordingly, the signal/noise ratio of pixel signals can be improved, and the image capturing device 1 can output even better image data (image information).

Further, in the image capturing device 1, the pad portions 120 electrically connecting the floating diffusions FD (floating diffusions FD1, FD2, FD3, and FD4) of the four pixels (pixels 541A, 541B, 541C, and 541D) are provided on the first substrate 100. Accordingly, the number of through electrodes (through electrodes 120E) connecting the first substrate 100 and the second substrate 200 can be reduced as compared to a case in which such pad portion 120 are provided on the second substrate 200. Thus, the insulating region 212 can be formed small, and a sufficiently large formation region for transistors configuring the pixel circuits 210 (semiconductor layer 200S) can be secured. Accordingly, noise of transistors provided to the pixel circuits 210 can be reduced, the signal/noise ratio of pixel signals can be improved, and the image capturing device 1 can output even better image data (image information).

A modification of the image capturing device 1 according to the above-described embodiments will be described below. In the following modification, configurations that are in common to the above embodiments are described denoted by the same reference signs.

2. MODIFICATION 1

Figure 76:
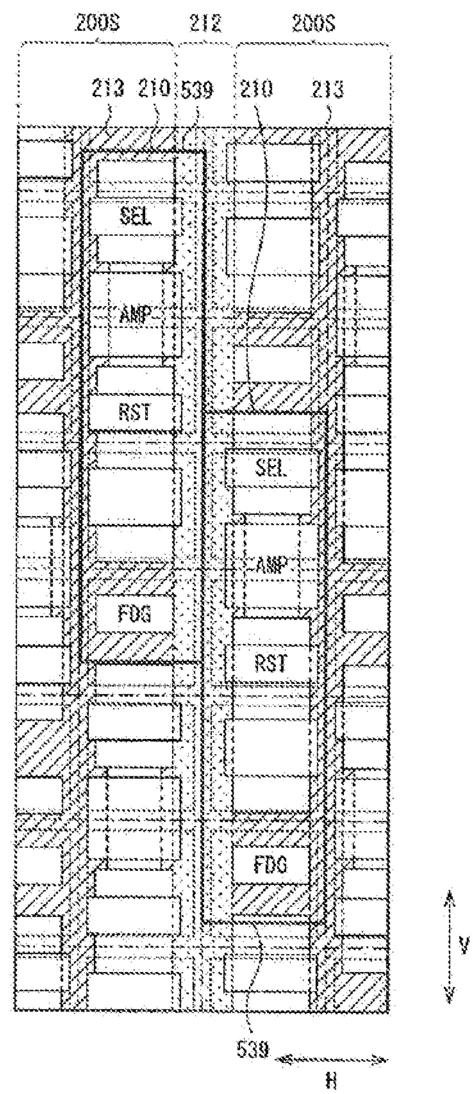
FIG. 76 is a schematic diagram illustrating a modification of the planar configuration of the second substrate (semiconductor substrate) illustrated in FIG. 69.
Figure 77:
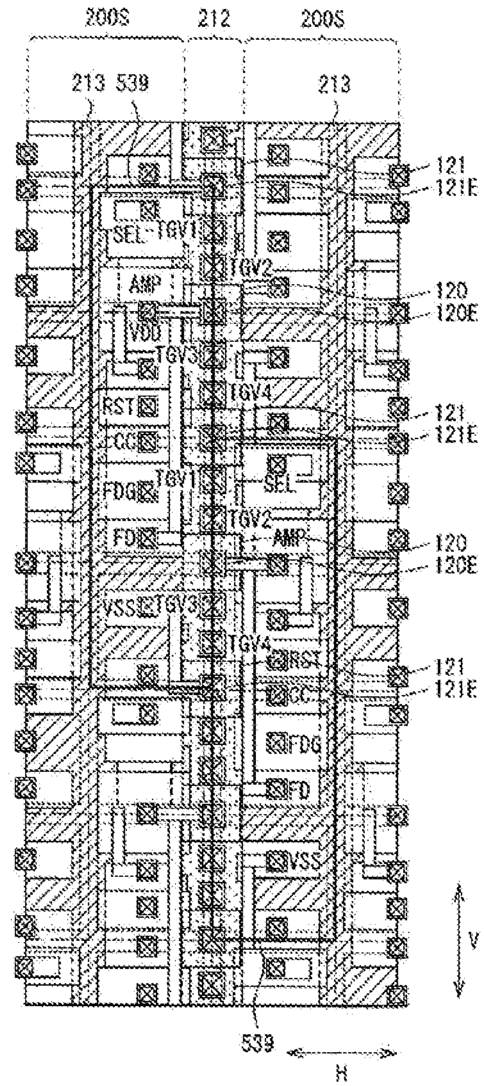
FIG. 77 is a schematic diagram representing a planar configuration of the first wiring layer and principal portions of the first substrate, along with pixel circuits illustrated in FIG. 76.
Figure 78:
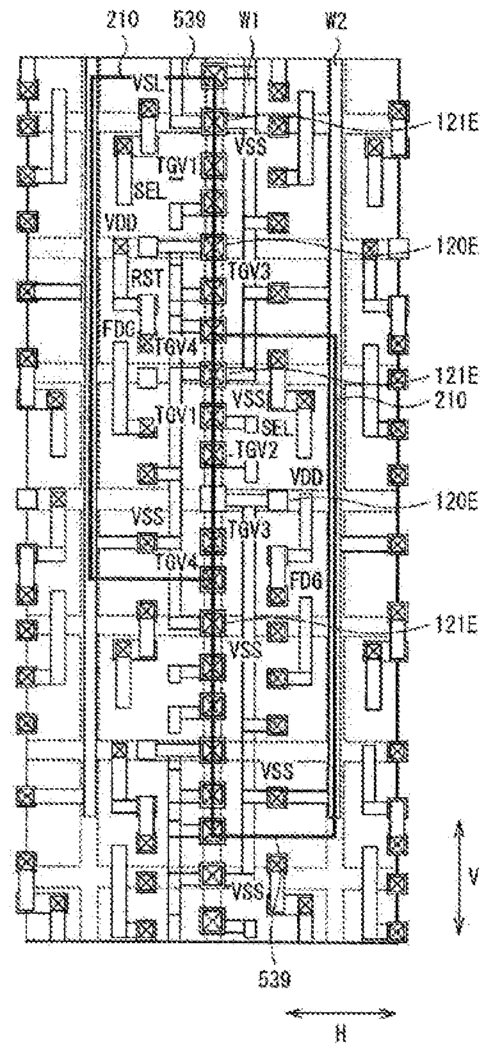
FIG. 78 is a schematic diagram representing an example of the planar configuration of the second wiring layer, along with the first wiring layer illustrated in FIG. 77.
Figure 79:
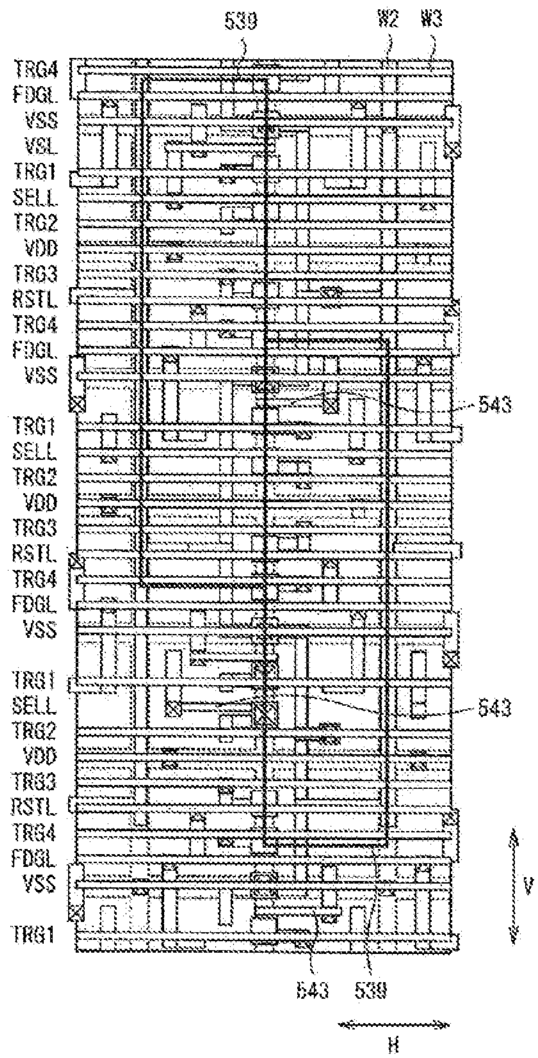
FIG. 79 is a schematic diagram representing an example of the planar configuration of the third wiring layer, along with the second wiring layer illustrated in FIG. 78.
Figure 80:
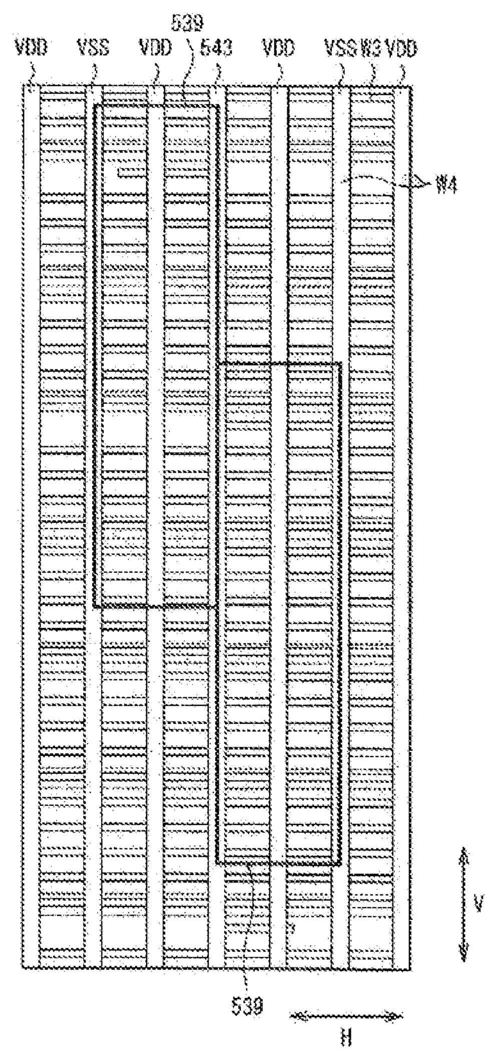
FIG. 80 is a schematic diagram representing an example of the planar configuration of the fourth wiring layer, along with the third wiring layer illustrated in FIG. 79.

FIG. 76 through FIG. 80 represent a modification of the planar configuration of the image capturing device 1 according to the above-described embodiments. FIG. 76 schematically represents the planar configuration near the front face of the semiconductor layer 200S of the second substrate 200, and corresponds to FIG. 69 described in the above embodiments. FIG. 77 schematically represents the configuration of the first wiring layer W1 and the parts of the semiconductor layer 200S and the first substrate 100 connected to the first wiring layer W1, and corresponds to FIG. 70 described in the above embodiments. FIG. 78 represents an example of the planar configuration of the first wiring layer W1 and the second wiring layer W2, and corresponds to FIG. 71 described in the above embodiments. FIG. 79 represents an example of the planar configuration of the second wiring layer W2 and the third wiring layer W3, and corresponds to FIG. 72 described in the above embodiments. FIG. 80 represents an example of the planar configuration of the third wiring layer W3 and the fourth wiring layer W4, and corresponds to FIG. 73 described in the above embodiments.

In the present modification, of the two pixel sharing units 539 arrayed in the H direction of the second substrate 200, the internal layout of one (e.g., to the right side in the plane of the Figure) pixel sharing unit 539 has a configuration where the internal layout of the other (e.g., to the left side in the plane of the Figure) pixel sharing unit 539 is inverted only in the H direction, as illustrated in FIG. 77. Also, the shift in the V direction between the outer shape lines of the one pixel sharing unit 539 and the outer shape lines of the other pixel sharing unit 539 is larger than the shift described in the above embodiments (FIG. 70). Thus, by making the shift in the V direction larger, the distance between the amplifying transistor AMP of the other pixel sharing unit 539 and the pad portion 120 connected thereto (pad portion 120 of the other (lower side in the plane of the Figure) of the two pixel sharing units 539 arrayed in the V direction illustrated in FIG. 68) can be made to be smaller. According to such a layout, in the Modification 1 of the image capturing device 1 illustrated in FIG. 76 through FIG. 80, the area of the two pixel sharing units 539 arrayed in the H direction can be made to be the same as the area of the pixel sharing units 539 of the second substrate 200 described in the above embodiments, without inverting the planar layout of each other in the V direction. Note that the planar layout of the pixel sharing units 539 of the first substrate 100 is the same as the planar layout described in the above embodiments (FIG. 68A, FIG. 68B). Accordingly, the image capturing device 1 according to the present modification can yield advantages the same as the image capturing device 1 described in the above embodiments. The placement of the pixel sharing units 539 of the second substrate 200 is not limited to the placement described in the above embodiments and the present modification.

3. MODIFICATION 2

Figure 81:
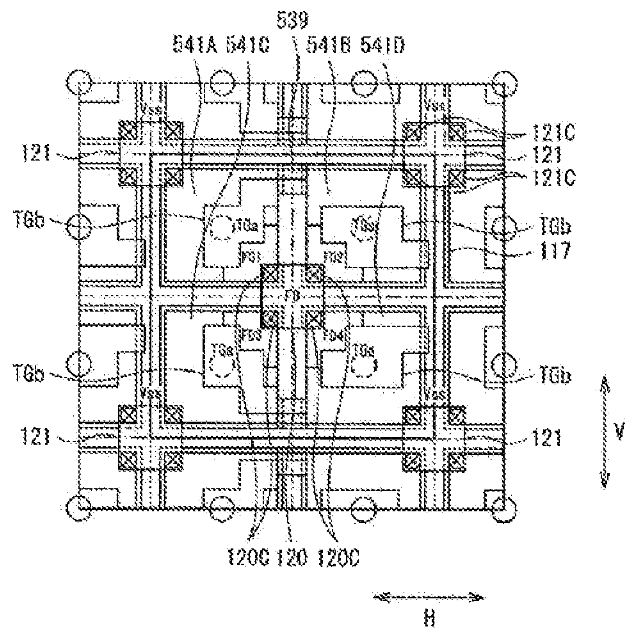
FIG. 81 is a schematic diagram representing a modification of the planar configuration of the first substrate illustrated in FIG. 68A.
Figure 82:
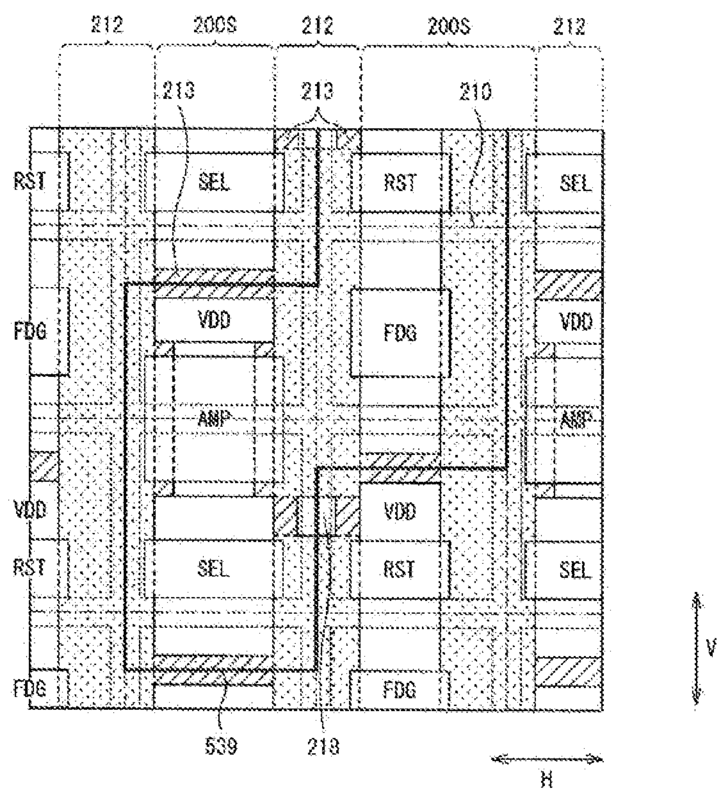
FIG. 82 is a schematic diagram representing an example of the planar configuration of the second substrate (semiconductor layer) stacked on the first substrate illustrated in FIG. 81.
Figure 83:
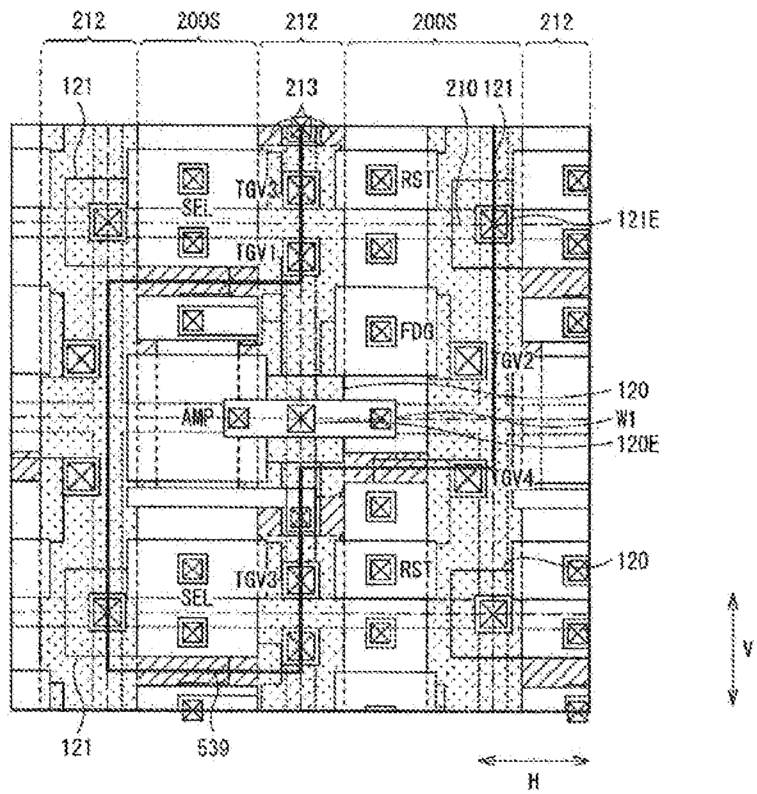
FIG. 83 is a schematic diagram representing an example of the planar configuration of the first wiring layer, along with the pixel circuits illustrated in FIG. 82.
Figure 84:
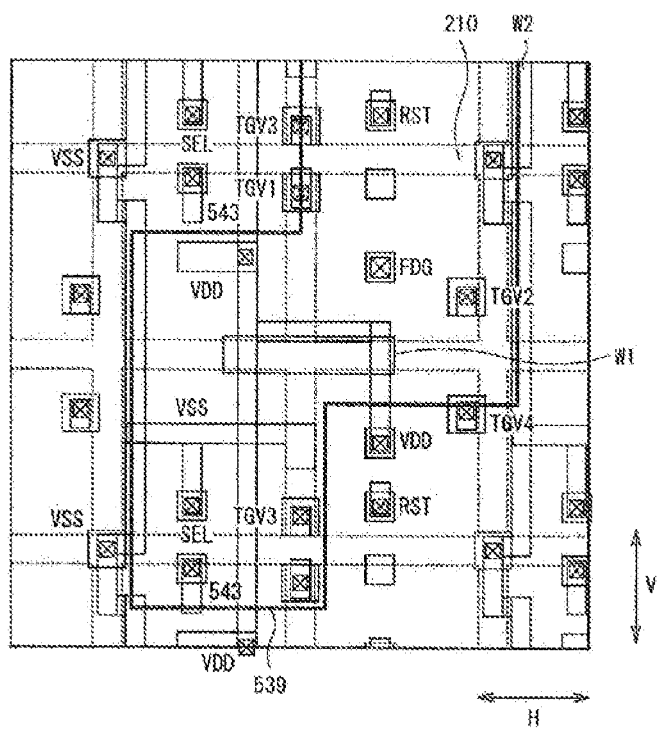
FIG. 84 is a schematic diagram representing an example of the planar configuration of the second wiring layer, along with the first wiring layer illustrated in FIG. 83.
Figure 85:
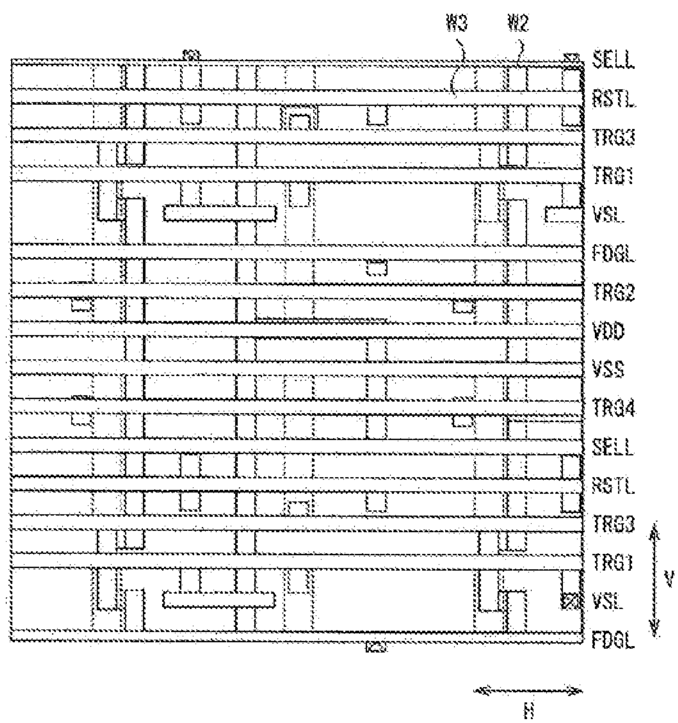
FIG. 85 is a schematic diagram representing an example of the planar configuration of the third wiring layer, along with the second wiring layer illustrated in FIG. 84.
Figure 86:
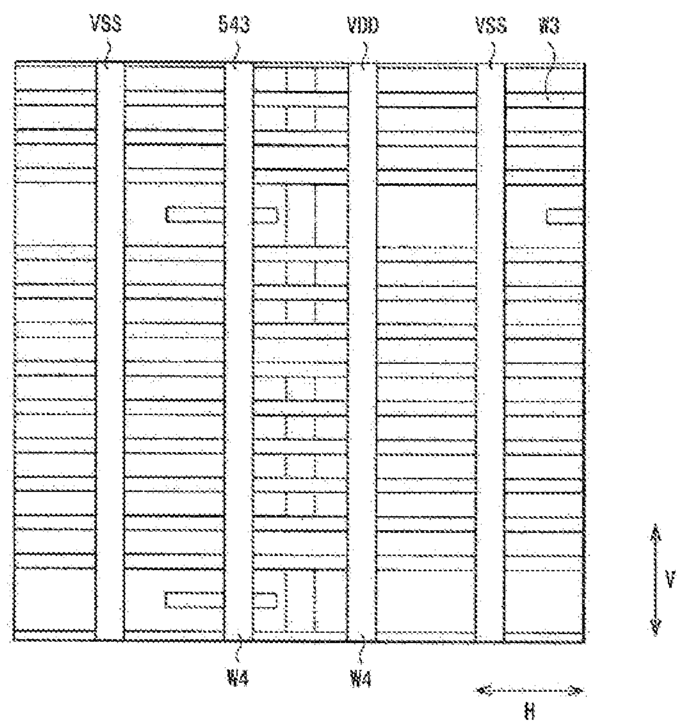
FIG. 86 is a schematic diagram representing an example of the planar configuration of the fourth wiring layer, along with the third wiring layer illustrated in FIG. 85.

FIG. 81 through FIG. 86 represent a modification of the planar configuration of the image capturing device 1 according to the above-described embodiments. FIG. 81 schematically represents the planar configuration of the first substrate 100, and corresponds to FIG. 68A described in the above embodiments. FIG. 82 schematically represents the planar configuration near the front face of the semiconductor layer 200S of the second substrate 200, and corresponds to FIG. 69 described in the above embodiments. FIG. 83 schematically represents the configuration of the first wiring layer W1 and the parts of the semiconductor layer 200S and the first substrate 100 connected to the first wiring layer W1, and corresponds to FIG. 70 described in the above embodiments. FIG. 84 represents an example of the planar configuration of the first wiring layer W1 and the second wiring layer W2, and corresponds to FIG. 71 described in the above embodiments. FIG. 85 represents an example of the planar configuration of the second wiring layer W2 and the third wiring layer W3, and corresponds to FIG. 72 described in the above embodiments. FIG. 86 represents an example of the planar configuration of the third wiring layer W3 and the fourth wiring layer W4, and corresponds to FIG. 73 described in the above embodiments.

In the present modification, the outer shape of the pixel circuit 210 has a substantially square planar shape (FIG. 82, etc.). The planar configuration of the image capturing device 1 according to the present modification differs from the planar configuration of the image capturing device 1 described in the above embodiments with regard to this point.

For example, the pixel sharing units 539 of the first substrate 100 are formed over two-row×two-column pixel regions, in the same way as described in the above embodiments, and have a substantially square planar shape (FIG. 81). For example, in each pixel sharing unit 539, the horizontal portions TGb of the transfer gates TG1 and TG3 of the pixel 541A and the pixel 541C of one pixel column extend in a direction from positions superimposed on the vertical portions TGa toward the middle portion of the pixel sharing unit 539 in the H direction (more specifically, in a direction toward the outer edge of the pixels 541A and 541C and also in a direction toward the middle portion of the pixel sharing unit 539), and the horizontal portions TGb of the transfer gates TG2 and TG4 of the pixel 541B and the pixel 541D of the other pixel column extend in a direction from positions superimposed on the vertical portions TGa toward an outer side of the pixel sharing unit 539 in the H direction (more specifically, in a direction toward the outer edge of the pixels 541B and 541D and also in a direction toward an outer side of the pixel sharing unit 539). The pad portion 120 connected to the floating diffusion FD is provided at the middle portion of the pixel sharing unit 539 (at the middle portion of the pixel sharing unit 539 in the H direction and the V direction), and the pad portion 121 connected to the VSS contact region 118 is provided at an edge portion of the pixel sharing unit 539 at least in the H direction (in the H direction and in the V direction in FIG. 81).

As a separate placement example, an arrangement in which the horizontal portions TGb of the transfer gates TG1, TG2, TG3, and TG4 are provided only to regions facing the vertical portions TGa is also conceivable. The semiconductor layer 200S tends to become finely divided here, in the same way as described in the above embodiments. Accordingly, forming the transistors of the pixel circuit 210 to be large is difficult. Conversely, by forming the horizontal portions TGb of the transfer gates TG1, TG2, TG3, and TG4 to extend from the positions superimposed on the vertical portions TGa in the H direction as in the above modification, the width of the semiconductor layer 200S can be increased in the same way as in the above-described embodiments. Specifically, the H-direction positions of the through electrodes TGV1 and TGV3 connected to the transfer gates TG1 and TG3 can be placed near to the H-direction positions of the through electrodes 120E, and the H-direction positions of the through electrodes TGV2 and TGV4 connected to the transfer gates TG2 and TG4 can be placed near to the H-direction positions of the through electrodes 121E (FIG. 83). Accordingly, the width (H-direction size) of the semiconductor layer 200S extending in the V direction can be increased, in the same way as described in the above embodiments. Thus, the size of the transistors of the pixel circuit 210, in particular the size of the amplifying transistors AMP can be increased. As a result, the signal/noise ratio of pixel signals can be improved, and the image capturing device 1 can output even better image data (image information).

The pixel sharing units 539 of the second substrate 200 are substantially the same size in the H direction and the V direction as the pixel sharing units 539 of the first substrate 100, for example, and are provided over regions corresponding to substantially two-row×two-column pixel regions, for example. For example, in each pixel circuit 210, the selecting transistor SEL and the amplifying transistor AMP are arrayed in the V direction in one semiconductor layer 200S extending in the V direction, and the FD conversion gain switching transistor FDG and the reset transistor RST are placed arrayed in the V direction in one semiconductor layer 200S extending in the V direction. The one semiconductor layer 200S in which the selecting transistor SEL and the amplifying transistor AMP are provided, and the one semiconductor layer 200S in which the FD conversion gain switching transistor FDG and the reset transistor RST are provided are arrayed in the H direction across the insulating region 212. This insulating region 212 extends in the V direction (FIG. 82).

Now, the outer shape of the pixel sharing unit 539 of the second substrate 200 will be described with reference to FIG. 82 and FIG. 83. For example, the pixel sharing unit 539 of the first substrate 100 illustrated in FIG. 81 is connected to the amplifying transistor AMP and the selecting transistor SEL provided on one side of the pad portion 120 in the H direction (the left side in the plane of the Figure in FIG. 83), and the FD conversion gain switching transistor FDG and the reset transistor RST provided on the other side of the pad portion 120 in the H direction (the right side in the plane of the Figure in FIG. 83). The outer shape of the pixel sharing unit 539 of the second substrate 200 including the amplifying transistor AMP, the selecting transistor SEL, the FD conversion gain switching transistor FDG, and the reset transistor RST, is decided by the following four outer edges.

A first outer edge is an outer edge at one end in the V direction of the semiconductor layer 200S including the selecting transistor SEL and the amplifying transistor AMP (edge at upper side in the plane of the Figure in FIG. 83). This first outer edge is provided between the amplifying transistor AMP included in this pixel sharing unit 539 and the selecting transistor SEL included in the pixel sharing unit 539 adjacent to this pixel sharing unit 539 in one direction in the V direction (upper side in the plane of the Figure in FIG. 83). More specifically, the first outer edge is provided in the middle portion in the V direction of the device isolation region 213 between these amplifying transistor AMP and the selecting transistor SEL. A second outer edge is an outer edge at the other end in the V direction of the semiconductor layer 200S including the selecting transistor SEL and the amplifying transistor AMP (edge at lower side in the plane of the Figure in FIG. 83). This second outer edge is provided between the selecting transistor SEL included in this pixel sharing unit 539 and the amplifying transistor AMP included in the pixel sharing unit 539 adjacent to this pixel sharing unit 539 on the other side in the V direction (lower side in the plane of the Figure in FIG. 83). More specifically, the second outer edge is provided in the middle portion in the V direction of the device isolation region 213 between these selecting transistor SEL and the amplifying transistor AMP. A third outer edge is an outer edge at the other end in the V direction of the semiconductor layer 200S including the reset transistor RST and the FD conversion gain switching transistor FDG (edge at lower side in the plane of the Figure in FIG. 83). This third outer edge is provided between the FD conversion gain switching transistor FDG included in this pixel sharing unit 539 and the reset transistor RST included in the pixel sharing unit 539 adjacent to this pixel sharing unit 539 on the other side in the V direction (lower side in the plane of the Figure in FIG. 83). More specifically, the third outer edge is provided in the middle portion in the V direction of the device isolation region 213 between these FD conversion gain switching transistor FDG and the reset transistor RST. A fourth outer edge is an outer edge at one end in the V direction of the semiconductor layer 200S including the reset transistor RST and the FD conversion gain switching transistor FDG (edge at upper side in the plane of the Figure in FIG. 83). This fourth outer edge is provided between the reset transistor RST included in this pixel sharing unit 539 and the FD conversion gain switching transistor FDG (omitted from illustration) included in the pixel sharing unit 539 adjacent to this pixel sharing unit 539 on the one side in the V direction (upper side in the plane of the Figure in FIG. 83). More specifically, the fourth outer edge is provided in the middle portion in the V direction of the device isolation region 213 (omitted from illustration) between these reset transistor RST and the FD conversion gain switching transistor FDG.

In the outer shape of the pixel sharing unit 539 of the second substrate 200 that includes such first, second, third, and fourth outer edges, the third and fourth outer edges are placed shifted to one side in the V direction as to the first and second outer edges (in other words, offset to one side in the V direction). Using such a layout enables the gate of the amplifying transistor AMP and the source of the FD conversion gain switching transistor FDG to both be placed maximally near to the pad portion 120. Accordingly, reduction in the area of the wiring connecting these, and miniaturization of the image capturing device 1, are facilitated. Note that the VSS contact region 218 is provided between the semiconductor layer 200S that includes the selecting transistor SEL and the amplifying transistor AMP, and the semiconductor layer 200S that includes the reset transistor RST and the FD conversion gain switching transistor FDG. For example, a plurality of pixel circuits 210 have the same placement as each other.

The image capturing device 1 having such a second substrate 200 also yields the same advantages as that described in the above embodiments. The placement of the pixel sharing units 539 of the second substrate 200 is not limited to the placement described in the above embodiments and the present modification.

4. MODIFICATION 3

Figure 87:
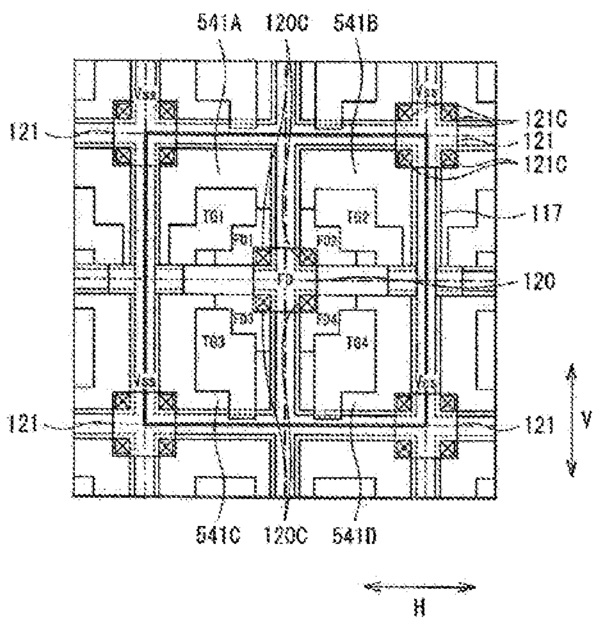
FIG. 87 is a schematic diagram representing another example of the planar configuration of the first substrate illustrated in FIG. 81.
Figure 88:
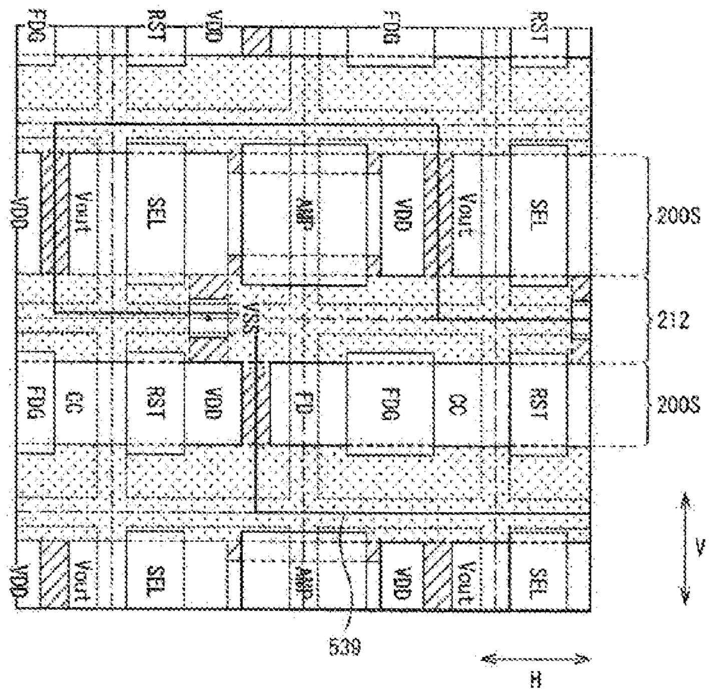
FIG. 88 is a schematic diagram representing an example of the planar configuration of the second substrate (semiconductor layer) stacked on the first substrate illustrated in FIG. 87.
Figure 89:
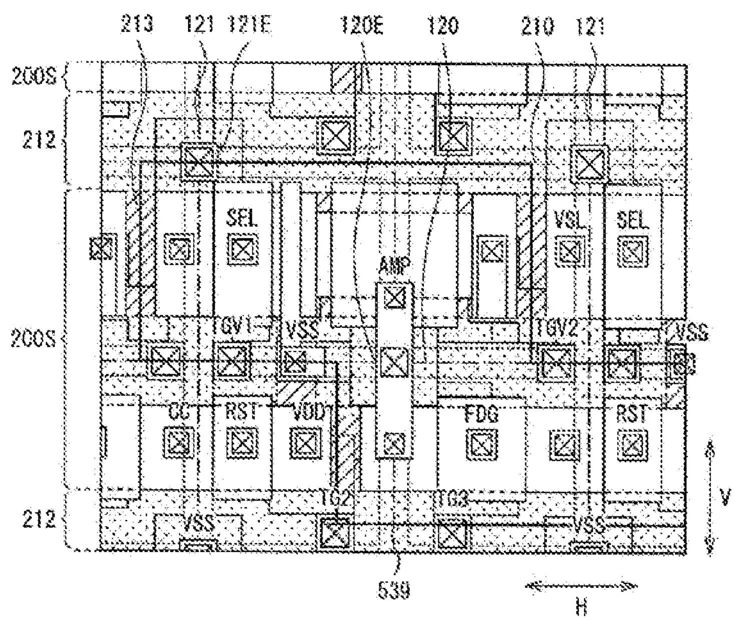
FIG. 89 is a schematic diagram representing an example of the planar configuration of the first wiring layer, along with the pixel circuits illustrated in FIG. 88.
Figure 90:
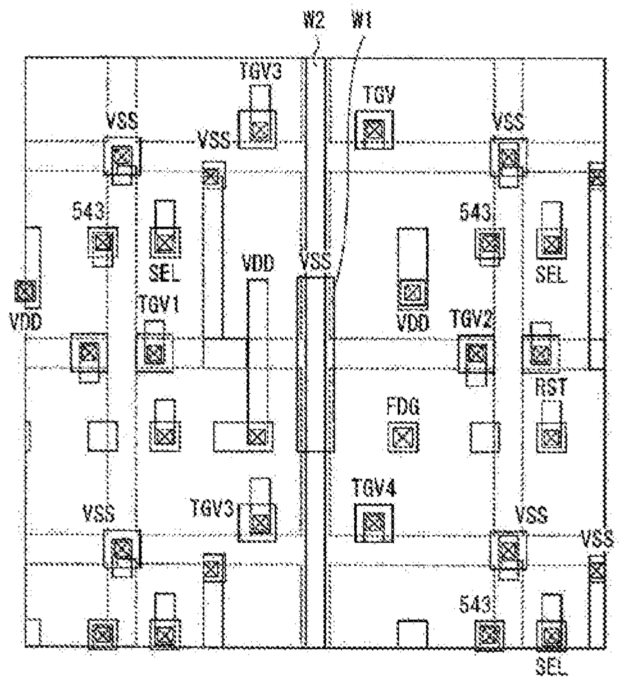
FIG. 90 is a schematic diagram representing an example of the planar configuration of the second wiring layer, along with the first wiring layer illustrated in FIG. 89.
Figure 91:
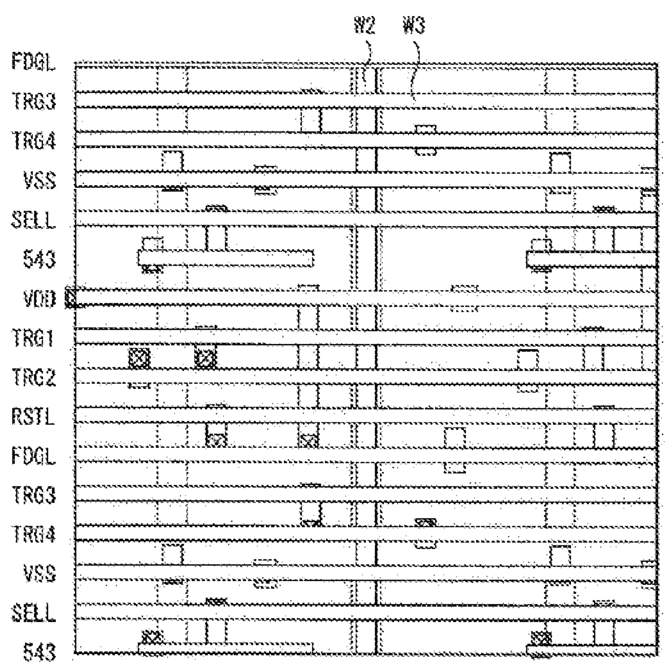
FIG. 91 is a schematic diagram representing an example of the planar configuration of the third wiring layer, along with the second wiring layer illustrated in FIG. 90.
Figure 92:
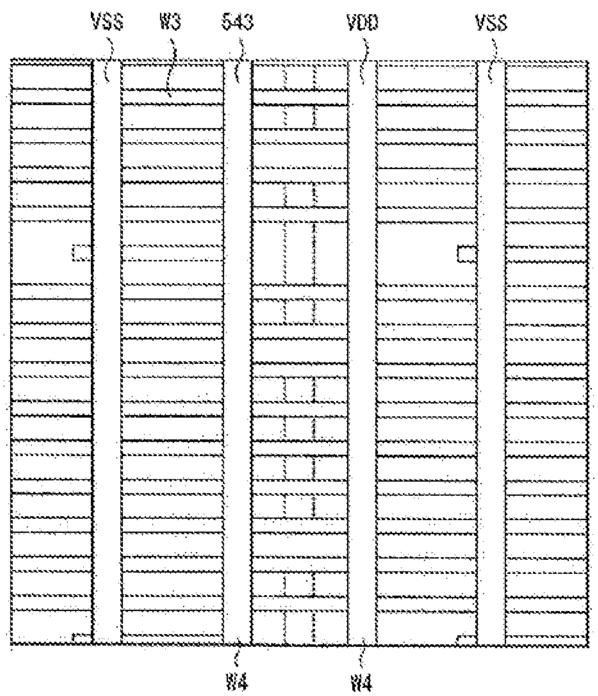
FIG. 92 is a schematic diagram representing an example of the planar configuration of the fourth wiring layer, along with the third wiring layer illustrated in FIG. 91.

FIG. 87 through FIG. 92 represent a modification of the planar configuration of the image capturing device 1 according to the above-described embodiments. FIG. 87 schematically represents the planar configuration of the first substrate 100, and corresponds to FIG. 68B described in the above embodiments. FIG. 88 schematically represents the planar configuration near the front face of the semiconductor layer 200S of the second substrate 200, and corresponds to FIG. 69 described in the above embodiments. FIG. 89 schematically represents the configuration of the first wiring layer W1 and the parts of the semiconductor layer 200S and the first substrate 100 connected to the first wiring layer W1, and corresponds to FIG. 70 described in the above embodiments. FIG. 90 represents an example of the planar configuration of the first wiring layer W1 and the second wiring layer W2, and corresponds to FIG. 71 described in the above embodiments. FIG. 91 represents an example of the planar configuration of the second wiring layer W2 and the third wiring layer W3, and corresponds to FIG. 72 described in the above embodiments. FIG. 92 represents an example of the planar configuration of the third wiring layer W3 and the fourth wiring layer W4, and corresponds to FIG. 73 described in the above embodiments.

In the present modification, the semiconductor layer 200S of the second substrate 200 extends in the H direction (FIG. 89), i.e., generally corresponds to a configuration in which the planar configuration of the image capturing device 1 illustrated in FIG. 82 above and so forth has been rotated by 90 degrees.

For example, the pixel sharing units 539 of the first substrate 100 are formed over two-row×two-column pixel regions, in the same way as described in the above embodiments, and have a substantially square planar shape (FIG. 87). For example, in each of the pixel sharing units 539, the transfer gates TG1 and TG2 of pixels 541A and 541B in one pixel row extend toward the middle portion of the pixel sharing unit 539 in the V direction, and the transfer gates TG3 and TG4 of pixels 541C and 541D in the other pixel row extend in a direction toward the outer side of the pixel sharing unit 539 in the V direction. The pad portion 120 connected to the floating diffusion FD is provided at the middle portion of the pixel sharing unit 539, and the pad portions 121 connected to the VSS contact region 118 are provided at end portions of the pixel sharing unit 539 in at least the V direction (the V direction and the H direction in FIG. 87). At this time, the V-direction position of the through electrodes TGV1 and TGV2 of the transfer gates TG1 and TG2 are near to the V-direction position of the through electrode 120E, and the V-direction position of the through electrodes TGV3 and TGV4 of the transfer gates TG3 and TG4 are near to the V-direction position of the through electrode 121E (FIG. 89). Accordingly, the width of the semiconductor layer 200S extending in the H direction (size in the V direction) can be increased, for the same reason as described in the above embodiments. Accordingly, the size of the amplifying transistor AMP can be made larger, and noise can be suppressed.

In each pixel circuit 210, the selecting transistor SEL and the amplifying transistor AMP are placed arrayed in the H direction, and the reset transistor RST is placed at a position adjacent to the selecting transistor SEL across the insulating region 212 in the V direction (FIG. 88). The FD conversion gain switching transistor FDG is placed arrayed with the reset transistor RST in the H direction. The VSS contact region 218 is provided in the insulating region 212 in an island form. For example, the third wiring layer W3 extends in the H direction (FIG. 91), and the fourth wiring layer W4 extends in the V direction (FIG. 92).

The image capturing device 1 having such a second substrate 200 also yields the same advantages as that described in the above embodiments. The placement of the pixel sharing units 539 of the second substrate 200 is not limited to the placement described in the above embodiments and the present modification. For example, the semiconductor layer 200S described in the above embodiments and Modification 1 may extend in the H direction.

5. MODIFICATION 4

Figure 93:
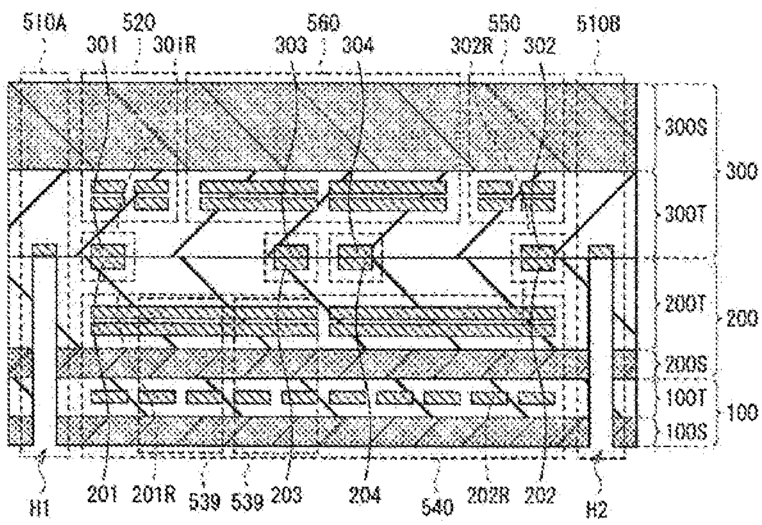
FIG. 93 is a cross-sectional schematic diagram representing another example of the image capturing device illustrated in FIG. 64.

FIG. 93 schematically represents a modification of the cross-sectional configuration of the image capturing device 1 according to the above-described embodiments.

FIG. 93 corresponds to FIG. 64 described in the above embodiments. In the present modification, the image capturing device 1 has, in addition to the contact portions 201, 202, 301, and 302, the contact portions 203, 204, 303, and 304, at positions facing the middle portion of the pixel array unit 540. The image capturing device 1 according to the present modification differs from the image capturing device 1 described in the above embodiments with regard to this point.

The contact portions 203 and 204 are provided exposed on the second substrate 200 at the joining face with the third substrate 300. The contact portions 303 and 304 are provided exposed on the third substrate 300 at the joining face with the second substrate 200. The contact portions 203 are in contact with the contact portions 303, and the contact portions 204 are in contact with the contact portions 304. That is to say, in this image capturing device 1, the second substrate 200 and the third substrate 300 are connected by the contact portions 203, 204, 303, and 304, in addition to the contact portions 201, 202, 301, and 302.

Figure 94:
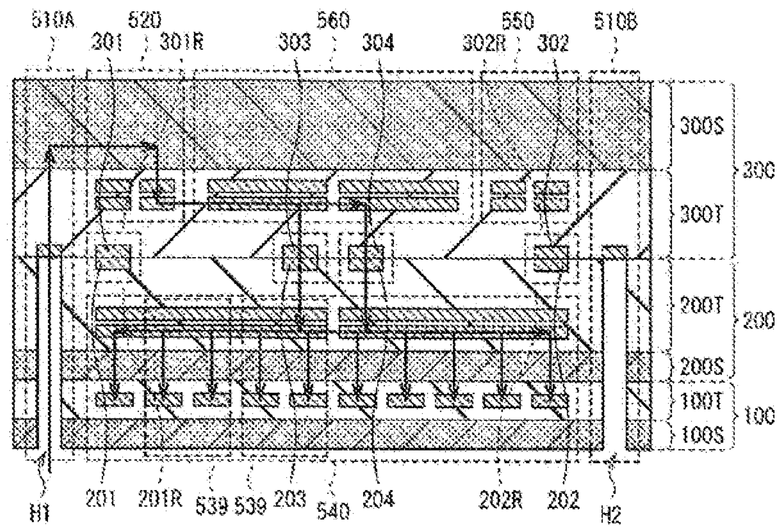
FIG. 94 is a schematic diagram for description regarding paths of input signals to the image capturing device illustrated in FIG. 93.
Figure 95:
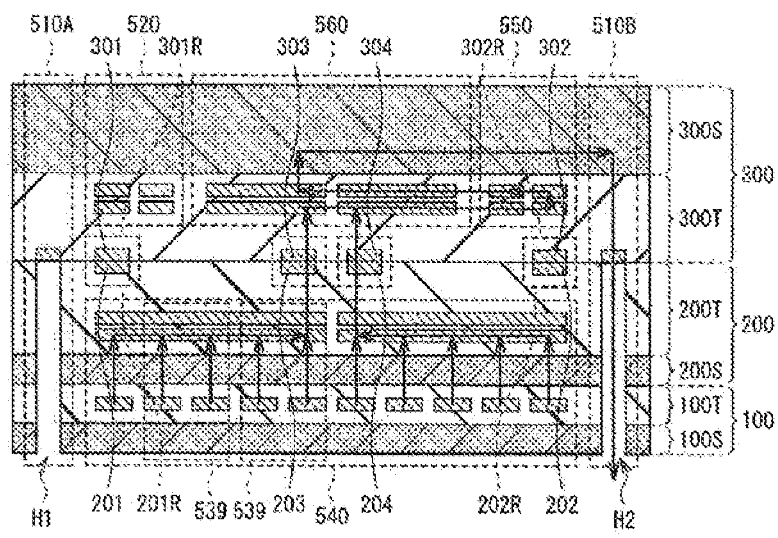
FIG. 95 is a schematic diagram for description regarding signal paths of pixel signals of the image capturing device illustrated in FIG. 93.

Next, the operations of this image capturing device 1 will be described with reference to FIG. 94 and FIG. 95. FIG. 94 represents paths of input signals externally input to the image capturing device 1, and paths of power source potential and reference potential by arrows. FIG. 95 represents signal paths of pixel signals externally output from the image capturing device 1 by arrows. For example, input signals input to the image capturing device 1 via the input unit 510A are transferred to the row driving unit 520 of the third substrate 300, and row driving signals are created at the row driving unit 520. The row driving signals are sent to the second substrate 200 via the contact portions 303 and 203. Further, the row driving signals reach each of the pixel sharing units 539 of the pixel array unit 540 via the row drive signal lines 542 within the wiring layer 200T. Of the row driving signals reaching the pixel sharing units 539 of the second substrate 200, driving signals for other than the transfer gate TG are input to the pixel circuits 210, and the transistors included in the pixel circuits 210 are driven. Driving signals for the transfer gate TG are input to the transfer gates TG1, TG2, TG3, and TG4 of the first substrate 100 via the through electrodes TGV, and the pixels 541A, 541B, 541C, and 541D are driven. Also, the power source potential and the reference potential supplied to the input unit 510A (input terminal 511) of the third substrate 300 from outside of the image capturing device 1 are sent to the second substrate 200 via the contact portions 303 and 203, and are supplied to the pixel circuits 210 of each of the pixel sharing units 539 via wiring within the wiring layer 200T. The reference potential is further supplied to the pixels 541A, 541B, 541C, and 541D of the first substrate 100 via the through electrodes 121E. Meanwhile, pixel signals obtained by photoelectric conversion at the pixels 541A, 541B, 541C, and 541D of the first substrate 100 are sent to the pixel circuit 210 of the second substrate 200 for each pixel sharing unit 539. Pixel signals based on these pixel signals are sent from the pixel circuit 210 to the third substrate 300 via the vertical signal lines 543 and the contact portions 204 and 304. These pixel signals are subjected to processing at the column signal processing unit 550 and the image signal processing unit 560 of the third substrate 300, and thereafter are externally output via the output unit 510B.

The image capturing device 1 having such contact portions 203, 204, 303, and 304 also yields the same advantages as that described in the above embodiments. The position, number, and so forth, of the contact portions can be changed in accordance with the design of circuits and so forth of the third substrate 300, which are the connection destination of wiring via the contact portions 303 and 304.

6. MODIFICATION 5

Figure 96:
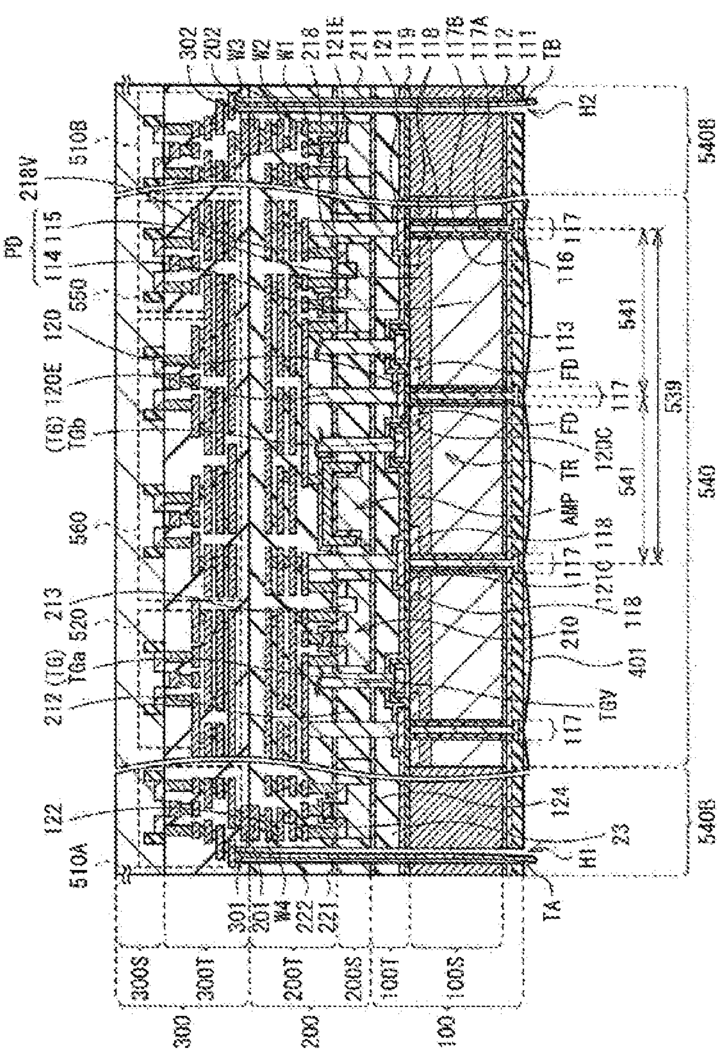
FIG. 96 is a cross-sectional schematic diagram representing another example of the image capturing device illustrated in FIG. 67.

FIG. 96 represents a modification of the cross-sectional configuration of the image capturing device 1 according to the above embodiments. FIG. 96 corresponds to FIG. 67 described in the above embodiments. In the present modification, a transfer transistor TR having a planar structure is provided to the first substrate 100. The image capturing device 1 according to the present modification differs from the image capturing device 1 described in the above embodiments with regard to this point.

The transfer gate TG of this transfer transistor TR is configured of only the horizontal portion TGb. That is to say, the transfer gate TG has no vertical portion TGa, and is provided facing the semiconductor layer 100S.

The image capturing device 1 having such a transfer transistor TR with a planar structure also yields the same advantages as that described in the above embodiments. Further, it is conceivable that providing the planar type transfer gate TG on the first substrate 100 enables forming the photodiodes PD nearer to the surface of the semiconductor layer 100S as compared with a case of providing a vertical transfer gate TG on the first substrate 100, thereby increasing saturation signal quantity (Qs). Also, the method of forming the planar type transfer gate TG on the first substrate 100 involves fewer manufacturing processes as compared to the method of forming the vertical type transfer gate TG on the first substrate 100, and it is conceivable that adverse effects on the photodiodes PD due to the manufacturing process occurs less readily.

7. MODIFICATION 6

Figure 97:
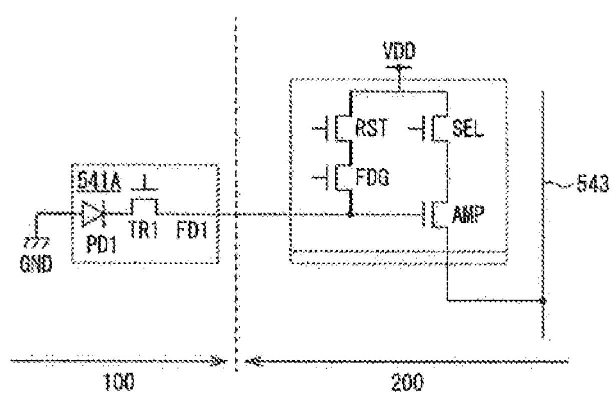
FIG. 97 is diagram representing another example of the equivalent circuit in FIG. 65.

FIG. 97 represents a modification of the pixel circuit of the image capturing device 1 according to the above embodiments. FIG. 97 corresponds to FIG. 65 described in the above embodiments. In the present modification, the pixel circuit 210 is provided to each single pixel (pixel 541A). That is to say, the pixel circuit 210 is not shared among a plurality of pixels. The image capturing device 1 according to the present modification differs from the image capturing device 1 described in the above embodiments with regard to this point.

The image capturing device 1 according to the present modification is the same as the image capturing device 1 described in the above embodiments with regard to the point of providing the pixel 541A and the pixel circuit 210 on different substrates (first substrate 100 and second substrate 200) from each other. Accordingly, the image capturing device 1 according to the present modification can also yield the same advantages as that described in the above embodiments.

8. MODIFICATION 7

Figure 98:
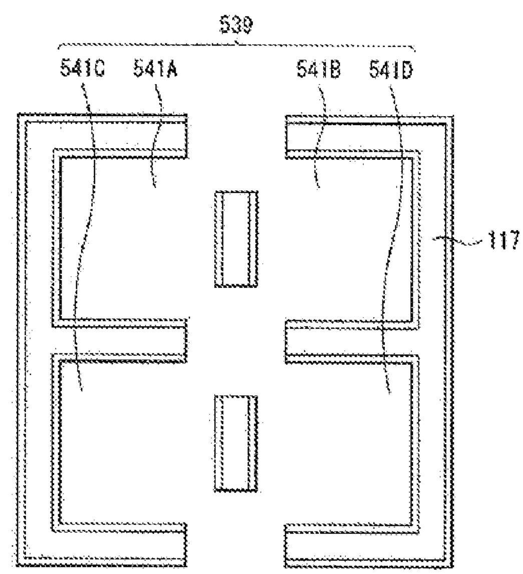
FIG. 98 is a planar schematic diagram representing another example of a pixel isolation portion illustrated in FIG. 68A and so forth.

FIG. 98 represents a modification of the planar configuration of the pixel isolation portions 117 described in the above embodiments. Gaps may be provided in the pixel isolation portions 117 surrounding each of the pixels 541A, 541B, 541C, and 541D. That is to say, the entire periphery of the pixels 541A, 541B, 541C, and 541D does not have to be surrounded by the pixel isolation portions 117. The gaps in the pixel isolation portions 117 are provided near the pad portions 120 and 121 (see FIG. 68B), for example.

Although description has been made regarding an example in which the pixel isolation portions 117 have an FTI structure that passes completely through the semiconductor layer 100S (see FIG. 67) in the above embodiments, the pixel isolation portions 117 may have a structure other than an FTI structure. For example, an arrangement may be made where the pixel isolation portions 117 are provided not completely passing through the semiconductor layer 100S, having a so-called DTI (Deep Trench Isolation) structure.

9. ADAPTATION EXAMPLE

Figure 99:
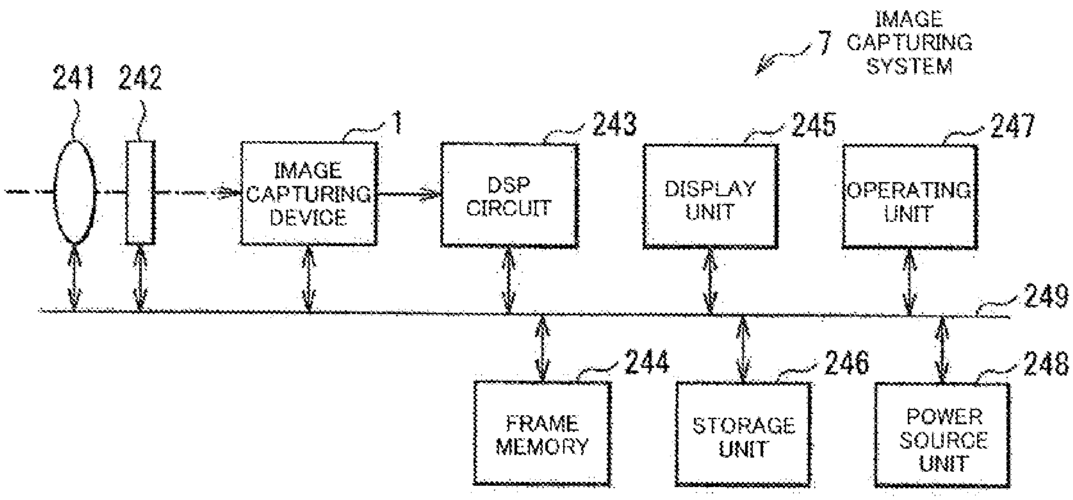
FIG. 99 is a diagram representing an example of a schematic configuration of an image capturing system that is provided with the image capturing device according to the above embodiments and modifications thereof.

FIG. 99 represents an example of a schematic configuration of an image capturing system 7 that has the image capturing device 1 according to the above-described embodiments and the modifications thereof.

The image capturing system 7 is an electronic apparatus, including an image capturing device such as a digital still camera, video camera, or the like, or a mobile terminal device such as a smartphone, tablet terminal, or the like, for example. The image capturing system 7 is provided with, for example, the image capturing device 1 according to the above-described embodiments and modifications thereof, a DSP circuit 243, frame memory 244, a display unit 245, a storage unit 246, an operating unit 247, and a power source unit 248. In the image capturing system 7, the image capturing device 1 according to the above-described embodiments and modifications thereof, the DSP circuit 243, the frame memory 244, the display unit 245, the storage unit 246, the operating unit 247, and the power source unit 248 are connected to each other via a bus line 249.

The image capturing device 1 according to the above-described embodiments and modifications thereof outputs image data in accordance with incident light. The DSP circuit 243 is a signal processing circuit that processes signals (image data) output from the image capturing device 1 according to the above-described embodiments and modifications thereof. The frame memory 244 temporarily holds the image data processed by the DSP circuit 243, in increments of frames. The display unit 245 is made up of a panel type display device, such as a liquid crystal panel or organic EL (Electro Luminescence) panel or the like, for example, and displays moving images or still images captured by the image capturing device 1 according to the above-described embodiments and modifications thereof. The storage unit 246 records image data of the moving images or still images captured by the image capturing device 1 according to the above-described embodiments and modifications thereof in a recording medium such as semiconductor memory, a hard disk, or the like. The operating unit 247 issues operation commands regarding various types of functions that the image capturing system 7 has, following user operations. The power source unit 248 supplies various types of power sources serving as operation power sources of the image capturing device 1 according to the above-described embodiments and modifications thereof, the DSP circuit 243, the frame memory 244, the display unit 245, the storage unit 246, and the operating unit 247, as appropriate to these objects of supply.

Next, image capturing procedures of the image capturing system 7 will be described.

Figure 100:
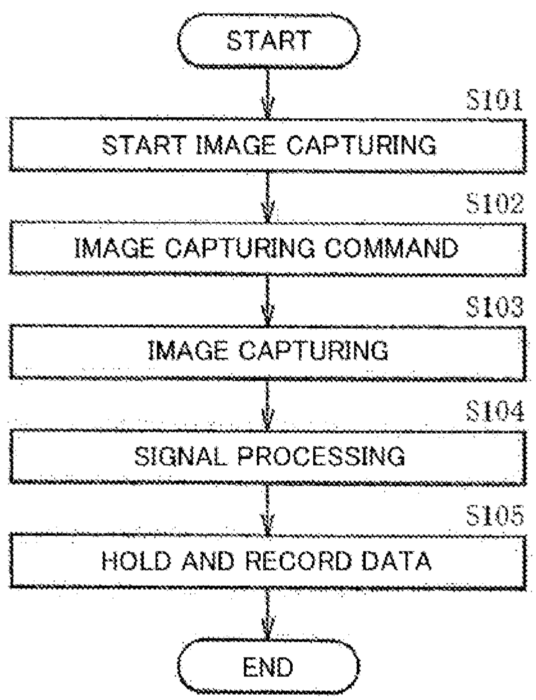
FIG. 100 is a diagram representing an example of image capturing procedures of the image capturing system illustrated in FIG. 99.

FIG. 100 represents an example of a flowchart of image capturing operations of the image capturing system 7. The user instructs starting of image capturing by operating the operating unit 247 (step S101). Thereupon, the operating unit 247 transmits an image capturing command to the image capturing device 1 (step S102). Upon receiving the image capturing command, the image capturing device 1 (specifically, a system control circuit 36) executes image capturing by a predetermined image capturing format (step S103).

The image capturing device 1 outputs the image data obtained by the image capturing to the DSP circuit 243. Image data here is data for all pixels worth of pixel signals generated on the basis of charges temporarily held in the floating diffusions FD. The DSP circuit 243 performs predetermined signal processing (e.g., noise reduction processing and so forth) on the basis of image data input from the image capturing device 1 (step S104). The DSP circuit 243 causes the frame memory 244 to hold the image data subjected to the predetermined signal processing, and the frame memory 244 causes the storage unit 246 to store the image data (step S105). Thus, image capturing of the image capturing system 7 is performed.

In the above adaptation example, the image capturing device 1 according to the above-described embodiments and the modifications thereof is adapted to an image capturing system 7. Accordingly, the image capturing device 1 can be reduced in size or made to be high in definition, and accordingly a small-sized or high-definition image capturing system 7 can be provided.

10. APPLICATION EXAMPLES

Application Example 1

Technology according to the present disclosure (the present technology) can be applied to various products. For example, the technology according to the present disclosure may be realized as a device installed in any type of moving body, such as an automobile, an electric vehicle, a hybrid electric vehicle, a motorcycle, a bicycle, a personal mobility device, an aircraft, a drone, a waterborne vessel, a robot, and so forth.

Figure 101:
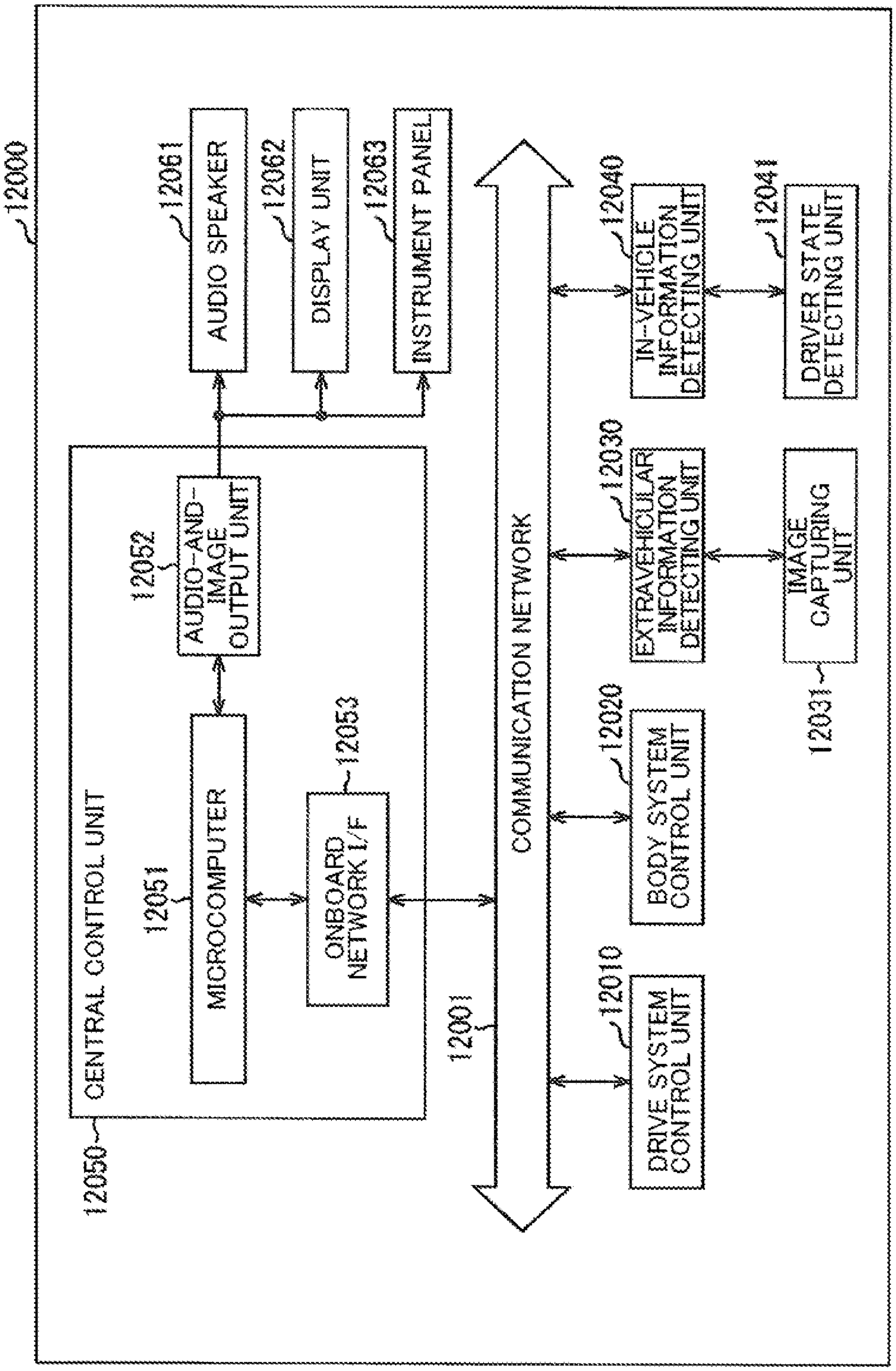
FIG. 101 is a block diagram illustrating an example of a schematic configuration of a vehicle control system.

FIG. 101 is a bock diagram illustrating a schematic configuration example of a vehicle control system, which is an example of a moving body control system to which the technology according to the present disclosure can be adapted.

A vehicle control system 12000 is provided with a plurality of electronic control units connected via a communication network 12001. In the example illustrated in FIG. 101, the vehicle control system 12000 includes a drive system control unit 12010, a body system control unit 12020, an extravehicular information detecting unit 12030, an in-vehicle information detecting unit 12040, and a central control unit 12050. Also, a microcomputer 12051, an audio-and-image output unit 12052, and an onboard network I/F (interface) 12053 are illustrated as functional configurations of the central control unit 12050.

The drive system control unit 12010 controls operations of devices relating to the drive system of the vehicle, following various types of programs. For example, the drive system control unit 12010 functions as a control device of a drive power generating device to generate drive power for the vehicle, such as an internal combustion engine or a traction motor or the like, a drive power transmission mechanism for transmitting the drive power to the wheels, a steering mechanism that adjusts the steering angle of the vehicle, and a braking device that generates braking force for the vehicle, and so forth.

The body system control unit 12020 controls operations of various types of devices provided to the vehicle body, following various types of programs. For example, the body system control unit 12020 functions as a control device of a keyless entry system, a smart key system, a power window device, and various types of lamps such as headlamps, taillamps, brake lamps, turn signals, foglamps, and so forth. In this case, radio waves emitted from a portable device that substitutes for a key, and signals from various types of switches, may be input to the body system control unit 12020. The body system control unit 12020 receives input of these radio waves or signals, and controls the door lock device, power window device, lamps, and so forth, of the vehicle.

The extravehicular information detecting unit 12030 detects information outside of the vehicle in which the vehicle control system 12000 is installed. For example, an image capturing unit 12031 is connected to the extravehicular information detecting unit 12030. The extravehicular information detecting unit 12030 causes the image capturing unit 12031 to perform image capturing of images outside of the vehicle, and receives the captured images. The extravehicular information detecting unit 12030 may perform object detection processing such as persons, vehicles, obstructions, traffic signs, letters on the pavement, and so forth, or distance detection processing, on the basis of received images.

The image capturing unit 12031 is an optical sensor that receives light and outputs electrical signals in accordance with the quantity of light received. The image capturing unit 12031 can output the electric signals as images, and can output as ranging information. Also, the light that the image capturing unit 12031 receives may be visible light, or may be invisible light such as infrared rays or the like.

The in-vehicle information detecting unit 12040 detects in-vehicle information. A driver state detecting unit 12041 that detects the state of the driver, for example, is connected to the in-vehicle information detecting unit 12040. The driver state detecting unit 12041 includes a camera that captures images of the driver, for example. The in-vehicle information detecting unit 12040 may calculate the degree of fatigue or the degree of concentration of the driver on the basis of the detected information input from the driver state detecting unit 12041, or may distinguish whether the driver has fallen asleep.

On the basis of the information within and outside of the vehicle, acquired by the extravehicular information detecting unit 12030 and in-vehicle information detecting unit 12040, the microcomputer 12051 can compute the control target values for the drive power generating device, the steering mechanism, and the braking device, and can output control commands to the drive system control unit 12010. For example, the microcomputer 12051 can perform collaborative control intended to realize ADAS (Advanced Driver Assistance System) functions including vehicle collision avoidance or impact mitigation, following traveling based on inter-vehicular distance, cruise control driving, vehicle collision warning, vehicle lane departure warning, and so forth.

Also, the microcomputer 12051 can perform collaborative control intended to realize automated driving and so forth, in which the vehicle autonomously travels without driver operations, by controlling the drive power generating device, the steering mechanism, the braking device, and so forth, on the basis of information around the vehicle acquired by the extravehicular information detecting unit 12030 and the in-vehicle information detecting unit 12040.

Also, the microcomputer 12051 can output control commands to the body system control unit 12020 on the basis of extravehicular information acquired by the extravehicular information detecting unit 12030. For example, the microcomputer 12051 can perform collaborative control intended to realize glare prevention, such as controlling the headlamps in accordance with the position of a vehicle traveling ahead or an oncoming vehicle detected by the extravehicular information detecting unit 12030, to switch between high beams and low beams, and so forth.

The audio-and-image output unit 12052 transmits output signals of at least one of audio and images to an output device capable of notifying occupants of the vehicle or outside of the vehicle of information, visually or audibly. In the example in FIG. 101, an audio speaker 12061, a display unit 12062, and an instrument panel 12063 are exemplified as output devices. The display unit 12062 may include at least one of an onboard display and a head-up display, for example.

Figure 102:
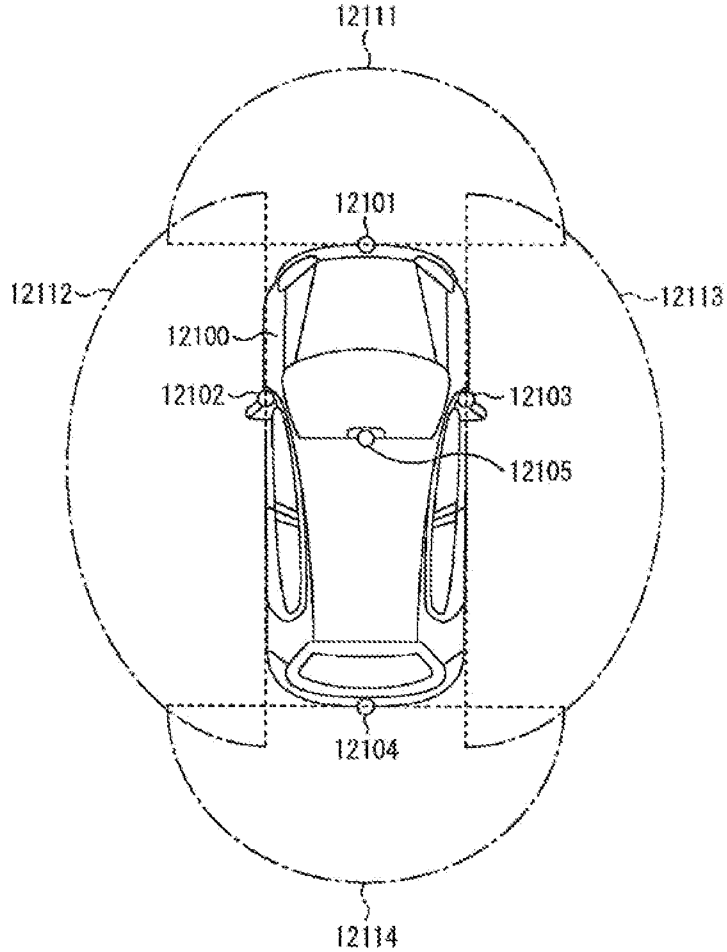
FIG. 102 is an explanatory diagram illustrating an example of an extravehicular information detection unit and installation positions of image capturing units.

FIG. 102 is a diagram illustrating an example of installation positions of the image capturing unit 12031.

In FIG. 102, a vehicle 12100 has, as the image capturing unit 12031, image capturing units 12101, 12102, 12103, 12104, and 12105.

The image capturing units 12101, 12102, 12103, 12104, and 12105 are provided to positions such as, for example, the front nose of the vehicle 12100, the side mirrors, a rear bumper, a rear hatch, at the top of the windshield in the vehicle cabin, and so forth. The image capturing unit 12101 provided to the front nose and the image capturing unit 12105 provided to the tip of the windshield in the vehicle cabin primarily acquire images of ahead of the vehicle 12100. The image capturing units 12102 and 12103 provided to the side mirrors primarily acquire images toward the sides of the vehicle 12100. The image capturing unit 12104 provided to the rear bumper or the rear hatch primarily acquires images of behind the vehicle 12100. The images ahead taken by the image capturing units 12101 and 12105 are primarily used for detection of vehicles traveling ahead, or pedestrians, obstructions, traffic signals, traffic signs, lanes, and so forth.

Note that FIG. 102 illustrates an example of a shooting range of the image capturing units 12101 through 12104. A image capturing range 12111 indicates the image capturing range of the image capturing unit 12101 provided on the front nose, shooting ranges 12112 and 12113 indicate the image capturing ranges of the image capturing units 12102 and 12103 provided to the respective side mirrors, and a shooting range 12114 indicates the image capturing range of the image capturing unit 12104 provided to the rear bumper or the rear hatch. By overlaying the image data captured by the image capturing units 12101 through 12104, for example, a plane view image as viewed from above the vehicle 12100 is obtained.

At least one of the image capturing units 12101 through 12104 may have a function of acquiring distance information. For example, at least one of the image capturing units 12101 through 12104 may be a stereo camera made up of a plurality of image sensors, or may be an image sensor that has pixels for phase difference detection.

For example, the microcomputer 12051 can find the distances to the objects within the image capturing ranges 12111 through 12114 and temporal change of the distances (relative speed as to the vehicle 12100) on the basis of distance information obtained from the image capturing units 12101 through 12104, thereby extracting a nearest three-dimensional object on the path of travel of the vehicle 12100 in particular, that is traveling in substantially the same direction as the vehicle 12100 at a predetermined speed (e.g., 0 km/h or more), as being a vehicle traveling ahead. Further, the microcomputer 12051 can set, in advance, an inter-vehicular distance to be kept in front as to the vehicle traveling ahead, and perform automatic braking control (including following stop control) and automatic acceleration control (including following start control) and so forth. Thus, collaborative control, intended to realize automated driving or the like in which autonomous driving is performed without driver operations, can be performed.

For example, the microcomputer 12051 can, on the basis of distance information obtained from the image capturing units 12101 through 12104, extract three-dimensional object data regarding three-dimensional objects, and classify into motorcycles, standard-size vehicles, large-size vehicles, pedestrians, utility poles, and so forth, and other three-dimensional objects, to be used for automatic avoidance of obstructions. For example, the microcomputer 12051 identifies obstructions around the vehicle 12100 as being visually-recognizable obstructions to the driver of the vehicle 12100, and obstructions that are difficult to visually recognize. The microcomputer 12051 then judges collision risks, which indicate the degree of danger of collision with each of the obstructions, and when the collision risk is equal to or greater than a set value and there is a possibility of a collision, and can output a warning to the driver by the audio speaker 12061 and the display unit 12062, or can perform driving assistance for collision avoidance, by performing forced deceleration or avoidance steering by the drive system control unit 12010.

At least one of the image capturing units 12101 through 12104 may be an infrared camera that detects infrared rays. For example, the microcomputer 12051 can recognize pedestrians by determining whether or not there are pedestrians in the captured images of the image capturing units 12101 through 12104. This pedestrian recognition is performed by procedures of extracting, for example, feature points in images captured by the image capturing units 12101 through 12104 serving as infrared cameras, and procedures of distinguishing whether or not pedestrians by performing pattern matching processing on series of feature points forming outlines of the objects. When the microcomputer 12051 determines that a pedestrian is in images captured by the image capturing units 12101 through 12104, and recognizes the pedestrian, the audio-and-image output unit 12052 controls the display unit 12062 to display a square outline in a superimposed manner to emphasize the recognized pedestrian. Also, the audio-and-image output unit 12052 may control the display unit 12062 to display an icon or the like representing a pedestrian at a desired position.

An example of the moving body control system to which the technology according to the present disclosure can be adapted has been described above. Of the above-described configurations, the technology according to the present disclosure can be adapted to the image capturing unit 12031. Specifically, the image capturing device 1 according to the above embodiments and the modifications thereof can be adapted to the image capturing unit 12031. By adapting the technology according to the present disclosure to the image capturing unit 12031, high-definition shot images with little noise can be obtained, and accordingly highly precise control using the shot images can be performed in the moving body control system.

Application Example 2

Figure 103:
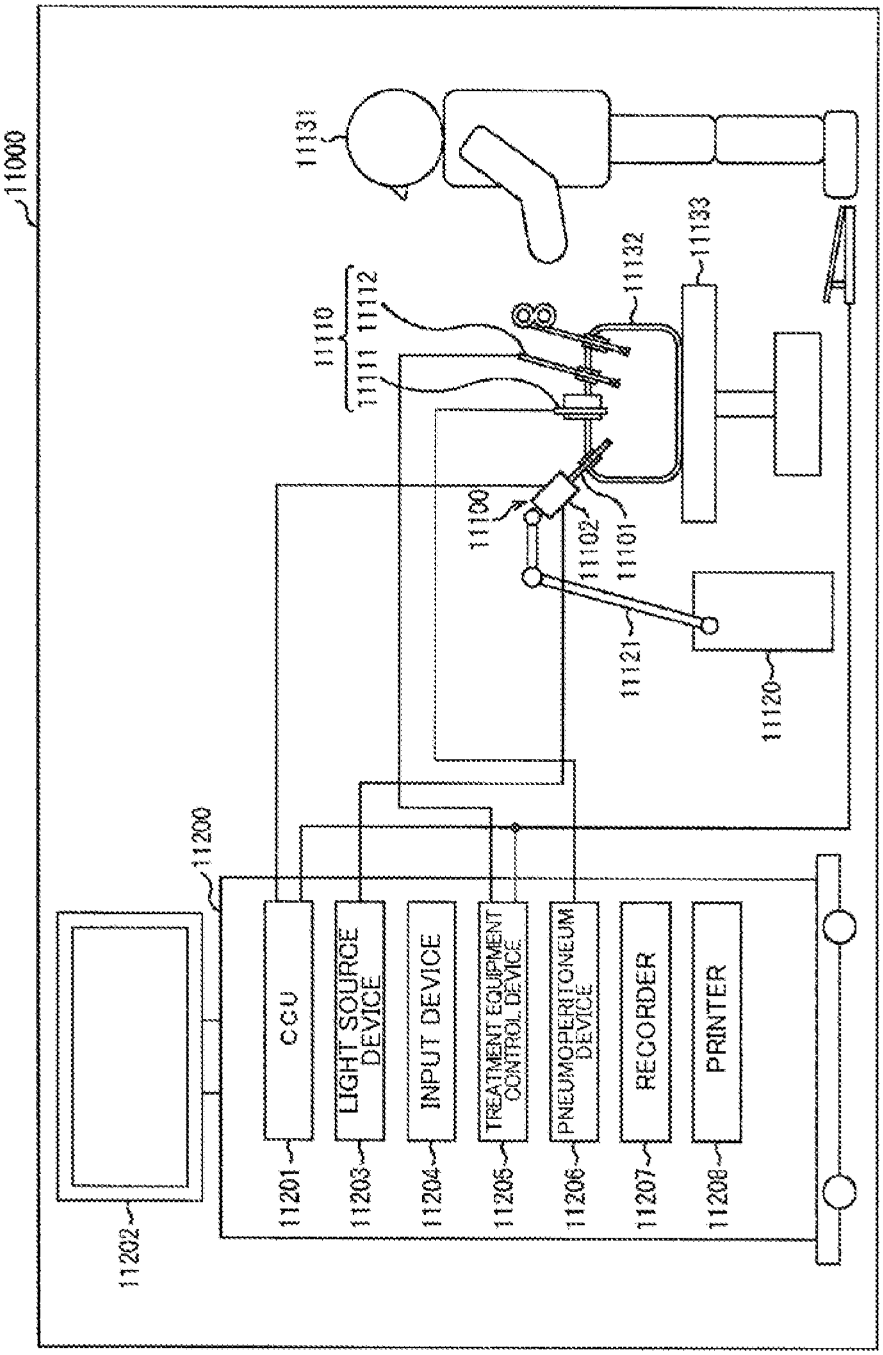
FIG. 103 is a diagram illustrating an example of a schematic configuration of an endoscopic surgery system.

FIG. 103 is a diagram illustrating an example of a schematic configuration of an endoscopic surgery system to which the technology according to the present disclosure (present technology) can be adapted.

FIG. 103 illustrates an operator (surgeon) 11131 performing surgery on a patient 11132 on a patient bed 11133, using an endoscopic surgery system 11000. The endoscopic surgery system 11000 is configured of an endoscope 11100, other surgical instruments 11110 such as a pneumoperitoneum tube 11111, energy treatment equipment 11112, and so forth, a supporting arm device 11120 that supports the endoscope 11100, and a cart 11200 on which various types of devices for the endoscopic surgery are loaded, as illustrated in the Figure.

The endoscope 11100 is configured of a tube 11101 of which a region of a predetermined length from a distal end is inserted into the body cavity of the patient 11132, and a camera head 11102 connected to a base end of the tube 11101. In the example illustrated in the Figure, the endoscope 11100 is illustrated as being configured as a so-called rigid endoscope that has a rigid tube 11101, but the endoscope 11100 may be configured as a so-called flexible endoscope having a flexible tube.

An opening in which an objective lens is fit is provided to the distal end of the tube 11101. A light source device 11203 is connected to the endoscope 11100, and light generated by this light source device 11203 is guided to by a light guide extending through the inside of the tube 11101 to the distal end of the tube, and is radiated toward an object of observation within the body cavity of the patient 11132 via the objective lens. Note that the endoscope 11100 may be a forward-viewing endoscope, or may be a forward-oblique viewing endoscope or a side-view endoscope.

An optical system and an image sensor are provided inside the camera head 11102, and reflected light (observation light) from the object of observation is collected at the image sensor by the optical system. Photoelectric conversion of the observation light is performed by the image sensor, and electrical signals corresponding to the observation light, i.e., image signals corresponding to an observation image are generated. The image signals are transmitted to a camera control unit (CCU: Camera Control Unit) 11201 as RAW data.

The CCU 11201 is configured of a CPU (Central Processing Unit), a GPU (Graphics Processing Unit), and so forth, and centrally controls the operations of the endoscope 11100 and a display device 11202. Further, the CCU 11201 receives image signals from the camera head 11102 and performs various types of image processing on the image signals, such as for example, developing processing (demosaicing processing) and so forth, for displaying images based on the image signals.

The display device 11202 displays images based on the image signals subjected to image processing by the CCU 11201, under control of the CCU 11201.

The light source device 11203 is configured of a light source such as an LED (Light Emitting Diode) or the like, for example, and supplies illumination light for shooting a surgery site or the like to the endoscope 11100.

An input device 11204 is an input interface for the endoscopic surgery system 11000. A user can perform input of various types of information and input instructions to the endoscopic surgery system 11000 through the input device 11204. For example, the user inputs instructions or the like to change image capturing conditions by the endoscope 11100 (type of illumination light, scale, focusing distance, and so forth).

A treatment equipment control device 11205 controls driving of the energy treatment equipment 11112 for cauterizing or incising tissue, sealing blood vessels, and so forth. A pneumoperitoneum device 11206 feeds gas into the body cavity through the pneumoperitoneum tube 11111 to insufflate the body cavity of the patient 11132, in order to secure a field of view for the endoscope 11100 and secure workspace for the operator. A recorder 11207 is a device capable of recording various types of information relating to the surgery. A printer 11208 is a device capable of printing various types of information relating to the surgery in various types of formats, such as text, images, graphs, and so forth.

Note that the light source device 11203 that supplies illumination light to the endoscope 11100 for shooting the surgery site can be configured from a white light source configured of, for example, LEDs, a laser light source, or a combination thereof. In a case of the white light source is configured of an RGB laser light source combination, the output intensity and output timing of each color (each wavelength) can be controlled with high precision, and accordingly adjustment of white balance of the captured image can be performed at the light source device 11203. Also, in this case, by illuminating the object of observation in time division by laser light from each RGB laser light source, and controlling driving of the image sensor of the camera head 11102 synchronously with the illumination timing, images corresponding to each of R, G, and B can be captured in time division. According to this method, color images can be obtained even without providing the image sensor with a color filter.

Also, the driving of the light source device 11203 may be controlled so that the intensity of light being output is changed each predetermined amount of time. By controlling the driving of the image sensor of the camera head 11102 synchronously with the timing of changing the intensity of light to acquire images in time division, and compositing these images, images with a high dynamic range, free of so-called clipped blacks and clipped whites, can be generated.

Also, the light source device 11203 may be configured to be able to supply light of a predetermined wavelength band corresponding to special light observation. In special light observation, so-called narrowband observation (Narrow Band Imaging), in which wavelength dependency of absorbance of light by body tissue is used to perform shooting of particular tissue with high contrast, such as blood vessels in superficial portions of mucous membranes, by illuminating with light of a narrow band as compared to the illumination light for when performing normal observation (i.e., white light). Alternatively, in special light observation, fluorescence observation, in which an image is obtained from fluorescent light generated by emitting an excitation light, may be performed. In fluorescence observation, emitting an excitation light to body tissue and observing fluorescent light from the body tissue (autofluorescence observation), and locally injecting a reagent such as indocyanine green (ICG) or the like into the body tissue and emitting an excitation light corresponding to the fluorescing wavelength of the reagent onto the body tissue to yield a fluorescent image, and so forth, can be performed. The light source device 11203 may be configured to be able to supply narrowband light and/or excitation light corresponding to such special light observation.

Figure 104:
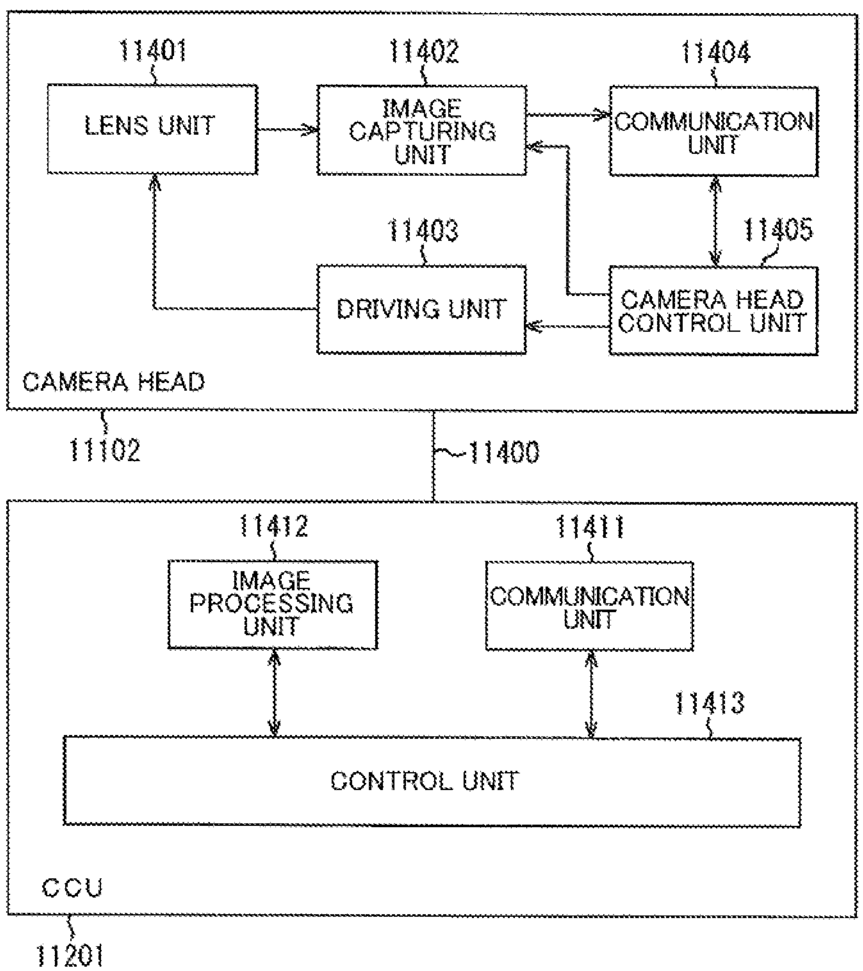
FIG. 104 is a block diagram illustrating an example of a functional configuration of a camera head and a CCU.

FIG. 104 is a block diagram illustrating an example of the functional configuration of the camera head 11102 and the CCU 11201 illustrated in FIG. 103.

The camera head 11102 has a lens unit 11401, an image capturing unit 11402, a driving unit 11403, a communication unit 11404, and a camera head control unit 11405. The CCU 11201 has a communication unit 11411, an image processing unit 11412, and a control unit 11413. The camera head 11102 and the CCU 11201 are connected by a transmission cable 11400 so as to be capable of communication with each other.

The lens unit 11401 is an optical system provided at a portion of connection to the tube 11101. Observation light taken into the tube 11101 from the distal end thereof is guided to the camera head 11102, and enters the lens unit 11401. The lens unit 11401 is configured of a combination of a plurality of lenses, including a zoom lens and a focusing lens.

The image capturing unit 11402 is configured of an image sensor. The image sensor configuring the image capturing unit 11402 may be one (a so-called single-sensor type), or may be a plurality (a so-called multi-sensor type). In a case where the image capturing unit 11402 is configured as a multi-sensor type, a color image may be obtained by image signals corresponding to each of R, G, and B by each image sensor being generated, and these being composited. Alternatively, the image capturing unit 11402 may be configured having a pair of image sensor for obtaining each of image signals for the right eye and for the left eye, corresponding to 3D (Dimensional) display. Performing 3D display enables the operator 11131 to even more accurately comprehend the depth of the body tissue at the surgery site. Note that in a case in which the image capturing unit 11402 is configured as a multi-sensor type, a plurality of systems of the lens unit 11401 may also be provided in accordance with the image sensors.

Also, the image capturing unit 11402 does not necessarily have to be provided to the camera head 11102. For example, the image capturing unit 11402 may be provided inside the tube 11101, directly behind the objective lens.

The driving unit 11403 is configured of an actuator, and moves the zoom lens and the focusing lens of the lens unit 11401 by a predetermined distance along the optical axis, under control from the camera head control unit 11405. Accordingly, the scale and the focal point of captured images from the image capturing unit 11402 can be appropriately adjusted.

The communication unit 11404 is configured of a communication device for transmitting and receiving various types of information with the CCU 11201. The communication unit 11404 transmits image signals obtained from the image capturing unit 11402 to the CCU 11201 via the transmission cable 11400, as RAW data.

The communication unit 11404 also receives control signals for controlling driving of the camera head 11102 from the CCU 11201, and supplies the control signals to the camera head control unit 11405. These control signals include, for example, information relating to image capturing conditions, such as information for specifying the framerate of captured images, information for specifying exposure values when capturing images, and/or information for specifying the scale and the focal point of captured images and so forth.

Note that the image capturing conditions, such as the aforementioned framerate, exposure values, scale, focal point, and so forth, may be specified as appropriate by the user, or may be automatically set by the control unit 11413 of the CCU 11201, on the basis of the acquired images. In the case of the latter, so-called AE (Auto Exposure) functions, AF (Auto Focus) functions, and AWB (Auto White Balance) functions are implemented in the endoscope 11100.

The camera head control unit 11405 controls driving of the camera head 11102 on the basis of control signals from the CCU 11201, received via the communication unit 11404.

The communication unit 11411 is configured of a communication device for transmitting and receiving various types of information with the camera head 11102. The communication unit 11411 receives image signals transmitted from the camera head 11102 via the transmission cable 11400.

The communication unit 11411 also transmits control signals to the camera head 11102, to control driving of the camera head 11102. The image signals and the control signals can be transmitted by electrical communication, optical communication, and so forth.

The image processing unit 11412 subjects image signals, which are RAW data transmitted from the camera head 11102, to various types of image processing.

The control unit 11413 performs image capturing of surgery sites and so forth by the endoscope 11100, and various types of control relating to display of captured images obtained by image capturing of the surgery sites, and so forth. For example, the control unit 11413 generates control signals for controlling driving of the camera head 11102.

Also, the control unit 11413 displays captured images including the surgery sites and so forth, on the display device 11202, on the basis of image signals subjected to image processing by the image processing unit 11412. At this time, the control unit 11413 may recognize various types of objects in the captured images, using various types of image recognition technology. For example, the control unit 11413 can recognize surgical instruments such as forceps and the like, particular sites of the body, hemorrhaging, mist when using the energy treatment equipment 11112, and so forth, by detecting edge shapes, colors, and so forth, of objects in the captured images. When displaying the captured images on the display device 11202, the control unit 11413 may display various types of surgery support information, superimposed on images of the surgery sites, using the results of recognition. By surgery support information being displayed superimposed, and presented to the operator 11131, the burden on the operator 11131 can be lightened, and the operator 11131 can proceed with the surgery with surety.

The transmission cable 11400 connecting the camera head 11102 and the CCU 11201 is an electrical signal cable that handles communication by electrical signals, an optical fiber that handles optical communication, or a combined cable of these.

Now, although wired communication is performed using the transmission cable 11400 in the example illustrated in the Figures, communication between the camera head 11102 and the CCU 11201 may be performed wirelessly.

An example of an endoscopic surgery system to which the technology according to the present disclosure can be adapted has been described above. Of the above-described configurations, the technology according to the present disclosure can be suitably adapted to the image capturing unit 11402 provided to the camera head 11102 of the endoscope 11100. By adapting the technology according to the present disclosure to the image capturing unit 11402, the image capturing unit 11402 can be reduced in size or made to be high in definition, and accordingly a small-sized or high-definition endoscope 11100 can be provided.

ADAPTATION EXAMPLE

Figure 105:
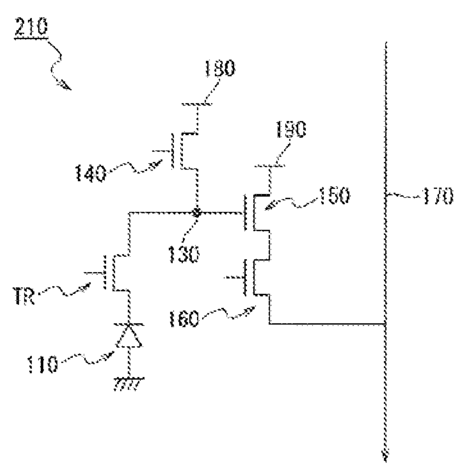
FIG. 105 is a circuit diagram illustrating an example of a solid-state imaging sensor, as an adaptation example of the present technology.

The semiconductor device according to the present technology is configured built into the amplifying transistor 150 that a pixel circuit (CMOS image sensor) combined with the photodiode 110 (photoelectric conversion device) is provided with, as illustrated in FIG. 105. Adaptation can also be made to a solid-state imaging sensor having the semiconductor device and the pixel circuit 210. The solid-state imaging sensor may be a so-called back-illuminated-type solid-state imaging sensor, or may be a front-illuminated-type solid-state imaging sensor. The pixel circuit 210 is provided with the transfer transistor TR, the floating diffusion 130, the reset transistor 140, the amplifying transistor 150, the selecting transistor 160, and the vertical signal line 170.

The transfer transistor TR is placed interposed between the photodiode 110 and the floating diffusion 130. The source electrode of the transfer transistor TR is connected to the other end (cathode electrode) of the photodiode 110 that performs photoelectric conversion of incident light, and generates and stores charges in accordance with the quantity of light for photoelectric conversion. The one end (anode electrode) of the photodiode 110 is grounded. The drain electrode of the transfer transistor TR is connected to the drain electrode of the reset transistor 140 and the gate electrode of the amplifying transistor 150. The transfer transistor TR turns transfer of charges from the photodiode 110 to the floating diffusion 130 on or off, following drive signals supplied to the gate electrode from a timing control unit omitted from illustration. Note that while the transfer transistor TR is stopping transfer of signal charges to the floating diffusion 130, charges regarding which the photodiode 110 has performed photoelectric conversion are stored in the photodiode 110.

The floating diffusion 130 is formed at a point where the drain electrode of the transfer transistor TR, the source electrode of the reset transistor 140, and the gate electrode of the amplifying transistor 150 are connected (connection point). Also, the floating diffusion 130 stores, and converts into voltage, charges transferred thereto from the photodiode 110 via the transfer transistor TR. That is to say, signal charges stored in the photodiode 110 are transferred to the floating diffusion 130.

The source electrode of the reset transistor 140 is connected to the floating diffusion 130, and the drain electrode is connected to a reset-side pixel power source 180. Also, the reset transistor 140 turns discharging of charges stored in the floating diffusion 130 on and off, following drive signals supplied to the gate electrode from the timing control unit.

For example, when a High level drive signal is supplied to the gate electrode, the reset transistor 140 shunts the charge to the pixel power source prior to transfer of the signal charge from the photodiode 110 to the floating diffusion 130. This discharges (resets) the charge stored in the floating diffusion 130. The amount of charge discharged is an amount corresponding to a drain voltage. The drain voltage is a reset voltage at which the floating diffusion 130 is reset. Conversely, when a Low level drive signal is supplied to the gate electrode, the reset transistor 140 places the floating diffusion 130 in an electrically floating state.

The gate electrode of the amplifying transistor 150 is connected to the floating diffusion 130, and the source electrode is connected to an amp-side pixel power source 190. Control voltage is input to the source electrode of the amplifying transistor 150 from a circuit omitted from illustration. The drain electrode of the amplifying transistor 150 is connected to the source electrode of the selecting transistor 160.

Also, the amplifying transistor 150 reads out the potential of the floating diffusion 130 reset by the reset transistor 140 as a reset level. The amplifying transistor 150 further amplifies the voltage corresponding to the signal charge stored in the floating diffusion 130 to which the signal charge has been transferred by the transfer transistor TR. That is to say, the amplifying transistor 150 reads out the signal charge transferred to the floating diffusion 130 as an electric signal, and amplifies.

The voltage (voltage signal) amplified by the amplifying transistor 150 is output to the vertical signal line 170 via the selecting transistor 160.

The drain electrode of the selecting transistor 160 is connected to one end of the vertical signal line 170, and the source electrode is connected to the drain electrode of the amplifying transistor 150, for example.

Also, the selecting transistor 160 turns the output of voltage signals from the amplifying transistor 150 to the vertical signal line 170 on or off, following drive signals SEL supplied from the timing control unit to the gate electrode.

The vertical signal line 170 (vertical signal line) is a line that outputs electrical signals amplified at the amplifying transistor 150. The drain electrode of the selecting transistor 160 is connected to one end of the vertical signal line 170. An A/D converter, omitted from illustration, is connected to the other end of the vertical signal line 170.

Figure 106:
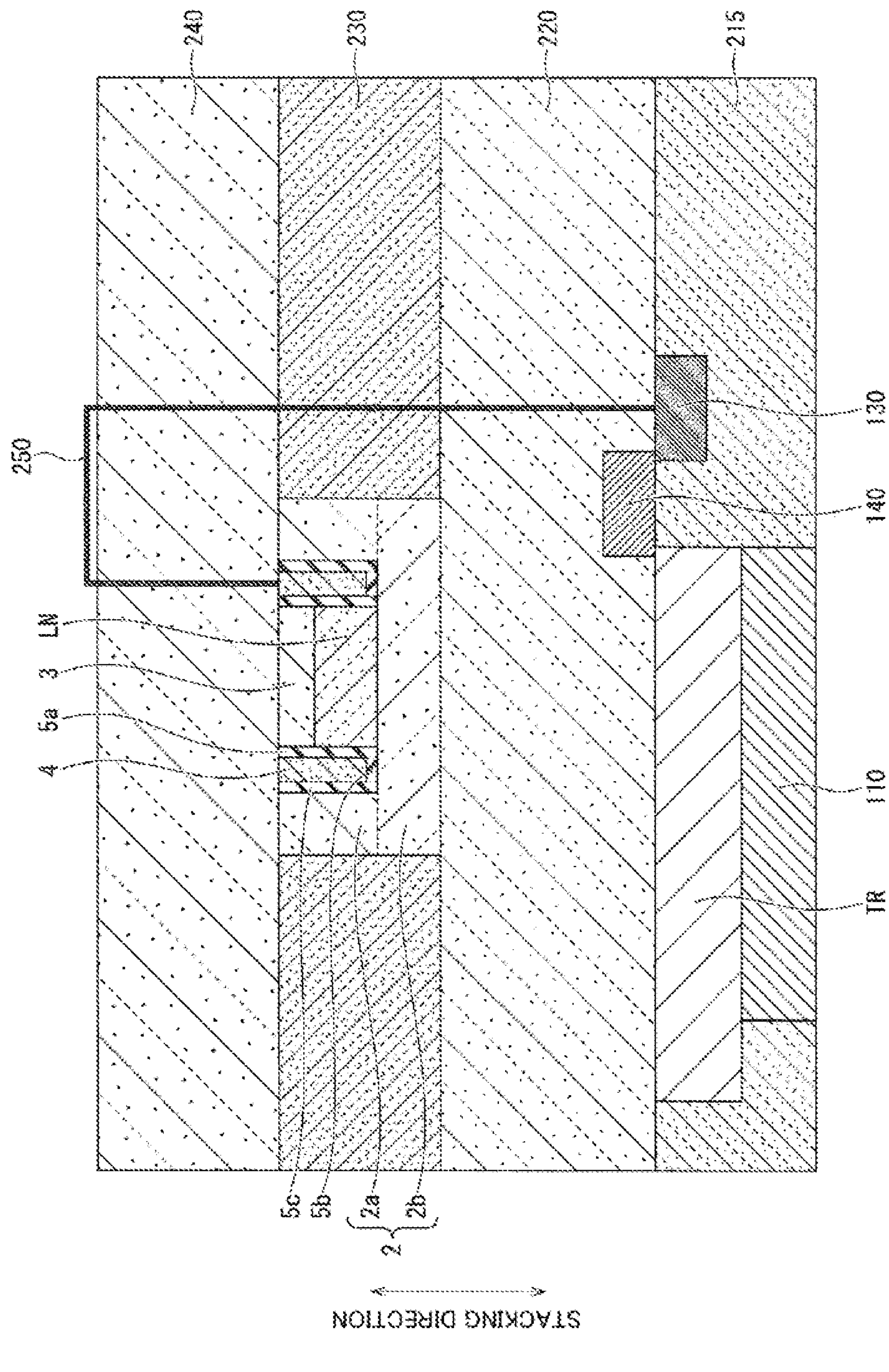
FIG. 106 is a cross-sectional view illustrating an example of a solid-state imaging sensor, as an adaptation example of the present technology.

The solid-state imaging sensor SCC is provided with a configuration in which a first device layer 215, a first wiring layer 220, a second device layer 230, and a second wiring layer 240 are stacked, as illustrated in FIG. 106.

The first device layer 215 forms a photoelectric conversion substrate including the photodiode 110, the transfer transistor TR, the reset transistor 140, and the floating diffusion 130.

The first wiring layer 220 is stacked on one face of the first device layer 215 (the upper face in FIG. 106), and forms an interlayer insulating layer that insulates between the first device layer 215 and the second device layer 230. Also, a portion of interlayer wiring 250 that connects the photodiode 110 and the amplifying transistor 150 is formed in the first wiring layer 220.

The second device layer 230 is stacked on one face of the first wiring layer 220 (the upper face in FIG. 106), and includes the amplifying transistor 150 into which the semiconductor device SD is built in. Also, a portion of the interlayer wiring 250 that connects the photodiode 110 and the amplifying transistor 150 is formed in the first wiring layer 220.

The second wiring layer 240 is stacked on one face of the second device layer 230 (the upper face in FIG. 106), and, a portion of the interlayer wiring 250 that connects the photodiode 110 and the amplifying transistor 150 is formed therein.

Note that either of a Junctionless FET and a Plane type FET may be used for the reset transistor 140 and the selecting transistor 160.

The first wiring layer 220, the second device layer 230, and the second wiring layer 240 are each formed so that the thickness thereof in the stacking direction is, for example, 0.5 [μm].

Accordingly, the front face of upper-layer silicon formed of the second device layer 230 and the second wiring layer 240 is formed at a height approximately 1 [μm] from the front face of a lower-layer silicon substrate formed of the first device layer 215 and the first wiring layer 220.

Also, the low-concentration N-type region LN, the second high-concentration N-type region 3, the gate electrode 4, and the facing region **2*a*** are each formed so that the width as viewed from the stacking direction is 0.2 [μm], for example.

Further, the second high-concentration N-type region 3 is formed so that the thickness in the stacking direction is 0.1 [μm], for example. Also, the low-concentration N-type region LN and the base region **2*b*** are each formed so that the thickness in the stacking direction is 0.2 [μm], for example.

That is to say, the semiconductor device SD having a vertical GAA structure in which the low-concentration N-type region LN is stacked with the low-concentration N-type region LN interposed between the first high-concentration N-type region 2 and the second high-concentration N-type region 3 is formed so that the size of each of the parts is around 0.1 [μm] to 0.3 [μm].

In particular, the spacing between the low-concentration N-type region LN (channel) extending in the vertical direction (stacking direction) from the source electrode to the drain electrode, and the gate electrode 4, is formed to be around 0.05 [μm].

The size of the semiconductor device SD is set so as to be smaller than the photodiode 110, in accordance with the size of the photodiode 110, and further, detailed size is decided in accordance with characteristics and ease of working. Note that the semiconductor device according to the present technology is not limited to a configuration built into the amplifying transistor 150, and may be a configuration built into other than the photodiode 110, for example.

OTHER EMBODIMENTS

Although embodiments according to the present technology have been described above, the discussion and Figures that make up part of this disclosure should not be understood to limit the present technology. Various substitutive embodiments, examples, and operation technology will be clear from this disclosure to one skilled in the art.

Beyond this, it is needless to say that the present technology includes various embodiments and so forth that are not described here, such as configurations in which the configurations described in the above embodiments are optionally applied. Accordingly, the technical scope of the present technology is determined only by the matters specifying the invention from the Claims which are reasonable from the above description.

Also, the semiconductor device according to the present disclosure does not have to be provided with all of the components described in the above embodiments and so forth, and conversely may be provided with other components.

Note that the effects described in the present specification are only exemplary and not limiting, and there may be other effects also.

Note that the present technology may assume the following configurations.

(1)

A semiconductor device, including:

a low-concentration N-type region;

a first high-concentration N-type region and a second high-concentration N-type region that are stacked with the low-concentration N-type region interposed therein, and that have a higher concentration of impurity than the low-concentration N-type region;

a gate electrode that surrounds the low-concentration N-type region as viewed from a stacking direction which is a direction in which the low-concentration N-type region, the first high-concentration N-type region, and the second high-concentration N-type region are stacked;

a first insulating film placed between the gate electrode and the low-concentration N-type region; and a second insulating film placed between the gate electrode and the first high-concentration N-type region, wherein the first high-concentration N-type region is connected to one of a source electrode and a drain electrode; and the second high-concentration N-type region is connected to the other of the source electrode and the drain electrode.

(2)

A semiconductor device, including:

a low-concentration N-type region;

a first high-concentration N-type region and a second high-concentration N-type region that are stacked with the low-concentration N-type region interposed therein, and that have a higher concentration of impurity than the low-concentration N-type region;

a gate electrode that has a portion facing the low-concentration N-type region and a portion not facing the low-concentration N-type region, as viewed from a stacking direction which is a direction in which the low-concentration N-type region, the first high-concentration N-type region, and the second high-concentration N-type region are stacked;

a first insulating film placed between the gate electrode and the low-concentration N-type region; and a second insulating film placed between the gate electrode and the first high-concentration N-type region, wherein the first high-concentration N-type region is connected to one of a source electrode and a drain electrode; and the second high-concentration N-type region is connected to the other of the source electrode and the drain electrode.

(3)

The semiconductor device according to (1) or (2) above, wherein the first high-concentration N-type region is formed including a facing region that is a region facing the low-concentration N-type region with the gate electrode interposed therebetween;

the semiconductor device includes a third insulating film placed between the facing region and the gate electrode; and the thickness of the second insulating film and the thickness of the third insulating film is thicker than the thickness of the first insulating film.

(4)

The semiconductor device according to (1) or (2) above, wherein the first high-concentration N-type region is formed including a facing region that is a region facing the low-concentration N-type region with the gate electrode interposed therebetween;

the semiconductor device includes a third insulating film placed between the facing region and the gate electrode; and the thickness of the third insulating film is thicker than the thickness of the first insulating film and the thickness of the second insulating film.

(5)

The semiconductor device according to (3) or (4) above, wherein at least one of silicon oxide, silicon nitride, and hafnium oxide is used as a material of the third insulating film.

(6)

The semiconductor device according to any one of (1) to (5) above, wherein at least one of silicon oxide, silicon nitride, and hafnium oxide is used as a material of the first insulating film and the second insulating film.

(7)

The semiconductor device according to any one of (1) to (6) above, wherein at least one of polycrystalline silicon, titanium nitride, copper, aluminum, and tungsten is used as a material of the gate electrode.

(8)

The semiconductor device according to any one of (1) to (7) above, including a plurality of the second high-concentration N-type regions and a plurality of the low-concentration N-type regions, wherein a plurality of the second high-concentration N-type regions and a plurality of the low-concentration N-type regions are stacked in one of the first high-concentration N-type region.

(9)

The semiconductor device according to any one of (1) to (8) above, wherein the shape of the low-concentration N-type region is square as viewed from the stacking direction, and the shape of the gate electrode is square as viewed from the stacking direction.

(10)

The semiconductor device according to any one of (1) to (8) above, wherein the shape of the low-concentration N-type region is circular as viewed from the stacking direction; and the shape of the gate electrode is circular as viewed from the stacking direction.

(11)

The semiconductor device according to any one of (1) to (10) above, wherein a face connected to the source electrode or the drain electrode of the first high-concentration N-type region, and a face connected to the source electrode or the drain electrode of the second high-concentration N-type region, are at a same height as viewed from a direction orthogonal to the stacking direction.

(12)

The semiconductor device according to any one of (1) to (10) above, wherein a face connected to the source electrode or the drain electrode of the first high-concentration N-type region, and a face connected to the source electrode or the drain electrode of the second high-concentration N-type region, are at different heights as viewed from a direction orthogonal to the stacking direction.

(13)

The semiconductor device according to any one of (1) to (12) above, wherein the low-concentration N-type region has a portion not facing the gate electrode.

(14)

The semiconductor device according to any one of (1) to (13) above, wherein a concentration of impurity of the low-concentration N-type region is not higher than 10 keV/1E$^{18}$ (cm$^{-2}$); and a concentration of impurity of the first high-concentration N-type region and the second high-concentration N-type region is not lower than 10 keV/1E$^{19}$ (cm$^{-2}$).

(15)

A solid-state imaging sensor, including:

a pixel circuit that is provided with an amplifying transistor, wherein the semiconductor device according to any one of (1) to (14) above is built into the amplifying transistor.

(16)

A solid-state imaging sensor, including:

a pixel circuit that is provided with an amplifying transistor, wherein the semiconductor device according to (2) above is built into the amplifying transistor.

(17)

A solid-state imaging sensor, including:

a first semiconductor layer that is a semiconductor layer in which is placed a pixel circuit provided with a photodiode, and a transfer transistor and a floating diffusion that are connected to the photodiode;

an interlayer insulating layer that is stacked on the first semiconductor layer; and a second semiconductor layer that is a semiconductor layer in which is placed an amplifying transistor including a semiconductor device, and that is stacked on the interlayer insulating layer, wherein transfer-side interlayer wiring that completely passes through the interlayer insulating layer and the second semiconductor layer is connected to the transfer transistor;

the semiconductor device has a low-concentration N-type region, a first high-concentration N-type region and a second high-concentration N-type region that are stacked in a direction orthogonal to the direction of stacking the first semiconductor layer and the second semiconductor layer, with the low-concentration N-type region interposed therein, and that have a higher concentration of impurity than the low-concentration N-type region;

a gate electrode that faces at least a part of the low-concentration N-type region, a shielding electrode that faces at least a portion of the low-concentration N-type region different from the portion facing the gate electrode, a first insulating film placed between the gate electrode and the low-concentration N-type region; and a second insulating film placed between the gate electrode and the first high-concentration N-type region;

the first high-concentration N-type region is connected to one of a source electrode and a drain electrode;

the second high-concentration N-type region is connected to the other of the source electrode and the drain electrode;

the gate electrode is connected to the floating diffusion by gate-side interlayer wiring that completely passes through the interlayer insulating layer and the second semiconductor layer, and is electrically connected to the first semiconductor layer; and the shielding electrode is electrically connected to a portion different from the first semiconductor layer and the second semiconductor layer.

(18)

The solid-state imaging sensor according to (17) above, wherein, as viewed from the stacking direction, the low-concentration N-type region is a square that has two sides parallel to the stacking direction and two sides orthogonal to the stacking direction; and the gate electrode and the shielding electrode face three sides or four sides of the low-concentration N-type region as viewed from the stacking direction.

(19)

The solid-state imaging sensor according to (18) above, wherein, as viewed from the stacking direction, the gate electrode faces a side of the two parallel sides that is farther from the first semiconductor layer, and faces a side of the two orthogonal sides that is nearer to the gate-side interlayer wiring, and, as viewed from the stacking direction, the shielding electrode faces a side of the two parallel sides that is nearer to the first semiconductor layer, and faces a side of the two orthogonal sides that is nearer to the transfer-side interlayer wiring.

(20)

The solid-state imaging sensor according to (19) above, wherein, as viewed from the stacking direction, the gate electrode faces a side of the two parallel sides and the two orthogonal sides that is nearer to the gate-side interlayer wiring, and, as viewed from the stacking direction, the shielding electrode faces a side of the two orthogonal sides that is nearer to the transfer-side interlayer wiring.

(21)

The solid-state imaging sensor according to (19) above, wherein, as viewed from the stacking direction, the gate electrode faces a side of the two parallel sides that is nearer to the first semiconductor layer, and faces a side of the two orthogonal sides that is nearer to the gate-side interlayer wiring, and, as viewed from the stacking direction, the shielding electrode faces a side of the two orthogonal sides that is nearer to the transfer-side interlayer wiring.

(22)

The solid-state imaging sensor according to (19) above, wherein, as viewed from the stacking direction, the gate electrode faces a side of the two orthogonal sides that is nearer to the gate-side interlayer wiring, and, as viewed from the stacking direction, the shielding electrode faces a side of the two parallel sides that is nearer to the first semiconductor layer, and faces a side of the two orthogonal sides that is nearer to the transfer-side interlayer wiring.

(23)

The solid-state imaging sensor according to (19) above, wherein, as viewed from the stacking direction, the gate electrode faces the two parallel sides;

as viewed from the stacking direction, the shielding electrode faces the two orthogonal sides;

the solid-state imaging sensor includes a fifth insulating film placed between the shielding electrode and the low-concentration N-type region; and the thickness of the fifth insulating film is thicker than the thickness of the first insulating film.

(24)

The solid-state imaging sensor according to (23) above, wherein the gate electrode and the shielding electrode are integrated; and the integrated gate electrode and the shielding electrode surround the low-concentration N-type region as viewed from the stacking direction.

(25)

The solid-state imaging sensor according to any one of (17) to (24) above, wherein the gate electrode has a low-concentration-region facing portion that is a portion facing the low-concentration N-type region, and a high-concentration-region facing portion that is a portion facing at least one of the first high-concentration N-type region and the second high-concentration N-type region; and a facing distance of the high-concentration-region facing portion facing at least one of the first high-concentration N-type region and the second high-concentration N-type region is longer than a facing distance of the low-concentration-region facing portion facing the low-concentration N-type region.

(26)

The solid-state imaging sensor according to any one of (17) to (25) above, wherein four of the pixel circuits are placed in the first semiconductor layer; and the solid-state imaging sensor includes an N-type polysilicon pad that connects four of the floating diffusions that the four pixel circuits respectively are provided with; and a shared contact that connects the N-type polysilicon pad and the amplifying transistor.

REFERENCE SIGNS LIST

1 Image capturing device
2 First high-concentration N-type region
2*a* Facing region
2*b* Base region
3 (3*a* to 3*d*) Second high-concentration N-type region
4 Gate electrode
4*a* Gate-side electrode material
4L Low-concentration-region facing portion
411 High-concentration-region facing portion
5*a* First insulating film
5*b* Second insulating film
5*c* Third insulating film
5*d* Fourth insulating film
5*e* Fifth insulating film
10 Silicon substrate
12 Hard mask
14*a* First resist mask
14*b* Second resist mask
14*c* Third resist mask
14*d* Fourth resist mask
16 Oxide film
16*a* First oxide film
16*b* Second oxide film
16*c* Third oxide film
16*d* Fourth oxide film
18 Polysilicon
110 Photodiode
130 Floating diffusion
140 Reset transistor
150 Amplifying transistor
160 Selecting transistor
170 Vertical signal line
180 Reset-side pixel power source
190 Amp-side pixel power source
210 Pixel circuit
215 First device layer
220 First wiring layer
230 Second device layer
240 Second wiring layer
250 Interlayer wiring
260 First semiconductor layer
260*a* First semiconductor substrate
270 Interlayer insulating layer
270*a* First interlayer insulating film
270*b* Second interlayer insulating film
270*c* Third interlayer insulating film
280 Second semiconductor layer
280*a* Second layer material insulating film
280*b* Third layer material insulating film
290*a* N-type polysilicon pad
290*b* Shared contact
310 Transfer-side interlayer wiring
320 Shielding electrode
320*a* Shielding electrode material layer

320*b* Shielding-side electrode material
330 Gate-side interlayer wiring
340 Shielding-side wiring
400 Channel semiconductor substrate
410 Fifth base insulating film
411 Fifth side insulating film
420 Spacer layer
500*a* Gate-side inclined portion
500*b* First high-concentration side inclined portion
500*c* Second high-concentration side inclined portion
500*d* Protective film
LN (LNa to LNd) Low-concentration N-type region
DL Depletion layer
TP Interface trap
T1 Film thickness of first insulating film 5*a*
T2 Film thickness of second insulating film 5*b*
T3 Film thickness of third insulating film 5*c*
CPa First parasitic capacitance
CPb Second parasitic capacitance
SCC Solid-state imaging sensor
TR Transfer transistor
SD Semiconductor device
SP Sensor pixel
RC Read circuit
FDG FD transfer transistor

What is claimed is:

1. A semiconductor device, comprising:

a low-concentration N-type region;

a first high-concentration N-type region and a second high-concentration N-type region that are stacked with the low-concentration N-type region interposed therein, and that have a higher concentration of impurity than the low-concentration N-type region;

a gate electrode that surrounds the low-concentration N-type region as viewed from a stacking direction which is a direction in which the low-concentration N-type region, the first high-concentration N-type region, and the second high-concentration N-type region are stacked;

a first insulating film placed between the gate electrode and the low-concentration N-type region; and a second insulating film placed between the gate electrode and the first high-concentration N-type region, wherein the first high-concentration N-type region is connected to a first one of a source electrode and a drain electrode; and the second high-concentration N-type region is connected to a second one of the source electrode and the drain electrode, wherein the first high-concentration N-type region includes a facing region that is a region facing the low-concentration N-type region with the gate electrode interposed therebetween, wherein the semiconductor device further comprises a third insulating film placed between the facing region and the gate electrode, and wherein a thickness of the second insulating film and a thickness of the third insulating film is thicker than a thickness of the first insulating film.

2. A semiconductor device, comprising:

a low-concentration N-type region;

a first high-concentration N-type region and a second high-concentration N-type region that are stacked with the low-concentration N-type region interposed therein, and that have a higher concentration of impurity than the low-concentration N-type region;

a gate electrode that surrounds the low-concentration N-type region as viewed from a stacking direction which is a direction in which the low-concentration N-type region, the first high-concentration N-type region, and the second high-concentration N-type region are stacked;

a first insulating film placed between the gate electrode and the low-concentration N-type region; and a second insulating film placed between the gate electrode and the first high-concentration N-type region, wherein the first high-concentration N-type region is connected to a first one of a source electrode and a drain electrode; and the second high-concentration N-type region is connected to a second one of the source electrode and the drain electrode, wherein the first high-concentration N-type region includes a facing region that is a region facing the low-concentration N-type region with the gate electrode interposed therebetween, wherein the semiconductor device further comprises a third insulating film placed between the facing region and the gate electrode, and wherein a thickness of the third insulating film is thicker than a thickness of the first insulating film and a thickness of the second insulating film.

3. The semiconductor device according to claim 1, comprising a plurality of the second high-concentration N-type regions and a plurality of the low-concentration N-type regions, wherein a plurality of the second high-concentration N-type regions and a plurality of the low-concentration N-type regions are stacked in the first high-concentration N-type region.

4. The semiconductor device according to claim 1, wherein at least one of silicon oxide, silicon nitride, and hafnium oxide is used as a material of the first insulating film and the second insulating film.

5. The semiconductor device according to claim 1, wherein at least one of silicon oxide, silicon nitride, and hafnium oxide is used as a material of the third insulating film.

6. The semiconductor device according to claim 2, wherein at least one of silicon oxide, silicon nitride, and hafnium oxide is used as a material of the third insulating film.

7. The semiconductor device according to claim 1, wherein at least one of polycrystalline silicon, titanium nitride, copper, aluminum, and tungsten is used as a material of the gate electrode.

8. The semiconductor device according to claim 1, wherein a concentration of impurity of the low-concentration N-type region is not higher than 10 keV/1E$^{18}$ (cm$^{-2}$), and wherein a concentration of impurity of the first high-concentration N-type region and the second high-concentration N-type region is not lower than 10 keV/1E$^{19}$ (cm$^{-2}$).

9. The semiconductor device according to claim 1, wherein a shape of the low-concentration N-type region is square as viewed from the stacking direction, and wherein a shape of the gate electrode is square as viewed from the stacking direction.

10. The semiconductor device according to claim 1, wherein a shape of the low-concentration N-type region is circular as viewed from the stacking direction, and wherein a shape of the gate electrode is circular as viewed from the stacking direction.

11. A semiconductor device, comprising:

a low-concentration N-type region;

a first high-concentration N-type region and a second high-concentration N-type region that are stacked with the low-concentration N-type region interposed therein, and that have a higher concentration of impurity than the low-concentration N-type region;

a gate electrode that surrounds the low-concentration N-type region as viewed from a stacking direction which is a direction in which the low-concentration N-type region, the first high-concentration N-type region, and the second high-concentration N-type region are stacked;

a first insulating film placed between the gate electrode and the low-concentration N-type region; and a second insulating film placed between the gate electrode and the first high-concentration N-type region, wherein the first high-concentration N-type region is connected to a first one of a source electrode and a drain electrode; and the second high-concentration N-type region is connected to a second one of the source electrode and the drain electrode, wherein a face connected to the source electrode or the drain electrode of the first high-concentration N-type region, and a face connected to the source electrode or the drain electrode of the second high-concentration N-type region, are at a same height as viewed from a direction orthogonal to the stacking direction.

12. The semiconductor device according to claim 1, wherein a face connected to the source electrode or the drain electrode of the first high-concentration N-type region, and a face connected to the source electrode or the drain electrode of the second high-concentration N-type region, are at different heights as viewed from a direction orthogonal to the stacking direction.

13. The semiconductor device according to claim 1, wherein-the low-concentration N-type region has a portion not facing the gate electrode.

14. A solid-state imaging sensor, comprising:

a pixel circuit that is provided with an amplifying transistor, wherein the semiconductor device according to claim 1 is built into the amplifying transistor.

15. The semiconductor device according to claim 2, comprising a plurality of the second high-concentration N-type regions and a plurality of the low-concentration N-type regions, wherein a plurality of the second high-concentration N-type regions and a plurality of the low-concentration N-type regions are stacked in the first high-concentration N-type region.

16. The semiconductor device according to claim 2, wherein at least one of silicon oxide, silicon nitride, and hafnium oxide is used as a material of the first insulating film and the second insulating film.

17. The semiconductor device according to claim 2, wherein at least one of polycrystalline silicon, titanium nitride, copper, aluminum, and tungsten is used as a material of the gate electrode.

18. The semiconductor device according to claim 2, wherein a concentration of impurity of the low-concentration N-type region is not higher than 10 keV/1E$^{18}$ (cm$^{-2}$), and wherein a concentration of impurity of the first high-concentration N-type region and the second high-concentration N-type region is not lower than 10 keV/1E$^{19}$ (cm$^{-2}$).

19. The semiconductor device according to claim 2, wherein a shape of the low-concentration N-type region is square as viewed from the stacking direction, and and wherein a shape of the gate electrode is square as viewed from the stacking direction.

20. The semiconductor device according to claim 2, wherein a shape of the low-concentration N-type region is circular as viewed from the stacking direction, and wherein a shape of the gate electrode is circular as viewed from the stacking direction.

21. The semiconductor device according to claim 2, wherein a face connected to the source electrode or the drain electrode of the first high-concentration N-type region, and a face connected to the source electrode or the drain electrode of the second high-concentration N-type region, are at different heights as viewed from a direction orthogonal to the stacking direction.

22. The semiconductor device according to claim 2, wherein the low-concentration N-type region has a portion not facing the gate electrode.

23. A solid-state imaging sensor, comprising:

a pixel circuit that is provided with an amplifying transistor, wherein the semiconductor device according to claim 2 is built into the amplifying transistor.

24. The semiconductor device according to claim 1, wherein a face connected to the source electrode or the drain electrode of a first-high-concentration N-type region, and a face connected to the source electrode or the drain electrode of a second high-concentration N-type region, are at a same height as viewed from a direction orthogonal to the stacking direction.

25. The semiconductor device according to claim 2, wherein a face connected to the source electrode or the drain electrode of a first-high-concentration N-type region, and a face connected to the source electrode or the drain electrode of a second high-concentration N-type region, are at a same height as viewed from a direction orthogonal to the stacking direction.

26. The semiconductor device according to claim 11, comprising a plurality of the second high-concentration N-type regions and a plurality of the low-concentration N-type regions, wherein a plurality of the second high-concentration N-type regions and a plurality of the low-concentration N-type regions are stacked in the first high-concentration N-type region.

27. The semiconductor device according to claim 11, wherein at least one of silicon oxide, silicon nitride, and hafnium oxide is used as a material of the first insulating film and the second insulating film.

* * * * *